United States Patent [19]

Yoshimi et al.

[11] Patent Number: 5,698,869
[45] Date of Patent: Dec. 16, 1997

[54] INSULATED-GATE TRANSISTOR HAVING NARROW-BANDGAP-SOURCE

[75] Inventors: Makoto Yoshimi; Satoshi Inaba; Atsushi Murakoshi; Mamoru Terauchi; Naoyuki Shigyo; Yoshiaki Matsushita; Masami Aoki; Takeshi Hamamoto; Yutaka Ishibashi; Tohru Ozaki; Hitomi Kawaguchiya; Kazuya Matsuzawa; Osamu Arisumi; Akira Nishiyama, all of Tokyo, Japan

[73] Assignee: Kabushiki Kaisha Toshiba, Kawasaki, Japan

[21] Appl. No.: 527,515

[22] Filed: Sep. 13, 1995

[30] Foreign Application Priority Data

| Sep. 13, 1994 | [JP] | Japan | 6-218513 |
| Sep. 13, 1994 | [JP] | Japan | 6-218593 |
| Sep. 13, 1994 | [JP] | Japan | 6-219073 |
| Dec. 8, 1994 | [JP] | Japan | 6-305214 |
| Dec. 8, 1994 | [JP] | Japan | 6-305241 |
| Sep. 7, 1995 | [JP] | Japan | 7-230329 |

[51] Int. Cl.$^6$ .................................................. H01L 31/072
[52] U.S. Cl. ........................... 257/192; 257/66; 257/347; 257/616
[58] Field of Search ................... 257/63, 65, 347, 257/616, 631, 55, 607, 192, 66

[56] References Cited

U.S. PATENT DOCUMENTS

| 4,603,471 | 8/1986 | Strain | 29/576 |
| 4,769,689 | 9/1988 | Lin | 257/607 |
| 4,835,112 | 5/1989 | Pfiester et al. | 257/607 |
| 5,095,358 | 3/1992 | Aronowitz et al. | 257/607 |
| 5,134,447 | 7/1992 | Ng et al. | 257/607 |

(List continued on next page.)

FOREIGN PATENT DOCUMENTS

| 1-255252 | 10/1989 | Japan . | |
| 3-119764 | 5/1991 | Japan . | |
| 0320063 | 11/1992 | Japan | 257/65 |
| 4-313242 | 11/1992 | Japan . | |
| 5-21762 | 1/1993 | Japan . | |
| 5-3322 | 1/1993 | Japan . | |
| 7-15015 | 1/1995 | Japan . | |

OTHER PUBLICATIONS

Sim et al., "Elimination of Parasitic Bipolar–Induced Breakdown Effects in Ultra–Thin SOI MOSFET's Using Narrow–Bandgap–Source (NBS) Structure", IEEE Transactions on Electron Devices, vol. 42, No. 8, pp. 1495–1502, Aug. 1995.
PFiester et al., "Improved MOSFET Short–Channel Device Using Germanium Implantation", IEEE Electron Device Letters, vol. 9, No. 7, pp. 343–346, Jul. 1988.
PFiester et al., "Improved CMOS Field Isolation Using Germanium/Boron Implantation", IEEE Electron Device Letters, vol. 9, No. 8, pp. 391–393, Aug. 1988.

(List continued on next page.)

*Primary Examiner*—Tom Thomas
*Assistant Examiner*—David B. Hardy
*Attorney, Agent, or Firm*—Foley & Lardner

[57] ABSTRACT

A structure of a semiconductor device and a method of manufacturing the same is provided wherein a leakage current can be reduced while improving a drain breakdown voltage of an Insulated-Gate transistor such as a MOSFET, MOSSIT and a MISFET, and a holding characteristic of a memory cell such as a DRAM using these transistors as switching transistors can be improved, and further a reliability of a gate oxide film in a transfer gate can be improved. More particularly, a narrow band gap semiconductor region such as $Si_xGe_{1-x}$, $Si_xSn_{1-x}$, PbS is formed in an interior of a source region or a drain region in the SOI.IG-device. By selecting location and/or mole fraction of the narrow band gap semiconductor region in a SOI film, or selecting a kind of impurity element to compensate the crystal lattice mismatching due to the narrow-bandgap semiconductor region, the generation of crystal defects can be suppressed. Further the structure that the influences of the crystal defects to the transistor or memory characteristics such as the leakage current can be suppressed, even if the crystal defects are generated, are also proposed.

31 Claims, 53 Drawing Sheets

U.S. PATENT DOCUMENTS

| | | | |
|---|---|---|---|
| 5,245,208 | 9/1993 | Eimori | 257/607 |
| 5,250,818 | 10/1993 | Saraswar et al. | 257/616 |
| 5,266,813 | 11/1993 | Comfort et al. | 257/616 |
| 5,268,324 | 12/1993 | Aitken et al. | 437/57 |
| 5,378,923 | 1/1995 | Mitsui et al. | 257/616 |
| 5,426,069 | 6/1995 | Selvakumar et al. | 257/288 |
| 5,475,244 | 12/1995 | Koizumi et al. | 257/347 |
| 5,553,566 | 9/1996 | Chiou et al. | 117/2 |

OTHER PUBLICATIONS

Yoshimi et al., "Technology Trends of Silicon–On–Insulator–Its Advantages and Problems to be Solved –" Tech. Digest of IEDM'94, pp. 429–435, Dec. 13, 1994.

Nishiyama et al., "Formation of SiGe Source/Drain Using Ge Implantation for Floating–Body Effect Resistant SOI MOSFETs", Extended Abstracts of the 1995 International Conference on Solid State Devices and Material, pp. 545–547, Aug. 21, 1995.

Arisumi et al., "Analysis of Si–Ge Source Structure in ).15 µm SOI MOSFETs Using Two–Dimensional Device Simulation", Extended Abstracts of the 1995 International Conference on Solid State Devices and Material, pp. 860–862, Aug. 21, 1995.

Yoshimi et al., "Bandgap Engineering Technology for Suppressing the Substrate–Floating Effect in 0.15 µm SOI–MOSFETS", IEEE International Conference, pp. 80–81, Oct. 1995.

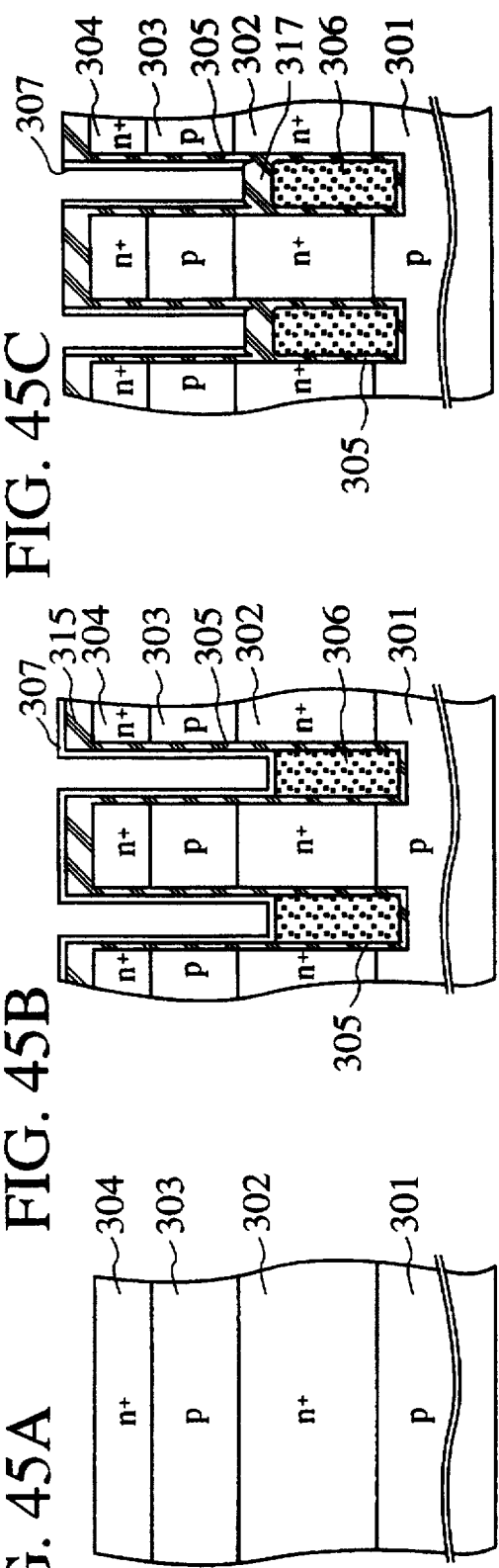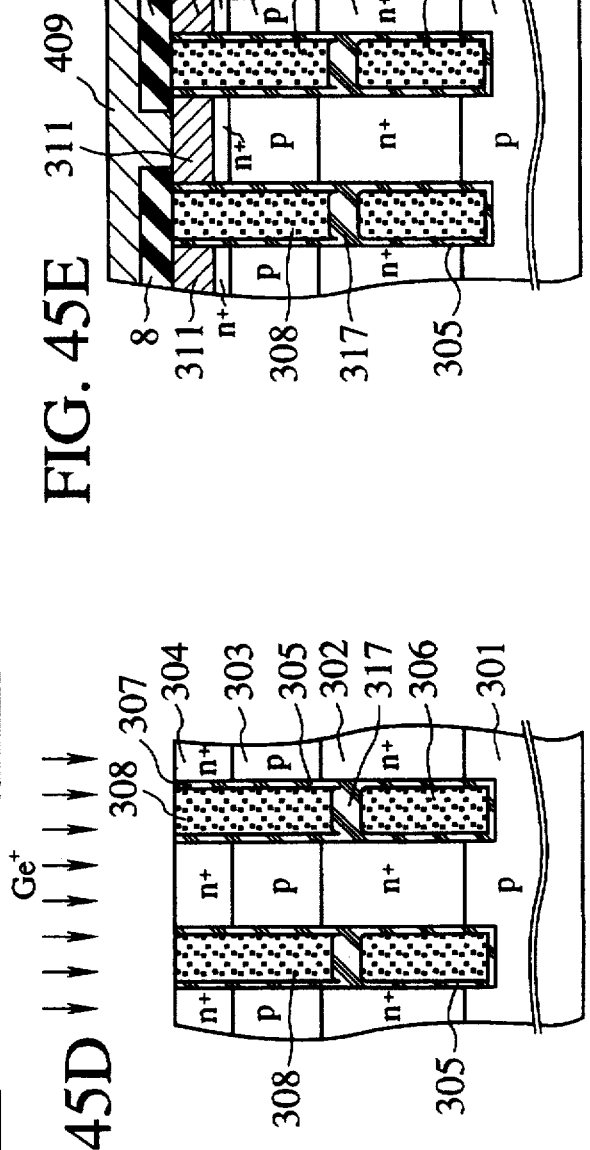

INSULATED-GATE TRANSISTOR HAVING NARROW-BANDGAP-SOURCE

BACKGROUND OF THE INVENTION

1. Field of the Invention

The present invention relates to an Insulated-Gate device (IG device) suitable for an integrated circuit such as a MOS integrated circuit in which fine patterning and high integration density are required and, more particularly, to a new device structure suitable for improvement in characteristics of MOSFET, MISFET, etc. having a SOI structure and a method of manufacturing the same.

2. Description of the Prior Art

In semiconductor integrated circuit technology, especially, dynamic random access memory (DRAM) technology in recent years, high integration density has become remarkable. However, there is a tendency to reduce a memory cell area of a DRAM more and more with the development of integration density. As a result, it becomes difficult to secure cell capacity for preventing erasure of memory contents caused by α-rays which exist in the natural world, i.e., so-called soft error. Thus, so-called SOI (Silicon-On-Insulator) devices have been preferably formed on a single crystal silicon, which is formed on an insulating film. Since the miniaturization and the high speed operation of the SOI device is easy, it is promising as a high performance device. The SOI device is formed to use Si layer formed on an insulating film such as an oxide film etc. as an active region. Thus, devices such as transistors formed in the active region are isolated perfectly. In addition, if integrated circuits etc. are formed by the SOI technologies, advantages such as small coupling capacitance between the substrate and the device have been expected. At the same time, since the SOI device can limit the number of the electron-hole pairs, which are generated by α-rays, within a single crystal silicon film on the insulating film (referred to as "SOI film" hereinafter), soft error immunity in the DRAM etc. can be improved significantly.

FIG. 1 shows a sectional structure of a conventional SOI.MOS.DRAM which is formed on a so-called SOI substrate. The SOI substrate is formed of an single crystal silicon film (SOI film) 203 on a silicon substrate 201 via a buried insulating layer 202. A data line (bit line) 409 is formed via a contact electrode 408 on an n$^+$ source region 206 formed in the SOI film 203. Storage electrode 405, capacitance insulating film 406, and opposing electrode 407 are formed on the n$^+$ drain region 206 via a contact electrode 410. In addition, a gate electrode 205 formed of polysilicon or the like is formed on the SOI film 203 serving as a channel region between the n$^+$ source region 206 and the n$^+$ drain region 206 via a gate oxide film 204. The gate electrode 205 also serves as a word line of the DRAM.

However, as shown in FIG. 2, the SOI device has a drawback that drain breakdown voltage is lowered because of the substrate floating effect, or the "floating body effect", where the generated carriers accumulate in the SOI body (the region between source and drain) and causes abnormal device characteristics by modifying the potential, in contrast to a bulk MOSFET. In FIG. 2, an SOLMOSFET is shown as a typical SOI device, and drain breakdown voltage of the SOI.MOSFET and the bulk MOSFET is plotted against a gate length L of respective MOSFETs. In addition, as shown in FIGS. 3A thru FIG. 3C, the SOI device (SOLMOSFET) has unstable characteristics such as an overshoot of output current caused by a switching operation of the SOI.MOSFET. These are serious drawbacks in practical uses. FIGS. 3A-3C show a waveform of output drain current due to an input gate voltage, and show the overshoot of the output drain current. In order to utilize the full potential of an SOI.MOSFET for VLSI/ULSI applications it is important to reduce its floating body effect. This floating body effect can be relaxed by using thin body whose thickness is less than the maximum depletion width. However, in spite of using the fully depleted body, the associated parasitic bipolar effect may still be troublesome. To completely eliminate the floating body effect, the SOI body has to be tied with the substrate or the ground electrode, which will lead to the complicated device structure, and make the miniaturization of device dimensions hard. The complicated device structure has another drawback of lower fabrication yield.

In a broad sense, the SOI structure may be formed to have various structures in which Si layer on the insulating film is formed of single crystal, poly crystal, or amorphous; the insulating material is formed thick or thin; the insulating layer is formed of single crystal or amorphous; or the like. However, in the following descriptions, a case wherein Si layer on the insulating film is formed in principle of a single crystal silicon will be mainly described, and the single crystal Si film formed on the insulating film will be called as the SOI film, as discussed above. But, there are some cases wherein amorphous regions, crystal defects generated regions, and the like are included partially in this SOI film, as can be understood in the following descriptions.

As a countermeasure for the floating body effect in the SOI device, a MOSFET structure in which the source region is formed of a narrow bandgap material in contrast to the channel region, or the SOI body, has been proposed, for instance (Patent Application Publication (KOKAI) 01-255252). In this device, if bandgap of the source region of the MOSFET is set more narrowly than that of the channel region, hole accumulation in the channel region (considered as a main factor of the floating body effect) can be prevented effectively.

As a most typical material having narrower bandgap than that of Si forming the channel region, $Si_xGe_{1-x}$ (0<x<1) is listed. As one of devices using this material, there is a SOLMOSFET having a sectional structure shown in FIG. 4A. In the SOLMOSEFT in FIG. 4A, an insulating layer 202 formed of an oxide film etc. is formed on an Si substrate 201, a SOI film 203 serving as an active layer is formed thereon, and n$^+$ source and drain regions 206 are formed on part of the SOI film. In FIG. 4A, the SOLMOSFET is featured in that an $Si_xGe_{1-x}$ layer 207 is formed in an inside of the n$^+$ source and drain regions 206. Thereafter, as similarly in an ordinary MOSFET, a gate oxide film 204 is formed on the channel region 203 between the n$^+$ source region 206 and the n$^+$ drain region 206, and then a gate electrode 202 formed of polysilicon, for example, is formed thereon.

FIG. 4B shows a potential profile (band diagram) of the SOLMOSEFT shown in FIG. 4A. In this MOSFET, as shown in FIG. 4B, a bandgap in the source region can be narrowed up to a location shown by a broken line. It is apparent from experiments or simulations that hole currents flowing into the n$^+$ source region 206 increase like an exponential function, with reduction of the energy band gap in the n$^+$ source region 206.

For instance, a current-voltage characteristic of the SOLMOSFET having a channel length of 0.5 µm is shown in FIG. 5A. In the characteristic in FIG. 5A, a full line shows a measured result of the SOLMOSFET in which Germanium (Ge) ions are implanted under conditions of accelerating voltage Vac=50 kV and a dose $\Phi=3\times10^{16}$ cm$^{-2}$. It could be found from FIG. 5A that, in comparison with the conventional homojunction MOSFET which has the source and drain regions formed of only Si, as shown by a dotted line, the drain breakdown voltage can be improved by more than 1 V in the heterojunction MOSFET which has a SiGe layer in the Si source and drain regions, as shown by the solid line.

The SOLMOSFET in FIG. 4A has been manufactured by following manufacturing steps. First, the SOI substrate is formed by SIMOX (Separation by IMplanted OXygen). In other words, a buried oxide film 202 is formed by implanting oxygen ions into the silicon substrate 201 and then annealing the implanted substrate, so as to isolate the silicon film (SOI film) 203 and the silicon substrate 201. Then, the field oxide film region serving as the device isolation region (not shown) for electrically isolating adjacent devices is formed by LOCOS (Local Oxidation of Silicon) etc. Subsequently, a surface of the SOI film 203 in the device forming region (active region) surrounded by the field oxide film region is exposed, and then the gate oxide film 204 is formed by thermal oxidization or the like on a surface of the SOI film 203. After this, the polysilicon layer 205 is formed thereon by LPCVD (Low Pressure Chemical Vapor Deposition) or the like. A resist pattern (not shown) is formed on the part of polysilicon layer, which will become a gate electrode afterward, by lithography process. Using this resist pattern as a mask, the polysilicon gate electrode 205 and the gate oxide film 204 are formed by RIE (Reactive Ion Etching) or the like. In order to form the $n^+$ source region 206 and the $n^+$ drain region 206, n type impurity such as As or P etc. are implanted in a self-alignment manner using the polysilicon gate electrode 205 as a mask, and then a resultant structure is annealed. Subsequently, Ge is ion-implanted into the source and drain regions 206 and then annealed, so that the SiGe layer 207 is formed in an interior of the source and drain regions 206. As a result, as shown in FIG. 4A, the SOLMOSFET is completed. Actually, after this, all being not shown, an interlayer insulating film such as the oxide film etc. is deposited, and openings for contacts are formed in the interlayer insulating film, and then metallization of the source and drain metal electrodes are executed.

However, as a first drawback, from results that the MOSFET have been examined by the inventors of the present invention under various conditions, it has been found that leakage current is generated as shown by the solid line in FIG. 5B. In case the MOSFETs are used as select transistors in memory cell regions of the DRAM, this leakage current brings about fatal and poor electrical characteristics as well as the low manufacturing yield.

In addition, as a second drawback, there has been caused a degradation in reliability of the gate oxide film 204 in memory devices etc. accompanying to ion implantation of Ge. As shown in FIG. 6, drain breakdown voltage of the SOLMOSFET with the SiGe layer can be improved more and more if the dose Φ is increased at the time when Ge ions are implanted. On the contrary, the degradation in reliability of the gate oxide film 204 is caused remarkably if the dose Φ of Ge is high. This degradation in reliability of the gate oxide film 204 becomes serious particularly in the memory cell in which high voltage is applied to the gate. Consequently, a rate of inferior products is significantly increased.

Furthermore, the prior art heterojunction MOSFET having the $Si_xGe_{1-x}$ region has a third drawback described hereinbelow. That is, as shown in FIG. 5A, the drain breakdown voltage of the prior art heterojunction MOSFET, which has a typical channel length of 0.5 μm and has $Si_xGe_{1-x}$ (x=0.2) in a $n^+$ source region, becomes 4 V. This voltage is improved by more than 1 V in comparison with the ordinary homojunction MOSFET into which Ge is not implanted. However, this prior art heterojunction MOSFET has been examined by inventors of the present invention under various conditions. Then, it has been found from the examination result that improvement of the drain breakdown voltage of this degree is not sufficient for some kinds of LSIs such as EEPROM, for example. In this case, as discussed above, increase of Ge mole fraction causes degradation of the gate oxide film etc., so that it is not practical and is less effective. Therefore, there still remains the third drawback that the drain breakdown voltage and the current driving capability of the prior art heterojunction MOSFET having the SiGe layer are not sufficient for some kinds of LSIs.

In the meanwhile, if composition (1–x) of Ge of the $Si_xGe_{1-x}$ mixed crystal is increased by higher implantation dose of Ge ions etc., misfit dislocations in Si crystal are generated due to the lattice mismatch, which means that the existence of Ge generates distortion in the Si crystal, since the lattice constant or the impurity atom radius of Ge is large by about 4% in comparison with that of Si. Because of this distortion, crystal defects are generated in the direction traversing the pn junction interface between the source and drain regions and the channel region in the course of annealing steps. And the secondary defects due to the ion implantation damage, which may be related to the above-mentioned third drawback, are also generated. In fact, the complex of the secondary defect and the misfit dislocation may be generated. FIG. 7 shows crystal defects of the prior art heterojunction MOSFET with the $Si_xGe_{1-x}$ region. The crystal defect region D was generated so as to traverse the pn junction interface 215 over the drain region 206 and the channel region 203. If a (100) plane oriented substrate is used, as shown in FIG. 7, the crystal defects tend to be generated mainly along the {111} planes. In addition, it is hard to control the position and the direction of crystal defects since they are spread over a wide range. In this case, junction leakage current is increased significantly, and thus the device utility is narrowed. As a result, increase of generation/recombination current, i.e., junction leakage current, with increase of the composition (1–x) of Ge causes a fourth drawback that, in memory device such as DRAM, degradation in data holding characteristic of the cell is caused or manufacturing yield is lowered seriously. It may be true that the defects of this fourth drawback can be overcome by placing the SiGe layer in the source region completely. However, in order to suppress effectively the floating body effect in the SOLMOSFET, the SiGe layer must be formed sufficiently close to the pn junction interface formed between the source region and the channel region as understood from the potential profile (band diagram) in FIG. 4B. And if we employ the configuration that the SiGe layer is close to the pn junction interface, in some cases, the crystal defects enter into the channel region to generate the high leakage current. It has been experimentally found by inventors of the present invention that, especially under the condition that Ge mole fraction is higher than 20–30% or more, dislocations are brought about in the SOI film owing to film distortion, thus preventing attainment of narrow bandgap semiconductor region, which prevents the elimination of the following body effect.

SUMMARY OF THE INVENTION

In view of the above drawbacks, a first object of the present invention is to suppress the floating body effect, i.e., the body, or a channel region of the insulated-gate (IG) device such as a SOLMOSFET, a SGT (Surrounding Gate Transistor), and a SOI.MOS.DRAM becomes a floating state. More particularly, a structure of a MOSFET, a SGT or a MOS.DRAM and a method of manufacturing the same are provided wherein a narrow bandgap semiconductor region is provided in an inside of a main electrode region or near the main electrode region, thus achieving an improvement of drain breakdown voltage and a reduction of leakage current simultaneously.

A second object of the present invention is to provide a structure of IG device and a method of manufacturing the same which can effectively overcome a trade-off relation, i.e., if an ion-implantation dose of Ge is increased, drain breakdown voltage of the IG device can be improved, but leakage current is generated and breakdown voltage of a gate oxide film is decreased.

A third object of the present invention is to provide a IG device having high transconductance $g_m$ and high current driving capability, and a structure of an integrated circuit employing the MOSFET, MISFET, or MOSSIT (MOS Static Induction Transistor) etc., and a method of manufacturing the same.

A fourth object of the present invention is to provide a structure of an IG device capable of preventing crystal defect generations due to lattice mismatching between the narrow bandgap semiconductor and body, such as between SiGe and Si or between SiSn and Si, or to provide a new structure of an IG device and a manufacturing method thereof capable of controlling locations and direction of crystal defects.

A fifth object of the present invention is to provide a manufacturing method capable of shortening a manufacturing time, i.e., improving a wafer throughput and thus improving productivity, with achieving the above objects simultaneously.

In order to achieve the above objects, the present invention provides a structure and manufacturing method of an IG device, wherein a narrow bandgap semiconductor region having one of structures described hereinbelow is formed in at least one of first and second main electrode regions (referred to as "main electrode region" hereinafter of the IG device. It is of course that the main electrode region also denotes one of source and drain regions of the IG device. The IG device includes the integrated circuit employing the MOSFET, MISFET or MOSSIT, etc.

(1) A first means for achieving the above objects is, as shown in FIGS. 8 and 10, to select and design the doping conditions for compensating the lattice mismatching, or the lattice distortion, while taking some respects such as a covalent radius of an impurity atom which is doped into a main electrode region of an IG device, a lattice site into which impurities in the body semiconductor, such as Si are introduced, i.e., interstitial sites or vacancy trapping sites, into consideration. In other words, kind of impurity element, depth of impurity element (or diffusion depth) in the main electrode region are designed after the covalent radius of the impurity element and lattice constant of the body semiconductor etc. are considered.

(2) A second means is, as shown in FIGS. 12A to 15D, 17A to 17C, and 24A, to form a narrow bandgap semiconductor region 47 more deeply than the bottom of a depletion layer 214 formed in a principle operation state of the SOI-IG device. Here, in the SOI.MOSFET or the SOI.MOS.LSI having a gate driven by voltage of 3V, the bottom of the depletion layer in the principle operation state denotes the location of a depletion layer generated when 3V is applied to the gate. By forming the narrow bandgap semiconductor region 47 on a lower location than that of the bottom of the depletion layer 214, leakage current is never caused by crystal defects in the SOI-IG device, even if crystal defects are generated in the deep region of SOI film 203. The structure of this second means also increases the efficiency of hole extraction from the SOI body.

(3) As shown in FIGS. 18A and 18B, 19, 21A and 21B, 22, 24A and 24B, a third means is to form either a heterojunction interface 225 between the narrow bandgap semiconductor region 237 formed of SiGe region etc. and a semiconductor forming a channel region formed of Si, or the narrow bandgap semiconductor region 237 per se beyond pn junction interface 215 between a channel region and a main electrode region 216 on the MOSFET.

As described above, in the typical prior art, a heterojunction to be formed between an SiGe layer and an Si layer is formed in an inside of pn junction interface 215 between source and channel regions (source region side). Although, in this prior art structure, holes are absorbed certainly, an energy barrier of pn junction still remains against holes in the channel region, so that holes not extracted by the SiGe layer will accumulate in the channel region. It is well known that a drain breakdown phenomenon is caused by holes accumulating in the channel region, or the SOI body. Consequently, in order to satisfy the object for increasing drain breakdown voltage, it is not always the best way to place the heterojunction in an inside of pn junction, like the prior art structure. In FIG. 20, a comparison of the energy barrier between the conventional homojunction structure and the heterojunction structure of the present invention is shown. It is apparent that, in a case shown by a thick solid line in FIG. 20, the energy barrier against holes can be significantly lowered. In other words, inventors of the present invention could find the fact that drain breakdown voltage can be increased greatly if energy band is so formed in the boundary region between source and channel regions that a location having lowest potential against holes is connected linearly to a valence band edge $E_v$ (SiGe) of the narrow bandgap semiconductor region so as not to generate a high barrier against holes. For this reason, as shown in FIGS. 18A and 18B, 19, 21A and 21B, 22, 24A and 24B, etc., it is desired that the narrow bandgap semiconductor region 237 is extended to the channel side, i.e., to the location having a minimum potential value (extreme value) of holes beyond pn junction interface 215.

(4) A fourth means is, as shown in FIG. 25A, to form the narrow bandgap semiconductor region 212 so as to extend to the channel region beneath a gate oxide film 204. Since a SiGe region as a typical narrow bandgap semiconductor region has larger electron mobility that of Si region, it can have high transconductance $g_m$ so that it can obtain higher current driving capability. A structure shown in FIG. 25B may be formed such that ions can be implanted through the gate electrode 205 by increasing accelerating voltage used for ion-implantation of Ge or Sn.

(5) A fifth means is to control locations and directions of the crystal defects caused by the lattice mismatching in the heterojunction structure and the secondary effects caused by the ion implantation damage. As shown in FIG. 26D, if crystal defects D is generated in an inside of the main electrode regions 216, 226, leakage current in the MOSFET etc. will not increase at all even though the defects are generated.

(6) A sixth means is to compensate lattice mismatching between the narrow bandgap semiconductor region and a mother semiconductor. More particularly, in the case of SiGe/Si as an example, the number of crystal defects shown in FIG. 29B is increased if the mole fraction of Ge is 30% or more, in the case that Ge is implanted at 25 kV. On the contrary, the drain breakdown voltage is improved gradually if the Ge mole fraction exceeds 1% and improved abruptly if Ge mole fraction is within a range of 5 to 15%, but it can be gently improved to be saturated if Ge mole fraction is 20~30% or more as shown in FIG. 29A. Therefore, if composition of SI of $Si_xGe_{1-x}$ is selected within a range of 99 to 70%, the crystal defect generations can be prevented as well as the drain breakdown voltage can be improved, simultaneously.

The structures of IG devices described above are not limited to a discrete device. They can also be applied effectively to integrated circuits of DRAM, SRAM, EEPROM and the like. This is because that such advantages become further dominant that a retention time of the stored charge in DRAM can be improved and the like if the MOSFET with small leakage current is utilized. More particularly, the structures of MOSFETs can be applied to trench type DRAMs shown in FIGS. 37A, 37B, 38, 39A, 39B and 40, and also to stack type DRAMs shown in FIGS. 41A, 41B, 42A, 42B, 43A and 43B.

Although the SOI.MOSFETs have been described mainly in the above descriptions, technical concepts of the present invention may be applied to FETs and SITs (Static Induction Transistors) in which a channel region is brought about a floating state with respect to other regions. For instance, they may be applied to a SGT (Surrounding Gate Transistor) shown in FIG. 44B or a vertical thin film transistor shown in FIG. 49B.

The narrow bandgap semiconductor region of the present invention can be formed by ion-implantation, MBE, CVD, or the like. In addition to SiGe and SiSn, narrow bandgap semiconductors such as PbS, PbSe, PbTe, SnTe, ZnSb, InSb, or InAs, and mixed crystals of Si and these semiconductors can be used. It is preferable that PbS, PbSe, etc. are formed by MBE or CVD. Further, it is available that, as shown in FIGS. 11A and 11B, different projection ranges may be employed to implant ions into different locations by changing accelerating voltage in accordance with kinds of ions. It is also available that, as shown in FIG. 11B, etc., sidewall insulating films formed on both sides of the gate electrode may be employed to implant ions into different locations on a plane pattern. As shown in FIG. 26B, oblique ion implantation may be employed to implant As, etc. to include the SiGe region. It is preferable that, in order to control the locations of the crystal defects after ion implantation, annealing may be executed at a temperature of 700° C. or more, especially within a range of 700° C. to 1000° C. In case an annealing temperature is selected at 700° C. or more and the crystal defects is included within the main electrode regions 216, 226 as shown in FIG. 27, leakage current is not increased in the MOSFET even when Ge or Sn is implanted to have the mole fraction more than 15~30%.

SiGe, SiSn, PbS, etc. may be grown by MBE, CVD, UHV-CVD, or MLE (Molecular layer Epitaxy) other than ion implantation. For instance, SiGe may be grown by CVD if $SiH_4$ (or $Si_2H_6$) and $GeH_4$ are used. At this time, $n^+$ type SiGe may be grown by doping with n-type dopant such as $AsH_3$ or $PH_3$ into SiGe. PbS may be obtained by CVD using $H_2S$ and lead halogenides, lead cheltates, lead tert-butoxide complexes such as $[Pb(OBu^t)_2]_2$ or $Pb_4O(OBu^t)_6$, for example.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

BRIEF DESCRIPTION OF THE DRAWINGS

FIGS. 45A to 45E are sectional views each showing manufacturing steps of the MOS.DRAM, wherein the surrounding gate transistor (SGT) is used as the selection transistor, according to the eighteenth embodiment of the present invention;

DESCRIPTION OF THE PREFERRED EMBODIMENTS

Figure 1:
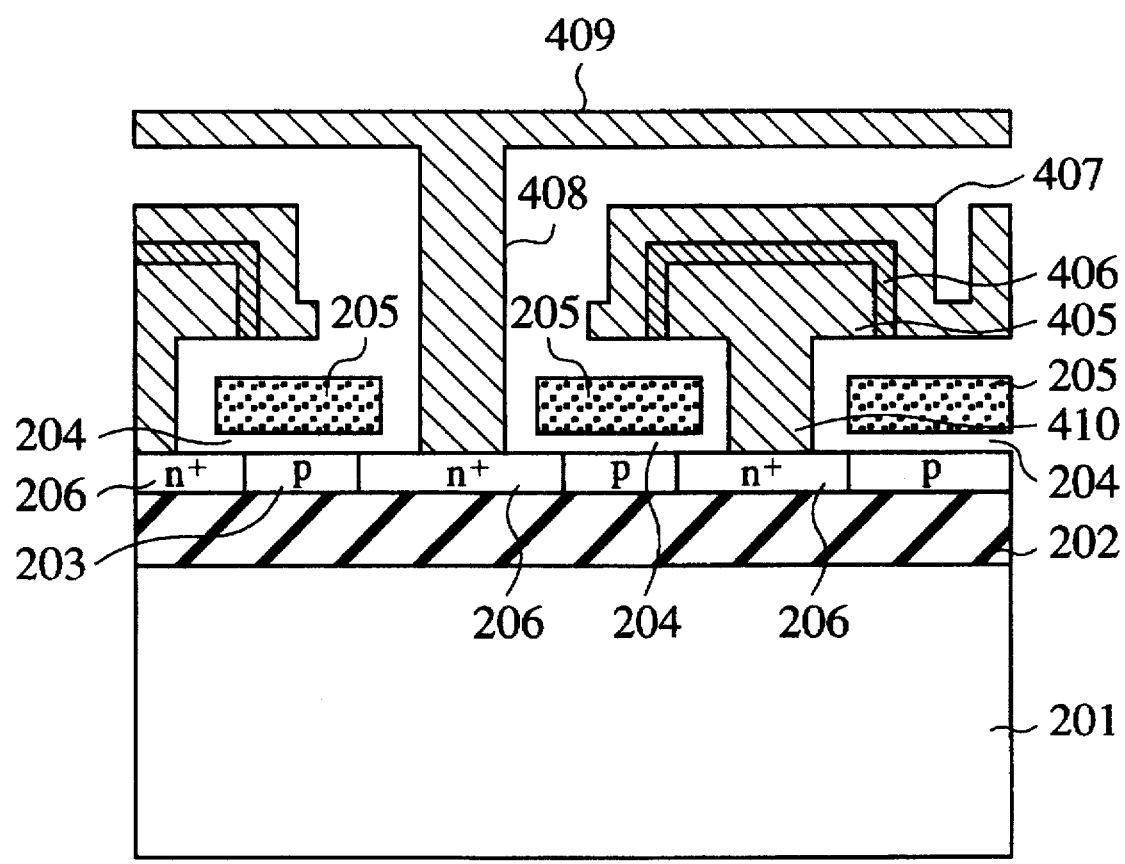
FIG. 1 is a sectional view showing a structure of a conventional SOI.MOS.DRAM.
Figure 2:
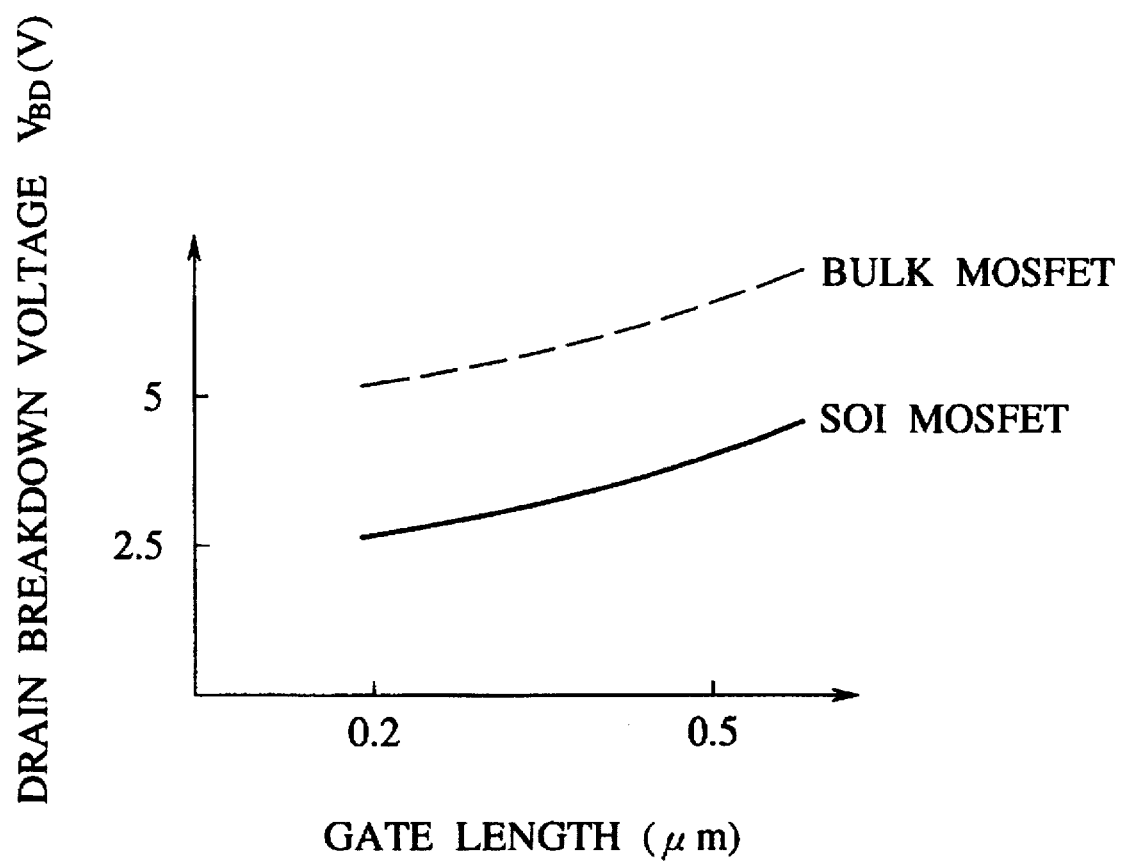
FIG. 2 is a view illustrating a comparison of drain breakdown voltage between a conventional SOI.MOSFET and a bulk MOSFET.
Figure 3A:
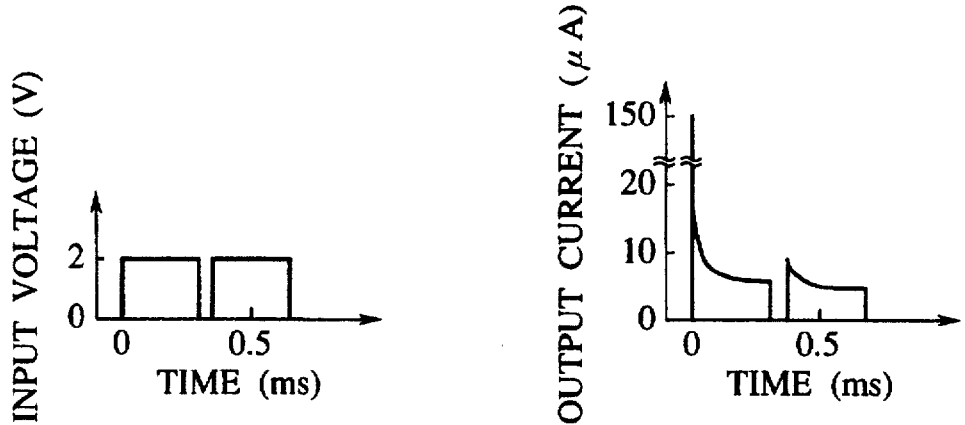
FIGS. 3A–3C are views illustrating an overshoot of output current when the SOI.MOSFET is switched.
Figure 3B:
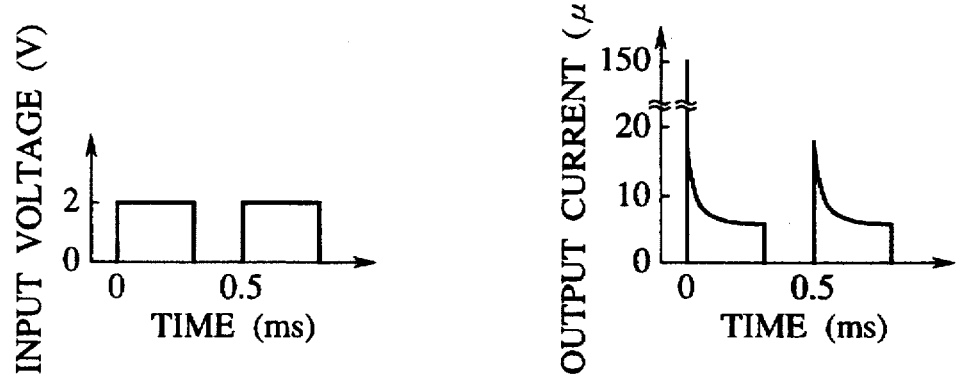
Figure 3C:
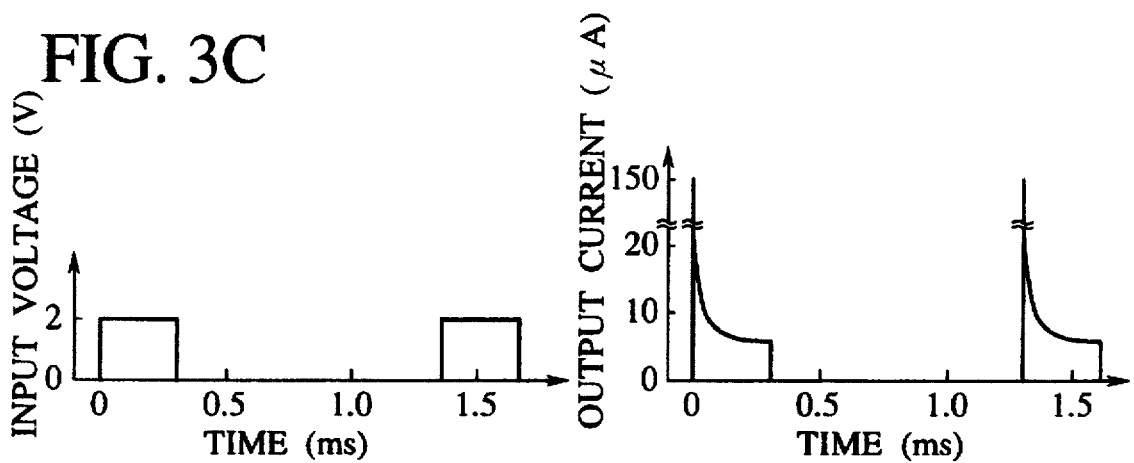

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

(FIRST EMBODIMENT)

Figure 8:
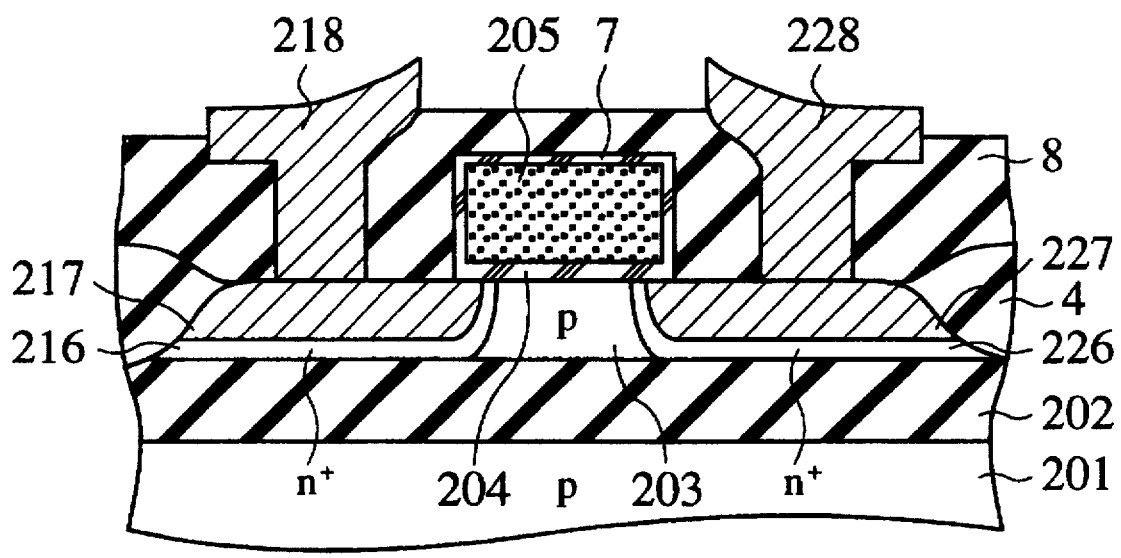
FIG. 8 is a sectional view showing a structure of a SOI.MOSFET according to a first embodiment of the present invention.

FIG. 8 shows a sectional structure of a SOLMOSFET according to a first embodiment of the present invention. In FIG. 8, a p-type SOI film 203 is formed on a p-type (100) silicon substrate 201 via a buried oxide film 202. The SOI film 203 is laterally device-isolated by a thick thermal oxide film 4 which is formed to reach the buried oxide film 202 from the surface of the SOI film 203. A dielectrically isolated area of the SOI film 203 is used as an active region. An $n^+$ source region 216 and an $n^+$ drain region 226 is formed in an inside of the active region so as to connect its bottom portion to a buried oxide film 202. SiGe regions 217, 227 including Phosphorus (P) are formed in the $n^+$ source region 216 and the $n^+$ drain region 226. A source metal electrode 218 and a drain metal electrode 228 are formed respectively on the $n^+$ source region 216 and the $n^+$ drain region 226 through contact holes formed in an inter-layer insulating film 8. A gate electrode 205 formed of polysilicon etc. is formed on a channel region 203 between the $n^+$ source region 216 and the $n^+$ drain region 226 via the gate oxide film 204. A thin oxide film 7 called as a post oxide film is formed on a surface of the polysilicon gate electrode 205. The $n^+$ source region 216 and the $n^+$ drain region 226 are formed by doping n type impurity of As, for example, at high impurity density of about $6\times10^{18}$ to $1\times10^{21}$ cm$^{-1}$.

Figure 4A:
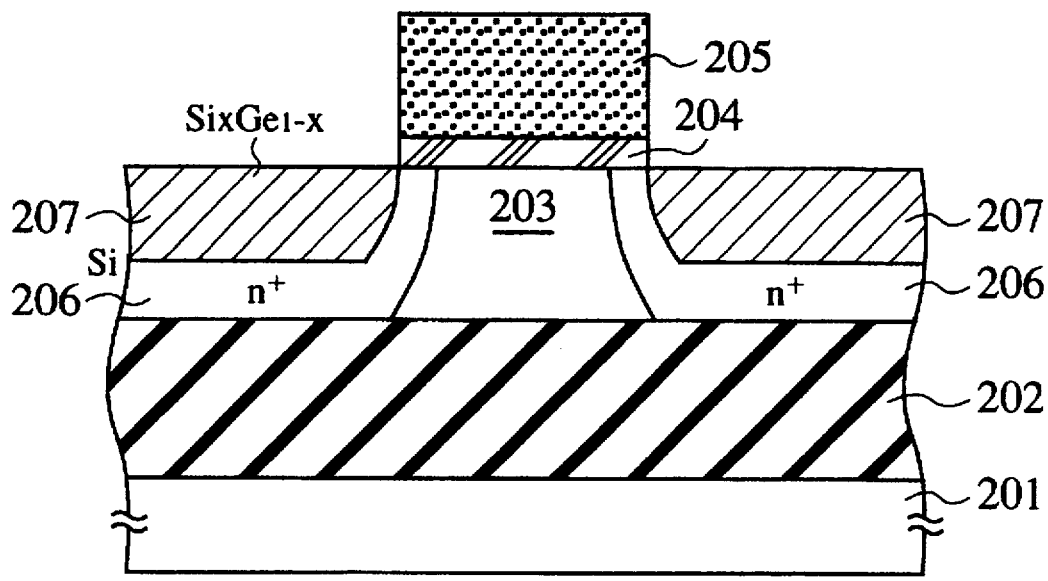
FIG. 4A is a sectional view showing the SOI.MOSEFT having an $Si_xGe_{1-x}$ region in $n^+$ source and drain regions.
Figure 5A:
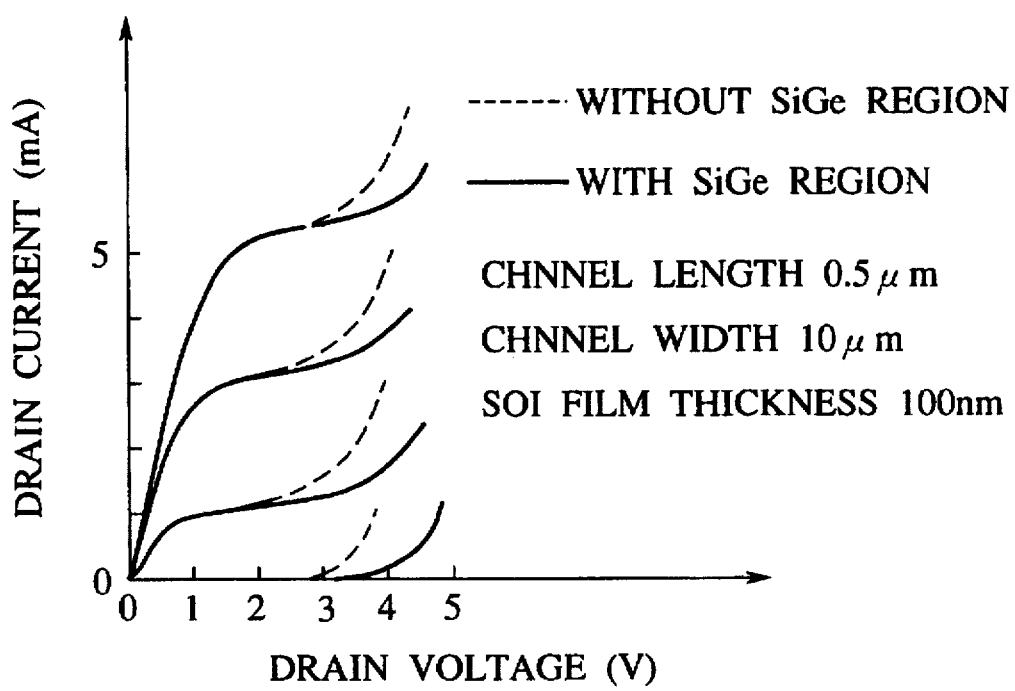
FIG. 5A is a view illustrating a comparison of a characteristic between a heterojunction-FET with the $Si_xGe_{1-x}$ region and a homojunction-FET without the $Si_xGe_{1-x}$ region.
Figure 5B:
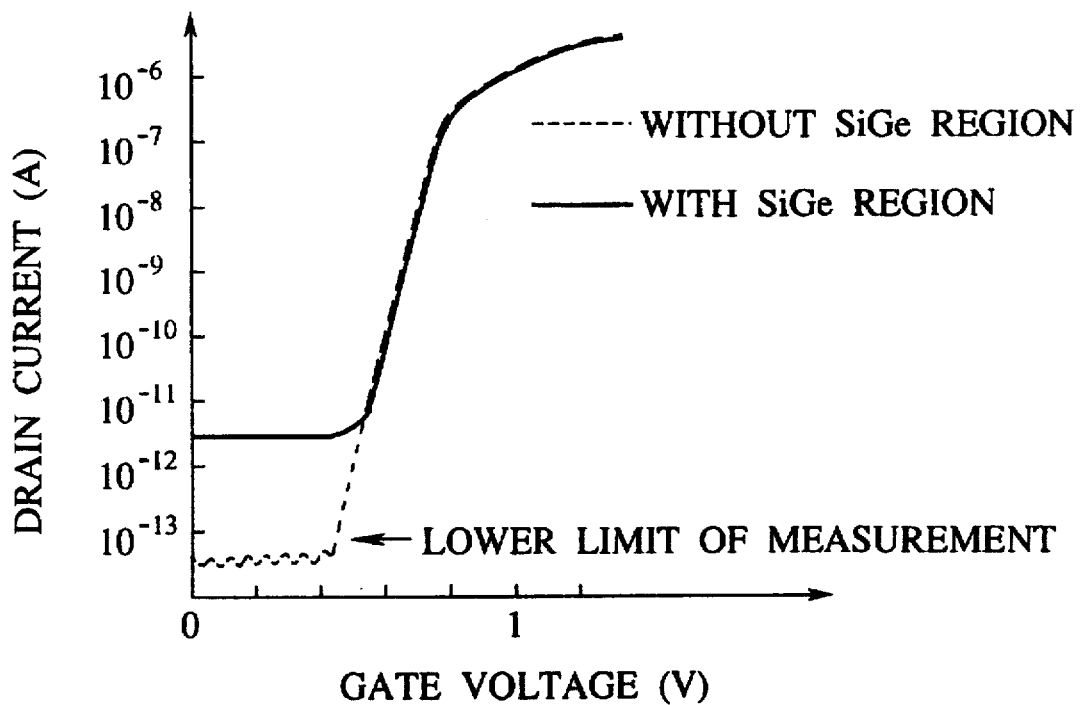
FIG. 5B is a view illustrating a comparison of leakage current of the FETs in FIG. 5A.
Figure 6:
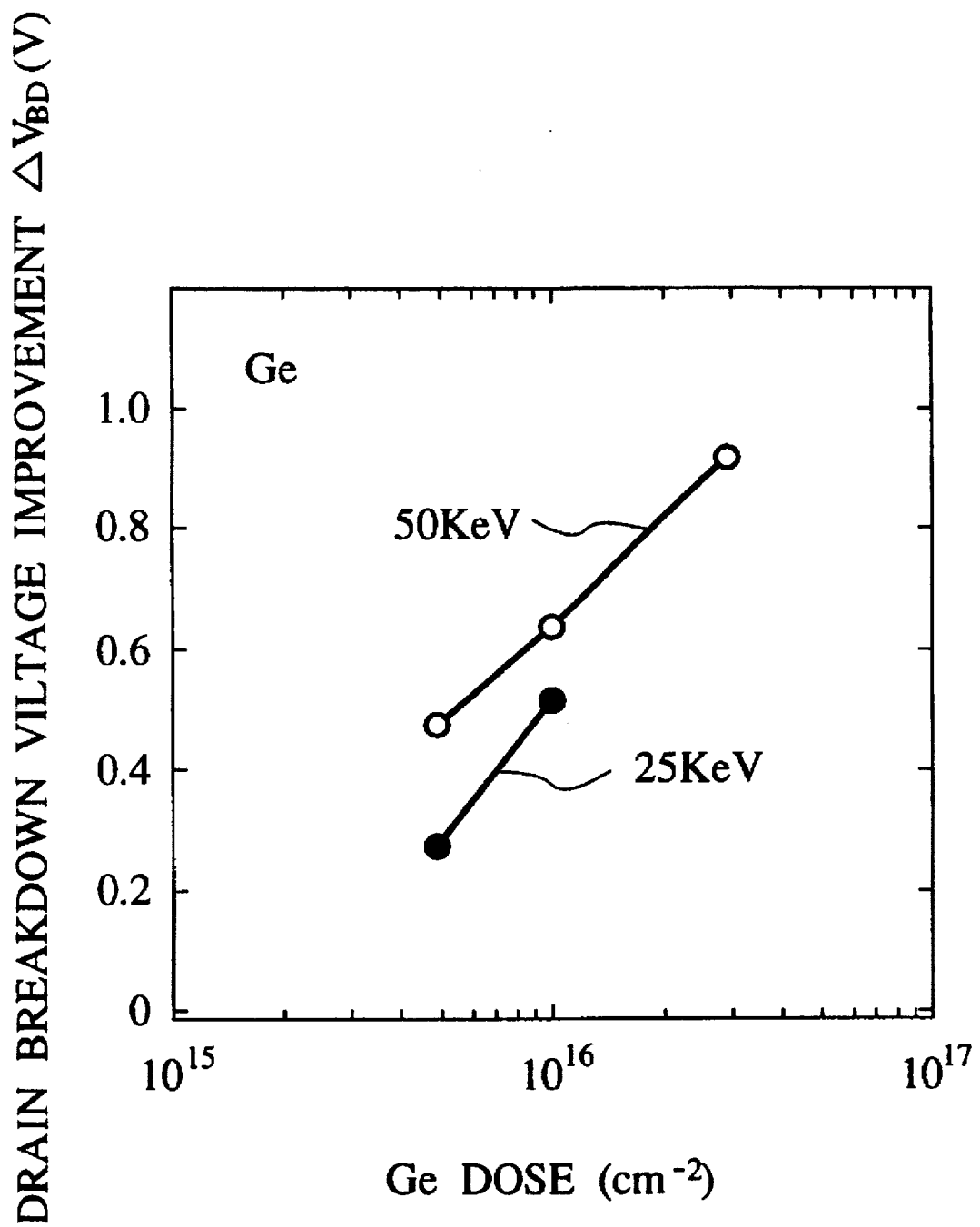
FIG. 6 is a view illustrating a relationship between an ion implantation dose and improvement of drain breakdown voltage.

In the first embodiment of the present invention, SiGe regions 217 and 227 including P which has a smaller covalent radius (=0.11 nm) than that of Si (=0.117 nm), i.e., regions 217 and 227 including Ge and P, are formed respectively on surface sides of the $n^+$ source region 216 and the $n^+$ drain region 226. According to this structure of the first embodiment, the probable (or statistical) generation of the leakage current in the prior art heterojunction SOLMOSFET as shown in FIG. 5B has not found. On the other hand, the large leakage current has been apparently found in the prior art heterojunction SOLMOSFET, as shown in FIG. 5B, wherein the SiGe region 207 is formed in the $n^+$ source and drain regions 206 including Arsenic (As) which has a larger covalent radius (=0.118 nm) than that of Si as shown in FIG. 4A.

Figure 7:
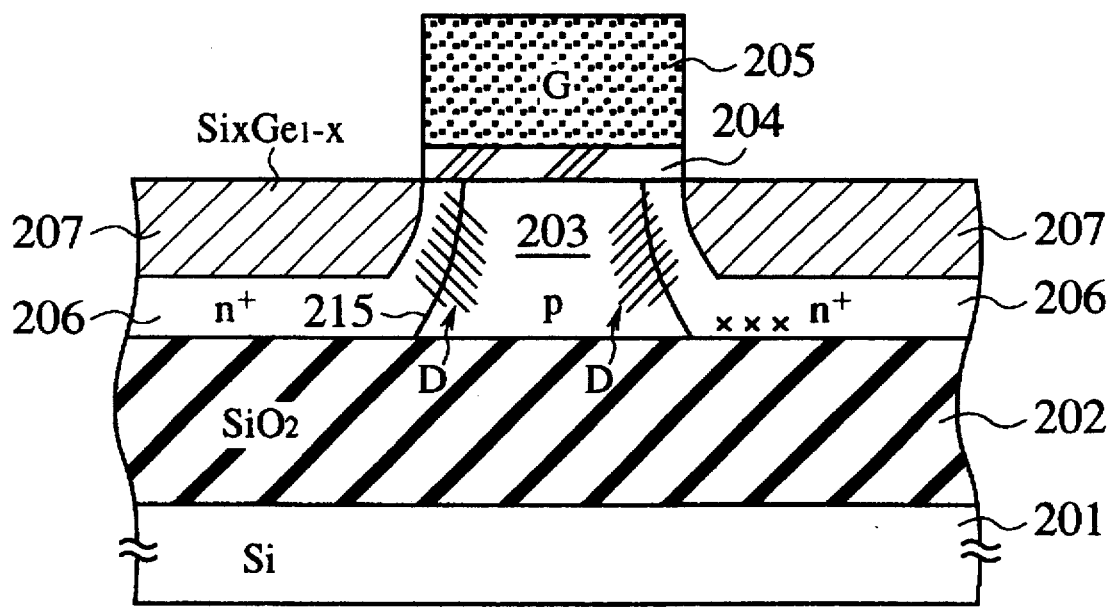
FIG. 7 is a sectional view showing crystal defects of a prior art heterojunction MOSFET with the $Si_xGe_{1-x}$ region.

In addition, the crystal defect D generated in the prior art heterojuction SOLMOSFET shown in FIG. 7 are not generated at all in the first embodiment of the present invention. Further, the drain breakdown voltage of the SOLMOSFET is not especially inferior to that of the prior art heterojunction SOLMOSFET wherein only Ge is implanted into an impurity diffused layer including As as $n^+$ impurity. In other words, in contrast to the prior art heterojunction SOLMOSFET which includes only one kind of n-type impurity for the source diffusion layer, the drain breakdown voltage of the MOSFET according to the first embodiment of the present invention is improved by 1 V in the non-conductive (OFF) state.

The reason why such effect may be attained can be considered as follows. That is, the crystal defects on (100) plane tend to be generated typically along the {111} planes, as shown in FIG. 7. Further, in a prior art SOI structure, after implantation of Ge ions having a larger covalent radius than that of Si, crystal distortions are generated because of stress caused by the SiGe/Si heterojunction, and they are concentrated upon gate electrode edges. But, according to the structure of the first embodiment of the present invention, such conventional phenomenon unique to the heterojunction SOI structure can be improved and the crystal distortion can be effectively relaxed.

In the meanwhile, since an effective channel length $L_{eff}$ of the device which is formed to have a polysilicon gate electrode length of 0.5 µm was 0.30 µm in the first embodiment, reduction of a threshold value based on a short channel effect could be found. This is because P can diffuse in the lateral direction by annealing after ion implantation of Ge and P.

The SOLMOSEFT according to the first embodiment of the present invention may be manufactured as described herein-below. FIGS. 9A to 9D are sectional views each showing manufacturing (or fabrication) steps of the SOI-.MOSEFT according to the first embodiment of the present invention.

Figure 9A:
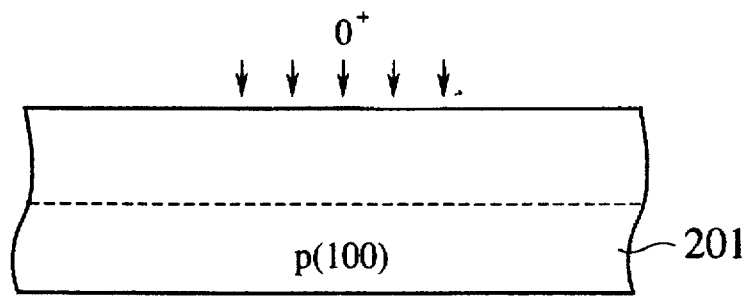
FIGS. 9A to 9D are sectional views each showing manufacturing (fabrication) steps of the SOI.MOSEFT according to the first embodiment of the present invention.

(a) First, as shown in FIG. 9A, oxygen ions are implanted into a p type (100) silicon substrate 201 at accelerating voltage Vac=180 kV, with a dose $\Phi=2\times10^{18}$ cm$^{-2}$.

Figure 9B:
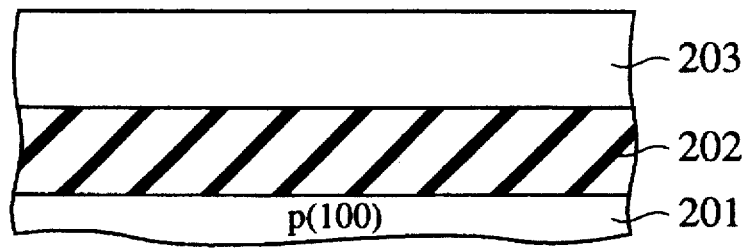

(b) Thereafter, as shown in FIG. 9B, the buried oxide film 202 with a thickness of 400 nm is formed at a depth of 200 nm from a silicon top surface by annealing at 1300° C. for five hours. At this time, the single crystal silicon film (SOI film) 203 is formed on the surface. That is, the SOI structure is formed by so-called SIMOX technique. Then, the surface of the SOI film 203 is oxidized thermally. The SOI film 203 is thinned to a predetermined thickness, for example, 100 nm by wet-etching this thermal oxide film using $NH_4F$ solution etc.

Figure 9C:
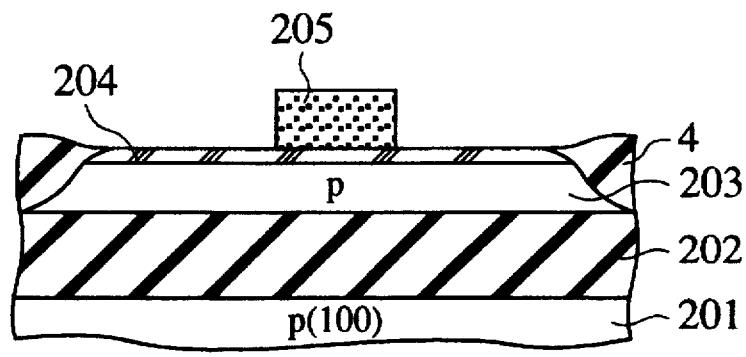

(c) Then, as shown in FIG. 9C, the isolation oxide film 4 is formed to reach the buried oxide film 202 by selective oxidization technology such as LOCOS technique or the like. Thus, adjacent devices are dielectrically isolated. If high integration density is utilized, BOX (Buried OXide) method or other device isolation technology may be used. After this, the gate oxide film 204 is formed to have a thickness of 10 nm, and then P-doped polysilicon film 205 with a thickness of 300 nm is deposited thereon by CVD. Then, as shown in FIG. 9C, the gate electrode 205 having a gate length of 0.5 µm is formed by photolithography step and RIE step.

Figure 9D:
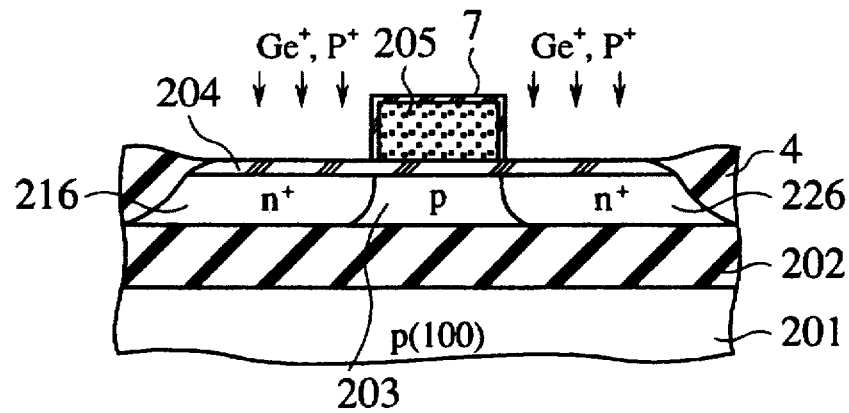

(d) Then, after the post oxide film 7 is formed to have a thickness of 10 nm, the $n^+$ source region 216 and the $n^+$ drain region 226 are formed by implanting As ions at accelerating voltage Vac=150 kV and a dose $\Phi=3\times10^{15}$ cm$^{-2}$ and annealing a resultant structure at 900° C. for one hour. Next, as shown in FIG. 9D, Ge ions are implanted at accelerating voltage Vac=50 kV and a dose amount $\Phi=1\times10^{16}$ cm$^{-2}$, and P ions are implanted at accelerating voltage Vac=15 kV and a dose $\Phi=3\times10^{15}$ cm$^{-2}$. Then, annealing is made at 850° C. for thirty minutes. Though not shown, the interlayer insulating layer 8 formed of $SiO_2$ film, $Si_3N_4$ film, or composite film made of $SiO_2$ film and PSG film, each having a thickness of 300 to 500 nm, is stacked by CVD. Contact holes for the source and drain metal electrodes 218, 228 are opened in the interlayer insulating layer 8. Then, the source metal electrode 218 and the drain metal electrode 228 are formed by metallization step using a metal such as Al—Si, Al—Si—Cu, or the like. As a result, the SOLMOSFET of the first embodiment of the present invention can be completed.

Now, in the first embodiment of the present invention, Tin (Sn) may be ion-implanted instead of Ge, and Ge and Sn may be ion-implanted simultaneously. In the case of ion-implanting Sn as an n type impurity, lattice distortion can be compensated by implanting P and Sn at a rate of about P:Sn=8:3. Ge and Sn may be included in Si at an impurity concentration of $1 \times 10^{19}$ cm$^{-3}$~$1 \times 10^{20}$ cm$^{-1}$ or more, preferably at an impurity concentration of $5 \times 10^{20}$ cm$^{-3}$. When Ge is included in Si at a mole fraction of 1 to 30%, the advantage of this embodiment can be attained mostly. The more preferable Ge mole fraction is 5~15%. In addition, although explained in the MOSFET, it is of course that these are the same as in the MIS.FET employing nitride film (Si$_3$N$_4$) etc. as the gate insulating film.

And these technical features and advantages are also applied to a SOLMOS SIT (Static Induction Transistor) having a narrow-bandgap-source region. If we want to obtain the SOLMOSSIT, the channel length, or the gate length should be shortened to such as 0.15~0.2 µm, keeping the other structural dimensions same as shown in FIG. 8, so as to become near punch-through condition. With these shortened channel length, the vaccum triode like non-saturated drain current ($I_d$)—drain voltage ($V_d$) characteristics is obtained. In this sense, the MOSSIT may be considered as a kind of short-channel MOSFET. Otherwise, if we keep the gate length as 0.5 µm, the same value as the structure shown in FIG. 8 by the first embodiment, the reduction of the carrier concentration in the SOI body 203, or channel, can make the SIT characteristics. In the SIT, the potential barrier, which is formed in front of the source region and is a mathematical saddle point determined by the gate potential and the drain potential, is controlled by the drain voltage applied to the drain metal electrode 228. Hence the drain current increases with the drain voltage according to the exponential law. And by forming the narrow-bandgap source region 217, the floating body effect in the SOLMOS-SIT is similarly eliminated, and the high breakdown voltage improvement $\Delta V_{BD}$ can be easily obtained.

Now, in the first embodiment of the present invention, two kinds of impurities of As and P are introduced into the n$^+$ drain region 226 and the n$^+$ source region 216. However, one kind of n type impurity of P may be used instead of As, and Antimony (Sb) may also be used in place of As. In addition, Boron (B) or Carbon (C) each having a smaller covalent radius than that of Si may be used in place of P. Moreover, a combination of these elements may be used.

(SECOND EMBODIMENT)

Figure 10A:
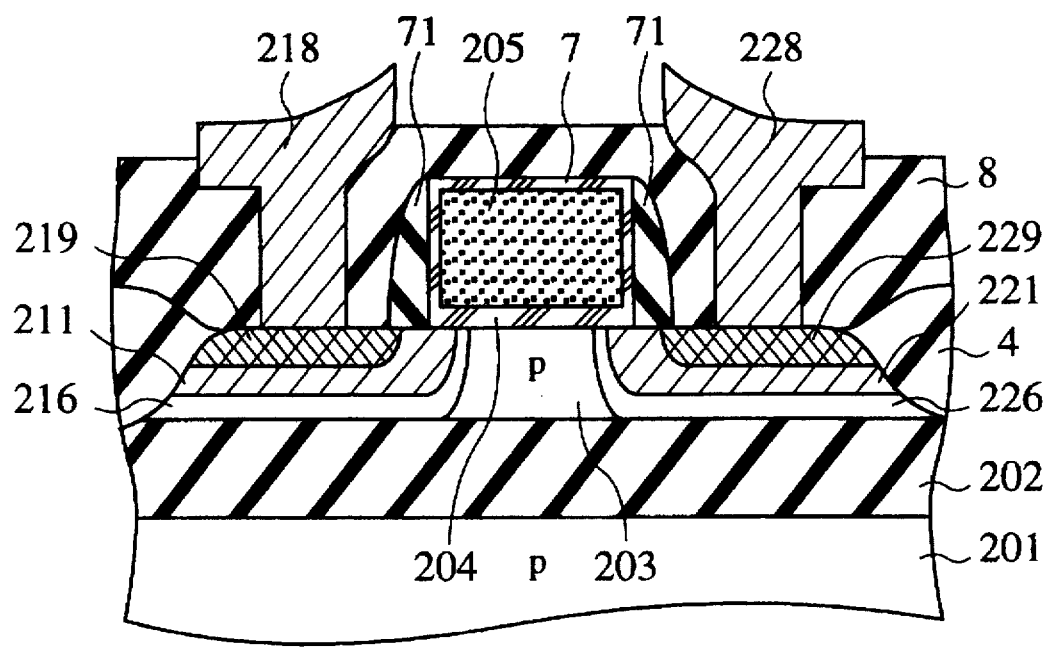
FIG. 10A is a sectional view showing a structure of a SOI.MOSFET according to a second embodiment of the present invention

FIG. 10A shows a sectional structure of a SOLMOSFET according to a second embodiment of the present invention. In FIG. 10A, a p-type SOI film 208 is formed on a p-type (100) silicon substrate 201 via a buried oxide film 202. The SOI film 203 is laterally isolated by a thermal oxide film 4 which is formed to reach the buried oxide film 207 from the surface of the SOI film 203. An isolated area of the SOI film 203 is used as an active region. An n$^+$ source region 216 and an n$^+$ drain region 226 are formed in an inside of the active region so as to contact their bottom portions with a buried oxide film 202. SiGe regions 211 and 221 are formed in an inside of the n$^+$ source region 216 and the n$^+$ drain region 226. Regions 219 and 229 having high impurity concentration of P are formed on surfaces of SiGe regions 211 and 221. A gate electrode 205 formed of polysilicon etc. is formed on a channel region 203 between the n$^+$ source region 216 and the n$^+$ drain region 226 via the gate oxide film 204. A thin oxide film 7 and 80 nm width sidewall oxide films 71 are formed around the gate polysilicon electrode 205. The high impurity concentration regions 219, 229 of P are formed spaced apart from the gate polysilicon 205 by a thickness of the sidewall oxide film 71. Similarly to the first embodiment of the present invention, the source metal electrode 218 and the drain metal electrode 228 are connected respectively to the n$^+$ source region 216 and the n$^+$ drain region 226 via contact holes formed in the interlayer insulating layer 8.

In the SOLMOSFET according to the second embodiment of the present invention, if it is compared with the prior art heterojunction SOLMOSFET shown in FIG. 4A wherein only the large covalent radius impurity ions of As, are implanted with Ge ions, which has a larger covalent radius than that of Si, into the n$^+$ source region and the n$^+$ drain region, it has been able to provides a remarkable improvement of the leakage current, as in the first embodiment of the present invention. And the improvement of the drain breakdown voltage of the second embodiment of the present invention is substantially identical to the prior art heterojunction SOLMOSFET. In addition, since an effective channel length of 0.38 µm can be attained with respect to the gate length of 0.5 µm, suppression effect of the short channel effect has been improved in contrast to the first embodiment of the present invention.

Figure 10B:
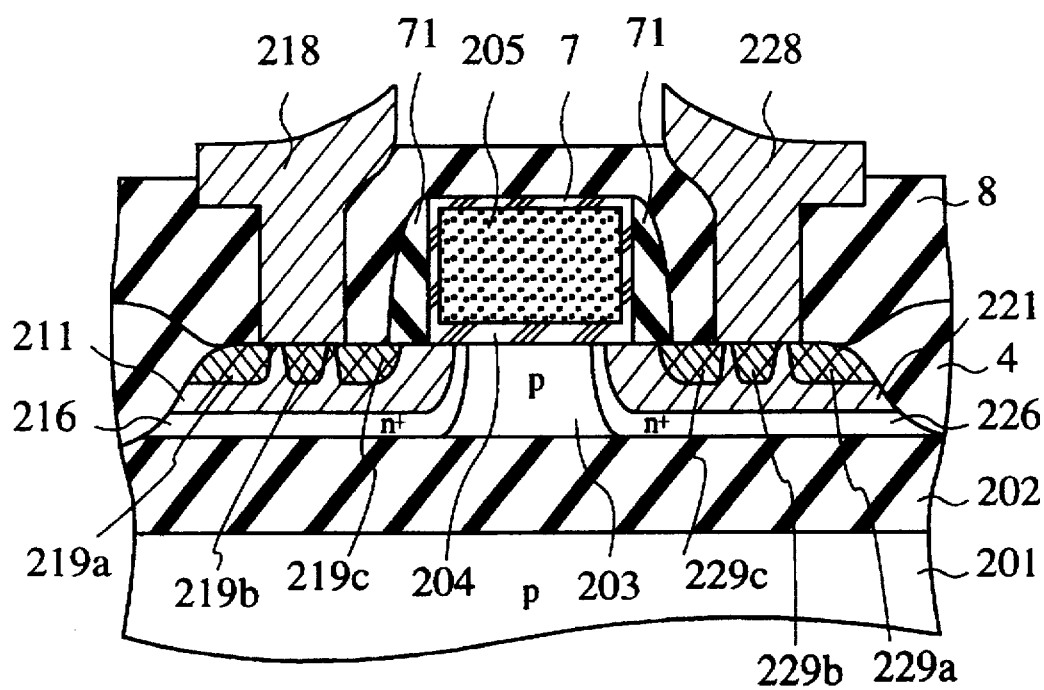
FIG. 10B is a sectional view showing a MOSFET according to a modification of the second embodiment.

In the second embodiment of the present invention, a case has been explained wherein high impurity concentration regions 219, 229 are enveloped in the SiGe regions 211, 221 by implanting P ions after a spacer 71 of a width 80 nm is formed. However, without changing other conditions such as ion implantation condition of As which is implanted into the n$^+$ source and drain regions 216 and 226, B ion having a smaller covalent radius (=0.088 nm) than that of P ion may be implanted instead of P ion at accelerating voltage Vac=20 kV and a dose $\Phi = 3 \times 10^{15}$ cm$^{-2}$ to form high impurity concentration region of B. At this time, As ions previously implanted in the n$^+$ source and drain regions 216 and 226 can be compensated partially with B ions, but substantial problems are not caused in the operation of the n type MOSFET. Moreover, since a covalent radius of B ion is smaller than that of P, lattice distortion can be compensated by a lower dose of B than that of P. Suppression of the leakage current can be attained by the high impurity concentration region of B similarly to the aforementioned second embodiment of the present invention. If the ohmic contact resistances between the source metal electrode 218, and n$^+$ source region 211, 216 are high, due to the existence of the interfacial Boron (B) doped layers 219, we should employ the modified structure of the second embodiment of the present invention, as shown in FIG. 10B. In FIG. 10B, the Boron doped interfacial layer in the n$^+$ narrow-bandgap-source region 211 is divided into plural (three, for example) regions 219a, 219b, 219c, and the source metal electrode 218 are contacted both on n$^+$ narrow-bandgap-source region 211 and Boron doped interfacial layer 219a, 219b, 219c, thereby short-circuiting the n$^+$ narrow-bandgap-source region 211 and Boron doped interfacial layer 219a, 219b, 219c. The same argument can be applied to the drain region side. Further, the technological features of the second embodiment of the present invention are similarly true in FETs other than above-mentioned MOSFET such as a MISFET using a nitride film ($Si_3N_4$ film), an alumina film ($Al_2O_3$) or the like as the gate oxide film.

Figure 11A:
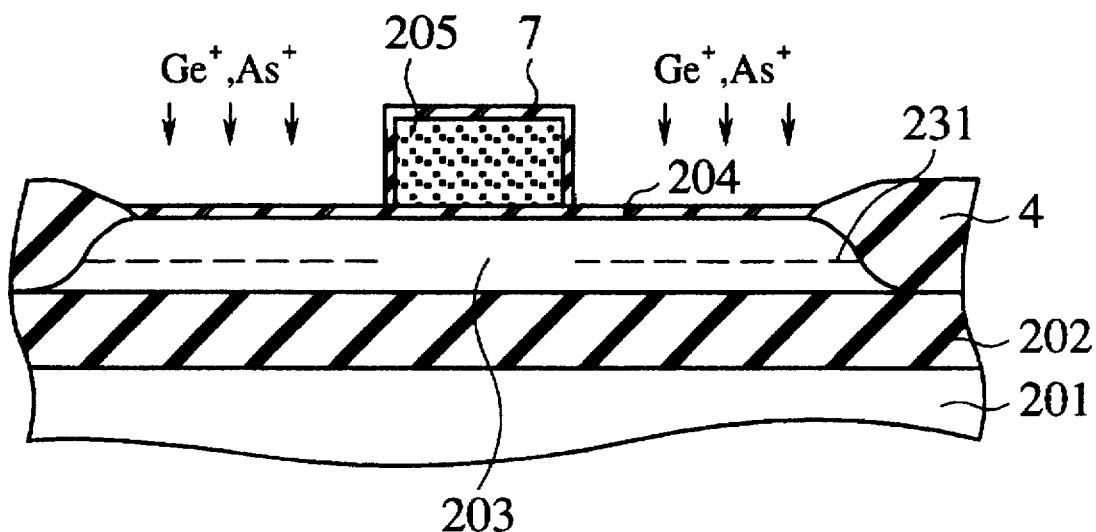
FIGS. 11A and 11B are sectional views each showing manufacturing steps of the SOI.MOSEFT according to the second embodiment of the present invention.
Figure 11B:
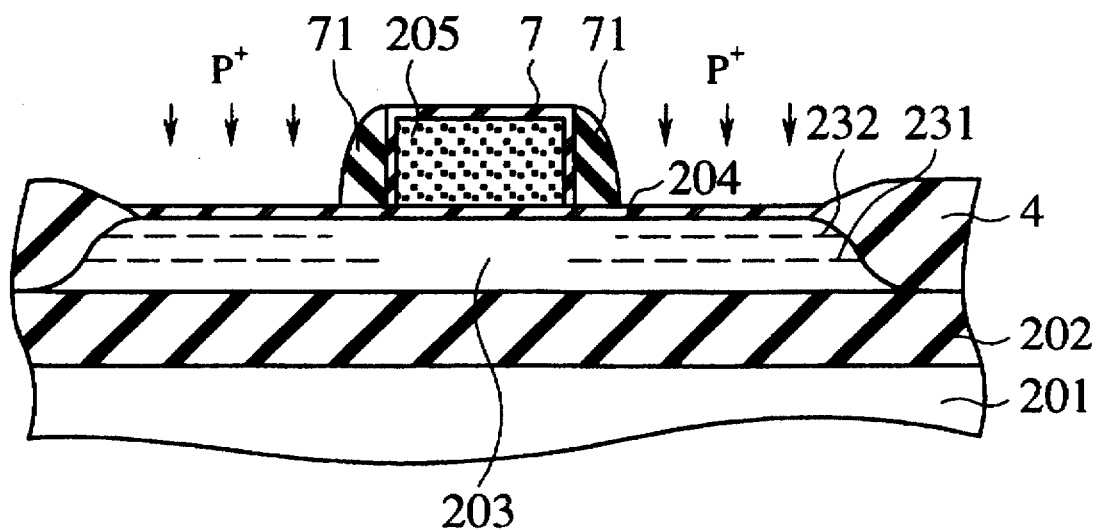

With reference to FIGS. 11A and 11B, a manufacturing method of the SOLMOSFET according to the second embodiment of the present invention will be explained.

(a) First, using SIMOX technique as in FIGS. 9A and 9B, a buried oxide film 202 and a SOI film 203 are formed on a p (100) silicon substrate 201. Like the first embodiment of the present invention, a thickness of the SOI film can be adjusted to a thickness of 100 nm, by thermally oxidizing the SOI film surface and then wet-etching the thermal oxide film.

(b) Thereafter, as shown in FIG. 11A, the isolation oxide film 4 is formed on a region except for the active region. The isolation oxide film 4 can be formed by LOCOS technique. Thereafter, the nitride film which is used as a mask for selective oxidation by LOCOS technique is removed. In addition, a gate oxide film of a thickness of 10 nm is formed and then a polysilicon film with a thickness of 300 nm is formed thereon by CVD. Then, the gate electrode pattern 205 having a gate length of 0.5 μm is formed by photolithography step with RIE step. As shown in FIG. 11A, a post oxide film 7 having a thickness of 10 nm is formed.

(c) Then, Ge ions are implanted at accelerating voltage Vac=50 kV and a dose $\Phi=1\times10^{16}$ $cm^{-2}$, and then As ions are implanted at accelerating voltage Vac=20 kV and a dose $\Phi=5\times10^{15}$ $cm^{-2}$, to have a peak concentration of As ions at a location 231 in the SOI film 203 as shown in FIG. 11A, the location 231 corresponding to a projected range $R_p$ of implanted As ions.

(d) Thereafter, an oxide film is deposited by CVD to have a thickness of 100 nm, and then oxide spacers 71 are formed by CVD and RIE or the like as sidewalls of the gate electrode 205 to have a width of 80 nm. As shown in FIG. 11B, using the oxide spacers 71 as a mask, P ions are implanted into the SOI film 231 at accelerating voltage Vac=15 kV and a dose $\Phi=3\times10^{15}$ $cm^{-2}$ so as to have a peak concentration of P ions at a depth 232 in the SOI film 231. Next, annealing is made at 850° C. for thirty minutes.

(e) After this, the interlayer insulating layer 8 is stacked on a surface of the substrate by CVD. Contact holes are opened in the interlayer insulating layer 8. Then, the source metal electrode 218 and the drain metal electrode 228 are formed. As a result, the SOLMOSFET of the second embodiment of the present invention can be completed.

Now, in the second embodiment of the present invention, the narrow bandgap semiconductor regions 211 and 221 etc. may be formed by ion-implanting Sn instead of Ge at accelerating voltage Vac=110 kV and a dose $\Phi=2\times10^{16}$ $cm^{-2}$ and then annealing a resultant structure at 850° C. for thirty minutes. In the case that the narrow bandgap semiconductor regions are formed by Sn in the $n^+$ source and drain regions, similar improvement of the drain breakdown voltage can clearly be attained. That is, in comparison with the prior art heterojunction SOLMOSFET shown in FIG. 4A wherein Ge and As, both having larger covalent radius than that of Si, are implanted into the $n^+$ source region 206 simultaneously and with approximately same projected range $R_p$, or depth, the drain breakdown voltage can be improved by 1.5 V with $As^+$, $Sn^+$, $P^+$ implantation. In addition, the statistical leakage current shown in FIG. 5B has not appeared at all. These facts that SiSn region can be employed instead of SiGe region can also be applied to the first embodiment of the present invention.

The reason why such advantages can be achieved can be considered as follows. That is, the narrow bandgap semiconductor regions are not formed near the surface of the source region but formed on a deeper location than that of the channel depletion layer, and P ions, as n type impurities, having a smaller covalent radius than that of Si are included, thereby compensating and relaxing the lattice mismatching. In addition, holes accumulating at the bottom of the channel region can be absorbed effectively by the narrow bandgap semiconductor regions formed on deeper locations, so that the leakage current can be reduced while the same improvement of the drain breakdown voltage as that of the prior art heterojunction SOLMOSFET is maintained.

Now, as the advantage of above first and second embodiments of the present invention, combinations of Ge and P; Ge, As and P; Ge, As and Sb; Ge and B; and Ge, B and P can achieve similar advantages. In addition, it is preferable that Ge ion implanted regions are formed in the ion implanted regions of B, P, As, or the like. For the case of B implantation, the concentration of implanted B ion should be ion should be set to be lower than that of As ion. However, if we employ the similar structure as shown in FIG. 10B, the B concentration can be higher than that of As ion. Sn may be implanted in place of Ge, and, for example, Sn and P; Sn, P and As; or the like may be implanted simultaneously. Moreover, Ge and Sn may be implanted simultaneously. Ge or Sn may be included in silicon at $5\times10^{19}$ $cm^{-3}$ or more, preferably $1\times10^{20}$ $cm^{-3}$ or more. It is more preferable that Ge or Sn may be included in silicon in a range of 1 to 30%. For instance, in case Sn is included at $5\times10^{19}$ $cm^{-3}$, lattice distortion can be relaxed and crystal defects can be suppressed if P is included at $1.6\times10^{20}$ $cm^{-3}$. Furthermore, though a combination of Ge or Sn and (As+Sb) has a larger covalent radius than that of Si, lattice distortion can also be compensated by such combination because of complicated compensating relations, i.e., some of these elements enter into interstitial sites of Si and other of them enter into vacancy trapping sites of Si. Although, the high impurity concentration region 219 of P is included in the SiGe region 211 as shown in FIG. 10A, the P high impurity concentration region 219 can protrudes from SiGe region 211 to locate near side of gate electrode 205. To form the P high impurity concentration region 219 close to the channel region just under the gate electrode, we should implant P ions without employing the sidewall spacer 71.

(THIRD EMBODIMENT)

Figure 12A:
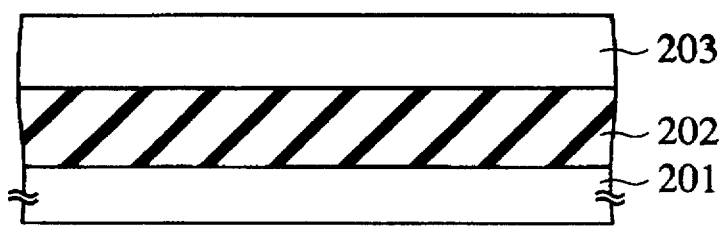
FIGS. 12A to 12D are sectional views each showing manufacturing steps of a SOI.MOSEFT according to a third embodiment of the present invention.
Figure 12B:
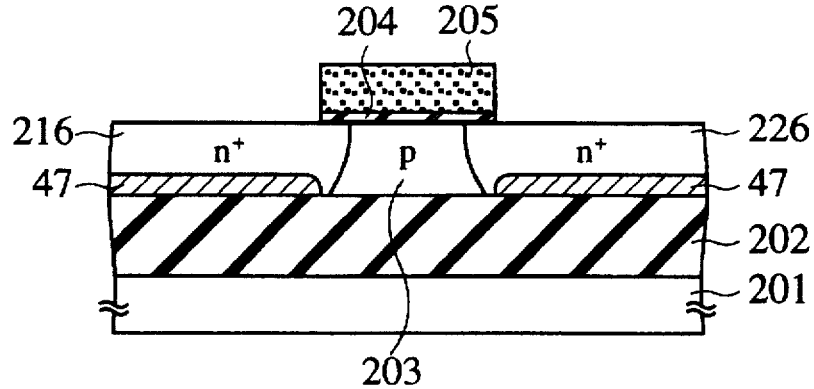
Figure 12C:
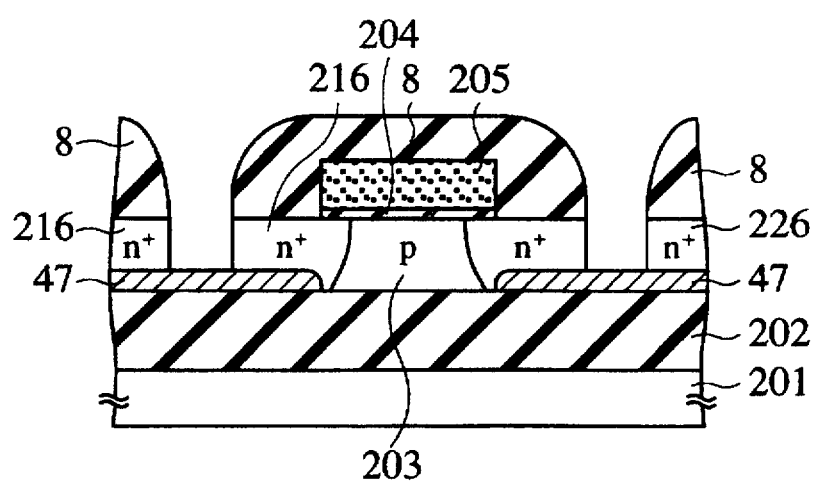
Figure 12D:
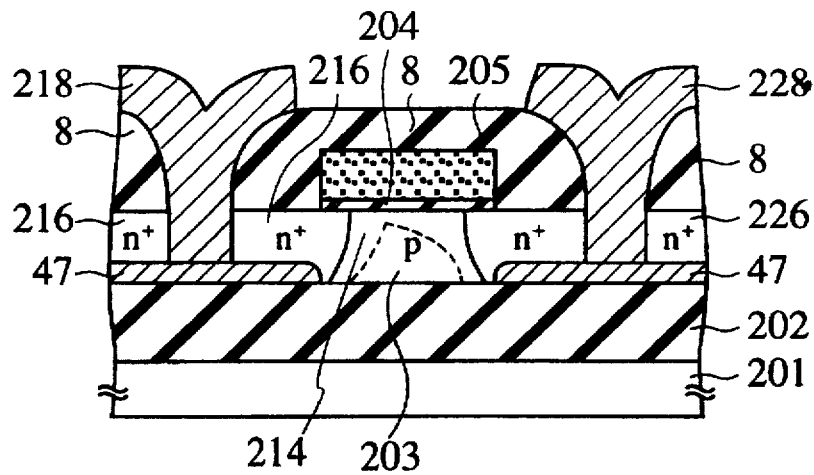

FIG. 12D shows a sectional structure of the SOLMOSFET according to a third embodiment of the present invention. In FIG. 12D, a p-type SOI film 203 is formed on a p-type (100) silicon substrate 201 via a buried oxide film 202. Although not shown, the SOI film 203 forms an active region which is surrounded by a device isolation region formed by BOX technique, LOCOS technique, or the like. An $n^+$ source region 216 and an $n^+$ drain region 226 are formed deeply in an inside of the active region so as to contact their bottom portions with a buried oxide film 202. SiGe regions 47 are formed on an interface between the $n^+$ source region 216 and the buried oxide film and an interface between the $n^+$ drain region 226 and the buried oxide film. The source metal electrode 218 and the drain metal electrode 228 are formed via contact holes formed in part of the interlayer insulating layer 8 which is formed on a surface of the active region. In addition, the gate electrode 205 formed of polysilicon etc. is formed on the channel region 203 between the $n^+$ source region 216 and the $n^+$ drain region 226.

In the third embodiment of the present invention, as shown in FIG. 12D, since Ge implanted regions (SiGe layers) 47 are formed deeply, leaving on top the n⁺ source region 216 and the n⁺ drain region 226, even though the crystal defects D are generated, these defects do not contribute to the leakage current as shown in FIG. 5B. It is preferable that the SiGe layers 47 are formed lower than the depletion layer 214 in the channel region at a principal operation state of the FET. The drain breakdown voltage has not been changed especially from the prior art heterojunction SOI.MOSFET so that the same improvement of the drain breakdown voltage can be maintained even though the SiGe layers 47 are formed deeply in the SOI film 203 as shown in FIG. 12D. In particular, the drain breakdown voltage in the off-state can be improved by 1 V, in comparison with the conventional homojunction SOI.MOSFET wherein the source diffusion layer is formed without Ge implantation. These advantages of the third embodiment of the present invention are the same in IG-FETs other than above-mentioned MOSFET, and in MISFETs or MISSITs using nitride film etc. as the gate insulating film.

Next, referring to FIGS. 12A to 12D, a manufacturing method of the SOLMOSEFT according to the third embodiment of the present invention will be explained.

(a) First, using SIMOX technique as already explained in the first embodiment of the present invention by using FIGS. 9A and 9B, a buried oxide film 202 and a SOI film 203 are formed on a p (100) substrate 201, as shown in FIG. 12A. Like the first embodiment of the present invention, the thickness of the SOI film 203 can be adjusted by thermally oxidizing its surface to form a thermal oxide film with a 100 nm thick unoxidized SOI film, and then wet-etching the oxide film to form 100 nm thick SOI film. Then, the SOI film 203 having desired impurity concentration can be derived by, for example, implanting BF₂ ions (BF₂⁺) at accelerating voltage Vac=30 kV and a dose $\Phi=10^{13}$ cm⁻².

(b) Then, the isolation oxide film (not shown in FIG. 12B) is formed by LOCOS technique, BOX technique, or the like to laterally isolate adjacent active regions. Thereafter, the gate oxide film 204 of a thickness of 10 nm is formed, and then a P-doped polysilicon film 205 with a thickness of 0.3 µm is deposited thereon by LPCVD etc. Then, as shown in FIG. 12B, the gate polysilicon electrode 205 is formed on the gate oxide film 204 by patterning technology of photolithography step and RIE step. Subsequently, as shown in FIG. 12B, Ge ions are implanted at accelerating voltage Vac=100 kV and a dose $\Phi=1\times10^{16}$ cm⁻², and then As ions are implanted at accelerating voltage Vac=30 kV and a dose $\Phi=3\times10^{15}$ cm⁻², and then a resultant structure is annealed at 850° C. for thirty minutes. Thus, the source and drain regions 216, 226 and the Si$_x$Ge$_{1-x}$ layers 47 can be formed.

(c) Thereafter, an oxide film 8 for an interlayer insulating film having a thickness of 0.5 µm is formed on an entire surface by CVD etc. Then, a resist film is coated and patterned by photolithography, and the oxide film 8 is etched by RIE technology to open contact holes. Subsequently, until the Si$_x$Ge$_{1-x}$ layers 47 are exposed, Si in the source and drain regions 216, 226 are etched by RIE using SF₆ etc. to thus form U grooves as shown in FIG. 12C.

In place of the Si$_x$Ge$_{1-x}$ layers 47, the Si$_x$Sn$_{1-x}$ layers may be formed by implanting Sn ions instead of Ge ions on a deeper location than the depletion layer formed in the channel region. Ge and Sn ions may be implanted simultaneously. Ge or Sn may be included in silicon at $5\times10^{19}$ cm⁻³ or more, preferably $1\times10^{0}$ cm⁻³ or more. It is more preferable that Ge or Sn may be included in silicon in a range of about 5 to 30%. Further, in place of Si$_x$Ge$_{1-x}$ and Si$_x$Sn$_{1-x}$, the semiconductor layer having a narrower bandgap than that of Si such as PbS, PbSe, ZnSb, InSb or the like, or the mixed crystals of Si and these narrow bandgap semiconductors may be used.

(d) And, as shown in FIG. 12D, the source metal electrode 218 and the drain metal electrode 228 are formed by metallization step using a metal such as Al, Al—Si, Al—Si—Cu, or the like. As a result, the SOI.MOSFET of the third embodiment of the present invention can be completed.

(FOURTH EMBODIMENT)

Figure 13A:
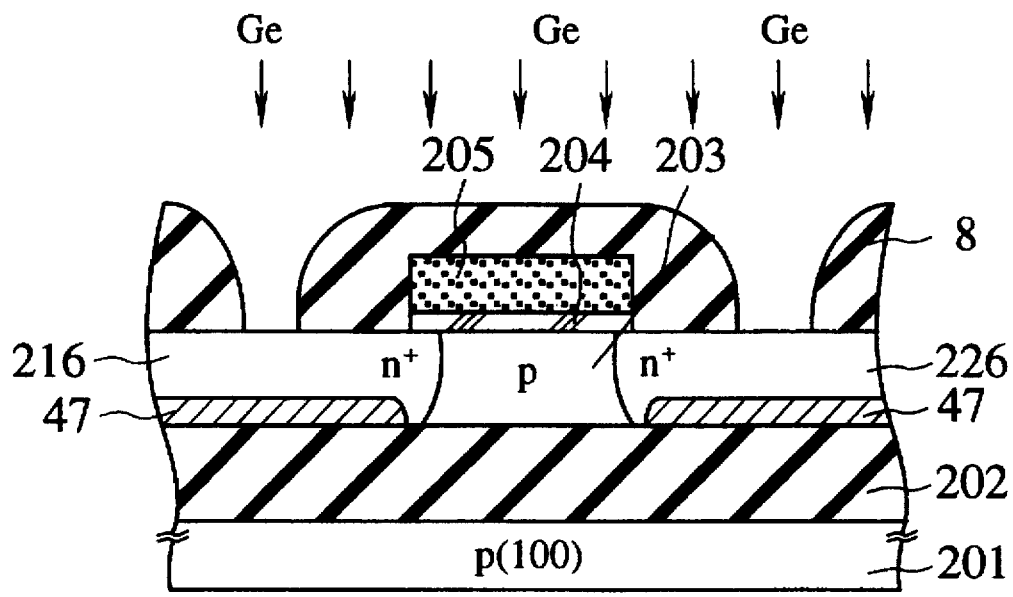
FIGS. 13A and 13B are sectional views each showing manufacturing steps of a SOI.MOSEFT according to a fourth embodiment of the present invention.
Figure 13B:
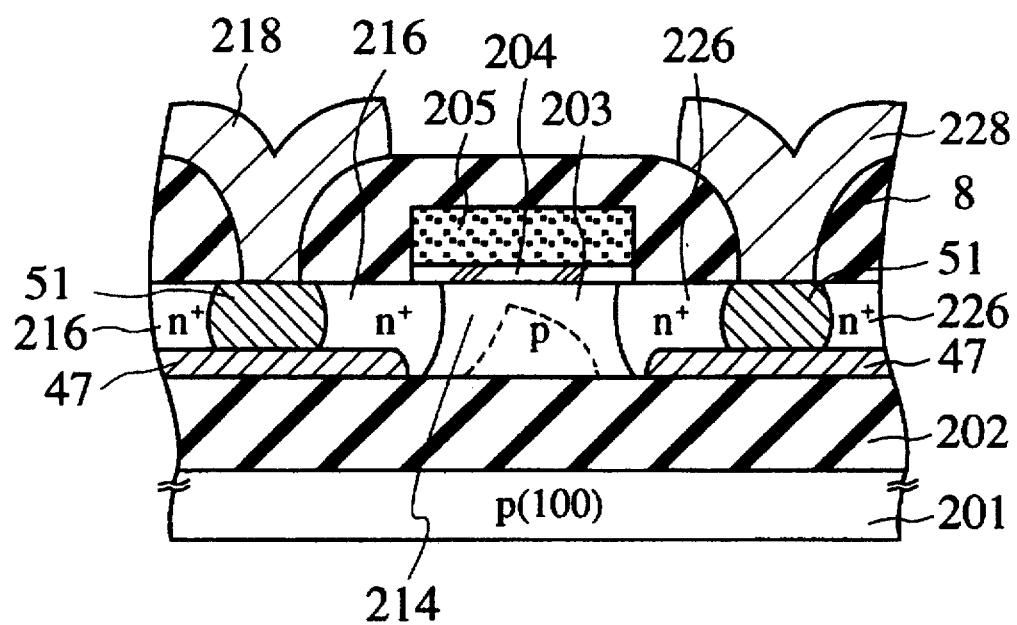

FIG. 13B shows a sectional structure of a SOI.MOSEFT according to a fourth embodiment of the present invention. The fourth embodiment shows another example of FET structure, in which the SiGe regions 47 are formed at locations deeper than the bottom of the depletion layer 214 in the channel region just under the gate electrode 205. In FIG. 13B, a p-type SOI film 203 is formed on a p-type (100) silicon substrate 201 via a buried oxide film 202. Although omitted from FIG. 13B, the SOI film 203 is divided into plural islands, each island is surrounded by an isolation oxide film etc., and the surrounded part of the SOI film 203, or the island is used as an active region (device region). FIG. 13B only shows one of the active regions. An n⁺ source region 216 and an n⁺ drain region 226 are formed in an inside of the active region so as to contact substantially their bottom portions with a buried oxide film 202. Like the third embodiment of the present invention, SiGe regions (referred to as "first SiGe layers" in the fourth embodiment of the present invention hereinafter) 47 are formed on an interface between the n⁺ source region 216 and the buried oxide film and an interface between the n⁺ drain region 226 and the buried oxide film. However, in the fourth embodiment, second SiGe layers 51 are further formed directly beneath contact hole opening portions for the source metal electrode 218 and the drain metal electrode 228 so as to reach the first SiGe layers 47 respectively. The Ge mole fraction of the second SiGe layers 51 may be the same as that of the first SiGe layers 47. More preferably, the Ge mole fraction of the second SiGe layers 51 should be larger than that of the first SiGe layers 47 to have narrow band gap, thereby increasing the efficiency of the hole extraction from the SOI body 203. The interlayer insulating layer 8 is formed on the active region. The source metal electrode 218 and the drain metal electrode 228 are formed so as to be connected to the second SiGe layers 51 via contact holes formed in the interlayer insulating layer 8. In addition, the gate electrode 205 formed of polysilicon or refractory metal etc. is formed on the channel region 203 between the n⁺ source region 216 and the n⁺ drain region 226 via the gate oxide film 204.

In the SOI.MOSFET according to the fourth embodiment of the present invention shown in FIG. 13B, the drain breakdown voltage has been improved and further the leakage current has been remarkably improved, like the third embodiment of the present invention.

Next, with reference to FIGS. 13A and 13B together with FIGS. 12A and 12B used in the manufacturing method of the third embodiment of the present invention, a manufacturing method of the SOLMOSEFT according to a fourth embodiment of the present invention will be described. However, we would like to mention that the forming step of a SOI structure with a buried oxide film 202 using SIMOX technique, the forming steps of the gate oxide film 204 on the surface of the active region formed of the SOI film 203, and the forming steps of the polysilicon gate electrode 205, Si$_x$Ge$_{1-x}$ layers 47, the n⁺ source region 216, and the n⁺ drain region 226 are substantially similar to those explained in the third embodiment of the present invention as shown in FIGS. 12A and 12B. Thus, detailed explanations of these manufacturing steps are omitted.

(a) After the formations of the polysilicon gate electrode 205, $Si_xGe_{1-x}$ layers 47, the $n^+$ source region 216, and the $n^+$ drain region 226, the oxide film 8 for the interlayer insulating film is deposited by CVD or the like. Thereafter, the contact holes are opened in the interlayer insulating film 8 by photolithography step and RIE step. That is, the oxide film 8 is etched until the surface of Si on $n^+$ source region 216 and the $n^+$ drain region 226 is exposed. Ge ions are implanted into $n^+$ source region 216, $n^+$ drain region 226 via the contact hole opening portions at accelerating voltage Vac=30 kV and a dose $\Phi=1\times10^{16}$ cm$^{-2}$, as shown in FIG. 13A.

(b) Then, the second $Si_xGe_{1-x}$ layers 51, as shown in FIG. 13B, are formed by annealing this resultant SOI substrate so as to contact to the $Si_xGe_{1-x}$ layers 47. Thereafter, as shown in FIG. 13B, the source metal electrode 218 and the drain metal electrode 228 are formed by using a metal such as Al, or the like. As a result, the SOLMOSFET of the fourth embodiment of the present invention can be completed.

In the above manufacturing method, the etching for opening the contact holes may be executed merely to reach the surfaces of the $n^+$ source and drain regions 216, 226 on the single crystal SOI film 203. Therefore, in contrast to the manufacturing method of the SOI.FET of the third embodiment of the present invention, processes in the fourth embodiment are simple so that process control capability is excellent. Now, similar to the third embodiment of the present invention, a mixed crystal of $Si_xSn_{1-x}$ or $Si_{1-x-y}Ge_xSn_y$ may be used in place of the $Si_xGe_{1-x}$ layer 47. In addition, Ge or Sn should be included in silicon at $5\times10^{19}$ cm$^{-3}$ or more, preferably $5\times10^{20}$ cm$^{-3}$ or more. It is most preferable that Ge or Sn may be included in silicon in a range of about 5 to 15%. Also, the narrow bandgap semiconductor layer, whose bandgap is narrower than that of Si, such as PbS, SnTe, InSb or the like may be used in place of the $Si_xGe_{1-x}$ layers 47, 51. And the band gap of the narrow band gap semiconductor layer for $Si_xGe_{1-x}$ layer 51 should be the same or narrower than that of for $Si_xGe_{1-x}$ layer 47, to increase the hole extraction efficiency from the SOI body 203. Namely, the bandgap in the source region should be formed as gradually decreasing to the source metal electrode 218.

(FIFTH EMBODIMENT)

Figure 14:
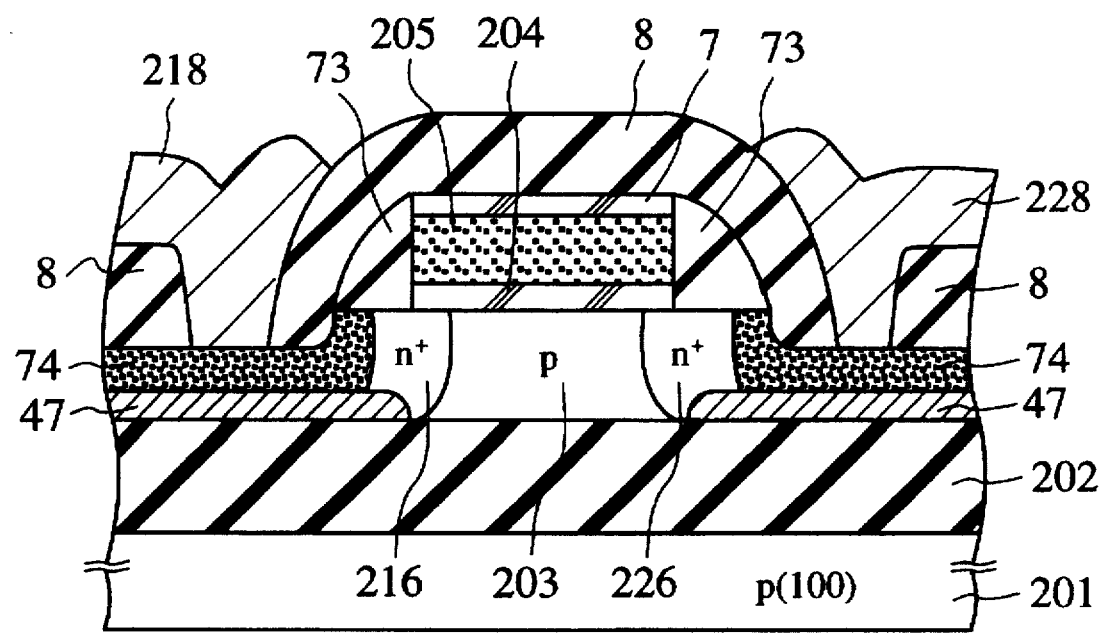
FIG. 14 is a sectional view showing a structure of a SOI.MOSFET according to a fifth embodiment of the present invention.

FIG. 14 shows a sectional structure of a SOLMOSFET according to a fifth embodiment of the present invention. In FIG. 14, a p-type SOI film 203 is formed on a p-type (100) silicon substrate 201 via a buried oxide film 202. Although not shown in FIG. 14, the SOI film 203 is divided into plural islands, each island is surrounded by an isolation oxide film etc., and the surrounded part of the SOI film 203, or the island is used as an active region (device region). FIG. 14 shows one of the active regions. An $n^+$ source region 216 and an $n^+$ drain region 226 are formed deeply in an inside of the active region so as to contact substantially their bottom portions with a buried oxide film 202. Like the third and fourth embodiments of the present invention, SiGe layers 47 are formed at the bottoms of the $n^+$ source region 216 and the $n^+$ drain region 226. Refractory metal silicide layers 74 such as $TiSi_2$, $WSi_2$, $MoSi_2$, $PtSi_2$ etc. are formed on the SiGe layers 47 located within the $n^+$ source region 216 and $n^+$ drain region 226. The source metal electrode 218 and the drain metal electrode 228 are formed so as to be connected to the refractory metal silicide layers 74 via contact holes formed in the inter-layer insulating layer 8 which is deposited on the active region. In addition, the polysilicon gate electrode 205 is formed on the channel region 203 between the $n^+$ source region 216 and the $n^+$ drain region 226 via the gate oxide film 204. Sidewall nitride films 73 are formed on both sides of the polysilicon gate electrode 205.

Although the refractory metal silicide layers 74 are formed on concave portions on the surface of the SOI film 203 in FIG. 14, the surface of the refractory metal silicide layers 74 may be formed to have the substantially same flat surface as the SOI film 203. In any event, the refractory metal silicide layers 74 are formed by reaction between Si and refractory metals such as Ti, W, Mo, etc. so as to enter into the deeper portion of the SOI film 203 from the surface of the SOI film 203, so that the refractory metal silicide layers 74 are contacted respectively to the SiGe layers 47.

In the SOLMOSFET according to the fifth embodiment of the present invention, the drain breakdown voltage has been improved excellently and also the leakage current has been remarkably improved, as in the third and fourth embodiments of the present invention. In addition, ohmic contact resistances between the metal electrodes and $n^+$ source/drain regions 216, 226 can be reduced because of existence of the refractory metal silicide films 74, and thus parasitic resistance in the source and drain regions can be decreased. As a result, transconductance $g_m$ becomes large and good current driving capability can be attained.

With reference to FIGS. 15A to 15D as well as FIG. 14, a manufacturing method of the SOLMOSEFT according to the fifth embodiment of the present invention will be discussed hereinbelow. In the following explanations, a case wherein $TiSi_2$ is used as the silicide layer 74 will be explained.

(a) First, like the first to fourth embodiments of the present invention, the SOI substrate is formed by SIMOX technique using the p type (100) silicon substrate 201. In other words, the buried oxide film 202 is formed on the substrate 201 by implanting oxygen ions and then annealing the resultant structure. At this time, the SOI film 203 is formed on the surface. Then, the SOI film 203 is thermally oxidized to leave unoxidized 100 nm thick SOI film 203. The thermal oxide film on the SOI film 203 is wet-etched using $NH_4$ F solution to expose the surface of the 100 nm thick SOI film 203, for example. In addition, as in respective embodiments above, desired impurity concentration for the channel region 203 can be derived by implanting B ions, $BF_2$ ions or the like.

(b) Thereafter, 10 nm thick gate oxide film 204 is formed on the channel region 203. A P-doped polysilicon 205 with a thickness of 0.3 μm is formed by LPCVD etc. on the surface of the gate oxide film 204. Then thermal oxide film 7 is formed on the surface of the polysilicon 205. A photoresist is spin-coated on the surface of the thermal oxide film 7. Then, as shown in FIG. 15A, the oxide film 7, the polysilicon gate electrode 205, and the gate oxide film 204 are patterned by photolithography step and RIE step.

Figure 15A:
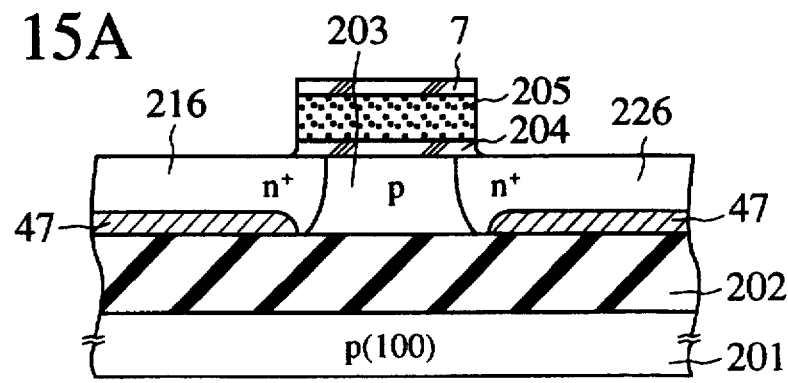
FIGS. 15A to 15D are sectional views each showing manufacturing steps of the SOI.MOSEFT according to the fifth embodiment of the present invention.

(c) Then, as shown in FIG. 15A, the source and drain regions 216, 226 and the $Si_xGe_{1-x}$ layers 47 are formed by implanting Ge ions at accelerating voltage Vac=100 kV with a dose $\Phi=1\times10^{16}$ cm$^{-2}$. And As ions are implanted at accelerating voltage Vac=30 kV with a dose $\Phi=3\times10^{15}$ cm$^{-2}$, and then the substrate, or the resultant SOI structure as shown in FIG. 15A is annealed at 850° C. for thirty minutes. That is, by this annealing step, the SiGe layers ($Si_{0.93}Ge_{0.07}$ layers) 47 is formed and the $n^+$ source and drain regions 216, 226 is adjusted to have an impurity concentration of about $1\times10^{20}$ cm$^{-2}$. By the lateral diffusion due to this annealing step, both pn-junction interfaces between the $n^+$ source and drain regions 216, 226 and the p type SOI film 203 are moved toward an inside of the channel region, or the SOI body 203 by about 20 nm from the SiGe layers 47.

Figure 15B:
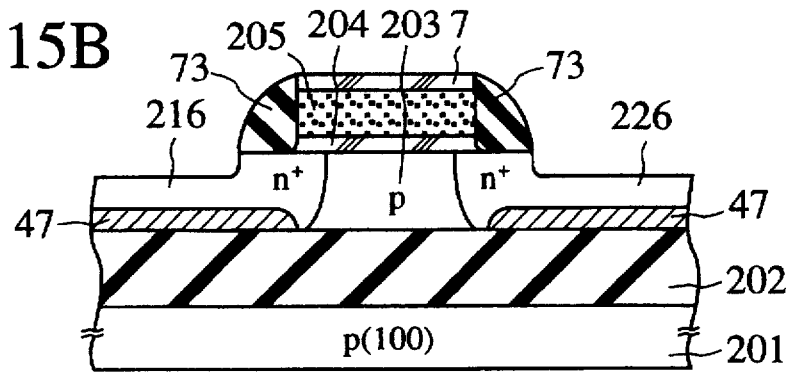
Figure 15C:
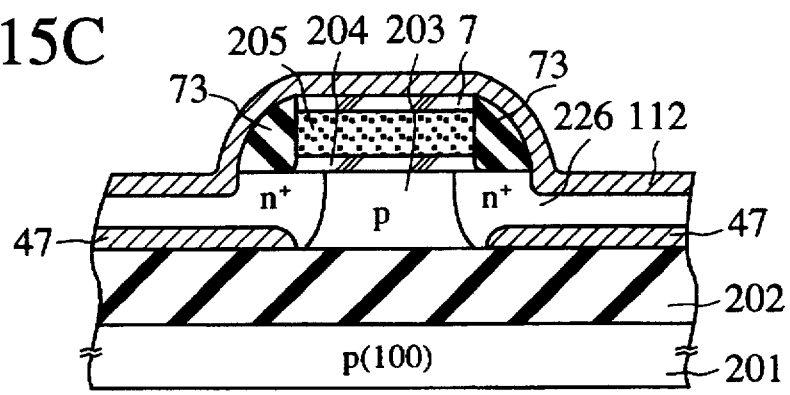
Figure 15D:
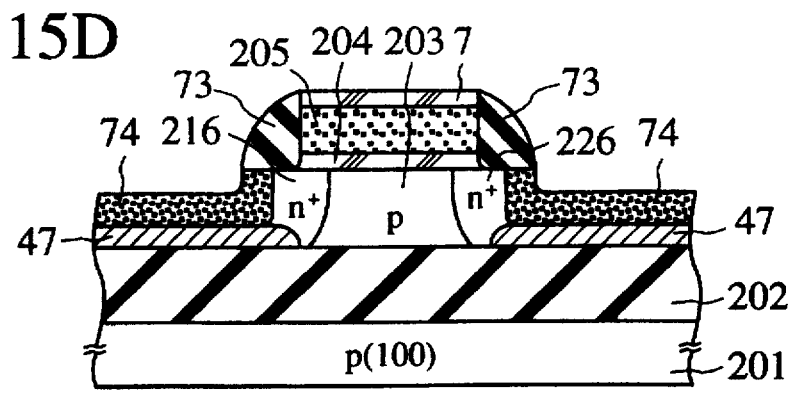

(d) Next, a nitride film is grown on an entire surface to have a thickness of 20 nm to 400 nm. Sidewall nitride films 73 are formed on both sides of the gate electrode 205 etc. by RIE or the like. In addition, as shown in FIG. 15B, the $n^+$ source and drain regions 216, 226 are etched by 30 nm in depth, for example, using the sidewall nitride films 73 and the oxide film 7 as a mask. This etching step of the $n^+$ source and drain regions 216, 226 may be omitted to remain their flat surfaces such that the $n^+$ source and drain regions 216, 226 can form the same flat surface as the SOI film 203. Then, as shown in FIG. 15C, a Ti film 112 is deposited by 20 nm in thickness on an entire surface by CVD, vacuum deposition, sputtering, or the like. Further, although not shown in FIG. 15C, 70 nm thick TiN film may be deposited on Ti film, if it is required a film which prevents the oxidation of the surface of the refractory metal.

(e) Then, the Ti film 112 is annealed at a temperature of 750°C. for thirty minutes in $N_2$ atmosphere. By this annealing, the $TiSi_2$ film 74 is formed on the SiGe layer 47 as a result of the reaction between Ti film 112 and silicon in the $n^+$ source/drain region 216, 226. However, $TiSi_2$ is not formed by this annealing (or silicidation) on the oxide film 7 and the sidewall SiN film 73, and thus remains as unreacted Ti film. By dipping a resultant structure into a solution containing hydrogen peroxide, the TiN film and the unreacted Ti can be removed. After that the substrate is further annealed at 850° C. for 30 minutes, and the thickness of the $TiSi_2$ film 74 become approximately 60 nm, thus resulting in a structure shown in FIG. 15D.

(f) Then, the oxide film 8 is deposited on an entire surface by CVD. The contact holes are opened in the oxide film 8. As shown in FIG. 14, the source metal electrode 218 and the drain metal electrode 228 are formed by metallization step using a metal such as Al, Al—Si, Al—Si—Cu, or the like. Otherwise, metal wirings such as the source metal electrode 218 and the drain metal electrode 228 may be formed on contact metals in the contact holes. In this case, the refractory metal such as W is filled into the contact holes by selective CVD, and then Al—Si(1%)-Cu(0.5%) is deposited on the refractory metal plugs in the contact holes as a wiring material, and finally cut it by photolithography.

Though a case wherein Ti is used as a refractory metal material has been explained in the fifth embodiment of the present invention, the refractory metal is not limited to this material. Any refractory metals such as Ni, Pt, W, or Mo may be used for the refractory metal silicide materials. In order to prevent oxidation of the surface of the refractory metal silicide at the time of annealing, a TiN film etc. may also be deposited on a refractory metal before annealing. As mentioned above, this TiN film etc. can be removed together with unreacted refractory metals such as Ni, Pt, W by hydrogen peroxide water process. In case the refractory metal is prevented to be changed to refractory metal silicide due to a natural oxide film between the $Si_{0.9}Ge_{0.1}$ layer and the refractory metal, a Ti layer, for example, having reducing capability may be further provided on an interface. Further, the refractory metal silicide film may be obtained either by one step annealing at predetermined condition or the two step annealing comprising lower temperature pre-annealing and higher temperature post-annealing as explained in this fifth embodiment. Though the refractory metal silicide remains as it is in the fifth embodiment of the present invention, it may be removed by HF solution. A method of forming the $Si_{0.9}Ge_{0.1}$ layers 47 is not restricted to the above examples, and the $Si_{0.9}Ge_{0.1}$ layers 47 may be formed only on the $n^+$ source region 216 coating resist etc. on the $n^+$ drain region 226 side as a mask. In the above example, pn junction interfaces between the $n^+$ source and drain regions 216, 226 and the p type SOI layer are located on inner sides of the channel region of MOSFET than Ge contained regions, but these pn-junction interfaces may be formed to locate within the Ge contained regions. Furthermore, although the SiGe layers and the refractory metal silicide layers are not formed on the gate electrode in the above example, the same advantage of the present invention can be attained if the SiGe layers and the refractory metal silicide layers are formed on the gate electrode. In place of $Si_xGe_{1-x}$ layers, $Si_xSn_{1-x}$ layers may be used.

(SIXTH EMBODIMENT)

Figure 16A:
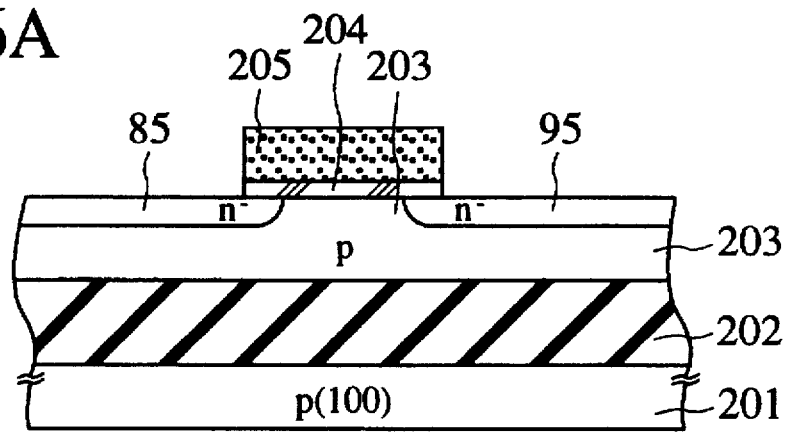
FIGS. 16A to 16C are sectional views each showing manufacturing steps of an LDD.SOI.MOSFET according to a sixth embodiment of the present invention.
Figure 16B:
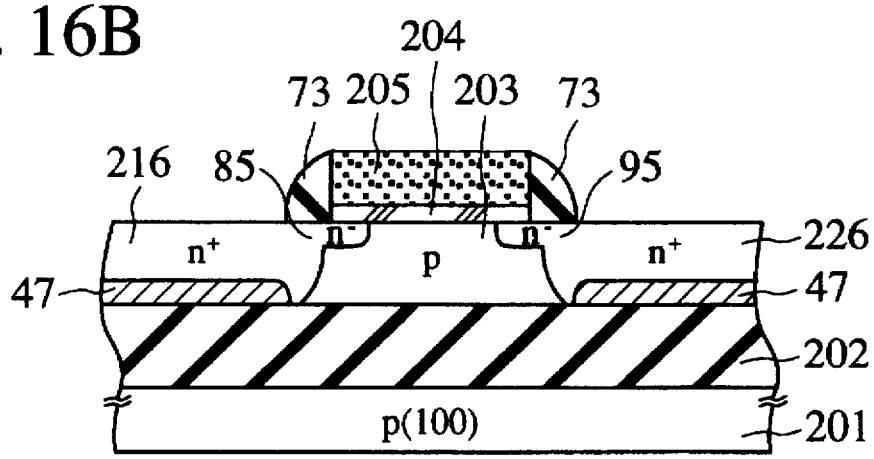
Figure 16C:
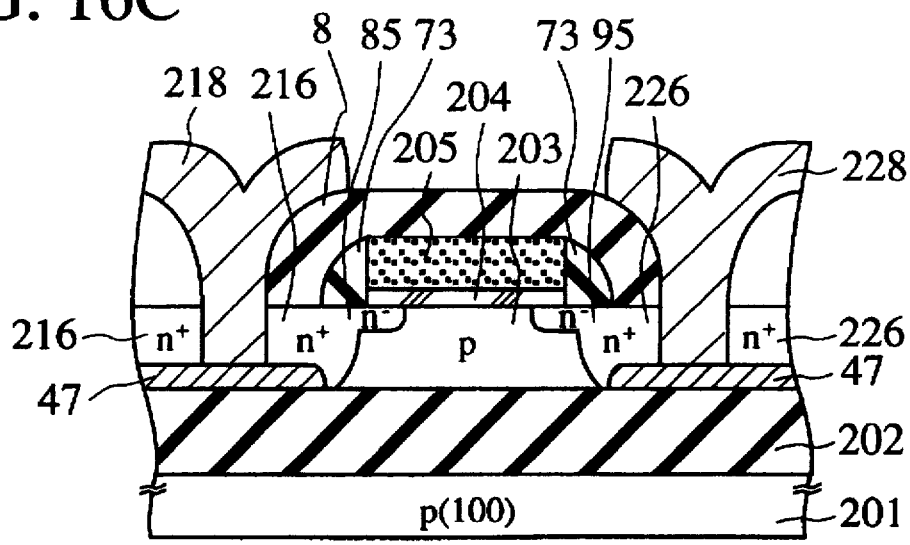

FIG. 16C shows a sectional structure of an LDD (Lightly Doped Drain).SOI.MOSFET according to a sixth embodiment of the present invention. In FIG. 16C, a p-type SOI film 203 is formed on a p-type (100) silicon substrate 201 inserting a buried oxide film 202 therebetween. Although not shown in FIG. 16C, the SOI film 203 is divided into plural silicon islands, and the silicon islands are surrounded by an isolation oxide film etc., and each silicon island 203 is used as an active region (device region) respectively. FIG. 16C only shows one of the active regions. An $n^-$ source region 85 and an $n^-$ drain region 95, both having relatively low impurity concentration, are formed shallowly in the active region so as to face to the SOI film 203, or the SOI body serving as the channel region of MOSFET. Further, the $n^+$ source region 216 and the $n^+$ drain region 226 having impurity concentration of $2\times10^{18}$ to $1\times10^{21}$ cm$^{-3}$ are formed deeply so as to contact substantially their bottom portions with a buried oxide film 202. Here the $n^-$ source region 85 and the $n^-$ drain region 95 denote relatively low impurity concentration regions in contrast to the $n^+$ source region 216 and the $n^+$ drain region 226 and, more particularly, they mean regions having about $5\times10^{16}$ to $5\times10^{18}$ cm$^{-3}$. In this sense, the impurity concentration of $n^-$ region in the sixth embodiment is rather higher than that of commonly used value. The SiGe layers 47 are formed at the bottoms of the deep $n^+$ source region 216 and deep $n^+$ drain region 226. Further, the gate electrode 205 formed of polysilicon etc. is formed on the channel region 203 between the $n^-$ source region 85 and the $n^-$ drain region 95 via the gate oxide film 204. Sidewall nitride films 73 are formed on both sides of the polysilicon gate electrode 205. The interlayer insulating film 8 is formed over the SOI film 203 so as to include the gate electrode 205 therein. The source metal electrode 218 and the drain metal electrode 228 are formed to reach the SiGe layers 47 through the U grooves formed in the interlayer insulating film and contact windows formed in the $n^+$ source region 216 and $n^+$ drain region 226.

In the SOI.MOSFET in the sixth embodiment of the present invention, as shown in FIG. 16C, statistical generation of leakage current has not been found at all because of its LDD structure even if it is compared to the prior art heterojunction MOSFET wherein Ge ions are implanted into entire regions of the $n^+$ source and drain regions 216, 226. In addition, the drain breakdown voltage in the off-state has been improved by 1.5 V in comparison with that of the conventional homojunction device wherein the $n^+$ source region 216 is formed without Ge ion implantation.

With reference to FIGS. 16A to 16C, a manufacturing method of the SOLMOSFET according to the sixth embodiment of the present invention.

(a) First, under the same fabrication processes as those in respective embodiments of the present invention, oxygen ions are implanted into the p type (100) silicon substrate 201, and then annealing is executed. Thus, by so-called SIMOX technique, the buried silicon oxide film 202 and the SOI film 203 thereon are formed on the p type (100) silicon substrate 201. Then, the surface of the SOI film 203 is thermally oxidized to form an oxide film thereon. The thermal oxide film on the SOI film 203 is removed by wet-etching using NH$_4$F solution or the like to obtain a 100 nm thick SOI film 203. In addition, under the same conditions as in respective embodiments above, desired impurity concentration for the channel region can be derived by implanting B ions or BF$_2$ ions. Thereafter, the thermal oxide film 204 used for the gate oxide film is formed to have a thickness of 10 nm. A P-doped polysilicon 205 with a thickness of 0.3 μm is formed by LPCVD etc. on the surface of the polysilicon 205. Then, a photoresist pattern is spin-coated on the surface of the thermal oxide film 7. Then, as shown in FIG. 16A, the gate electrode 205, and the gate oxide film 204 are patterned by anisotropic etching such as RIE. Thereafter, P ions are implanted at accelerating voltage Vac=100 kV and a dose $\Phi=5\times10^{12}$ to $1\times10^{14}$ cm$^{-2}$. As a result, as shown in FIG. 16A, n$^-$ LDD regions 85, 95 are formed.

(b) Then, the nitride film 73 is deposited on the entire surface of the substrate, and sidewall nitride films 73 are formed at both sides of gate electrode 205 by anisotropic etching such as RIE. The Si$_x$Ge$_{1-x}$ layers 47 are formed by implanting Ge ions at accelerating voltage Vac=30 kV with a dose $\Phi=1\times10^{16}$ cm$^{-2}$, and implanting As ions at accelerating voltage Vac=30 kV with a dose $\Phi=3\times10^{15}$ cm$^{-2}$ using the sidewall nitride films 73 and the gate electrode 205 as a mask, and then annealing a resultant structure at 850° C. for thirty minutes. As a result, deep n$^+$ source and drain regions 216, 226 are formed as shown in FIG. 16B.

(c) Then, the oxide film 8 is deposited on an entire surface in the same manner as those of above embodiments. Then, until the underlying Si$_x$Ge$_{1-x}$ layers 47 are exposed, the oxide film 8 and the silicon for the n$^+$ source and drain regions 216, 226 are successively etched by RIE etc. to form contact windows and U grooves just under the contact windows. Metal wirings such as the source metal electrode 218 and the drain metal electrode 228 formed of Al etc. are formed to reach the SiGe layers 47 through the U grooves film and contact windows. Thus, the SOLMOSFET of the sixth embodiment of the present invention as shown in FIG. 16C has been completed.

In the sixth embodiment of the present invention, the source metal electrode 218 and the drain metal electrode 228 are contacted to the SiGe layers 47. However, as has been explained in the fourth embodiment, after the oxide film 8 is etched to form the contact windows until the surface of the n$^+$ source and drain regions 216 and 226 are exposed, the second Si$_x$Ge$_{1-x}$ layers 51 may be formed on the first Si$_x$Ge$_{1-x}$ layers 47 by implanting Ge ions into the window parts so as to bridge the metal electrode 218, 228 and the first Si$_x$Ge$_{1-x}$ layers 47. The source metal electrode 218 and the drain metal electrode 228 may contact to the Si$_x$Ge$_{1-x}$ layer via interfacial refractory metal silicide layers. Furthermore, semiconductor etc. having a narrower bandgap than that of Si such as Si$_x$Sn$_{1-x}$ layer, PbS, PbTe, InSb etc. may be used instead of the Si$_x$Ge$_{1-x}$ layer 47.

Figure 17A:
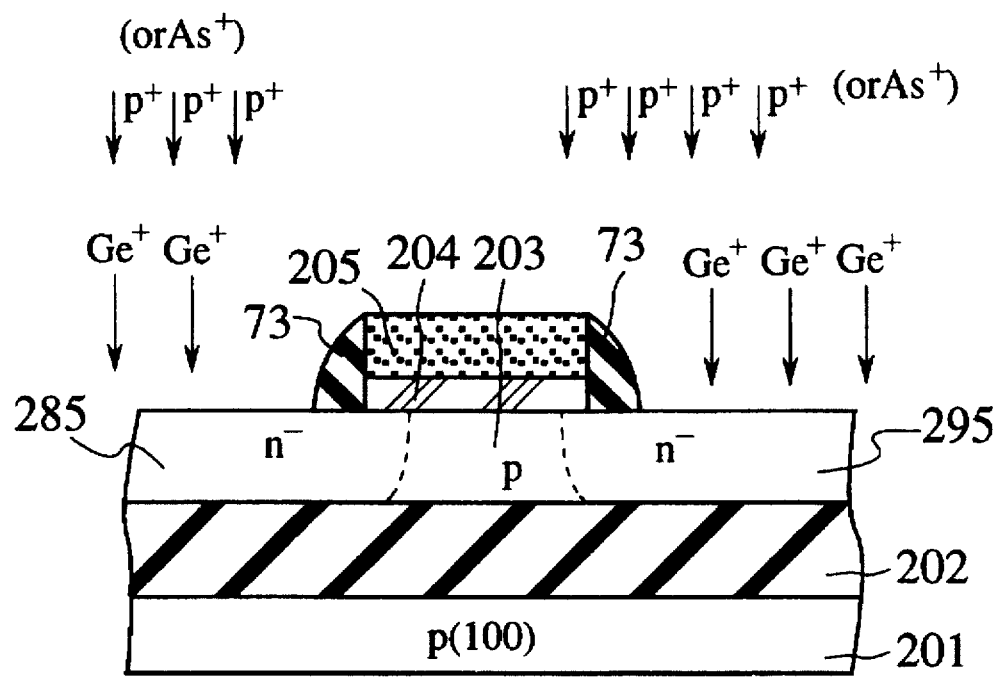
FIGS. 17A and 17B are sectional views each showing manufacturing steps of a MOSFET according to a modification of the sixth embodiment.
Figure 17B:
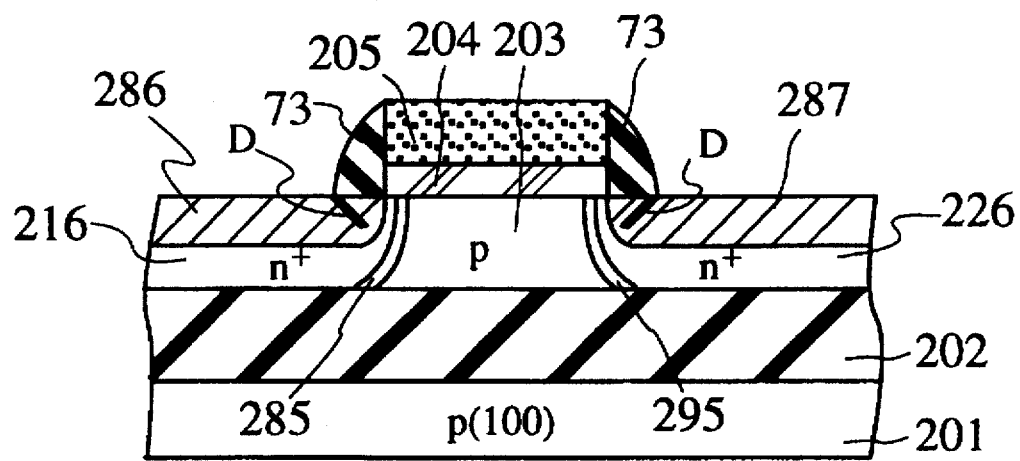

As stated at the beginning part of the specification of the present invention, the crystal defects caused by misfits in the heterojunction and the crystal defects caused by the ion implantation damages are generated in the heterojunction SOLMOSFET. From various experiments tried by inventors of the present invention, it has been found that these crystal defects are generated on interfaces between Ge ion implanted regions and Ge ion non-implanted regions. For this reason, firstly arsenic (As) ions are implanted and annealed to form relatively wide n$^-$ regions 285, 295 as shown in FIG. 17A immediately after forming the gate electrode pattern 205. And then the gate sidewall spacers 73 are formed, as shown in FIG. 17A, thereafter P ions (or As ions) as well as Ge ions are implanted simultaneously to form SiGe regions 286, 287, n$^+$ source and drain regions 216, 226 within the n$^-$ regions 285, 295. Thereby, as shown in FIG. 17B, edges of the defects D can be positioned within the n$^-$ regions 285, 295. Namely, even in a case that the drain breakdown voltage must be increased while minute leakage current must be suppressed, we can obtain the SOLMOSFET having desired characteristics by the structure as shown in FIG. 17B. The structure shown in FIG. 17B can be considered as one kind of LDD structures. However, this advantage is not restricted to the standard LDD structure, and any structure in which the Ge ion implanted region (or the Sn ion implanted region) is surrounded by the n$^-$ region can suppress the leakage current in the prior art heterojunction SOLMOSFET as shown in FIGS. 5B.

(SEVENTH EMBODIMENT)

Figure 18A:
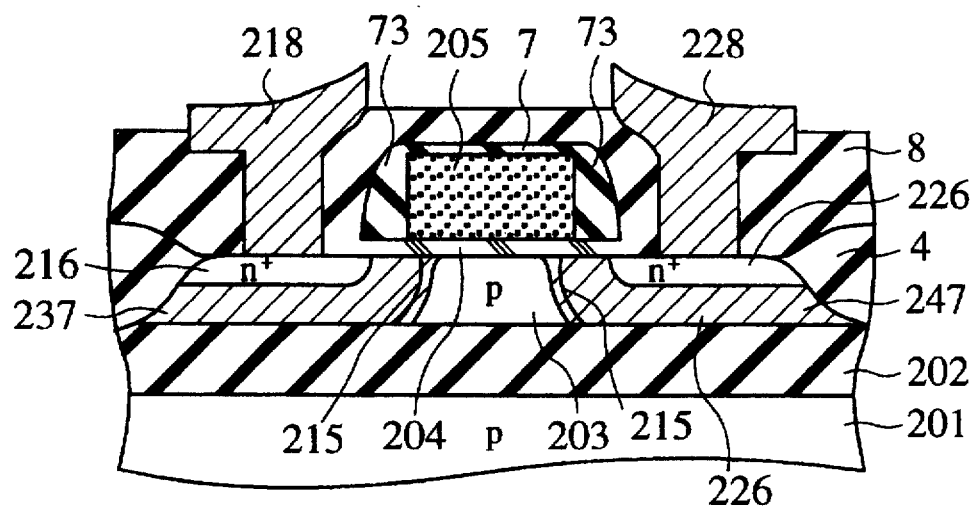
FIG. 18A is a sectional view showing a SOI.MOSEFT according to a seventh embodiment of the present invention.
Figure 18B:
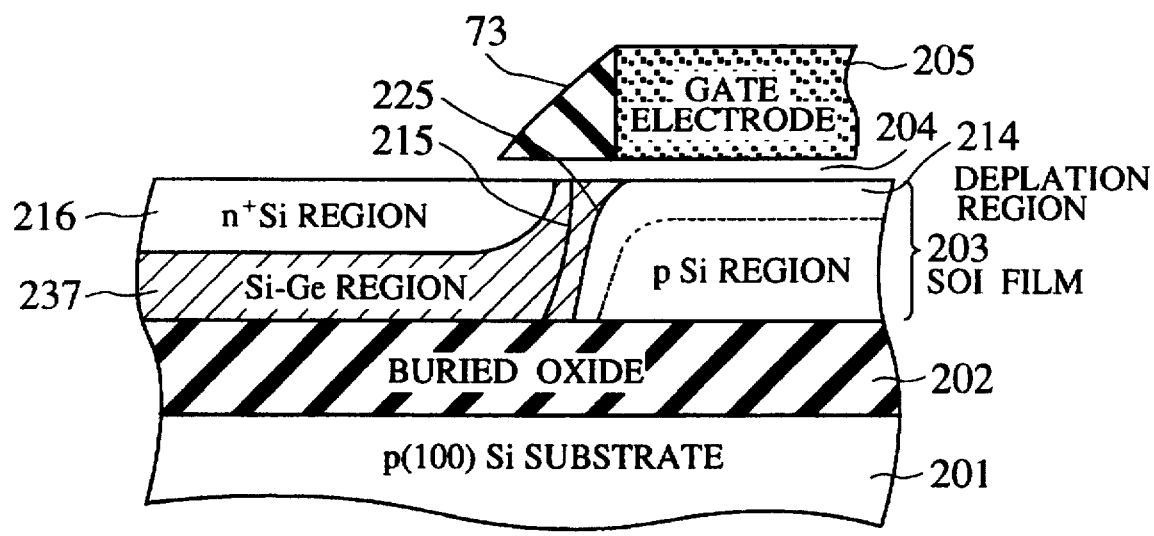
FIG. 18B is an enlarged sectional view showing a structure near an n⁺ source region of the SOI.MOSEFT shown in FIG. 18A.

FIG. 18A shows a sectional structure of a SOLMOSFET according to a seventh embodiment of the present invention. In FIG. 18A, a p-type SOI film 203 is formed on a p-type (100) silicon substrate 201 via a buried oxide film 202. The SOI film 203 is divided into plural silicon islands, and each silicon island is surrounded by an isolation oxide film 4 formed by LOCOS technique etc., and an interior of the surrounded silicon island is used as an active region (device region). FIG. 18A only shows the active region. An n$^+$ source region 216 and an n$^+$ drain region 226 are formed deeply in an inside of the active region so as to contact substantially their bottom portions with a buried oxide film 202. FIG. 18B is an enlarged sectional view showing a structure near an n$^+$ source region 216 of the SOLMOSFET shown in FIG. 18A. A part of SiGe region 237 is formed around the bottom part of the n$^+$ source region 216, and another part of SiGe region 237 extends into the channel region beyond a pn-junction interface (metallurgical junction) 215 between the n$^+$ source region and the p-type SOI body 203, or the channel region. Namely, the SiGe region 237 beyond the pn-junction interface 215 and existing in the SOI body side is a p-type SiGe region. Similarly, an SiGe region 247 is formed in the n$^+$ drain region 226 to extend into the channel region, or the SOI body, beyond a pn-junction interface between the n$^+$ drain region and the p-type SOI body 203. In some cases, the SiGe region 247 in the drain side can be omitted. In addition, the polysilicon gate electrode 205 is formed on the channel region 203 between the n$^+$ source region 216 and the n$^+$ drain region 226 via the gate oxide film 204. Sidewall nitride films 73 are formed on both sides of the polysilicon gate electrode 205. An SiO$_2$ film or a composite film of the SiO$_2$ film and a PSG (or BPSG) film serving as an interlayer insulating film 8 is formed on the SOI layer and on the gate electrode. Contact holes (windows) are opened in the interlayer insulating film 8. A source metal electrode 218 and a drain metal electrode 228 are formed therethrough.

Figure 19:
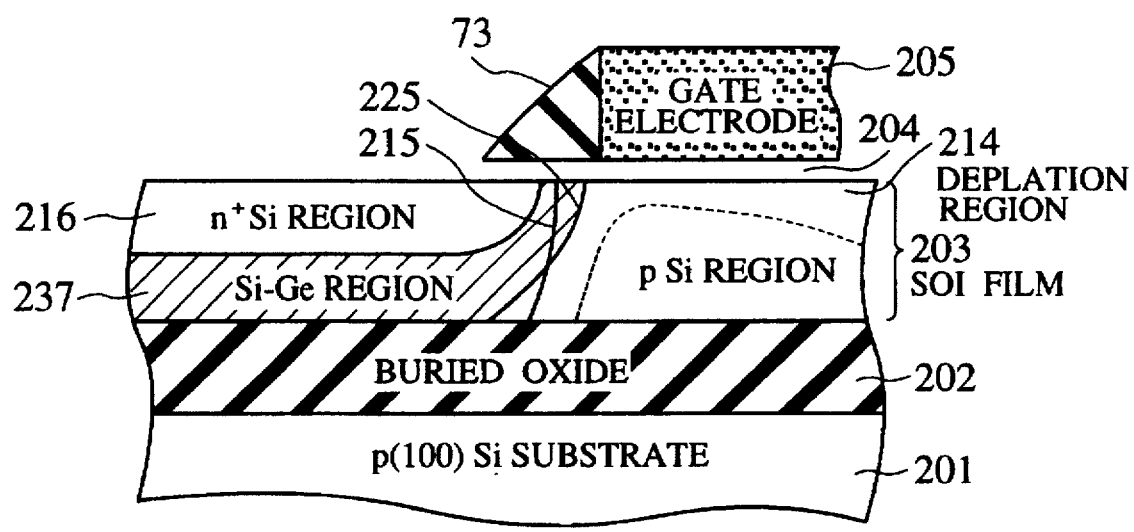
FIG. 19 is a sectional view showing a structure according to a modification of the seventh embodiment of the present invention, wherein part of a heterojunction interface traverses a pn junction interface.

In the seventh embodiment of the present invention shown in FIGS. 18A and 18B, a SiGe/Si heterojunction interface 225 is formed in the inner location of the channel region than that of pn junction interface 215 between the n⁺ source region 216 and p-type SOI body, and is located within a depletion layer 214 extending from the pn junction interface 215. However, as shown in FIG. 19, the same advantage in FIGS. 18A and 18B can be derived from a structure wherein a part of the SiGe/Si heterojunction interface 225 is formed nearer to the channel region than the pn junction interface 215. In FIG. 19, to form the SiGe region 237, acceleration voltage Vac used for Ge ion implantation can be set slightly lower than that of FIGS. 18A and 18B, for example, it can be set at 80 kV.

Figure 20:
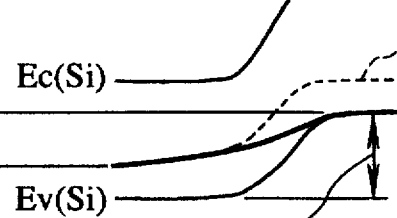
FIG. 20 is a view showing a potential profile (band diagram) of a SOI.MOSEFT according to the seventh embodiment of the present invention.

With the above, the SiGe/Si heterojunction interface 225 region 216 can be located in an inside of the depletion layer 214 extended from the metallurgical pn-junction interface 215. By this structure, a potential profile (a narrow dashed line indicates a valence band edge of Ev (SiGe) of SiGe, and a thick solid line indicates a valence band edge obtained by the present invention) of a SOLMOSEFT as shown in FIG. 20 can be achieved. Consequently, holes can be exhausted effectively to the source electrode and high drain breakdown voltage can be realized. In either case of FIGS. 18 and 19, the drain breakdown voltage is 5 V, which is improved by 1 V in contrast to the prior art heterojunction SOLMOSFET having the same channel length of 0.5 μm.

It is well known that a drain breakdown phenomenon in the SOLMOSFET is caused by holes accumulated in the channel region, or the SOI body. Consequently, in order to satisfy the object for increasing drain breakdown voltage, it is not always the best way to place the heterojunction interface 225 in an inside of pn junction interface 215, like the prior art heterojunction MOSFET shown in FIG. 4A. A comparison of the potential profile between the conventional homojunction MOSFET and the heterojunction MOSFET of the present invention is shown. It is apparent that, in a potential profile shown by a thick solid line in FIG. 20, the energy barrier height against holes can be most effectively lowered. In other words, in the structure of the seventh embodiment of the present invention, the valence band edge Ev (Si) in the channel region, where the potential for holes is lowest, is connected linearly to a valence band edge Ev (SiGe) of the narrow-bandgap-source region so as not to generate a high barrier against holes in the source-channel boundary region, whereby the accumulated holes in the SOI body are effectively exhausted, and thus the drain breakdown voltage can be increased excellently. For this reason, as shown in FIGS. 18A, 18B and 19, the SiGe region, having the narrower bandgap than that of Si, may be extended to the channel region, where the potential for holes is minimum (extremal value), beyond pn-junction interface 215. In place of the SiGe region, SiSn, PbS, mixed crystal of SiGeSn, mixed crystal of $Si_x(PbS)_{1-x}$, $Si_x(PbTe)_{1-x}$, or the like may be used.

The SOLMOSFET of the seventh embodiment of the present invention can be manufactured by the substantially same manufacturing steps as that of the first embodiment of the present invention, as described hereinbelow.

(a) First, the SOI structure is formed by so-called SIMOX technique using a p type (100) silicon substrate 201. That is, oxygen ions are implanted into the p type (100) silicon substrate 201 at accelerating voltage Vac=180 kV, and a dose $\Phi=2\times10^{18}$ cm⁻². Thereafter, the buried oxide film 202 with a thickness of 400 nm is formed by annealing at 1300° C. for six hours. Thus, the SIMOX-SOI substrate having the 200 nm thick SOI film 208 on the buried oxide film 202 is formed.

(b) Then, the surface of the SOI film 208 is oxidized thermally to leave a 100 nm thick silicon film. The thickness of the SOI film 203 is adjusted to a thickness of 100 nm by wet-etching the thermal oxide film on the unoxidized silicon film. Further, B ions (or $BF_2$ ions) are implanted to have a desired channel impurity concentration.

(c) Then, a device is formed by standard MOSFET fabrication steps using such as the self-alignment technique with the ordinary polysilicon gate electrode 205. Namely, after forming the 200~300 nm thick polysilicon gate electrode, a nitride film is formed by CVD, and then 300 nm width sidewall nitride films 73 are formed at both sides of gate electrode by using RIE. Then, using the polysilicon gate electrode 205 and the sidewall nitride films as a mask, Ge ions are implanted at accelerating voltage Vac=130 kV with a dose $\Phi=3\times10^{16}$ cm⁻², and As ions are implanted at accelerating voltage Vac=20 kV and a dose $\Phi=3\times10^{15}$ cm⁻². In this self-alignment ion-implantation, a part of Ge ions are implanted through the sidewall nitride films while slightly changing their effective projected ranges $R_p$ in the SOI film 203. After this, annealing of a resultant structure is performed at 850° C. for one hour. The Ge ions, which are implanted through the sidewall nitride films, are also diffused slightly by this annealing step. Hence, part of the SiGe regions 237 is extended into the channel region beyond pn junction interface 215, that is, the n⁺ source/drain regions 216, 226 are formed simultaneously with this ion-implantation/annealing steps. And, another part of SiGe regions 237 in the n⁺ source region 216, where the Ge ions are directly implanted into SOI films without penetrating the sidewalls, is formed deeply in the depth direction of the SOI film so as to reach the buried oxide film 202.

As described above, if Ge ions are implanted at lower accelerating voltage Vac=80~100 kV, a structure wherein only part of the heterojunction interface 225 is extended beyond pn junction interface 215 can be derived, as shown in FIG. 19. In this case, the accelerating voltage may be changed stepwisely as 80 kV, 90 kV, and 100 kV, and the Ge ions may be successively implanted with these varied accelating voltages.

(d) Then, the interlayer insulating film 8 such as $SiO_2$ film, composite film of $SiO_2$/PSG, or composite film of $SiO_2$/BPSG is formed by CVD etc. on a surface of the SOI film 203 so as to include the polysilicon gate electrode 205 therein. Then, contact holes (windows) are opened by photolithography in the interlayer insulating film 8. Finally, the source metal electrode 218 and the drain metal electrode 228 shown in FIG. 18A are formed by the following steps. Namely, after depositing a metal such as Al—Si, Al—Si—Cu, or the like on the surface of SOI film and interlayer insulating film by means of EB evaporation or sputtering and then patterning the metal by means of photolithography and RIE steps. As a result, the heterojunction SOLMOSFET having narrow-bandgap-source region of the seventh embodiment of the present invention can be completed.

(EIGHTH EMBODIMENT)

Figure 21A:
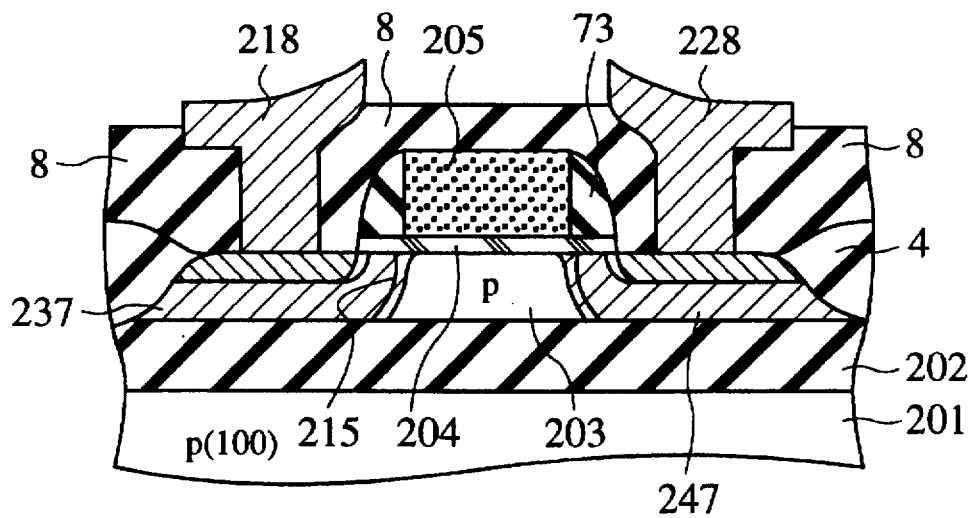
FIG. 21A is a sectional view showing a SOLMOSEFT according to a eighth embodiment of the present invention.
Figure 21B:
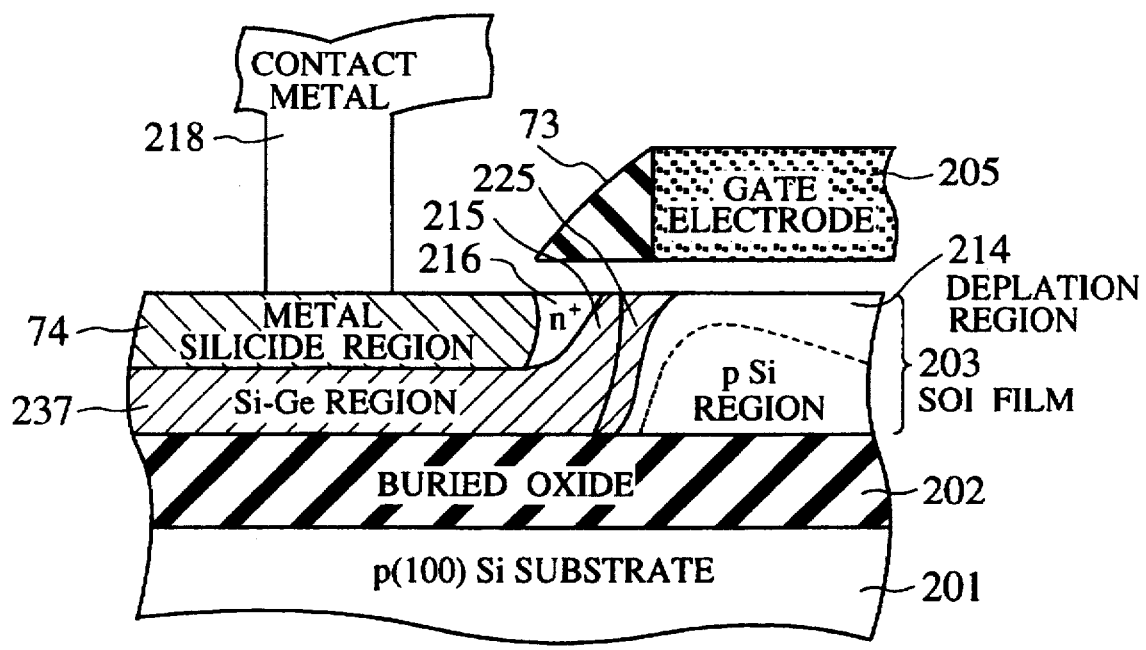
FIG. 21B is an enlarged sectional view showing a structure near an n⁺ source region of the SOLMOSEFT shown in FIG. 21A.

FIG. 21A shows a sectional structure of a SOLMOSEFT according to a eighth embodiment of the present invention. In FIG. 21A, a p-type SOI film 203 is formed on a buried oxide film 202, which is formed on a p-type (100) silicon substrate 201. The SOI film 203 is divided into plural silicon islands, and each island is surrounded by an isolation oxide film 4 formed by LOCOS technique etc., and an interior of each silicon island is used as an active region (device region). FIG. 21A shows a structure near the active region. An n⁺ source region 216 and an n⁺ drain region 226 are formed deeply in an inside of the active region so as to contact substantially their bottom portions with a buried oxide film 202. FIG. 21B is an enlarged sectional view showing a detailed structure near an $n^+$ source region 216 of the SOLMOSFET having the narrow-bandgap-source region as shown in FIG. 21A. An SiGe region 237 is formed in the $n^+$ source region 216 to extend into the channel region beyond a pn-junction interface (metallurgical junction) between the $n^+$ source region 216 and the p-type SOI layer 203, or the SOI body serving as the channel region. Similarly, an SiGe region 247 is formed in the drain region to extend into the channel region beyond a pn-junction interface between the $n^+$ drain region and the p-type channel region. However, in some cases, the SiGe region 247 in the drain side can be omitted. Refractory metal silicide layers 74 such as $TiSi_2$, $WSi_2$, or $MoSi_2$ are formed on the SiGe regions 237, 247. In addition, the gate electrode 205 formed of polysilicon etc. is formed on the channel region 203 between the $n^+$ source region 216 and the $n^+$ drain region 226 via the gate oxide film 204. Sidewall nitride films 73 are formed on both sides of the gate electrode 205. An $SiO_2$ film or a composite film of a $SiO_2$ film and a PSG film serving as an interlayer insulating film 8 is formed on the SOI layer including the gate electrode. Contact windows are opened in the interlayer insulating film 8. A source metal electrode 218 and a drain metal electrode 228 are formed on the refractory metal silicide layers 74. In FIGS. 21A and 21B, it is desired that the SiGe regions 237, 247 are formed to be directly connected to the refractory metal silicide layers 74, respectively. If they are directly connected, the drain voltage can be improved by about 0.3 V in contrast to a structure wherein the SiGe regions 237, 247 and the refractory metal silicide layers 74 are separately formed via the $n^+$ silicon regions 216, 226.

Figure 22:
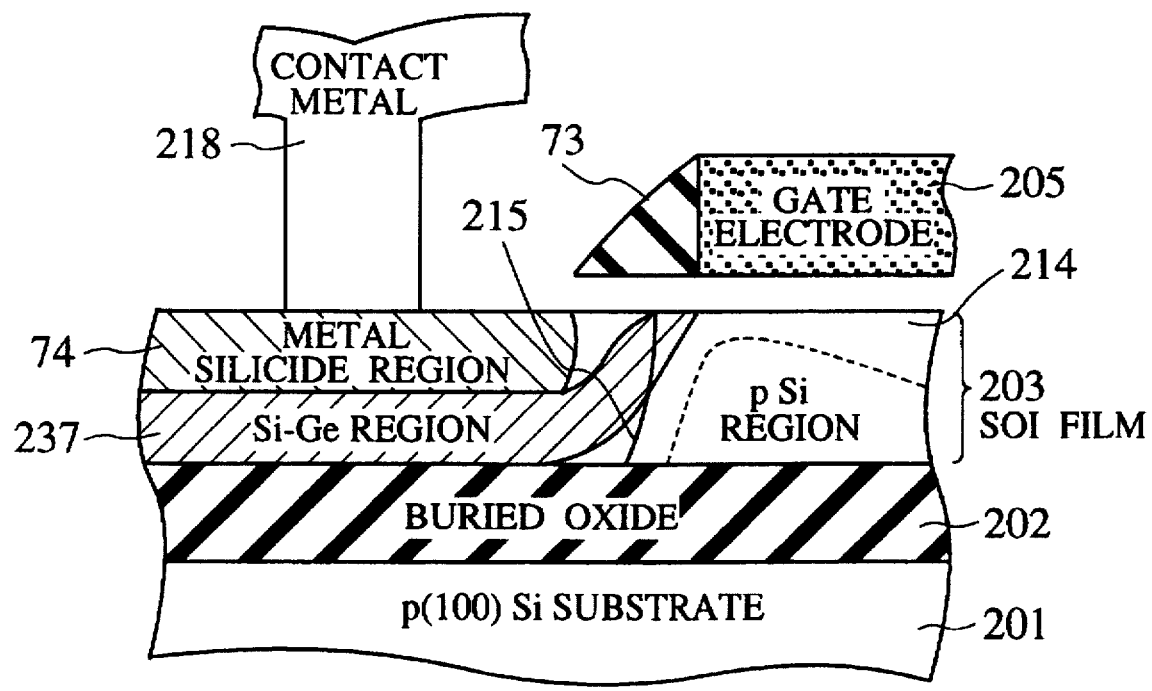
FIG. 22 is a sectional view showing a structure of the MOSFET according to a modification of the eighth embodiment of the present invention.

In the eighth embodiment of the present invention shown in FIGS. 21A and 21B, a SiGe/Si heterojunction interface 225 is formed in the location nearer to the channel region than that of pn junction interface 215 between the $n^+$ source region 216 and p-type SOI body 203, and is located within a depletion layer 214 extending from the pn-junction interface and gate oxide film. However, as shown in FIG. 22, the same advantage in FIGS. 21A and 21B can be derived from a structure wherein part of the SiGe/Si heterojunction interface is formed nearer to the channel region than a pn junction interface 215. In FIG. 22, to form the SiGe region 237, accelerating voltage Vac used for Ge ion implantation can be set slightly lower than that of FIGS. 21A and 21B, for example, it can be set at 80 kV.

Figure 23:
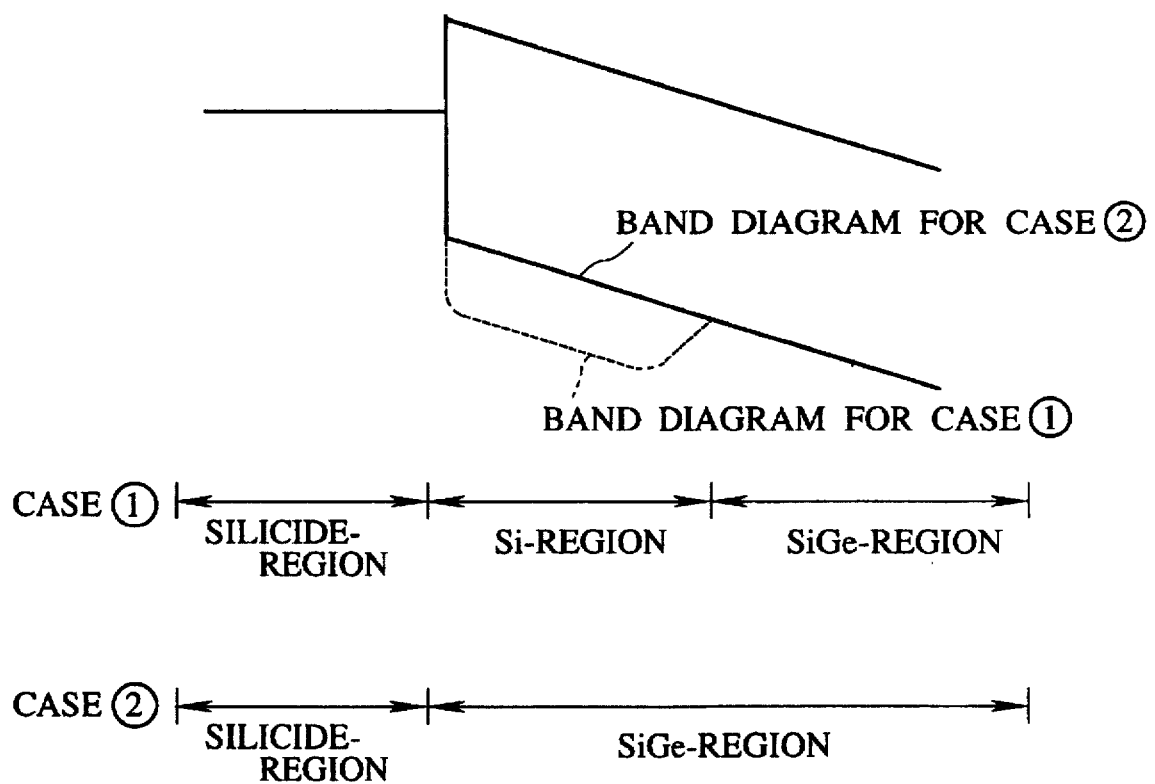
FIG. 23 is a view illustrating a comparison of a potential profile (band diagram) between SOI.MOSFETs wherein the $Si_xGe_{1-x}$ region is contacted to a silicide region directly and it is contacted to the silicide region via an Si region.

With the above, the heterojunction interface 225 between Si region and SiGe region 237 can be located in an inside of the depletion layer 214 in the channel region beyond metallurgical pn-junction interface 215. In this case, the similar potential profile of a SOLMOSFET shown in FIG. 20 and described in the seventh embodiment of the present invention can be achieved. Consequently, holes accumulated in the SOI body can be exhausted effectively into the narrow-bandgap-source region and high drain breakdown voltage can be realized. In the meanwhile, holes which are exhausted by the narrow-bandgap-source region, or the SiGe layer 237 flow further towards the source contact metal electrode 218. As a result of examinations tried by the inventors of the present invention using various structures, if the energy barrier against holes exists near the source contact metal electrodes, it has been found that improvement of the drain breakdown voltage is reduced. In other words, as shown by the broken line in FIG. 23, if the Si regions remain near the source contact metal electrodes, the energy barrier against holes may be formed so that holes cannot be exhausted immediately and effectively. If the SiGe region 237 is formed deeply in the depth direction of the SOI film 203 and the source contact metal electrode and the interfacial alloyed layer (metal-silicon alloyed interface) is formed shallowly on the surface of $n^+$ source region, such situation is caused since the contact metal electrode and the interfacial alloyed layer does not reach the SiGe region 237. Inventors of the present invention have found by repeated simulation analyses and experiments that, if the SiGe region 237 is directly contacted to the refractory metal silicide layers just under the source contact metal electrode portions as the structure of the eighth embodiment of the present invention, the potential profile shown by the solid line in FIG. 23 is accomplished and holes can be exhausted quickly and efficiently into the refractory metal silicide layers. It is preferable that the mole fraction of Ge is 1% or more, i.e., a concentration of Ge is $5\times10^{20}$ $cm^{-2}$ or more against Si in the SiGe regions 237, 247 shown in FIGS. 21 and 22. Instead of the SiGe region, SiSn region or mixed crystal of SiGeSn may be used.

A structure of the SOLMOSFET according to the eighth embodiment of the present invention will be manufactured by following manufacturing steps.

(a) First, the SOI structure is formed by so-called SIMOX technique using a p type (100) silicon substrate 201. That is, oxygen ions are implanted into the p type (100) silicon substrate 201 at accelerating voltage Vac=180 kV, and a dose $\Phi=2\times10^{18}$ $cm^{-2}$. Thereafter, the 400 nm thick buried oxide film 202 and 200 nm thick SOI film 203 on the buried oxide film 202 are formed by annealing the substrate 201 at 1300° C. for six hours. Thus, the SIMOX-SOI substrate is obtained.

(b) Then, the surface of the SOI film 203 is thermally oxidized to leave 100 nm thick unoxidized silicon film. The thickness of the SOI film 203 is adjusted to a thickness of 100 nm by wet-etching this thermal oxide film. Further, B or $BF_2$ ions are implanted to have a desired channel impurity concentration and then a device region is formed by LOCOS steps.

(c) Then, the MOSFET is fabricated by the standard MOSFET fabrication steps. Namely, after forming the 200~300 nm thick polysilicon gate electrode, a nitride film is formed on the polysilicon gate electrode and entire surface of SOI film by CVD. After that 300 nm width sidewall nitride films 73 are formed by anistropically etching the nitride film using RIE or the like. Then, using the polysilicon gate electrode 205 and the sidewall nitride films 73 as a mask, Ge ions are implanted at accelerating voltage Vac= 130 kV with a dose $\Phi=3\times10^{16}$ $cm^{-2}$, and thereafter As ions are implanted at accelerating voltage Vac=20 kV with a dose $\Phi=3\times10^{15}$ $cm^{-2}$. As shown in FIGS. 21A and 21B, part of Ge ions are implanted through the sidewall nitride films 73 while slightly changing their effective projected ranges $R_p$ in the SOI film 203. After this, annealing of a resultant structure is performed at 900° C. for 60 minutes. The Ge ions implanted through sidewall nitride films 73 are slightly diffused by this annealing process. And this annealing process forms $n^+$ source/drain regions 216, 226 and SiGe regions 237, 247. Hence, one part of the SiGe regions 237 is extended into the channel region beyond pn junction interface 215. And, another part of the SiGe regions 237 is formed deeply in the $n^+$ source region 216 so as to reach the buried oxide film 202 in the depth direction of the SOI film. As described above, if Ge ions are implanted at accelerating voltage Vac=80~100 kV, a structure wherein the limited part of the heterojunction interface 225 extends beyond pn junction interface 215 can be derived, as shown in FIG. 22.

(d) Then, Ti film and TiN film are respectively deposited by sputtering on an entire surface of the SOI film 203 to have thicknesses of 30 and 40 nm respectively. Otherwise, Ti film and TiN film may be deposited by EB evaporation or CVD. Refractory metal silicide films is formed by annealing at 800° C. on the surface of the SOI film 203. Then, unreacted Ti film and TiN film are removed by well known selective etching to thus remain Ti silicide (TiSi$_2$) layers 74 on the surfaces of the n$^+$ source and drain regions 216 and 226.

(e) Then, the interlayer insulating film 8 formed of SiO$_2$ film, composite film of SiO$_2$/PSG, or composite film of SiO$_2$/BPSG is formed by CVD etc. on a surface of the SOI film 203 so as to include the polysilicon gate electrode 205 therein. Then, contact holes are opened by photolithography in the interlayer insulating film 8. Finally, the source metal electrode 218 and the drain metal electrode 228 shown in FIG. 21A are formed by depositing a metal such as Al—Si, Al—Si—Cu, or the like by means of EB evaporation or sputtering and then patterning the metal by means of photolithography. As a result, the heterojunction SOLMOSFET of the eighth embodiment of the present invention having narrow-bandgap-source region can be completed.

(NINTH EMBODIMENT)

Figure 24A:
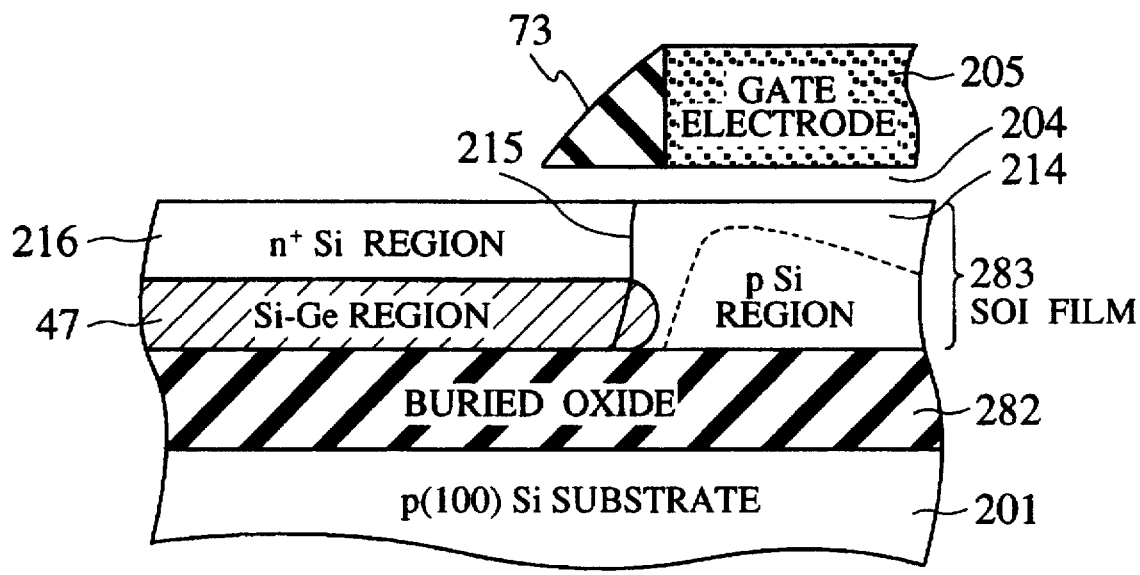
FIGS. 24A and 24B are sectional views each showing a structure near an n⁺ source region of a SOLMOSEFT according to a ninth embodiment of the present invention.
Figure 24B:
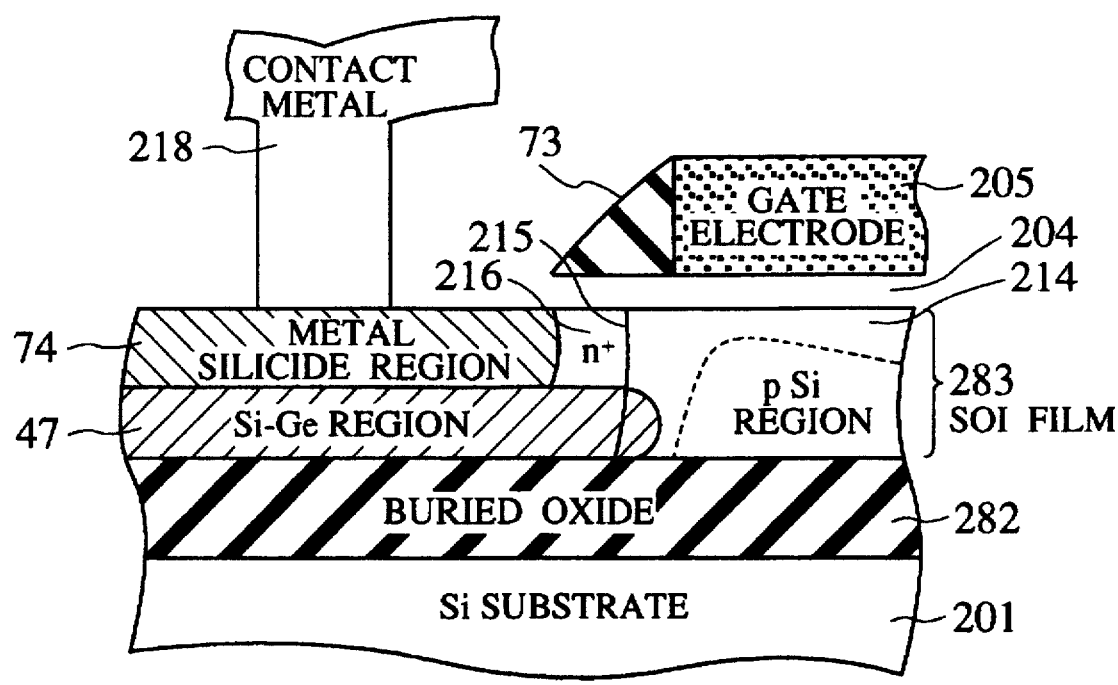

FIGS. 24A and 24B show a sectional structure near an n$^+$ source region of a SOLMOSFET according to a ninth embodiment of the present invention. In FIG. 24A, a p-type SOI film 283 is formed on a p-type (100) silicon substrate 201 via a buried oxide film 282. Although not shown in FIG. 24A, the SOI film 283 is surrounded by a device isolation oxide film, and an interior of the SOI film 283 surrounded by the isolation oxide film is used as an active region (device region). FIG. 24A only shows a structure near the source region of the active region. A structure of the ninth embodiment of the present invention is substantially similar to those of the third to fifth embodiments of the present invention. An n$^+$ source region 216 is formed deeply in an inside of the active region so as to contact substantially its bottom portion with a buried oxide film 282. In FIG. 24A, an SiGe region 47 is formed at the bottom of the n$^+$ source region 216 to contact to the buried oxide film 282.

The SiGe region 47 as a narrow-bandgap-source region is formed in the n$^+$ source region 216 so as to extend into the channel region beyond a pn-junction interface (metallurgical junction) 215 between the n$^+$ source region 216 and the p-type SOI film 283, or p-type SOI body serving as the channel region. Similarly, although not shown, the SiGe region 47 is formed in the drain region so as to extend into the channel region beyond a pn-junction interface between the n$^+$ drain region 226 and the p-type SOI body 283. But, the SiGe region 47 in the drain side can be omitted. In FIG. 24B, the refractory metal silicide region 74 such as WSi$_2$, MoSi$_2$, TiSi$_2$, PtSi$_2$, or the like is formed on the SiGe region 47. In addition, the gate electrode 205 formed of polysilicon etc. is formed on the channel region 283 between the n$^+$ source region 216 and the n$^+$ drain region (the drain region is not shown in FIG. 24B), via the gate oxide film 204. Sidewall nitride films 73 are formed on both sides of the gate electrode 205. An SiO$_2$ film, a composite film of SiO$_2$/PSG films, or the like serving as an interlayer insulating film 8, although not shown, is formed on the SOI layer 283 enveloping the gate electrode. A source metal electrode 218 is formed via contact holes opened in the interlayer insulating film 8. In FIG. 24B, only the source metal electrode 218 is shown, but the drain metal electrode 228 can be formed similarly. Although metal electrodes are omitted from FIG. 24A, it is of course that similar metal electrodes as those in the FIG. 24B have been formed.

With the above, the heterojunction interface between the Si region and the SiGe region 47 can be located in an inside of the depletion layer 214 in the channel region 283 beyond metallurgical pn-junction interface 215. By this structure, a similar potential profile of a SOLMOSEFT already shown in FIG. 20 can be achieved. As a result, holes can be exhausted effectively into the source electrode and high drain breakdown voltage such as 4.9 V can be realized.

In the above embodiment, although a case wherein the SOI structure is formed by SIMOX technique has been described, the SOI substrate can be formed silicon direct bonding technique (referred to as "SDB" technique hereinafter), epitaxial growth method, or the like other than SIMOX technique. The ninth embodiment of the present invention will be explained as being formed by SDB technique, but it is a matter of course that it can be formed by SIMOX technique.

Manufacturing steps of the heterojunction SOLMOSFET according to the ninth embodiment of the present invention having a narrow-bandgap-source region will be explained hereinafter.

(a) First, an SiO$_2$ film 282 having a thickness of 1 μm is formed by thermal oxidation or CVD on a surface of a p type silicon substrate 201 having predetermined surface orientation such as (100) plane. As the CVD, CVD using reaction between SiH$_4$ and N$_2$O may be used, or CVD using organic silicon source such as TEOS (Tetraaethylorthosilicate; Si(OC$_2$H$_5$)$_4$), HMDS (Hexamethyldisiloxane; Si$_2$O(CH$_3$)$_6$), OMCTS (Octamethylcyclotetrasiloxane; c(OSi(CH$_3$)$_2$)$_4$), or the like may also be used.

(b) Then, the substrate is annealed at 1200° C. for two hours in N$_2$ atmosphere. After this, with fixing a back surface of the p type silicon substrate 201 by an evacuation-supporting tool, the SiO$_2$ film 282 formed on a front surface of the p type silicon substrate 201 is polished by chemical mechanical polishing (CMP) technique, or the like to make a thickness of the SiO$_2$ film 282 0.3 μm and also to form a flat mirror surface of SiO$_2$ film 282. To the end, an SDB oxide film 282 serving as a buried oxide film for SOI structure is formed.

(c) Then, a p type silicon substrate 283 having a mirror polished surface is prepared. As shown in FIG. 24A, the mirror polisher surface of the SiO$_2$ film 283 on the p type silicon substrate 201 and the mirror polished surface of the p type silicon substrate 283 are bonded mutually. Then, a resultant structure is annealed to form an SDB substrate. At this time, annealing can be done by applying voltage. Then, a thickness of the p type silicon substrate 283 is adjusted by polishing to have a thickness of 200 nm.

(d) Then, the surface of the SOI film 283 formed by SDB technique is thermally oxidized to leave unoxidized 100 nm thick silicon layer. The SOI film 283 is thinned to a thickness of 100 nm by wet-etching this thermal oxide film.

(e) Then, the isolation oxide film is formed by LOCOS technique, BOX technique, or the like so as to electrically isolate adjacent devices. Further, if necessary, B or BF$_2$ ions are implanted into the surface of the SOI film 283 to have a desired channel impurity concentration. Thereafter, the gate oxide film 204 of a thickness of 10 nm is formed, and then a P-doped polysilicon film 205 with a thickness of 0.3 μm is formed thereon by LPCVD etc. Then, as shown in FIG. 24A, the gate polysilicon electrode 205 is defined on the gate oxide film 204 by patterning technology of photolithography step and RIE step. Subsequently, as shown in FIG. 24A, in order to form Si$_x$Ge$_{1-x}$ layers 47, Ge ions are implanted at accelerating voltage Vac=130 kV and a dose $\Phi = 3 \times 10^{16}$ cm$^{-2}$.

(f) Then, a nitride film is formed by CVD on an entire surface. Then, as shown in FIG. 24A, sidewall nitride films 73 with a width of 0.3 μm are formed by anisotropic etching having high directionality such as RIE. Then, As ions are implanted at accelerating voltage Vac=30 kV and a dose $\Phi=3\times10^{15}$ cm$^{-2}$. After this, a resultant structure is annealed at 850° C. for 30 minutes to form the n$^+$ source region 216. As a result, a structure shown in FIGS. 24A has been completed. A structure shown in FIG. 24B can be obtained if refractory metal silicide regions 74 are formed on SiGe region 47, which are obtained by depositing a refractory metal film such as Ti, Mo, W, Ta, or the like by means of CVD, sputtering or vacuum evaporation on the surface of n$^+$ source region 216, after the structure of FIG. 24A is completed.

(g) Then, although following steps are not shown, they are identical to metallization steps in standard MOSFET fabrication processes. More particularly, the interlayer insulating oxide film 8 is formed by CVD etc. on an entire surface of the SOI film 283 so as to have a thickness of 0.5 μm, for example. Then, a resist film is spin-coated thereon and patterned by photolithography. Thereafter, contact holes are opened by etching the oxide film 8 by means of RIE. Finally, the source metal electrode and the drain metal electrode are formed by metallization processes using a metal such as Al, Al—Si, Al—Si—Cu, or the like. As a result, the heterojunction SOLMOSFET of the ninth embodiment of the present invention having a narrow-bandgap-source region can be completed.

As another method using the SDB method, the p type silicon substrate 283 and another p type silicon substrate 201 may be bonded together to contact their surfaces via SDB buried oxide, embedding the CVD grown SiGe layer in silicon substrate 283. This another SDB-SOI structure with CVD-SiGe layer 47 can be formed as follows. That is, the SiGe layer is formed by CVD on a surface of a groove, the groove is formed on the p type silicon substrate 283, and the surfaces of SiGe layer and substrate are flattened to have the same plane embedding the SiGe layer in the substrate 283. After that, the surface of the SiGe layer 47 may be oxidized and then polished to have a mirror face. Then, an oxide film 282 is formed on the surface of another p type silicon substrate 201, and the surface of the oxide film 282 is mirror polished. With these preparations, the both mirror polished surfaces are bonded together at high temperatures to accomplish the SDB-SOI structure. According to this another method, a narrow bandgap semiconductor layer such as PbS, PbSe, SnTe, ZnSb, InSb, etc. can be formed readily by CVD etc. In place of the SiGe layer 47.

(TENTH EMBODIMENT)

Figure 25A:
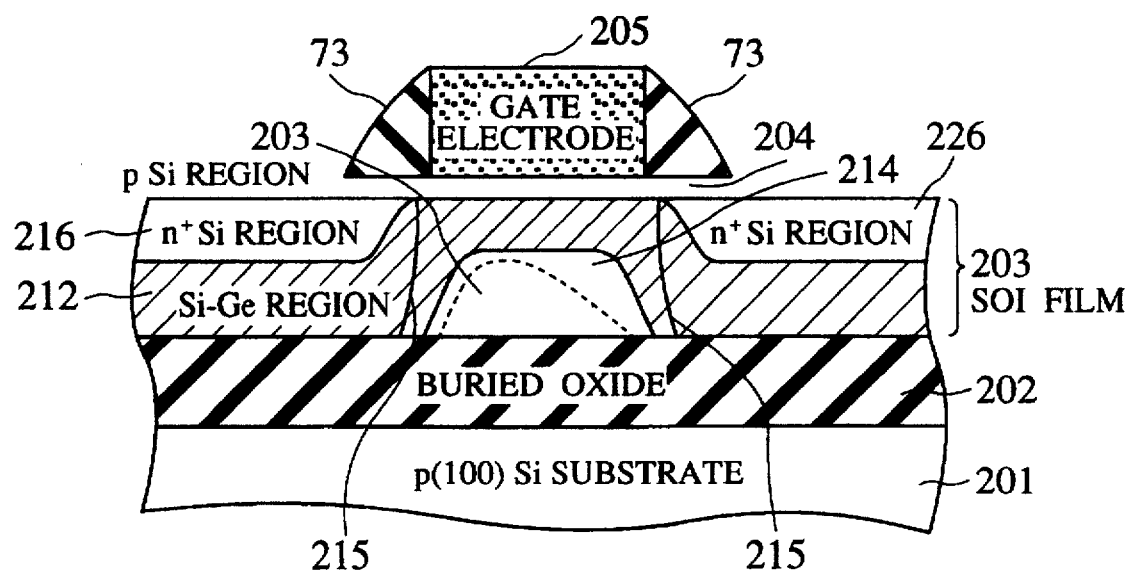
FIGS. 25A and 25B are sectional views each showing a structure near an n⁺ source region of a SOLMOSEFT according to a tenth embodiment of the present invention.
Figure 25B:
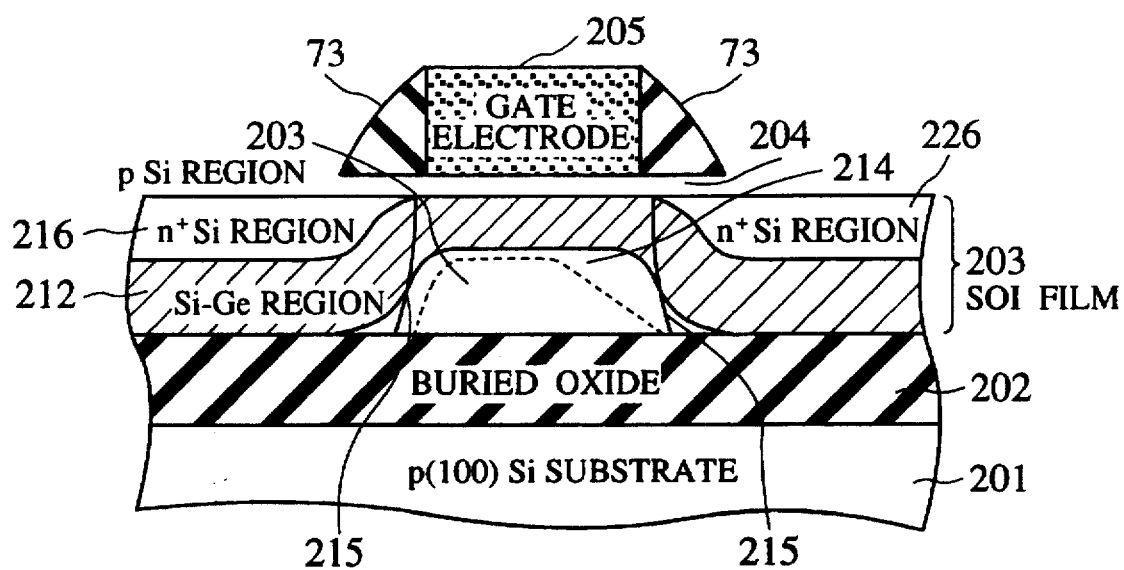

FIGS. 25A and 25B show a sectional structure a SOLMOSEFT according to a tenth embodiment of the present invention. In FIGS. 25A and 25B, a p-type SOI film 203 is formed on a p-type (100) silicon substrate 201 via a buried oxide film 202. Although not shown in FIGS. 25A and 25B, the SOI film 203 is surrounded by a device isolation oxide film, and an interior of the SOI film 203 surrounded by the isolation film is used as an active region (device region). FIGS. 25A and 25B only show a sectional structure near the active region. An n$^+$ source region 216 and an n$^+$ drain region 226 are formed deeply in an inside of the active region so as to contact substantially their bottom portions with a buried oxide film 202. SiGe regions 212 are formed at the bottom region of the n$^+$ source region 216 and the n$^+$ drain region 226. As this SiGe regions, the SiGe region 212 is formed not only in the source region but also is extended into the channel region beyond a pn-junction interface (metallurgical junction) 215 between the n$^+$ source region 216 and the p-type SOI layer 203, or p-type SOI body serving as the channel region. Similarly, the SiGe region 212 is formed in the drain region so as to extend into the channel region beyond a pn-junction interface between the n$^+$ drain region 226 and the p-type SOI body 203. Both SiGe regions 212 extended from the n$^+$ source region 216 and the n$^+$ drain region 226 are contacted together and continuously formed in the shallow surface side of the SOI body 203. In addition, the gate electrode 205 formed of polysilicon etc. is formed on the channel region (the SOI body) 203, in which the thin SiGe region 212 is formed, between the n$^+$ source region 216 and the n$^+$ drain region 226 via the gate oxide film 204. Sidewall nitride films 73 are formed on both sides of the gate electrode 205. Actually, although not shown, an SiO$_2$ film, a composite film of SiO$_2$/PSG films, a composite film of SiO$_2$/BPSG films, or the like serving as an interlayer insulating film is formed on the SOI layer 203 enveloping the gate electrode. Like the above embodiments, a source metal electrode and a drain metal electrode are formed via contact holes opened in the interlayer insulating film. In FIG. 25A, a case is shown wherein the pn junction interface 215 is fully contained in an inside of the SiGe region 212 whereas, in FIG. 25B, a case is shown wherein the belt-shaped SiGe region 212 traverses part of the pn junction interface 215. However, substantially identical characteristics of the device can be provided in both cases.

In FIGS. 25A and 25B, no metal silicide layer is shown in the source metal electrode contact portion. However, needless to say, it is important that the SiGe layer is formed to contact to the refractory metal silicide layer so that lower ohmic contact resistance R$_c$ can be established between the SiGe layer and the metal silicide layer. Therefore, in the tenth embodiment of the present invention, the SiGe layer can be formed in combination with formation of the metal silicide layer. In the tenth embodiment of the present invention, with forming the belt-shaped SiGe layer 212 to traverse the pn junction interface, the SiGe layer 212 is also formed continuously in the channel region just under the gate electrode 205. Since the carrier mobility μ$_n$, μ$_p$ in the SiGe layer 212 higher than that of in Silicon the transconductance g$_m$ of FET having SiGe channel region is high, and current driving capability can be increased. And the fact that hole mobility μ$_p$ in SiGe is higher than that of in Si improves the efficiency of the accumulated holes exhaustion from the SOI body 203, thereby improves the drain breakdown voltage. This improvement enables a high performance MOSFET having high drain breakdown voltage, high transconductance g$_m$ and high current driving capability to be proposed. It is needless to say that these improvements could be derived from a countermeasure for improving the drain breakdown voltage of FET by providing the narrow-bandgap-source structure in the present invention. Therefore, according to the tenth embodiment of the present invention, high transconductance conductance g$_m$ as well as high drain breakdown voltage, both could not be achieved simultaneously by the prior art heterojunction SOLMOSFET or the conventional homogeneous junction SOLMOSFET, can be obtained readily. Thus, the intrinsic high performance of the SOI device can be extracted.

Manufacturing steps of the heterojunction SOLMOSFET according to the tenth embodiment of the present invention will be explained hereinbelow.

(a) First, as in the above embodiments, the SOI film 203 having a thickness of 130 nm is formed by SIMOX technique or SDB technique on a buried oxide film 202, which is formed on a p-type (100) silicon substrate.

(b) Then, the device isolation oxide film is formed by LOCOS technique, BOX technique, or the like so as to laterally isolate adjacent devices. Thereafter, the gate oxide film 204 of a thickness of 10 nm is formed, and then a P-doped polysilicon film 205 with a thickness of 130 nm is formed thereon by LPCVD or the like. Then, as shown in FIGS. 25A and 25B, the gate polysilicon electrode 205 is formed on the gate oxide film 204 by photolithography step with RIE step. Subsequently, a nitride film of 150 to 200 μm is formed by CVD. Then, as shown in FIGS. 25A and 25B, the sidewall nitride films 73 are formed by anisotropic etching having high directionality such as RIE or the like.

(c) Using the gate polysilicon electrode 205 and the sidewall nitride films 73 as a mask, Ge ions are implanted to form $Si_xGe_{1-x}$ layers 47, and As ions are implanted to form the n⁺ source and drain regions 216 and 226. At this time, if a film thickness of the gate polysilicon electrode 205, accelerating voltage Vac of Ge ions and a film thickness of the SOI film 203 are selected suitably, part of the SiGe regions 212 can be formed deeply into the n⁺ source and drain regions 216 and 226 to contact the buried oxide film 202. At the same time, another part of the SiGe region can be formed in the shallow surface side of the SOI film 203 near the boundary between the gate oxide film 204 and the channel region. In the tenth embodiment of the present invention, since a film thickness of the SOI film is set to be 130 nm, a thickness of the polysilicon gate electrode 205 is set to be 180 nm, the Ge ions are implanted at accelerating voltage Vac=180 kV with a dose $\Phi=5\times10^{16}$ cm⁻². As ions are implanted at accelerating voltage Vac=20 kV with a dose $\Phi=2\times10^{15}$ cm⁻². After this, a resultant structure is annealed at 850° C. for 30 minutes to form the n⁺ source and drain regions 216, 226 and belt-shaped SiGe region 212. As shown in FIG. 25B, in order to form the relatively narrow belt-shaped SiGe regions 212 to traverse upper part of the pn junction interface 215, accelerating voltage Vac=110 kV and a dose $\Phi=3\times10^{16}$ cm⁻² of Ge ion implantation may be selected.

(d) Then, an oxide film for the interlayer insulating layer 8 is formed by CVD etc. on an entire surface of the SOI film 283 to have a thickness of 0.5 μm, for example. Then, a resist film is spin-coated thereon and patterned by photolithography, and contact holes are opened by etching the oxide film by means of RIE. Subsequent to etching of the oxide film, the source metal electrode and the drain metal electrode are formed by metallization processes using a metal such as Al, Al—Si, Al—Si—Cu, or the like. As a result, the heterojunction SOI.MOSFET of the tenth embodiment of the present invention can be completed.

The SiGe regions 212 may be formed by MBE or CVD other than ion implantation. By implanting Sn ions into the silicon instead of Ge ions, same objects of the present invention can be attained in the tenth embodiment as well as the above embodiments of the present invention. Further, it is effective to implant both Ge and Sn ions into the silicon.

In the tenth embodiment of the present invention, the SiGe regions 212 are formed in the n⁺ source region on relatively deep location. However, if the SiGe regions 212 are formed shallowly, advantages of the present invention can be obtained similarly. As described in advance, the metal silicide layer may be formed in the source contact portion. In addition, as a material used for forming the metal silicide, a refractory metal such as Ti, Mo, W, Ni, Ta, or Pt may be used. A SALICIDE (Self-aligned silicide) technology may be used to form simultaneously the silicide on the gate electrode 205 in a self-alignment manner.

In FIGS. 25A and 25B, the belt-shaped SiGe regions 212 exist over an entire surface of the channel beyond pn junction interface 215 on the source side, and further exist continuously up to the drain side. However, this is a mere example of structure owing to the simplified manufacturing steps and therefore does not effect desired improvement of device characteristics at all. As another example, the formation of the SiGe region in the n⁺ drain region 226 may be prevented by masking a certain area on the n⁺ drain region 226 by the photoresist when ion implantation is performed, although the manufacturing steps become a little complicated.

(ELEVENTH EMBODIMENT)

Figure 26A:
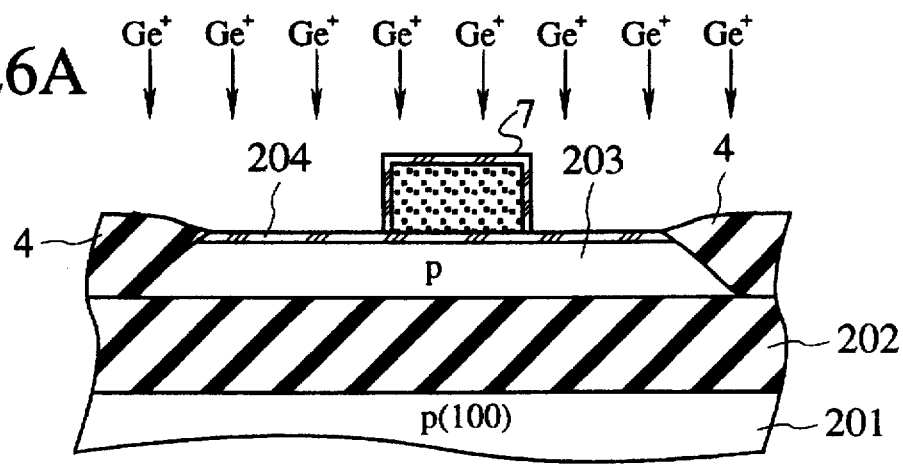
FIGS. 26A to 26D are sectional views each showing manufacturing steps of the SOI.MOSEFT according to an eleventh embodiment of the present invention.
Figure 26B:
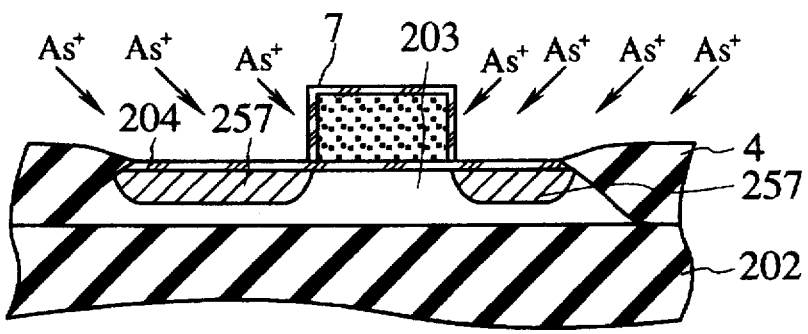
Figure 26C:
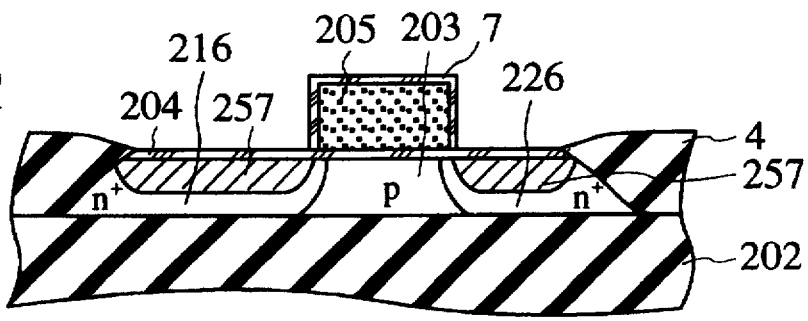
Figure 26D:
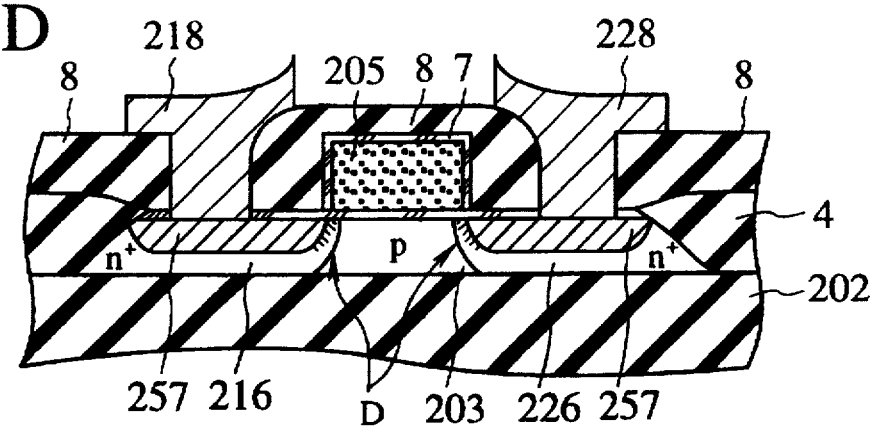

FIG. 26D shows a sectional structure of a SOLMOSFET according to an eleventh embodiment of the present invention. In FIG. 26D, a p-type SOI film 203 is formed on a p-type (100) silicon substrate 201 via a buried oxide film 202. The SOI film 203 is surrounded by an isolation oxide film 4 formed by LOCOS technique etc., and an interior of the SOI film 203 surrounded by the isolation oxide film 4 is used as an active region (device region). FIG. 26D only show a sectional structure near the active region. An n⁺ source region 216 and an n⁺ drain region 226 are formed deeply in an inside of the active region so as to contact substantially their bottom portions with a buried oxide film 202. Relatively shallow SiGe regions 257 are formed in insides of the n⁺ source region 216 and the n⁺ drain region 226. A source metal electrode 218 and a drain metal electrode 228 are formed to contact to the SiGe regions 257 via contact holes opened in the interlayer insulating film 8. In addition, the gate electrode 205 formed of polysilicon etc. is formed on the channel region 203 between the n⁺ source region 216 and the n⁺ drain region 226 via the gate oxide film 204. The structure of the MOSFET of the eleventh embodiment of the present invention shown in FIG. 26D resembles the structure of the first embodiment of the present invention. However, in FIG. 8, the impurity element such as Phosphorus (P), having a smaller covalent radius than that of Si have been used as the n⁺ impurity in the n⁺ source and drain regions 216, 226 to compensate the lattice mismatch in SiGe/Si heterojunction or SiSn/Si heterojunction caused by Ge or Sn, having a larger covalent radius than that of Si whereas, in FIG. 26D, the lattice mismatch compensation, or the covalent radius of the n type impurity included in the SiGe layers 257 is not considered particularly. In other words, in the first embodiment of the present invention, by taking sizes of covalent radius of impurity and the impurity sites in crystal lattice into consideration, the distortion in crystal lattice, which is caused when the narrow-bandgap-semiconductor regions 217, 227 having a larger covalent radius are formed in Si, is compensated or relaxed. On the other hand, in the eleventh embodiment of the present invention, even if crystal defects are generated by distortion because of lattice mismatching, the crystal defects D can be fully confined within the n⁺ source and drain regions 216, 226, as shown in FIG. 26D, not to affect the generation-recombination current in depletion layer in the channel region.

As has already been explained in the prior art with reference to FIG. 7, crystal defects D in the heterojunction SOLMOSFET are generated so as to traverse pn junction interface 215 in the n⁺ source and drain regions. If the (100) substrate is used, the crystal defects tend to generate along the {111} planes. It has been found from detailed examinations of crystal defects by the inventors of the present invention that such crystal defects generated along the {111} planes are plane defects such as stacking faults or twinning defects. It could be made apparent by inventors' study that the conditions for generating the crystal defects depend on a Ge dose and an annealing temperature after ion implantation. In other words, according to inventors' experiments, the generation locations of defects are confined in the location just under the gate electrode edges.

As a result of further analysis by the inventors of the present invention, it has been found that crystal defects in the heterojunction SOLMOSFETs are classified into three categories. That is, (a) misfit dislocations caused by the lattice mismatching in the SiGe/Si heterojunction;

(b) secondary defects caused by the ion-implantation damages; and (c) twinning defects generated in the course of recrystallization process of the amorphous silicon, which is formed by the ion-implantation damages. It has been known that such crystal defects form deep levels in bandgap. It seems that junction leakage current is increased since the crystal defects can serve as generation-recombination centers. In the above-mentioned three kinds of crystal defects, the misfit-dislocations and the secondary defects are controlled by the structures as shown in FIG. 26D, wherein the crystal defects D are generated only in the $n^+$ source and drain regions 216, 226 not to overlap the depletion layer of pn junction and the crystal defects D each other. However, as to the twinning defects, much attention must be paid not to generate such defects, since twinning defects are generated in the entire region of $n^+$ source/drain region. As a result, junction leakage current can be reduced.

Moreover, in the eleventh embodiment of the present invention, it is important that the regions in which the crystal defect D are generated must be formed not to thrust through the pn junction interface. This is because, as shown in FIG. 26D, the crystal defects D cannot be fully included in the $n^+$ source and drain regions 216, 226 if the crystal defects D thrust through the pn junction interface. By forming a structure wherein, as shown in FIG. 26D, the crystal defects D are collected in the gate edge portions not to reach the pn junction interface, leakage current can be extremely reduced below measuring limit shown in FIG. 5B in the heterojunction SOLMOSFET according to the eleventh embodiment of the present invention.

The heterojunction SOLMOSEFT according to the eleventh embodiment of the present invention will be manufactured by manufacturing steps described hereinbelow.

(a) First, like the above embodiments, the SOI structure is formed by SIMOX technique or SDB technique, having a SOI film 203 on the buried oxide film 202, which are formed on a p (100) substrate 201. Similarly to the above embodiments, a thickness of the SOI film 03 is adjusted to have a predetermined thickness of 100 nm, for example.

(b) Then, as shown in FIG. 26A, the device isolation oxide film is formed by LOCOS, BOX, or the like technique so as to laterally isolate adjacent devices. FIG. 26A shows a case wherein LOCOS technique is employed. Thereafter, the gate oxide film 204 of a thickness of 10 nm is formed, and then a P-doped polysilicon film 205 with a thickness of 0.3 μm is formed thereon by LPCVD or the like. Then, as shown in FIG. 26A, the gate polysilicon electrode 205 having a gate length of 0.5 μm is formed on the gate oxide film 204 by photolithography step and RIE step.

(c) Then, a post oxide film 7 is formed to have a depth of 10 nm. Then, as shown in FIG. 26A, $Ge^+$ ions are implanted at accelerating voltage Vac=50 kV and a dose $\Phi=1\times10^{16}$ $cm^{-2}$ to form the SiGe regions 257.

(d) Next, as shown in FIG. 26B, $As^+$ ions are implanted by means of rotational oblique ion implantationt at implantation angle of 45° C. and at accelerating voltage Vac=20 kV and a dose $\Phi=2\times10^{15}$ $cm^{-2}$.

After this ion implantation, a resultant structure is annealed at 950° C. for 30 minutes to activate implanted As ions and the like. As shown in FIG. 26C, the $n^+$ source and drain regions 216, 226 are formed to include the SiGe regions 257. The crystal defects D can be confined within the $n^+$ source and drain regions 216 and 226 by the rotational oblique ion implantation. In other words, since there exists no crystal defect in the depletion layer extending from the $n^+$ drain region 226 and gate oxide into the p type SOI film 203 serving as the channel region, the junction leakage current becomes difficult to flow. As described above, it is important that annealing must be conducted at a temperature within a range of 700° C. to 1000° C. after ion implantation.

(e) Thereafter, as shown in FIG. 26D, an oxide film 8 for the interlayer insulating film is formed by CVD etc. on an entire surface of the SOI film 203 to have a thickness of 0.5 μm, for example. Then, a resist film is spin-coated thereon and patterned by photolithography, and contact holes are opened by etching the oxide film by means of RIE. Subsequent to etching of the oxide film 8, as shown in FIG. 26D, the source metal electrode 218 and the drain metal electrode 228 are formed by metallization processes using a metal such as Al, Al—Si, Al—Si—Cu, or the like. As a result, the heterojunction SOLMOSFET of the eleventh embodiment of the present invention can be completed.

In the eleventh embodiment of the present invention, it is important that single crystal regions of the SOI film 203, which are not damaged and not changed into an amorphous silicon by ion implantation, remain near boundary between the buried oxide film 202 and the $n^+$ source or drain regions 216 or 226. As a result, since the recrystallization process proceeds in the vertical direction by annealing step without generating the twinning defects, no crystal defect exists in the $n^+$ source and drain regions 216 and 226. Therefore, the minute misfit dislocations and the secondary defects are gathered just beneath the gate electrode edges 205.

A thin film SOLMOSFET capable of achieving a fully depleted MOSFET is shown in the eleventh embodiment of the present invention. In the case of the SOI film thickness of 100 nm, Ge ions may be implanted at accelerating voltage Vac=50 kV and a dose $\Phi=1\times10^{16}$ $cm^{-2}$.

At this time, amorphous region generated by ion implantation is formed up to a depth of about 83 μm from the surface of the SOI film. Therefore, the region which is not changed into an amorphous state remains as it is near the boundary of the buried oxide film 202 to have about 17 nm. Further, by performing annealing step at 700° C. or more, preferably either 850° C. for 120 minutes or 900° C. for 30 minutes, solid phase growth of the silicon, or the recrystallization of silicon is caused from Si single crystal region remaining in the bottom of SOI film 203 to the damaged amorphous region. Consequently, the damaged $n^+$ source region 216 becomes single crystal silicon, except for the region just under the gate electrode edges. Thus, the generated crystal defects are confined restrictedly in the portion of SOI film 203 just under the gate electrode edge. The recrystallization process and the control of the crystal defects have good reproducibility.

In the heterojunction SOLMOSFET of the eleventh embodiment of the present invention completed as described above, the increase of resistivity in the $n^+$ source region, the leakage current from the gate oxide film etc., all being caused by the crystal defects observed in the prior art heterojunction IG devices, have not been found. In addition, the drain breakdown voltage remained as high as the value of the prior art heterojunction IG devices.

In case a film thickness of the SOI film 203 is set to be 200 nm upon forming the above SOI film substrate, $Ge^+$ ions are implanted at accelerating voltage Vac=50 kV and a dose $\Phi=1\times10^{16} cm^{-2}$ and $As^+$ ions are implanted at accelerating voltage Vac=35 kV and a dose $\Phi=3\times10^{15} cm^{-2}$. In the case, non-amorphous regions of about 120 nm in thickness remain in the bottom side of SOI film 203 according to the above ion implantation conditions. And, by subsequent heating steps and annealing step performed at 850° C. for 120 minutes, the damaged amorphous region can be changed into single crystal regions, or grown in solid phase, and the crystal defects are confined in the $n^+$ source region. As a result, good crystal property can be derived. In this case, owing to the fact that position and direction of the crystal defects D generated are confined in the region just under the gate electrode edges, electric property of the device is not influenced by the defects D at all.

Figure 27:
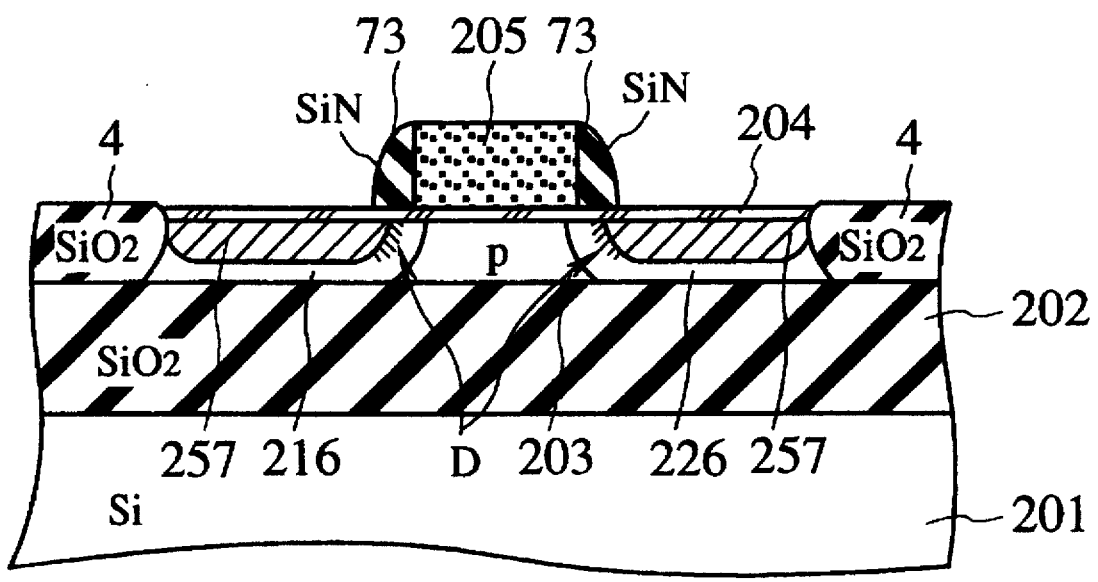
FIG. 27 is a sectional view showing a structure according to a modification of the eleventh embodiment of the present invention, wherein ion implantation is executed by employing a side wall nitride film as an implantation mask.

The device can also be manufactured as follows. That is, after the same manufacturing steps as above described steps (a) and (b) are performed, the post oxide film 7 is formed. Then, $P^+$ ions are implanted at accelerating voltage Vac=20 kV and a dose $\Phi=3\times10^{13} cm^{-2}$ to form $n^-$ source and drain. Subsequently, the nitride film 73 of 15 to 40 nm in thickness is formed by CVD on an entire surface, and then the sidewall nitride films 73 are formed by anisotropic etching having high directionality such as RIE, as shown in FIG. 27. Using the sidewall nitride films 73 and the polysilicon gate electrode 205 as a mask, $Ge^+$ ions are implanted at Vac=50 kV with a dose $\Phi=1\times10^{16} cm^{-2}$ and $P^+$ (or $As^+$) ions are implanted at accelerating voltage Vac=20 kV and a dose $\Phi=3\times10^{15} cm^{-2}$. Then, annealing may be performed at 850° C. for 120 minutes. Hence, locations of the crystal defects D caused by Ge ion implantation can be controlled by the similar structure as the LDD structure shown in FIGS. 16C and 17B employ the sidewall nitride films 73 formed on both sides of the gate electrode. In other words, the location of the crystal defects D can be shifted from the location right beneath the polysilicon gate electrode edge 205 to the location far from the gate electrode edge.

In the device shown in FIG. 27 in which ions are implanted via the sidewall nitride films 73, although the drain breakdown voltage is comparable with or somewhat lower than that of the prior art structure shown in FIG. 4A wherein Ge and As ions are implanted in the n+ source region 216, leakage current can be improved remarkably, like the above embodiments.

In the eleventh embodiment of the present invention, a thickness of the SOI film 203 may be formed thicker. For example, the SOI film 203 may have a thickness of 400 nm. In this case, a dose amount of Ge ion may be increased to $\Phi=1\times10^{17} cm^{-2}$ so as to form SiGe layers, which are enveloped by the bottoms of the $n^+$ source and drain regions 216 and 226. If the SOI film 203 is formed thick, nonamorphous region having a sufficient thickness exists near the buried oxide film 202 in the SOI film 203. Therefore, such non-amorphous region is enoughly available after recrystallization of the damaged region by annealing step, and the twinning defects are not generated.

In the eleventh embodiment of the present invention, like the above described embodiments (first to tenth embodiments), Sn ions may be implanted in place of Ge at accelerating voltage Vac=110 kV and a dose $\Phi=2\times10^{16} cm^{-2}$ and then annealing may be performed at 850° C. for 30 minutes. In this case, in contrast to the prior art method wherein Ge and As ions are implanted in the source diffusion layer, the drain breakdown voltage has been improved by 1.5 V. But, statistical leakage current shown in 5B has not been found. In the case of the thick SOI substrate using the SOI film 203 having a thickness of 200 to 400 nm, the drain breakdown voltage can be improved significantly if a dose amount of Sn ion is set within a range of $\Phi=1\times10^{16} cm^{-2}$ to $1\times10^{17} cm^{-2}$. However, in the case of Sn, the number of crystal defects are increased slightly in contrast to Ge since lattice mismatching between Si and Sn is larger than the lattice mismatching between Si and Ge. In view of this respect, in the eleventh embodiment of the present invention, a semiconductor such as PbS, PbSe, PbTe, SnTe, ZnSb, InSb, InAs, etc., which has narrower bandgap than that of Si to create larger lattice mismatching may be used. Otherwise, mixed crystal of Si and these narrow bandgap semiconductors may be used. This is because, in the case of the above large lattice mismatching, locations and directions of the crystal defects can be controlled.

In the eleventh embodiment of the present invention described above, heating step must be performed at a temperature enabling at least the recrystallization, i.e., at least 600° C. or more. On the contrary, heat process time may be determined with considering the diffusion depth and the recrystallization. For example, annealing may be performed at 1000° C. for 60 minutes.

(TWELFTH EMBODIMENT)

Figure 28A:
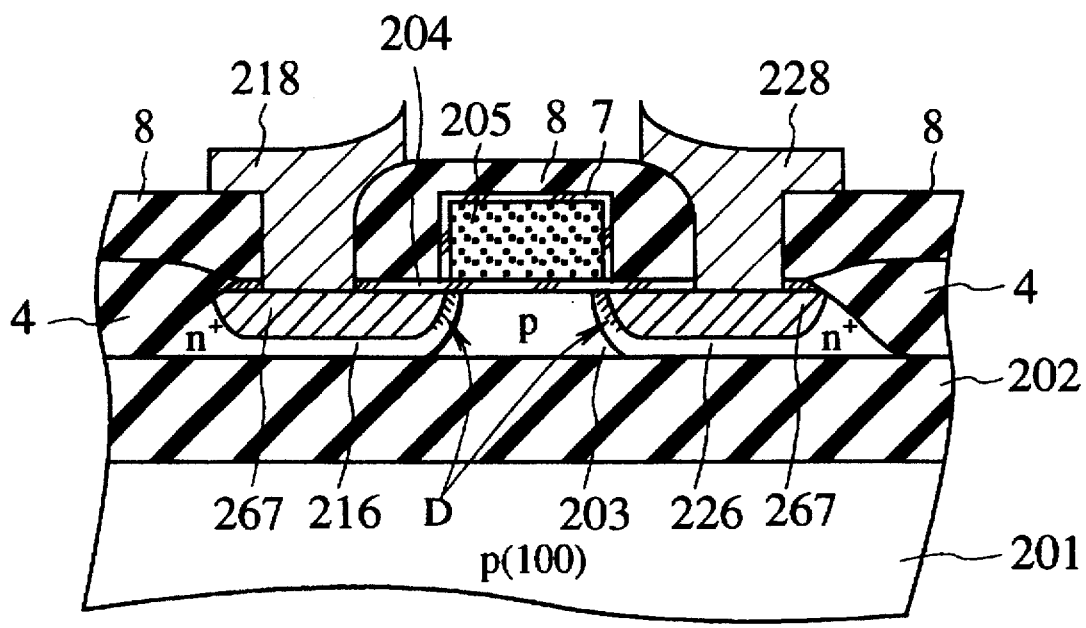
FIGS. 28A and 28B are sectional views each showing a structure of a SOLMOSEFT according to a twelfth embodiment of the present invention.
Figure 28B:
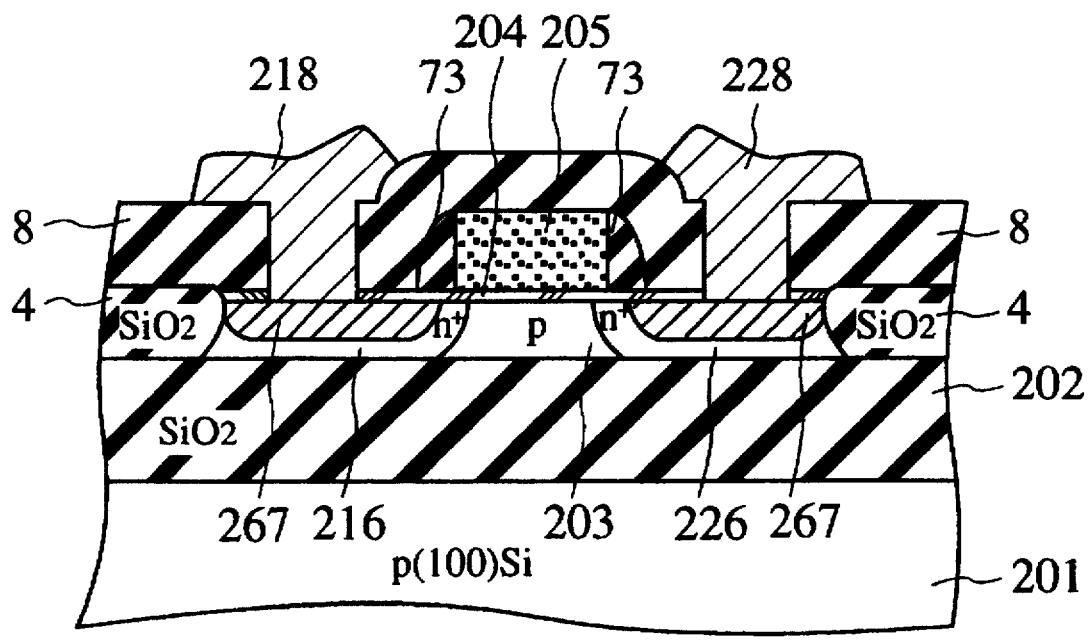

FIGS. 28A and 28B show a sectional structure of a SOI.MOSFET according to a twelfth embodiment of the present invention. In FIGS. 28A and 28B, a p-type SOI film 203 is formed on a p-type (100) silicon substrate 201 via a buried oxide film 202. The SOI film 203 is surrounded by an isolation oxide film 4 formed by LOCOS technique etc., and an interior of the SOI film 203 surrounded by the isolation oxide film 4 is used as an active region (device region). FIGS. 28A and 28B only show a sectional structure near the active region. An $n^+$ source region 216 and an $n^+$ drain region 226 are formed deeply in an inside of the active region so as to contact substantially their bottom portions with a buried oxide film 202. $Si_xGe_{1-x}$ regions 267 are formed in the $n^+$ source region 216 and the $n^+$ drain region 226. A peak mole fraction of Ge in the $Si_xGe_{1-x}$ regions 267 is adjusted within a range of 1% to 30%. That is, the $Si_xGe_{1-x}$ regions 267 can be within a range of $Si_{0.99}Ge_{0.01}$ to $Si_{0.70}Ge_{0.30}$. A source metal electrode 218 and a drain metal electrode 228 are formed to contact to the $Si_xGe_{1-x}$ regions 267 via contact holes opened in the interlayer insulating film 8. In addition, the gate electrode 205 formed of polysilicon etc. is formed on the channel region 203 between the $n^+$ source region 216 and the $n^+$ drain region 226 via the gate oxide film 204. FIG. 28B shows a case wherein sidewall nitride films 73 are formed on both sides of the gate electrode 205, and remaining portions in FIG. 28B are the same as those of FIG. 28A. The $Si_xGe_{1-x}$ regions 267 can be confined fully and firmly in the $n^+$ source region 216 and the $n^+$ drain region 226 by implanting the Ge ions using the sidewall nitride films 73 as masks. In the above eleventh embodiment of the present invention, locations and directions of the crystal defects D have been controlled. Thus, it can be seen in a sense that the crystal defects D are positively generated, but it is of course that no crystal defect is desired. On the other hand, in the twelfth embodiment of the present invention, the generation of the crystal defects can be prevented by controlling the mole fraction of Ge in the $Si_xGe_{1-x}$ regions 267 although it being almost same as the SOI.MOSFET in the eleventh embodiment. Since the $Si_xGe_{1-x}$ regions 267 is an example of the semiconductor region having a narrower bandgap than that of Si, an $Si_xSn_{1-x}$ region may be used instead of the $Si_xGe_{1-x}$ regions 267. Further, a narrow-bandgap-semiconductor having a narrower bandgap than that of Si such as PbS, PbTe, GaSb, InAs, etc. may be used instead of the $Si_xGe_{1-x}$ regions 267. In addition, mixed crystal of Si and these semiconductors may be used for the narrow-bandgap-source region.

Figure 4B:
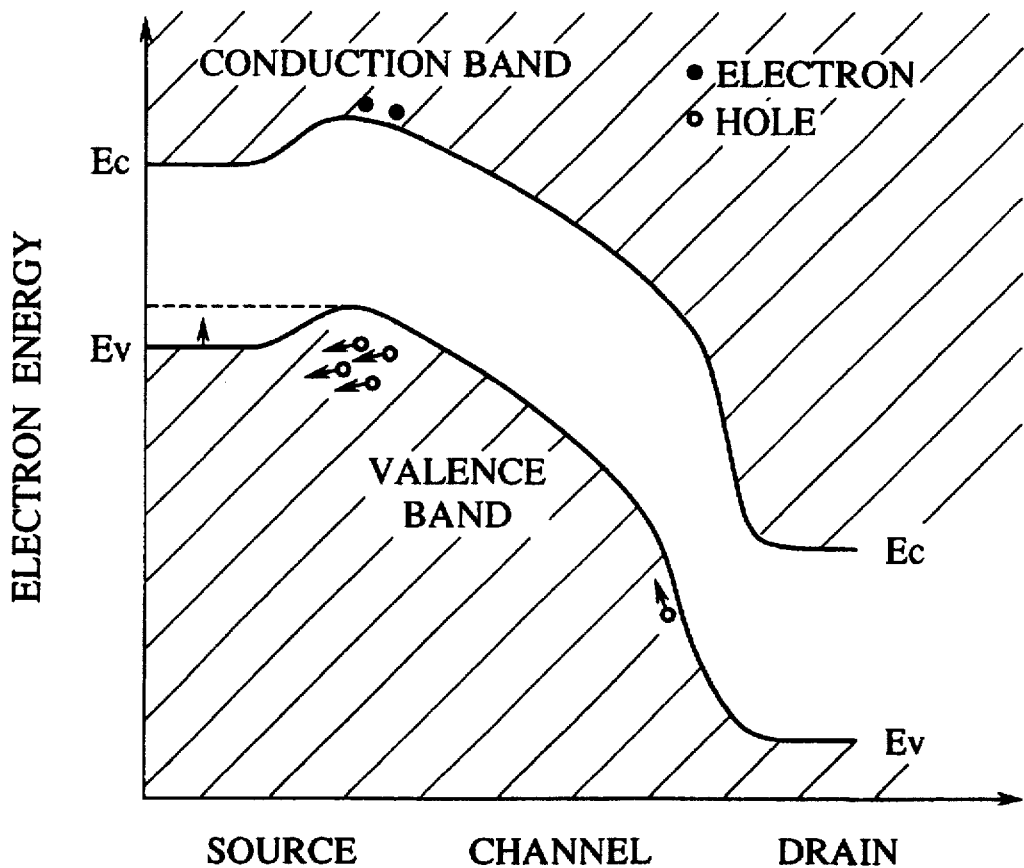
FIG. 4B is a view showing a potential profile (band diagram) of the heterojunction-SOI.MOSEFT in FIG. 4A.
Figure 29A:
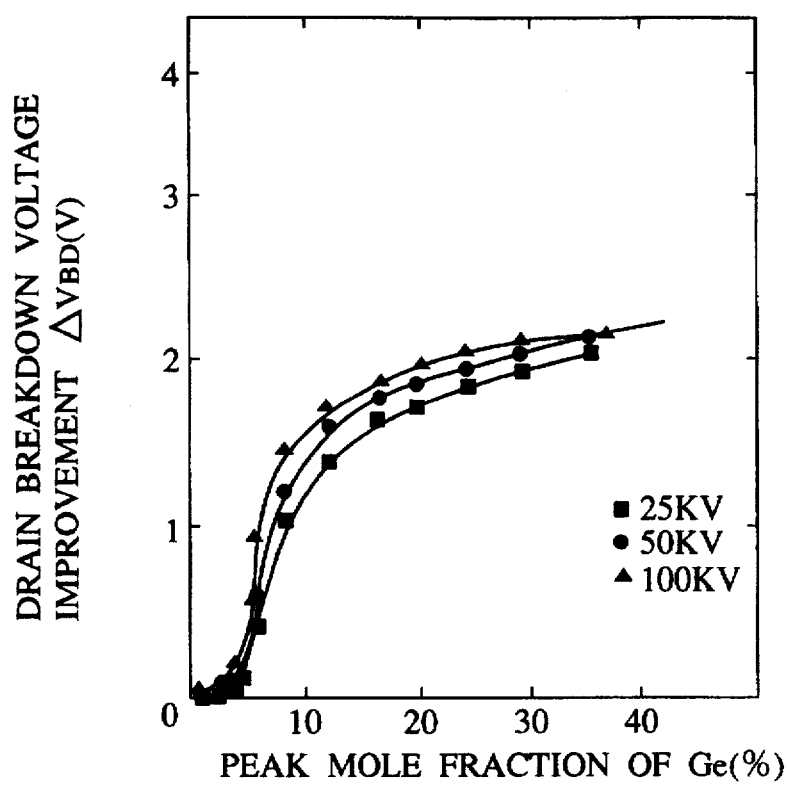
FIG. 29A is a view illustrating a relationship between a peak mole fraction of Ge in the $Si_xGe_{1-x}$ region and improvement of drain breakdown voltage.
Figure 29B:
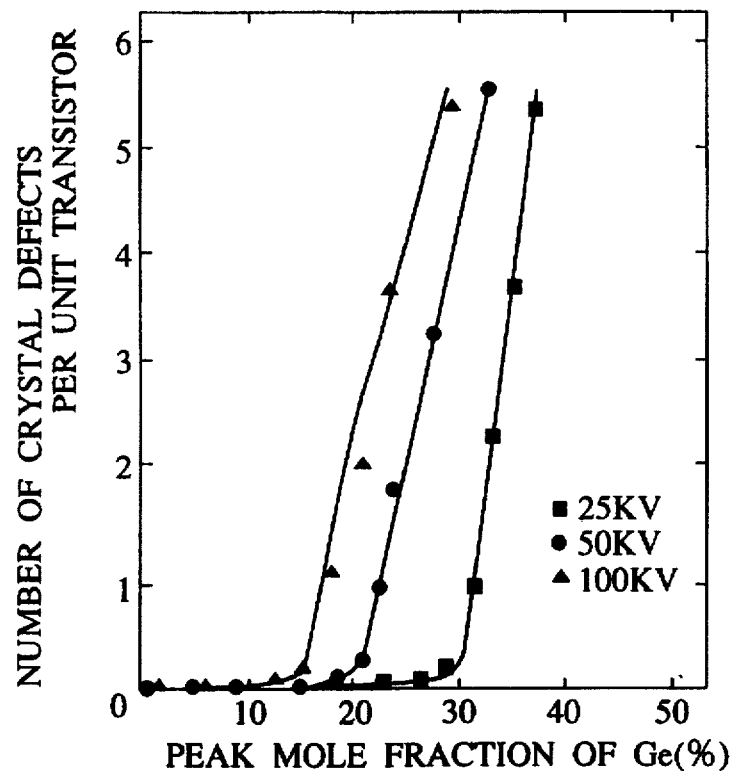
FIG. 29B is a view illustrating a relationship between a peak mole fraction of Ge and the number of defects generated.
Figure 29C:
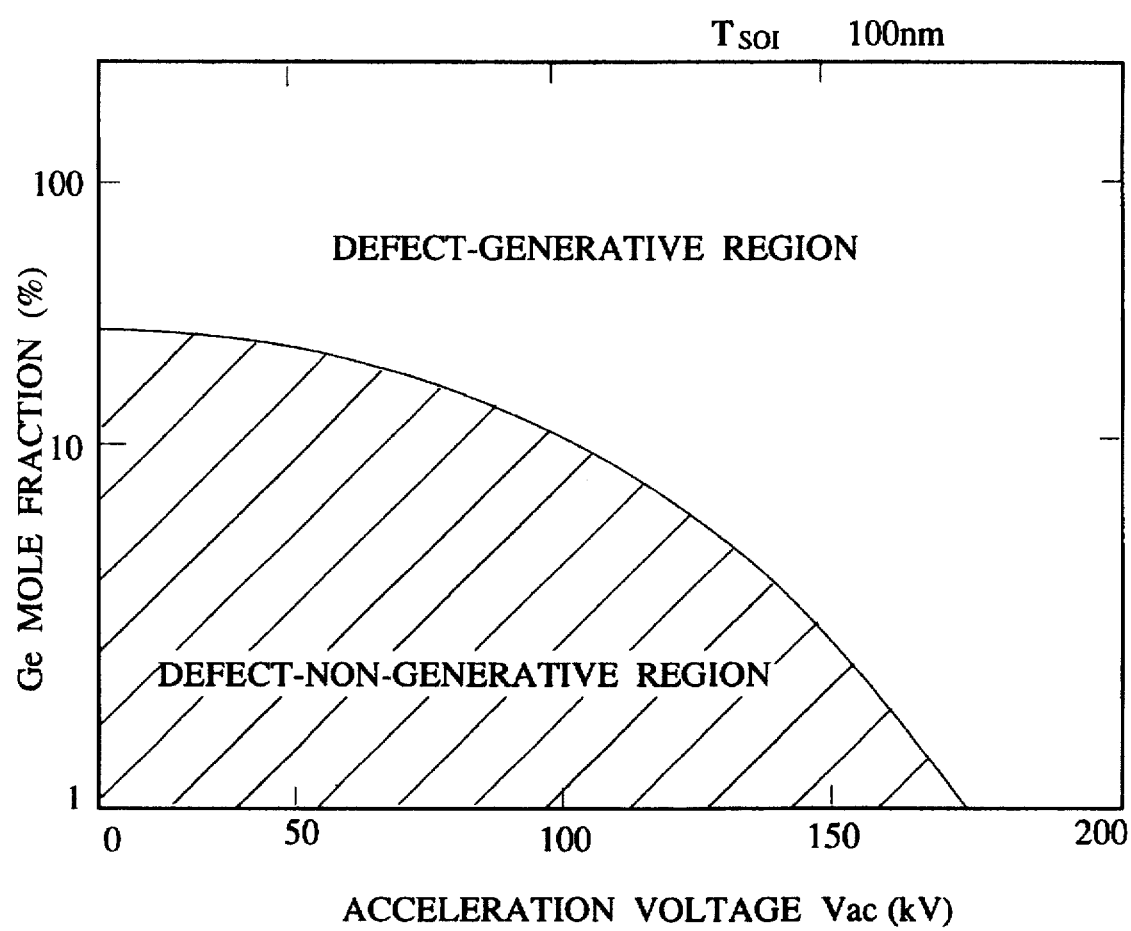
FIG. 29C is a view illustrating a relationship between the peak mole fraction of Ge at which the crystal defects are generated and the acceleration voltage of the Ge ion implantation.

In the twelfth embodiment of the present invention, inventors of the present invention have examined conditions for forming the narrow-bandgap-semiconductor regions such as the optimum mole fraction of Ge in the $Si_xGe_{1-x}$ regions 267 with various simulations and experiments. In particular, the drain breakdown voltage and the crystal defects in the MOSFET have been examined and studied in detail while changing the condition of Ge ion implantation. As a result, a relationship shown in FIG. 29A has been found between the improvement of the drain breakdown voltage $\Delta V_{BD}$ and the peak mole fraction of Ge. That is, the drain breakdown voltage improvement $\Delta V_{BD}$ rises gradually from Ge peak mole fraction of about 1%, rises abruptly at Ge peak mole fraction of about 5%, and saturates in a range of 25 to 80%. This reason could be understood as follows. That is, if the $Si_xGe_{1-x}$ region is formed in the $n^+$ source region, the potential profile of valence band edge $E_v$ is changed as shown by the broken line in FIG. 4B to exhaust holes accumulated in the channel region to the narrow-bandgap-source electrode side. However, even if the bandgap in the source region is narrowed by increasing the Ge mole fraction more and more, the larger suppression of floating body effect cannot be produced over a certain degree of Ge mole fraction, because the potential barrier against holes still remains due to the built-in potential in the pn-junction formed between the channel and source regions. On the contrary, FIG. 29B shows a relationship between a peak Ge mole fraction and the number of crystal defects per one transistor. From FIG. 29B, it has been found that the crystal defects D are generated when the Ge peak mole fraction exceeds 30% when the Ge ions are implanted at acceleration voltage Vac=25 kV. The relations between the number of crystal defects and the Ge peak mole fraction depend on the acceleration voltage Vac as shown in FIG. 29B. The number of crystal defects abruptly increases from 15% at Vac=100 kV, and from 20% at Vac=50 kV. Namely, there is a relation between the acceleration voltage Vac and the minimum mole fraction of Ge, over which the crystal defects are generated, as shown in FIG. 29C. In the twelfth embodiment of the present invention, by setting the peak mole fraction of Ge between 1% and 30% based on these experimental results, the generation of the crystal defects can be prevented while the drain breakdown voltage (endurance) $V_{BD}$ is improved. By setting the peak mole fraction of Ge between 1% and 30%, the bandgap in the source region shown in FIG. 4B spans 1.07 to 0.80 eV. In the case of Sn, it is preferable that the Sn mole fraction is so selected that the bandgap in the source region shown in FIG. 4B is within 1.07 to 0.70 eV.

Manufacturing steps of the heterojunction SOI.MOSEFT according to the twelfth embodiment of the present invention having the narrow-bandgap-source region will be explained hereinafter. In general, in manufacturing steps of the semiconductor device, high wafer throughput is required. But, in the twelfth embodiment of the present invention, the optimum mole fraction of Ge is selected to a rather small value, and sharp profile (peak) of Ge can be achieved by decreasing accelerating voltage to shorten an ion implantation time. In the meanwhile, manufacturing steps of the heterojunction SOI.MOSFET of the twelfth embodiment of the present invention are similar in principle to those of the eleventh embodiment of the present invention except for the condition of ion implantation. Thus, with reference to FIGS. 28A and 28B together with aforementioned FIGS. 26A to 26C, manufacturing steps of the twelfth embodiment of the present invention will be explained hereinbelow.

(a) First, like the first to eleventh embodiments of the present invention, the SOI film 203 is formed by SIMOX or SDB technique on a p type (100) substrate via the buried oxide film 202. As in the above embodiments, a thickness of the SOI film 203 is adjusted to have a predetermined thickness of 100 nm, for example.

(b) Then, the device isolation oxide film 4 is formed by LOCOS, BOX, or the like technique so as to laterally isolate from adjacent devices, and p type impurities such as $BF_2$ ions etc. are implanted to have desired channel impurity concentration. Thereafter, the gate oxide film 204 of a thickness of 10 nm is formed, and then a P-doped polysilicon film 205 with a thickness of 0.3 μm is formed thereon by LPCVD or the like. Then, the gate polysilicon electrode 205 having a gate length of 0.5 μm is formed on the gate oxide film 204 by photolithography step and RIE step.

(c) Then, a post oxide film 7 is formed to have a depth of 10 nm. Then, as shown in FIG. 26A, $Ge^+$ ions are implanted at accelerating voltage Vac=50 kV and a dose $\Phi=1\times10^{16}$ $cm^{-2}$ to form the $Si_xGe_{1-x}$ regions 267. This dose $\Phi$ of Ge ion implantation is set to be lower than the dose $\Phi=3\times10^{16}$ $cm^{-2}$ in the eleventh embodiment of the present invention.

(d) Next, $As^+$ ions are implanted at implantation angle of 90° C.—although FIG. 26B shows the oblique implantation, the implant angle may be 90° C. in this case—and at accelerating voltage Vac=20 kV and a dose $\Phi=3\times10^{15}$ $cm^{-2}$. After this ion implantation, annealing is performed at 850° C. for 120 minutes to activate implanted As ions and the like. As shown in FIG. 26C, the $n^+$ source region 216 and the $n^+$ drain regions 226 are formed to fully include the $Si_xGe_{1-x}$ regions 267.

Alternatively, after annealing accompanying to Ge ion implantation, $As^+$ ions may be implanted at accelerating voltage Vac=40 kV and a dose $\Phi=1\times10^{15}$ $cm^{-2}$. Thereafter, the nitride film is formed on an entire surface by CVD. Then, as shown in FIG. 28B, the sidewall nitride films 73 of 50 nm in thickness are formed on both sides of the gate electrode 205 by directional etching such as RIE. Again, $As^+$ ions may be implanted at accelerating voltage Vac=40 kV and a dose $\Phi=3\times10^{15}$ $cm^{-2}$. After this, annealing is performed at 850° C. for 90 minutes. Next, metallization processes is executed, thus resulting in the SOI.MOSFET of the twelfth embodiment of the present invention, as shown in FIGS. 28A and 28B. At this time, maximum mole fraction of Ge is 10%. The drain breakdown voltage was improved by about 1 V in comparison with the conventional SOI.MOSFET for the channel length is 0.2 μm. No crystal defect due to the lattice mismatching has been found. In addition, it takes about two minutes to implant ions every wafer sheet. This time can be considered as a practical level.

The twelfth embodiment of the present invention is not limited to the above embodiment if peak mole fraction of Ge, Sn etc. may selected within a range of 1 to 30%, more preferably 5 to 15% in order to form the narrow-bandgap-source region such as the $Si_xGe_{1-x}$ source region 267, the $Si_xSn_{1-x}$ source region etc. Also, the condition of ion implantation may be varied suitably in accordance with the thickness of the SOI film 203 etc. In addition, if PbS, PbTe, GaSb, InAs, or the like is adopted to form the narrow bandgap region 267, either MBE or selective CVD may be used. For instance, the n$^+$ source region 216 and the n$^+$ drain region 226 may be formed by implanting only As ions while omitting Ge ion implantation, and surfaces of the n$^+$ source region 216 and the n$^+$ drain region 226 may be etched to form U grooves semiconductor, and then PbS, PbTe, or the like may be deposited in the U grooves by selective CVD.

Furthermore, in the case of ion implantation, there are several modifications in accordance with variations of design conditions such as the thickness of the SOI film as follows.

(i) For instance, in case the SOI film 203 has a thickness of 50 nm, after forming the polysilicon gate electrode 205, Ge ions are implanted at accelerating voltage Vac=25 kV and a dose $\Phi=2\times10^{16}$ cm$^{-2}$ using the polysilicon gate electrode 205 as a mask, and subsequently annealing is effected at 850° C. Thereafter, As ions are implanted at accelerating voltage Vac=20 kV and a dose $\Phi=3\times10^{15}$ cm$^{-2}$. After this, annealing is effected at 800° C. for 60 minutes to complete the device. At this time, maximum mole fraction of Ge is 20%. The drain breakdown voltage can be improved by about 1.5 V if the channel length is set to be 0.5 μm. In this case, no crystal defect appears.

(ii) in case the SOI film 203 has a thickness of 40 nm, Sn ions may be implanted. After the polysilicon gate electrode 205 is formed, Sn ions are implanted at accelerating voltage Vac=50 kV and a dose $\Phi=7\times10^{15}$ cm$^{-2}$ using the polysilicon gate electrode 205 as a mask. Subsequently, annealing is effected at 900° C. Thereafter, As ions are implanted at accelerating voltage Vac=15 kV and a dose $\Phi=3\times10^{15}$ cm$^{-2}$. Then, annealing is effected at 800° C. for 60 minutes to complete the device. At this time, maximum mole fraction of Sn is 15%. The drain breakdown voltage can be improved by about 2.0 V under the channel length of 0.5 μm. In this modification, no crystal defect has been found.

(iii) In case the SOI film 203 is formed to have a thickness of 90 nm, after forming the polysilicon gate electrode 205, Ge ions are implanted at accelerating voltage Vac=50 kV and a dose $\Phi=1\times10^{16}$ cm$^{-2}$ using the poly-silicon gate electrode 205 as a mask. Subsequently, As ions are implanted at accelerating voltage Vac=40 kV and a dose $\Phi=1\times10^{15}$ cm$^{-2}$. After this, annealing is effected at 900° C. for one hour. The nitride film is formed by CVD, and, as shown in FIG. 28B, the sidewall nitride films 73 of 50 nm in thickness are formed on both sides of the polysilicon gate electrode 205 by RIE. Then, As ions are implanted again at accelerating voltage Vac=40 kV and a dose $\Phi=3\times10^{15}$ cm$^{-2}$. If it is required to form lower impurity concentration diffused layers, before forming the sidewall nitride films 73, As ions may be implanted under a lower accelerating voltage and a lower dose than the above-mentioned value for the ion implantation. After this, annealing is effected at 850° C. for 30 minutes to complete the device. At this time, maximum mole fraction of Ge is 10%. Implanted As ions are diffused by annealing beyond the Ge containing layer, or SiGe layer 267. Therefore, since the SiGe layer is fully covered by the n$^+$ source and drain regions 216 and 226, the depletion layer is prevented to contact with the crystal defects generated in the n$^+$ source/drain regions 216, 226 like the eleventh embodiment of the present invention, even if the crystal defects are generated at the worst. The drain breakdown voltage can be improved by about 1.5 V if the channel length is set to be 0.2 μm. In this modified case, no crystal defect and hence no leakage current due to the crystal defect have been found. In addition, about five minutes are required to implant ions for one wafer. This wafer processing time can be considered as a practical level.

(THIRTEENTH EMBODIMENT)

Figure 30:
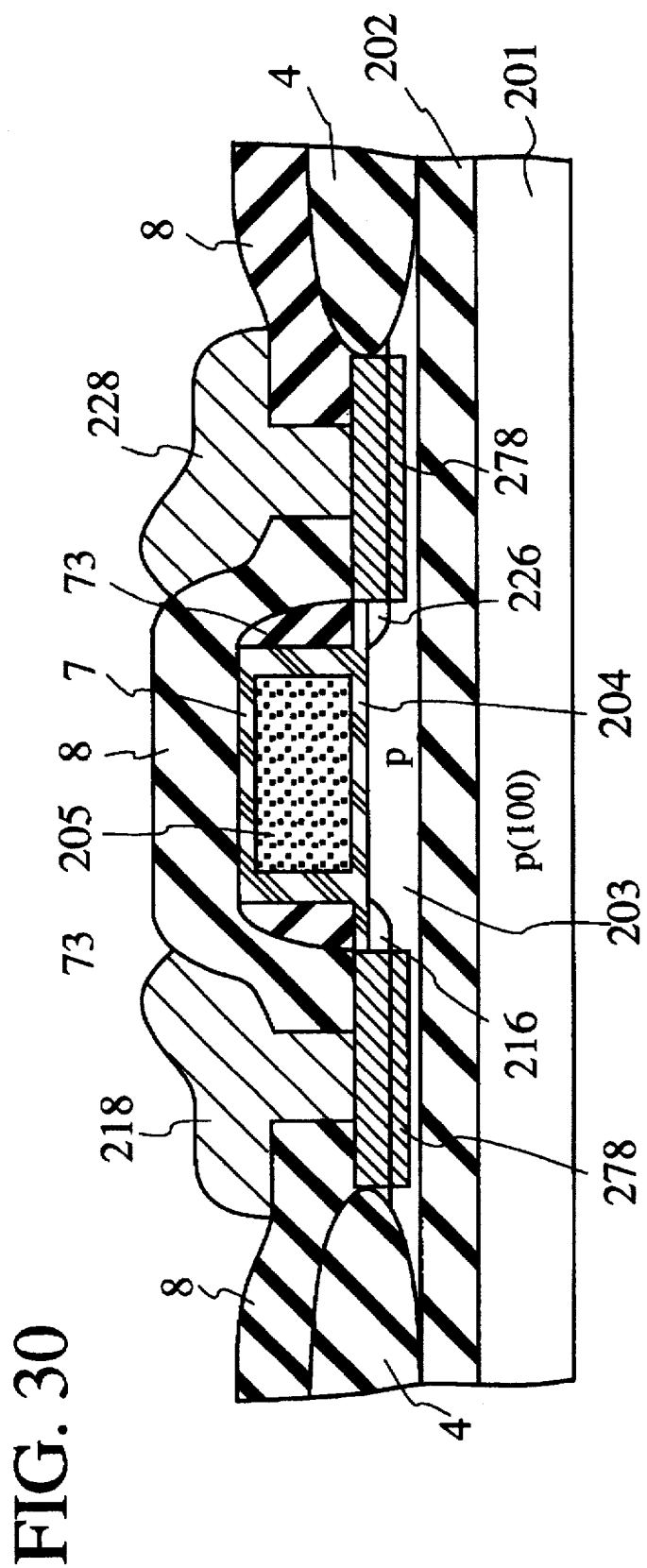
FIG. 30 is a sectional view showing a structure of a SOI.MOSEFT according to a thirteenth embodiment of the present invention.

FIG. 30 shows a sectional structure of a SOLMOSFET according to a thirteenth embodiment of the present invention. In FIG. 30, a p-type SOI film 203 is formed on a p-type (100) silicon substrate 201 via a buried oxide film 202. The SOI film 203 is surrounded by an isolation oxide film 4 formed by LOCOS technique etc., and an interior of the SOI film 203 surrounded by the isolation oxide film 4 is used as an active region (device region). FIG. 30 only shows a sectional structure near the active region. An n$^+$ source region 216 and an n$^+$ drain region 226 are formed in an inside of the active region so as to overlap part of Si$_x$Ge$_{1-x}$ regions 278. As shown in FIG. 30, the n$^+$ source region 216 and the n$^+$ drain region 226 have a larger width than the Si$_x$Ge$_{1-x}$ regions 278, but the Si$_x$Ge$_{1-x}$ regions 278 project vertically from the bottoms of the n$^+$ source region 216 and the n$^+$ drain region 226 toward the buried oxide film 202. Therefore, the thirteenth embodiment of the present invention may also be considered as a modification of the seventh embodiment of the present invention as shown in FIGS. 18A and 18B. An interlayer insulating film 8 formed of SiO$_2$/PSG films etc. is formed on the Si$_x$Ge$_{1-x}$ regions 278. A source metal electrode 218 and a drain metal electrode 228 are formed via contact holes opened in the interlayer insulating film 8. In addition, a gate electrode 205 formed of polysilicon, refractory metal, or refractory metal silicide etc. is formed on the channel region 203 between the n$^+$ source region 216 and the n$^+$ drain region 226 via the gate oxide film 204.

In the above structure, heterojunction interfaces between Si regions and the Si$_x$Ge$_{1-x}$ regions 278 exist protruding from bottoms of pn junction to the depletion layer extending from the metallurgical pn-junction interfaces. In such case, a potential barrier against holes, which is shown in FIG. 20 and explained in the seventh embodiment of the present invention, is accomplished. Holes can be exhausted effectively to the narrow-bandgap-source side so that high drain breakdown voltage can be obtained, eliminating the floating body effect. In other words, if the SOLMOSFET is formed to have the structure of the thirteenth embodiment of the present invention, energy band can be so formed that the valence band edge E$_v$ in the channel region, where the lowest potential for holes is obtained, is connected gradually to a valence band edge in the SiGe-source region so as not to generate a barrier against holes. As a result, the drain breakdown voltage can be increased greatly. In place of the SiGe region, SiSn, SiGeSn, PbS, Si$_x$(PbS)$_{1-x}$, and Si$_x$(PbTe)$_{1-x}$, or the like may be used.

Figure 31A:
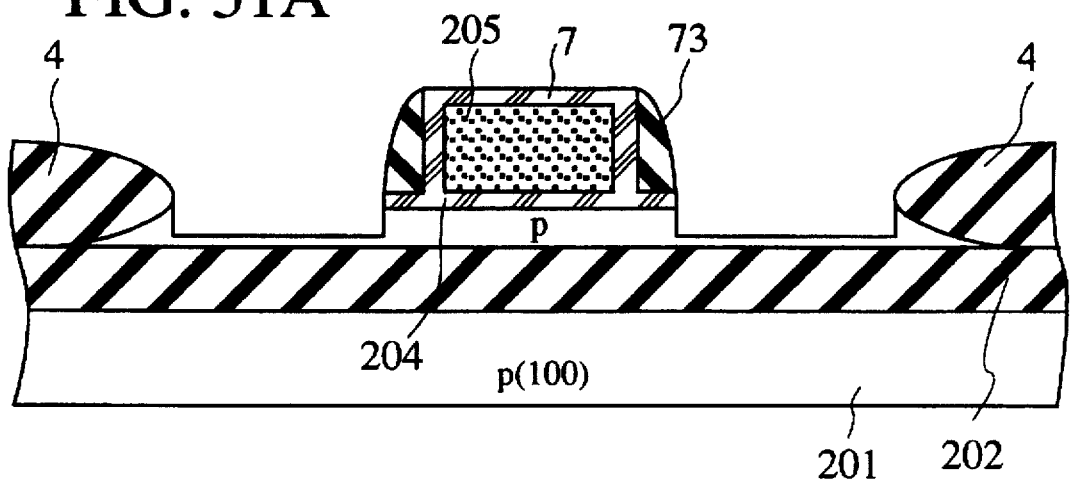
FIGS. 31A to 31C are sectional views each showing manufacturing steps of the SOI.MOSEFT according to the thirteenth embodiment of the present invention.
Figure 31B:
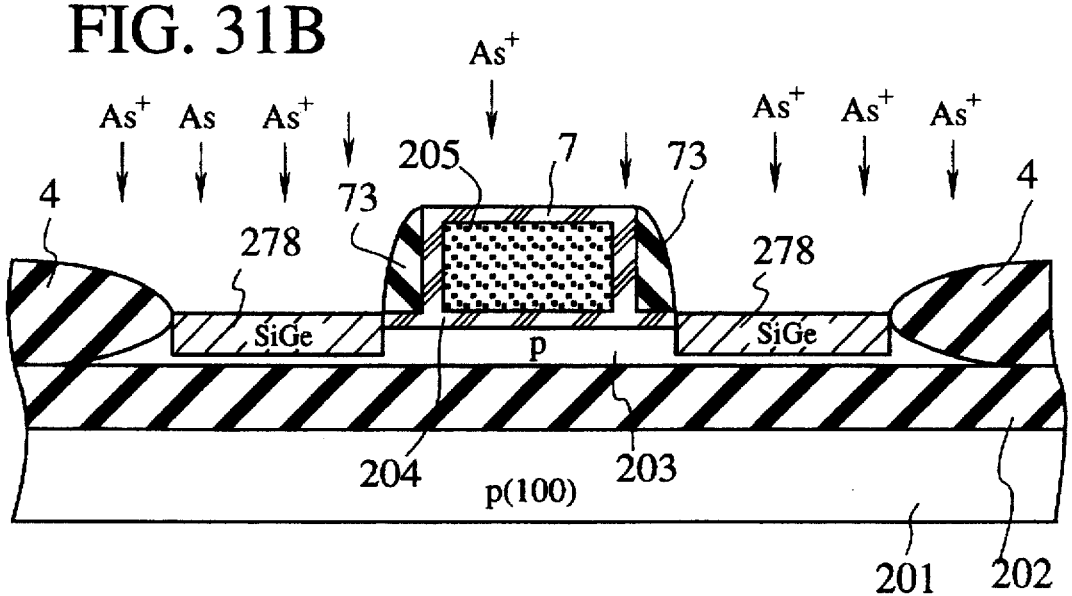
Figure 31C:
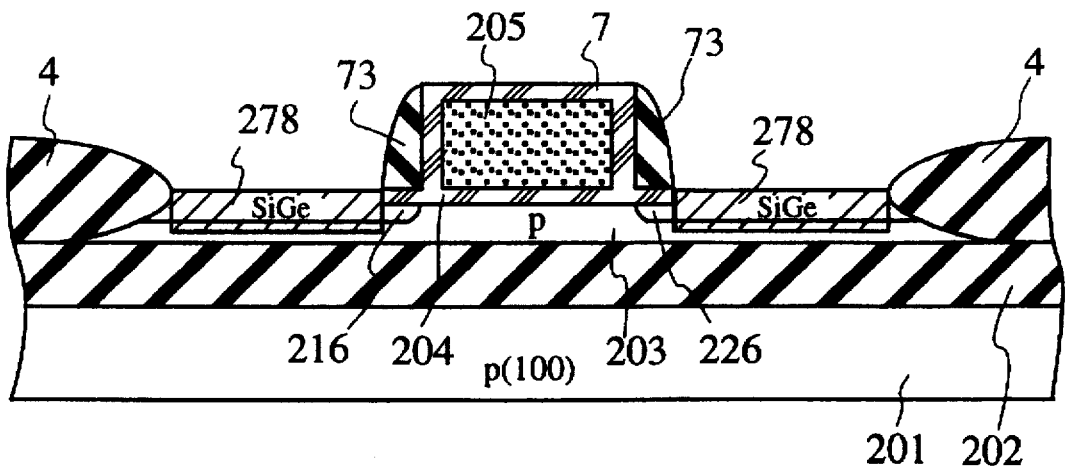

The heterojunction SOLMOSFET of the thirteenth embodiment of the present invention can be manufactured by manufacturing steps shown in FIGS. 31A to 31C.

(a) First, like the above embodiments of the present invention, a 150 nm thick SOI film 203 is formed by SIMOX or SDB technique on a p type (100) substrate via the buried oxide film 202.

(b) Then, as shown in FIG. 31A, the device isolation oxide film 4 is formed by LOCOS, BOX, or the like technique so as to electrically isolate adjacent devices. FIG. 31A shows a case wherein the LOCOS technique is used. Thereafter, the gate oxide film 204 of a thickness of 10 nm is formed, and then a P-doped polysilicon film 205 with a thickness of 0.5 μm is formed thereon by atmospheric pressure CVD (APCVD), LPCVD or the like. Then, as shown in FIG. 31A, the gate polysilicon electrode 205 having a gate length of 0.5 μm is defined on the gate oxide film 204 by photolithography step and RIE step. A post oxide film 7 is formed on the gate polysilicon electrode 205 to have a depth of 8 to 10 nm.

(c) Then, the nitride (SiN) film of 20 nm in thickness is formed on an entire surface by CVD. Then, the sidewall nitride films 73 are formed by an "etch-back" process, namely the entire surface of the nitride film is anistropically etched by means of RIE or the like. Then, as shown in FIG. 31A, using the isolation oxide film 4, the sidewall nitride films 73 and the post oxide film 7 on the polysilicon gate electrode 205 as a mask, U grooves are formed in the SOI film 203. In particular, the SOI film 203 may be etched by RIE, or photo-excited etching with a UV light irradiation using $SF_6$, $CCl_4$, $SiCl_4$, or the like to form the U grooves having a depth of 120 nm, for example.

(d) Then, as shown in FIG. 31B, the $Si_{0.9}Ge_{0.1}$ film 112 is selectively deposited only in insides of the U grooves to a thickness of 150 nm by CVD at 500° to 550° C. in $SiH_4$ and $GeH_4$ mixed gas atmosphere. $Si_2H_6$ or $SiH_2Cl_2$ may be used instead of $SiH_4$. Further, $GeH_2Cl_2$ etc. may be used instead of $GeH_4$. More particularly, if 100% $Si_2H_6$ is introduced in the growth chamber at pressure of $5\times10^{-2}$ Pa and $GeH_4$ is introduced at pressure of $5\times10^{-2}$ Pa, for one hour, SiGe layer 278 with a thickness of 150 nm is grown selectively, as shown in FIG. 31B.

(e) Next, as shown in FIG. 31B, using the gate polysilicon electrode 205 and the sidewall nitride films 73 as a mask, $As^+$ ions may be implanted at accelerating voltage Vac=30 kV and a dose $\Phi=3\times10^{15}$ $cm^{-2}$. After this, if annealing is performed at 850° C. for 30 minutes in $N_2$ atmosphere, As ions are diffused laterally beyond the $Si_xGe_{1-x}$ region 278 to thus form the laterally projected $n^+$ source region 216 and the $n^+$ drain region 226, as shown in FIG. 31C.

(f) Then, the interlayer insulating layer 8 is formed by CVD etc. on an entire surface of the SOI film 203 to have a thickness of 0.3 to 0.5 µm, for example. Then, a resist film is spin-coated thereon and is patterned by photolithography. After this, contact holes are opened by etching the oxide film 8 by RIE or the like. Subsequent to etching of the oxide film 8, as shown in FIG. 30, the source metal electrode 218 and the drain metal electrode 228 are formed by using a metal such as Al—Si, Al—Si—Cu, or the like. As a result, the SOLMOSFET of the thirteenth embodiment of the present invention having a narrow-bandgap-source can be completed.

In the above thirteenth embodiment of the present invention, although the $Si_xGe_{1-x}$ layer 278 is formed by selective CVD, the $Si_xSn_{1-x}$ layer, or the narrow bandgap semiconductor layer such as PbS, PbTe, GaSb, InAs, InSb etc. may be used by selective CVD in place of the $Si_xGe_{1-x}$ layer 278.

(FOURTEENTH EMBODIMENT)

Figure 32A:
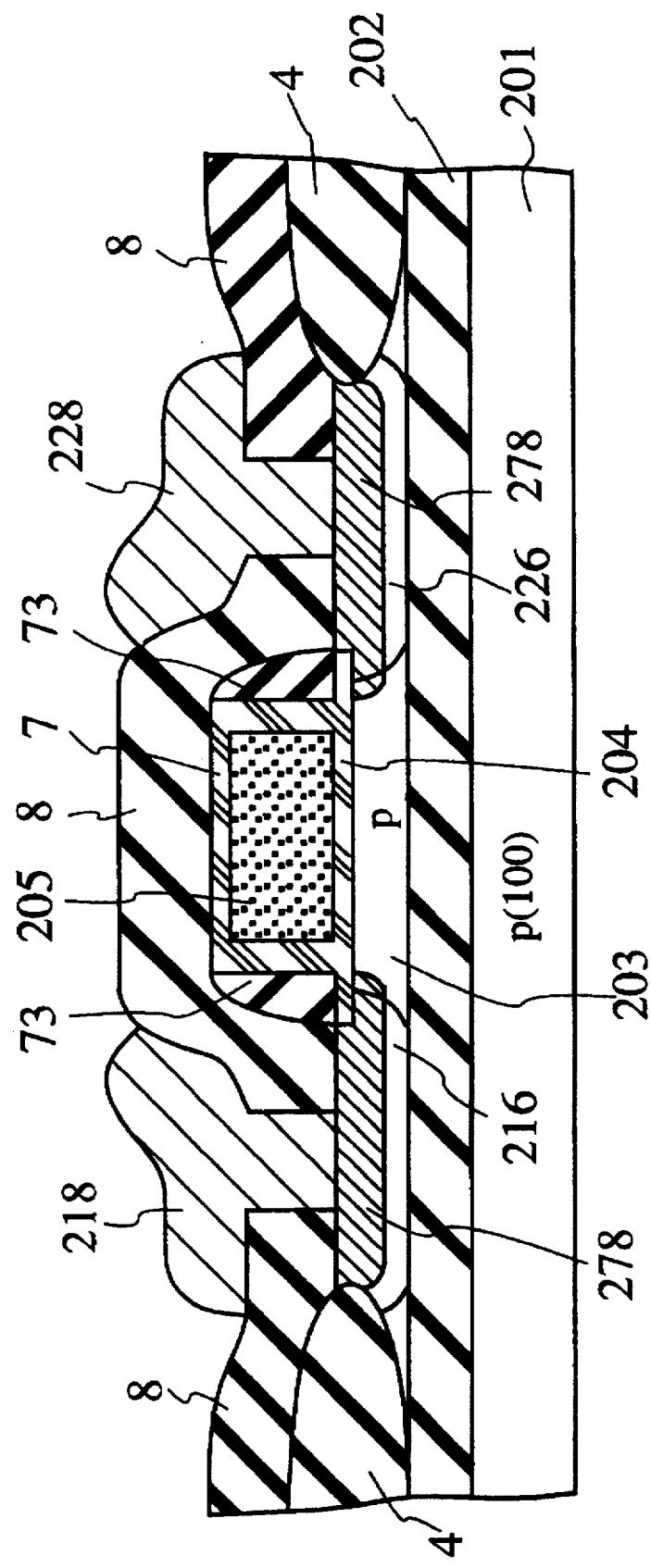
FIG. 32A is a sectional view showing a structure of a SOI.MOSEFT according to a fourteenth embodiment of the present invention.

FIG. 32A shows a sectional structure of a SOLMOSEFT according to a fourteenth embodiment of the present invention. In FIG. 32A, a p-type SOI film 203 is formed on a p-type (100) silicon substrate 201 via a buried oxide film 202. The SOI film 203 is surrounded by an isolation oxide film 4 formed by LOCOS technique etc., and the SOI film 203 surrounded by the isolation oxide film 4 is used as an active region (device region). FIG. 32A only shows a sectional structure near the active region. An $n^+$ source region 216 and an $n^+$ drain region 226 are formed in an inside of the active region so as to overlap part of the $Si_xGe_{1-x}$ regions 278. As shown in FIG. 32A, the $n^+$ source region 216 and the $n^+$ drain region 226 project from a bottom of the $Si_xGe_{1-x}$ regions 278. The $Si_xGe_{1-x}$ regions 278 protrude laterally from the n+ source and drain regions 216, 226 and are located nearer to the channel region side, which is located just under the gate electrode edge. Thus, the fourteenth embodiment of the present invention may also be considered as a modification of the seventh embodiment of the present invention as shown in FIG. 18A. An interlayer insulating film 8 formed of $SiO_2$/PSG films etc. is formed on the $Si_xGe_{1-x}$ regions 278. A source metal electrode 218 and a drain metal electrode 228 are formed via contact holes opened in the interlayer insulating film 8. In addition, a gate electrode 205 formed of polysilicon etc. is formed on the channel region 203 between the $n^+$ source region 216 and the $n^+$ drain region 226 via the gate oxide film 204.

In the above structure, heterojunction interfaces between Si regions and the $Si_xGe_{1-x}$ regions 278 protrude laterally from $n^+$ regions 216, 226 to the depletion layer in the channel region and exist beyond metallurgical pn-junction interfaces. In such case, the potential barrier for holes, which is already shown in FIG. 20 and explained in the seventh embodiment of the present invention, is similarly accomplished. Holes can be exhausted effectively to the narrow-bandgap-source side so that the floating body effect can be eliminated or reduced. In other words, if the SOLMOSFET is formed to have the structure of the fourteenth embodiment of the present invention, energy band can be so formed that the valence band edge $E_v$ in the channel region, where the lowest potential for holes is obtained, is connected gradually to a valence band edge $E_v$ of the SiGe region so as not to generate a high barrier against holes. As a result, the drain breakdown voltage can be increased essentially. In place of the SiGe region, SiSn, PbS, PbTe, PbSe, SnTe, ZnSb, InAs, InSb, $Si_x(PbTe)_{1-x}$, $Si_x(PbSe)_{1-x}$ and $Si_x(SnTe)_{1-x}$, or the like may be used.

Figure 32B:
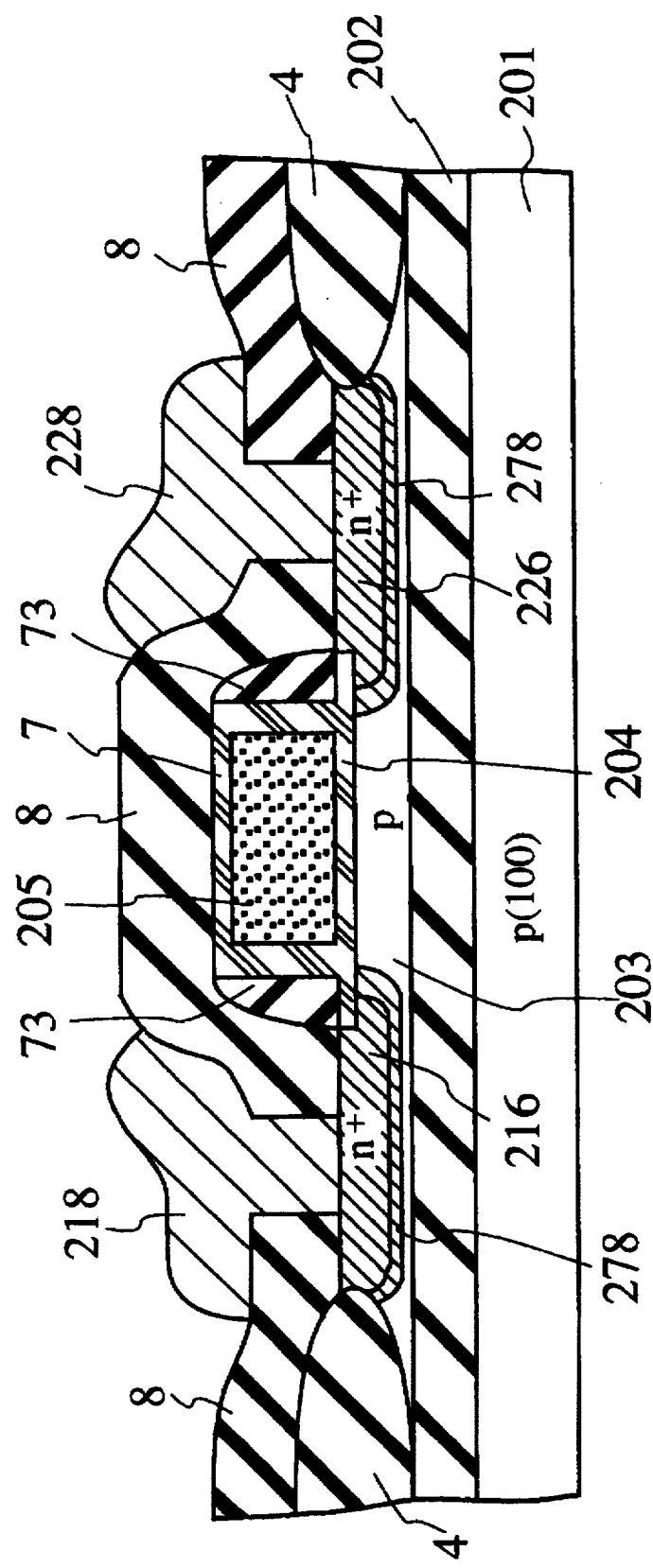
FIG. 32B is a sectional view showing a structure of a modification of a SOLMOSEFT in FIG. 32A.

Incidentally, FIG. 32B shows a structure wherein the SiGe/Si heterojunction interfaces protrude perfectly from pn junction interface between the $n^+$ regions 216, 226 and p-type SOI film 208. A hole exhaustion effect can be increased and the floating body effect is reduced remarkably.

Figure 33A:
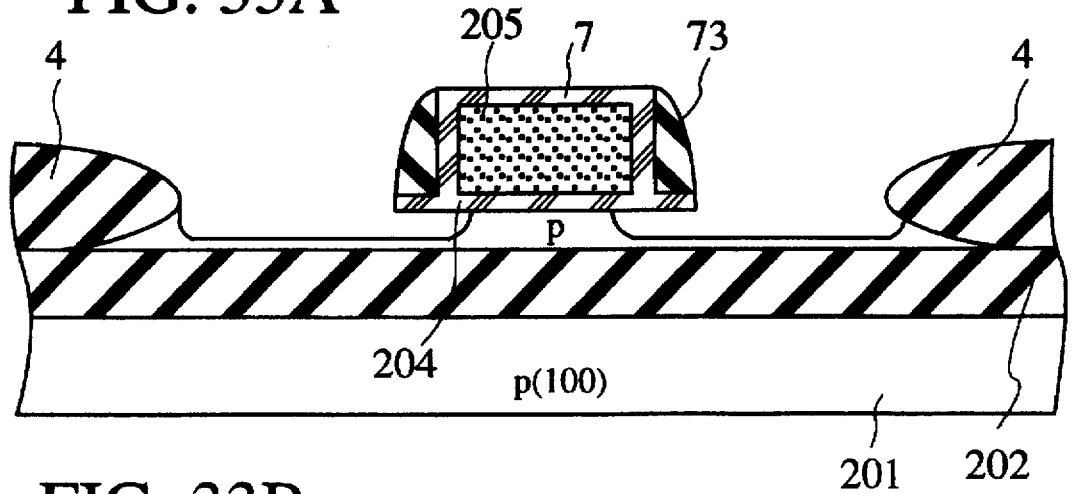
FIGS. 33A to 33C are sectional views each showing manufacturing steps of the SOI.MOSEFT according to the fourteenth embodiment of the present invention.
Figure 33B:
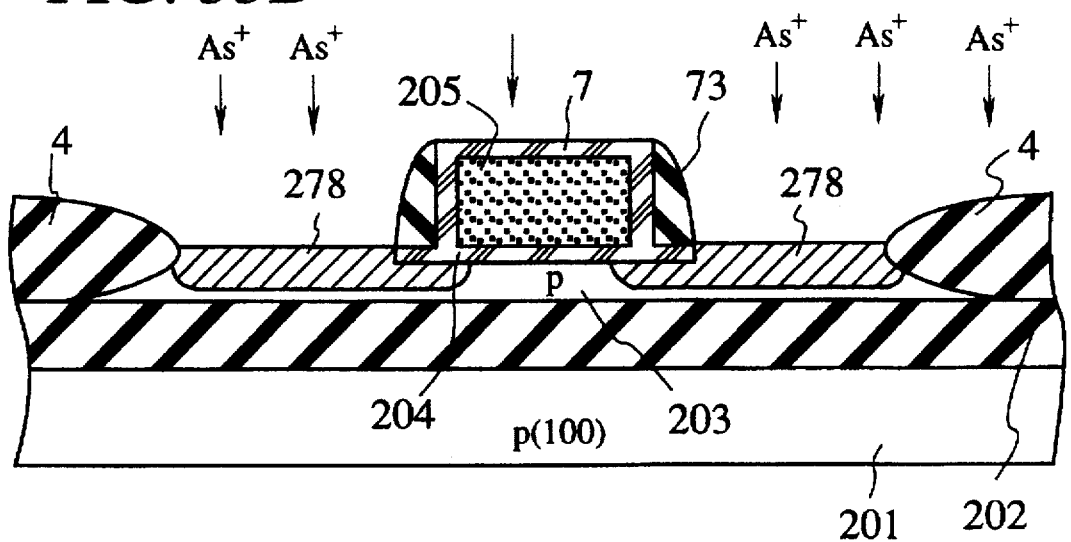
Figure 33C:
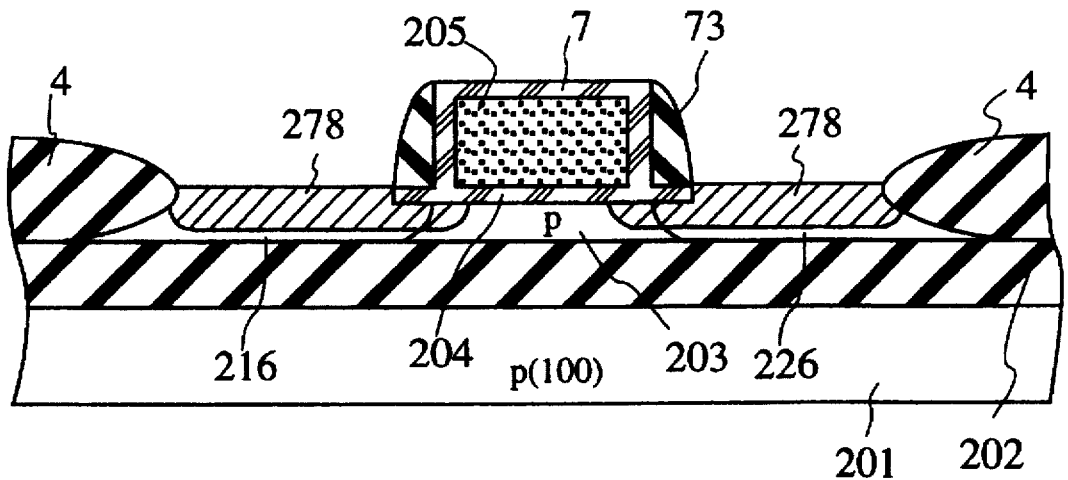

The heterojunction SOLMOSFET of the fourteenth embodiment of the present invention can be manufactured by manufacturing steps shown in FIGS. 33A to 33C.

(a) First, like the above embodiments of the present invention, the SOI film 203 is formed by SIMOX or SDB technique on a p type (100) substrate via the buried oxide film 202.

(b) Then, as shown in FIG. 33A, the isolation oxide film 4 is formed by LOCOS, BOX or the like technique so as to electrically isolate adjacent devices. FIG. 33A shows a case wherein the LOCOS technique is used. Thereafter, the gate oxide film 204 of a thickness of 10 nm is formed, and then a P-doped polysilicon film 205 with a thickness of 0.3 µm is formed thereon by APCVD, LPCVD or the like. Then, as shown in FIG. 31A, the gate polysilicon electrode 205 having a gate length of 0.5 µm is defined on the gate oxide film 204 by photolithography step and RIE step. A post oxide film 7 is formed on the gate polysilicon electrode 205 to have a depth of 8 to 10 nm.

(c) Then, the nitride (SiN) film of 20 nm in thickness is formed on an entire surface by CVD. Then, the sidewall nitride films 73 are formed by "etch-back" process, namely the entire surface of nitride films are anisotropically etched by means of RIE or the like. Then, as shown in FIG. 33A, using the isolation oxide film 4, the sidewall nitride films 73 and the post oxide film 7 on the polysilicon gate electrode 205 as a mask, grooves are formed in the SOI film 203. In particular, the SOI film 203 may be isotropically etched by CDE (Chemical Dry etching), or photo-excited etching using $SF_6$, $CCl_4$, $SiCl_4$, or the like to form the 67 nm depth grooves having large under-cut portions under the sidewall nitride film masks 73 for example.

(d) Then, at a substrate temperature of 470° C., 100% $Si_2H_6$ is introduced (injected) into the growth chamber at pressure of $1.8 \times 10^{-2}$ Pa and $GeH_4$ is introduced at pressure of $1.5 \times 10^{-2}$ Pa, so that the $Si_{0.7}Ge_{0.3}$ film 278 having a thickness of 77 nm is selectively grown, as shown in FIG. 33B.

(e) Next, as shown in FIG. 33B, using the gate polysilicon electrode 205 and the sidewall nitride films 73 as a mask, $As^+$ ions may be implanted at accelerating voltage Vac=30 kV and a dose $\Phi=3\times10^{15}$ $cm^{-2}$, and annealing is performed at 850° C. for 30 minutes in $N_2$ atmosphere. Then, as shown in FIG. 33C, the $n^+$ source region 216 and the $n^+$ drain region 226 are diffused vertically beyond the bottom of the $Si_xGe_{1-x}$ regions 278. If annealing is again performed at 850° C. for 10 minutes, the $n^+$ source region 216 and the $n^+$ drain region 226 is formed to be fully surrounded by the $Si_xGe_{1-x}$ regions 278, as shown in FIG. 32B.

(f) Then, the oxide film 8 for the interlayer insulating film formed by CVD etc. on an entire surface to have a thickness of 0.3 to 0.5 µm, for example. Then, a resist film is spin-coated thereon and is patterned by photolithography. After this, contact holes are opened by etching the oxide film 8 by RIE or the like. Subsequent to etching of the oxide film 8, as shown in FIGS. 32A or 32B, the source metal electrode 218 and the drain metal electrode 228 are formed by metallization steps using a metal such as Al, Al—Si, Al—Si—Cu, or the like. As a result, the SOLMOSFET of the fourteenth embodiment of the present invention can be completed.

In the fourteenth embodiment of the present invention, the $Si_xGe_{1-x}$ regions 278 are formed by CVD. However, in place of the $Si_xGe_{1-x}$ regions 278, $Si_xSn_{1-x}$ layer or narrow bandgap semiconductor layer such as PbS, PbTe, GaSb, InAs, InSb, Si(PbS), Si(PbTe) or the like may be formed by selective CVD.

(FIFTEENTH EMBODIMENT)

Figure 34:
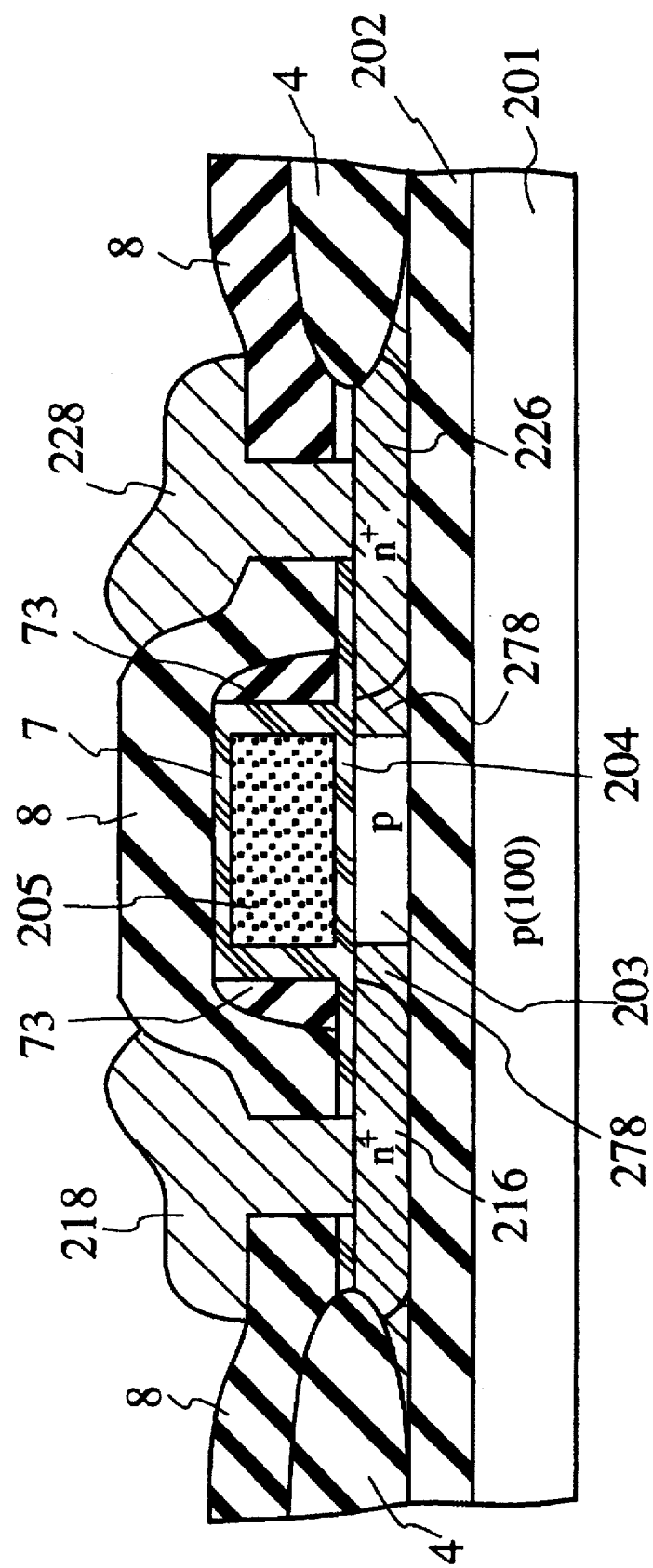
FIG. 34 is a sectional view showing a structure of a SOI.MOSEFT according to a fifteenth embodiment of the present invention.

FIG. 34 shows a sectional structure of a SOLMOSFET according to a fifteenth embodiment of the present invention. In FIG. 34, a p-type SOI film 203 is formed on a p-type (100) silicon substrate 201 via a buried oxide film 202. The SOI film 203 is surrounded by an isolation oxide film 4 formed by LOCOS technique etc., and the SOI film 203 surrounded by the isolation oxide film 4 is used as an active region (device region). FIG. 34 only shows a sectional structure near the active region. $Si_xGe_{1-x}$ regions 278 are formed in the active region so as to contact their bottoms with the buried oxide film 202. An $n^+$ source region 216 and an $n^+$ drain region 226 are formed in an inside of the $Si_xGe_{1-x}$ regions 278. That is, as shown in FIG. 34, the $Si_xGe_{1-x}$ regions 278 protrude laterally from $n^+$ regions 216, 226 and are located near the channel region just under the gate electrode edge. An interlayer insulating film 8 formed of $SiO_2$/PSG films etc. is formed on the $Si_xGe_{1-x}$ regions 278. A source metal electrode 218 and a drain metal electrode 228 are formed via contact holes opened in the interlayer insulating film 8. In addition, a gate electrode 205 formed of polysilicon etc. is formed on the channel region 203 between the $n^+$ source region 216 and the $n^+$ drain region 226 via the gate oxide film 204.

In the above structure, heterojunction interfaces between Si regions and the $Si_xGe_{1-x}$ regions 278 exist in the depletion layer formed in the channel region just under the gate electrode edge beyond metallurgical pn-junction interfaces.

In such case, a potential barrier for holes, which is shown in FIG. 20 and explained in the seventh embodiment of the present invention, is also obtained. Holes can be exhausted effectively to the narrow-bandgap-source side so that the floating body effect due to the accumulated holes in the SOI body is eliminated or greatly reduced. In other words, if the SOLMOSFET is formed to have the structure of the fifteenth embodiment of the present invention, energy band diagram can be so formed that the valence band edge $E_v$ in the channel region, where the potential for holes is lowest, is connected gradually to a valence band edge $E_v$ of the SiGe region so as not to generate a barrier against holes. As a result, the drain breakdown voltage can be increased remarkably. In place of the SiGe region, SiSn, PbS, InAs, Si(PbS), Si(InAs), and HgCdTe, or the like may be used.

The heterojunction SOLMOSEFT according to the fifteenth embodiment of the present invention can be manufactured by manufacturing steps shown in FIGS. 35A to 35E.

(a) First, like the above embodiments of the present invention, the SOI film 293 with a thickness of 10 nm is formed by SIMOX or SDB technique on a p type (100) substrate via the buried oxide film 202.

Figure 35A:
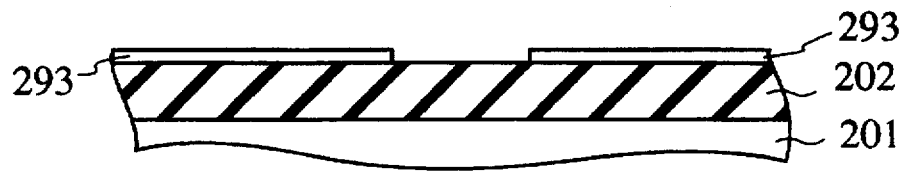
FIGS. 35A to 35E are sectional views each showing manufacturing steps of the SOI.MOSEFT according to the fifteenth embodiment of the present invention.

(b) Then, as shown in FIG. 35A, the SOI film 293 in a prearranged area for forming a channel region is removed to expose the buried oxide film 202 by photolithography and RIE.

Figure 35B:
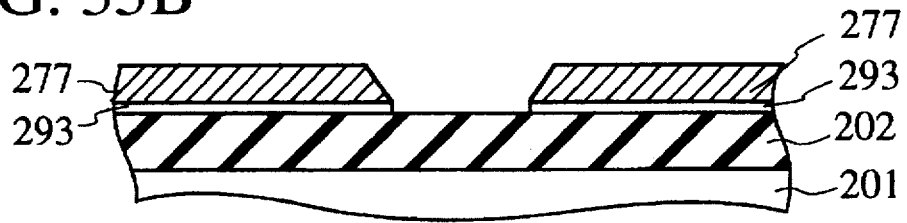

(c) Next, as shown in FIG. 35B, SiGe layers 277 are formed selectively on the SOI film 293 by CVD to have a thickness of about 30 nm or more. For instance, the SiGe layers 277 including Ge by 40% mole fraction are grown by 30 nm in thickness under the LPCVD conditions of, a substrate temperature of 470° C., the introduced $GeH_4$ pressure of $1.5\times10^{-2}$ Pa and, the introduced $Si_2H_6$ pressure of $1.8\times10^{-2}$ Pa.

In this case, a growth rate is 1 nm/mm.

Figure 35C:
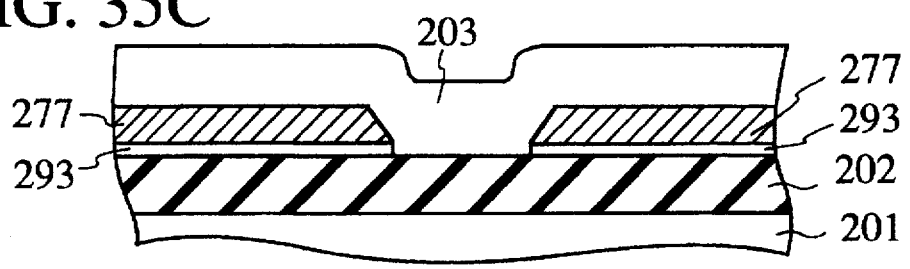

(d) Then, as shown in FIG. 35C, an Si layer 203 having a thickness of 200 µm is formed on the SiGe layers 277 by epitaxial growth. In the fifteenth embodiment of the present invention, since the channel length, or the window part of SiGe layer 277 is set to be 0.1 µm, lateral growth is caused from both sides of the SiGe layers 277 to form a bridging portion on the buried oxide film 202, and a single crystal is also grown in the channel region. This epitaxial growth is carried out for about one hour under the conditions of a substrate temperature of 650° C., with $Si_2H_6$ pressure of $2.5\times10^{-3}$ Pa.

Figure 35D:
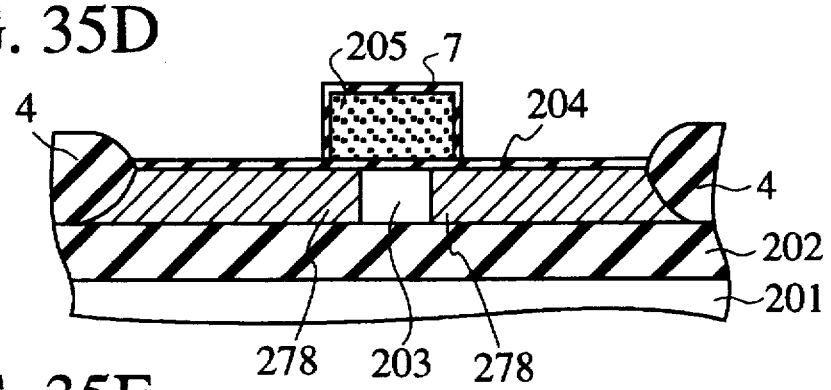

(e) Then, the epitaxial growth layer 203 shown in FIG. 35C is levelled to form a flat surface by CMP or the like. Subsequently, as shown in FIG. 35D, the isolation oxide film 4 is formed by LOCOS, BOX or the like technique so as to electrically isolate adjacent devices. FIG. 35D shows a case wherein the LOCOS technique is used. Thereafter, the gate oxide film 204 of a thickness of 10 nm is formed, and then a P-doped polysilicon film 205 with a thickness of 150 nm is formed thereon by APCVD, LPCVD or the like. Then, as shown in FIG. 35D, the gate polysilicon electrode 205 having a gate length of 0.2 µm is formed on the gate oxide film 204 by photolithography and RIE steps. A post oxide film 7 is formed on the gate polysilicon electrode 205 to have a depth of 8 to 10 nm. Since above LOGOS process, gate oxidation process, etc. are heating processes at substrate temperature of 800° C. or more, Ge atoms in the SiGe layer 277 shown in FIG. 35C are diffused. As a result of Ge outdiffusion, SiGe layers 278 are formed as shown in FIG. 35D.

Figure 35E:
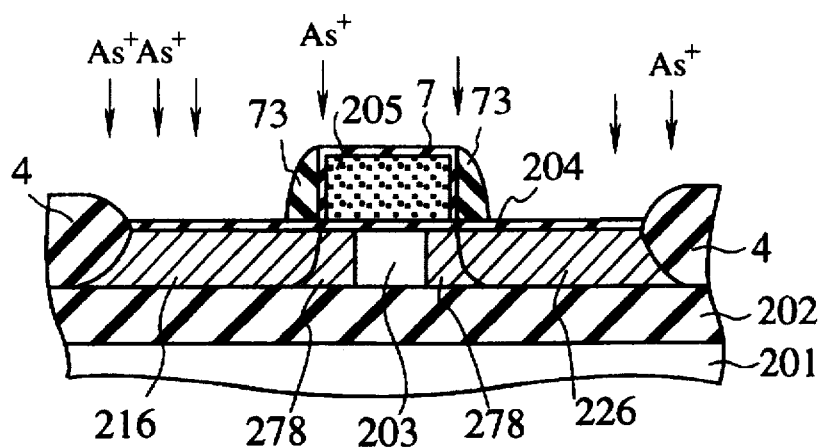

(f) Then, the nitride (SIN) film of 20 nm in thickness is formed on an entire surface. Then, the sidewall nitride films 73 are formed by "etching-back" the entire surface by means of RIE or the like. Then, as shown in FIG. 35E, using the isolation oxide film 4, the sidewall nitride films 73 and the post oxide film 7 on the polysilicon gate electrode 205 as a mask, As ions may be implanted at accelerating voltage Vac=30 kV and a dose $\Phi=3\times10^{15}$ cm$^{-2}$, and then annealing is performed at 850° C. for 30 minutes to activate these implanted ions. Thus, as shown in FIG. 35E, the n$^+$ source region 216 and the n$^+$ drain region 226 is formed in the SiGe regions 278.

(g) Then, the oxide film 8 for the interlayer insulating film formed by CVD etc. on an entire surface to have a thickness of 0.3 to 0.5 μm, for example. Then, a resist film is spin-coated thereon and is patterned by photolithography. After this, contact holes are opened by etching the oxide film 8 by photolithography, RIE or the like. Subsequent to etching of the oxide film 8, as shown in FIG. 34, the source metal electrode 218 and the drain metal electrode 228 are formed by metallization steps using a metal such as Al, Al—Si, Al—Si—Cu, or the like. As a result, the SOI.MOSFET of the fifteenth embodiment of the present invention can be completed.

The heterojunction SOI.MOSEFT according to the fifteenth embodiment of the present invention can also be manufactured by other manufacturing steps such as shown in FIGS. 36A to 36D in addition to the above-mentioned manufacturing method.

(a) First, like the above embodiments of the present invention, the SOI film 203 having a thickness of 110 nm is formed by SIMOX or SDB technique on a p type (100) substrate via the buried oxide film 202.

Figure 36A:
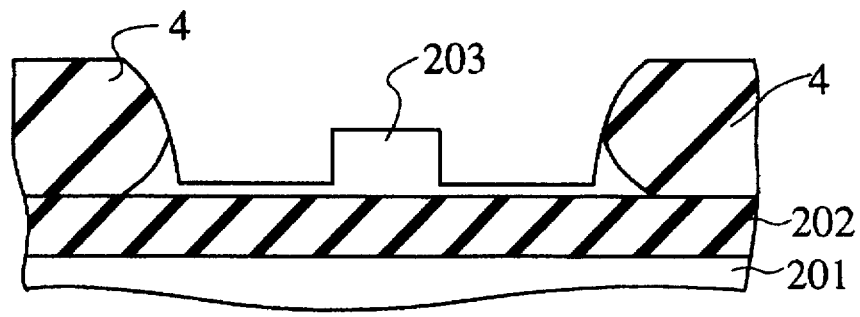
FIGS. 36A to 36D are sectional views each showing another manufacturing steps of the SOLMOSEFT according to the fifteenth embodiment of the present invention.

(b) Then, as shown in FIG. 36A, the thick isolation oxide 4 is formed by LOCOS, BOX or the like technique so as to electrically isolate adjacent devices. FIG. 36A shows a case wherein the LOCOS technique is used and the bottoms of the isolation oxide films 4 reach the buried oxide film 202. Thereafter, using a resist as a mask, the SOI film 203 is etched by a depth of about 90 nm by RIE to form U grooves.

Figure 36B:
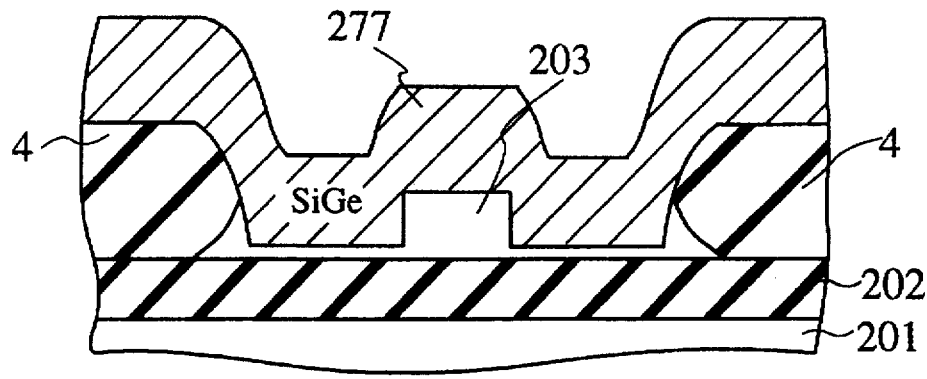

(c) Thereafter, as shown in FIG. 36B, an SiGe layer 277 having a thickness of 200 nm is formed by CVD to bury the U grooves. The CVD for forming the SiGe layer 277 is executed by introducing GeH$_4$ gas at pressure of $1.5\times10^{-2}$ Pa and Si$_2$H$_6$ gas at pressure of $1.8\times10^{-2}$ Pa into a reaction tube at a substrate temperature of 470° C., for example, to thus grow Si$_{0.6}$Ge$_{0.4}$ at a growth rate of about 1 nm/mm. In place of CVD of the SiGe layer 277, Si$_x$Sn$_{1-x}$ layer, narrow bandgap semiconductor layer such as PbS, PbTe, GaSb, InSb, InAs etc., mixed crystal of Si and these layers, or the like may be grown selectively by MBE, ALE (Atomic Layer Epitaxy), MLE (Molecular Layer Epitaxy) or the like.

Figure 36C:
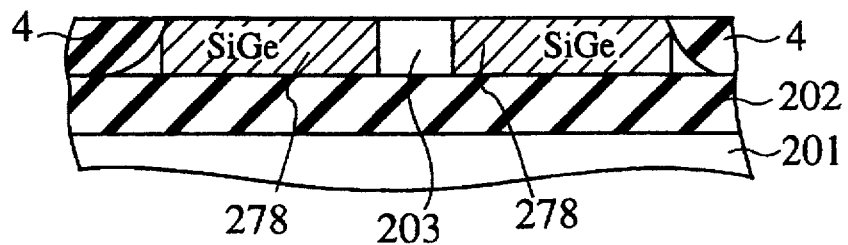

(d) Then, as shown in FIG. 36C, a resultant structure is etched-back by means of CMP etc. to flatten a surface thereof. By this process, the SOI film 203 is formed to have a thickness of 100 nm.

Figure 36D:
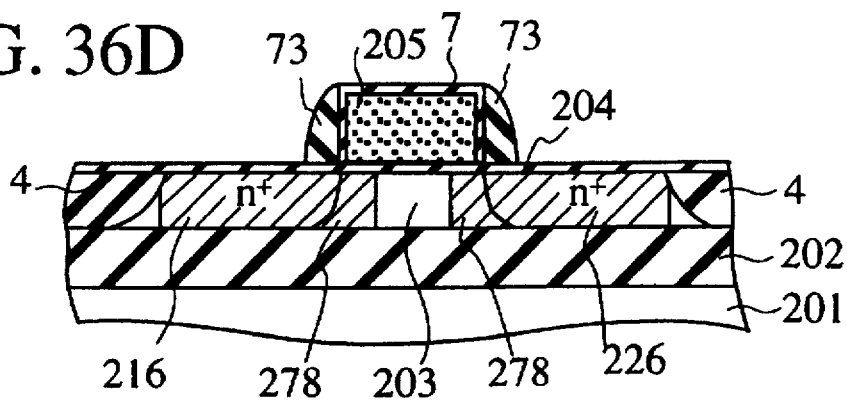

(e) Then, the gate oxide film 204 of a thickness of 10 nm is formed, and then a P-doped polysilicon film 205 with a thickness of 0.3 μm is formed thereon by APCVD, LPCVD or the like. Then, as shown in FIG. 36D, the gate polysilicon electrode 205 having a gate length of 0.5 μm is defined on the gate oxide film 204 by photolithography and RIE steps. A post oxide film 7 is formed on the gate polysilicon electrode 205 to have a depth of 8 to 10 nm. Then, the nitride film with a thickness of 20 nm is formed on an entire surface. Then, the sidewall nitride films 73 are formed by etching-back the entire surface by means of RIE or the like. Then, using the isolation oxide film 8, the sidewall nitride films 73, and the post oxide film 7 formed on the polysilicon gate electrode 205 as a mask, As ions may be implanted at accelerating voltage Vac=30 kV and a dose $\Phi=3\times10^{15}$ cm$^{-2}$, and then annealing is performed at 850° C. for 30 minutes. Then, as shown in FIG. 36D, the n$^+$ source region 216 and the n$^+$ drain region 226 are formed in the SiGe regions 278.

(f) Then, the oxide film 8 for the interlayer insulating film formed by CVD etc. on an entire surface to have a thickness of 0.3 to 0.5 μnm, for example. Then, a resist film is spin-coated thereon and is patterned by photolithography. After this, contact holes are opened by etching the oxide film 8 by means of RIE or the like. Subsequent to etching of the oxide film 8, as shown in FIG. 34, a metal such as Al, Al—Si, Al—Si—Cu, or the like is patterned to form the source metal electrode 218 and the drain metal electrode 228. As a result, the SOI.MOSFET of the fifteenth embodiment of the present invention can also be completed.

(SIXTEENTH EMBODIMENT)

Figure 37A:
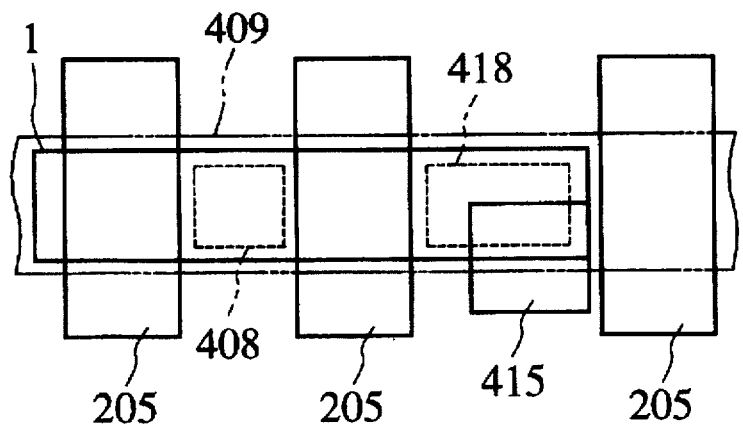
FIG. 37A is a plan view showing a SOI.MOS.DRAM according to a sixteenth embodiment of the present invention.
Figure 37B:
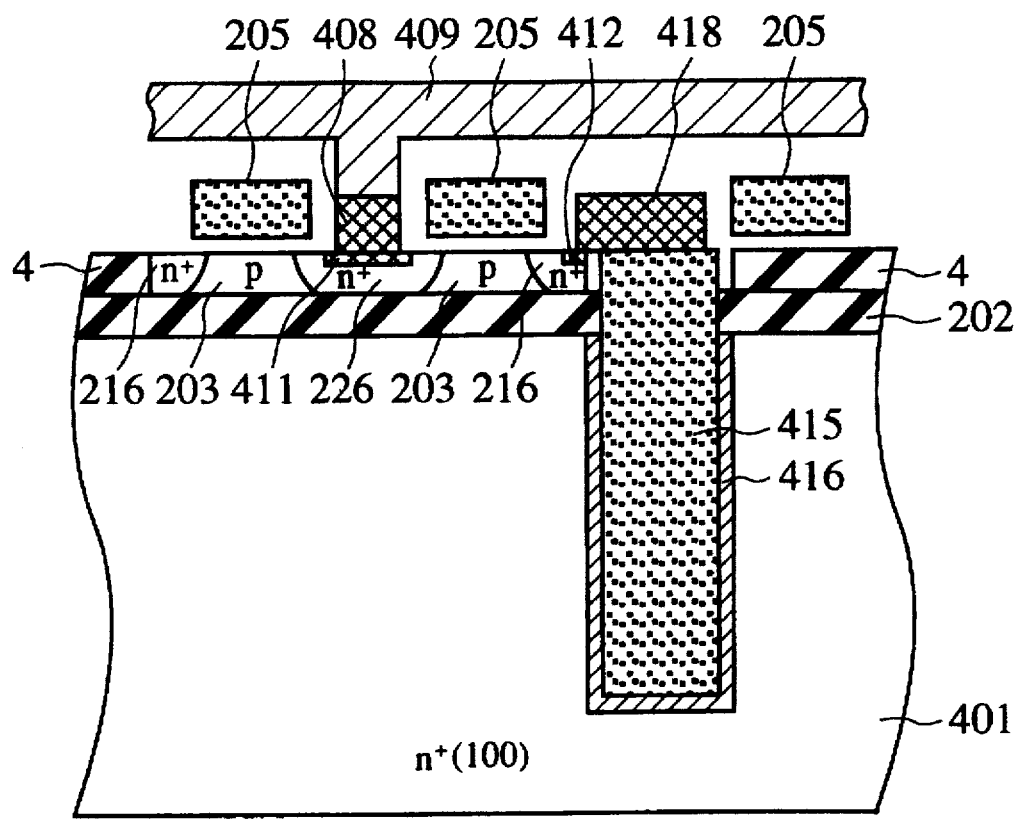
FIG. 37B is a sectional view showing the SOI.MOS.DRAM in FIG. 37A.

FIGS. 37A and 37B shows respectively a plan structure and a sectional structure of a SOI.MOS dynamic random access memory (DRAM) according to a sixteenth embodiment of the present invention. FIG. 37A is a plan view of the sixteenth embodiment and FIG. 37B is a sectional view of the sixteenth embodiment in FIG. 37A. In FIG. 37B, a p-type SOI film 203 is formed on an n$^+$ (100) silicon substrate 401 via a buried oxide film 202. The SOI film 203 is surrounded by an isolation oxide film 4 formed by LOCOS technique etc., and the SOI film 203 surrounded by the oxide film 4 is used as an active region (device region) 1. FIG. 37B only shows a sectional structure near the active region 1. An n$^+$ source region 216 and an n$^+$ drain region 226, which constitute a switching transistor (or select transistor) of a DRAM, are formed deeply in the active region 1 so as to contact their bottoms with the buried oxide film 202. SiGe regions 411 and 412 are formed respectively in insides of the n$^+$ source region 216 and the n$^+$ drain region 226. In addition, a gate electrode 205 formed of polysilicon etc. is formed on a channel region 203 between the n$^+$ source region 216 and the n$^+$ drain region 226 of the switching transistor via the gate oxide film 204. As shown in FIG. 37A, the polysilicon gate electrode 205 is also used as a word line. A contact electrode 408 formed of W etc. is formed so as to be connected to the SiGe regions formed in the surface portion of the n$^+$ drain region 226. The contact electrode 408 is also connected to a data line (bit line) 409. Near the n$^+$ source region 216 in the SOI film 203, a trench is formed by digging deeply the n$^+$ (100) silicon substrate 401 through the buried oxide film 202. A capacitor insulating film 416 is formed on an innerwall of the trench. A doped polysilicon serving as a storage node electrode 415 is formed on a surface of the capacitor insulating film 416 so as to bury an inside of the trench. A refractory metal such as W, Ti, Mo, etc. or a refractory metal silicide such as WSi$_2$, TiSi$_2$, MoSi$_2$, etc. may be used in place of the doped polysilicon. A DRAM storage capacitor portion (cell capacitor portion) is formed by the storage node electrode 415 and the n$^+$ (100) silicon substrate 401 serving as a plate electrode (opposing electrode), which are formed to put the capacitor insulating film 416 therebetween. The storage node electrode 415 in this capacitor portion is connected to the SiGe region 412 formed in the surface portion of the n$^+$ source region 216 in the switching transistor by a contact metal 418. As shown in FIG. 37B, in the SOI.MOS.DRAM according to the sixteenth embodiment of the present invention, since the Si$_x$Ge$_{1-x}$ regions 412 and 411 are formed in the n$^+$ source region 216 and the n⁺ drain region 226, holes accumulated in the channel region 203, or the SOI body can be extracted therefrom quickly and at high efficiency. Therefore, the drawback of the drain breakdown voltage (drain endurance) lowering because of the floating body effect can be improved. Moreover, as shown in FIG. 37B, the $Si_xGe_{1-x}$ regions are fully included in the n⁺ regions 216, 226 and formed spaced apart from pn junction interface by a distance corresponding to the thickness of sidewalls (not shown) of the gate electrode, i.e., by about 10 to 50 nm. By the structure that SiGe region is fully included in n⁺ region, the leakage current due to the crystal defects caused by ion implantation can be similarly prevented as the eleventh embodiment of the present invention, which are shown in FIG. 26, and a good data holding characteristic can be exhibited.

The SOLMOS.DRAM according to the sixteenth embodiment of the present invention can be manufactured by manufacturing steps described hereinbelow.

(a) First, utilizing a CZ.n⁺ (100) substrate (ρ=0.006 Ωcm) into which phosphorus (P) is doped by $10^{19}$ cm⁻³ as a supporting substrate 401, an SOI substrate for the sixteenth embodiment is fabricated by SDB technique. At this time, a boron doped CZ.p (100) substrate 203 (ρ=4 Ωcm) is prepared firstly, as the SOI film 203 for an active region side. Then, a thermal oxide film 202 having a thickness of 500 nm is grown on the surface of the SOI film 103, and the surface of the thermal oxide film 202 is polished to have a mirror like surface. Secondary, another substrate, which is a n⁺ (100) supporting substrate 401, is prepared, and the surface of the n⁺ supporting substrate is mirror polished. Thereafter, both substrates 203, 401 are mated with facing mirror surface of thermal oxide film 202 to mirror surface of n⁺ substrate 401, and a resultant structure is annealed at a temperature of 1100° C. After this, the active layer (SOI film) 203 is thinned by grinding, followed by etching to have a thickness of 250 nm, thus resulting in a SDB-SOI substrate. Alternatively, the SOI substrate may be formed by SIMOX technique. In this case, more particularly, O⁺ ions are implanted from a surface of the n⁺ (100) substrate at an accelerating voltage of Vac=400 kV and a dose $\Phi=2\times10^{18}$ cm⁻², and annealing is performed at a temperature of 1325° C. for about five hours, and then B⁺ (or BF₂⁺)ion implantation into the SOI film 203 formed on the buried oxide film 202 by the SIMOX technique is conducted to have desired impurity concentration for channel region. A thickness of the SOI film 203 can be controlled by thermally oxidizing a surface of the SOI film 203 and wet-etching the thermal oxide film. Thereafter, if a thermal oxide film with a thickness of 300 nm is formed on the surface of the SOI film 203, a total thickness of the remaining Si layer at the bottom portion of the SOI film 203 becomes 100 nm. By the way, before forming the thermal oxide film of 300 nm in thickness, the device isolation oxide film 4 should be formed deeply into SOI film 203 by LOCOS, BOX or the like technique so as to reach the buried oxide film 202, and laterally isolate the device region 1.

(b) Then, a photoresist pattern is formed by photolithography having a window part for a trench (U groove) forming region. The 300 nm thick oxide film formed on the surface of the SOI film 203 is etched by ECR or RIE etching using $CF_4$, $CF_4/H_2$, $C_3F_6$, or the like, for example. Furthermore, using the oxide film as a mask, a trench for forming the DRAM storage capacitor is formed by RIE or ECR ion etching using $C_4$, $SF_6$, $CBrF_3$, $SiCl_4$, $CCl_4$, or the like. It is available to refrigerate the substrate at −110° C. to −130° C. when the high aspect ratio trench is being etched.

(c) Then, the capacitor insulating film (capacitor oxide film) 416 is formed on the surface of the trench by thermal oxidation to have a thickness of 10 to 20 nm. In addition, the doped polysilicon film serving as the storage node electrode 415 is formed by LPCVD on the capacitor insulating film so as to bury the trench. The capacitor insulating film 416 may be also formed by LPCVD. That is, first the doped polysilicon for the plate electrode may be formed on inner walls of the trench by CVD, and subsequently the capacitor oxide film 416 and the doped polysilicon film 415 for the storage node electrode may be formed continuously by CVD. Thereafter, the doped polysilicon is etched back and a surface of the SOI film 203 is made even by CMP or the like technique if necessary.

(d) Subsequent steps are such steps used for forming the switching transistor by standard MOSFET processes. Although the detail explanations such as ion implantation for doping ions into the channel region are omitted, the gate oxide film 204 of a thickness of 10 nm, for example, is formed by thermal oxidation. Next, the polysilicon gate electrode 205 is formed. The n⁺ source region 216 and the n⁺ drain region 226 are formed by ion implantation of As or P ions in a self-alignment manner. More particularly, P ions may be implanted at accelerating voltage Vac=30 kV and a dose $\Phi=3\times10^{15}$ cm⁻², and then annealing is performed at a substrate temperature of 850° C. for 30 minutes. As a result, the n⁺ source region 216 and the n⁺ drain region 226 are formed. Then, the nitride film is deposited on an entire surface to have a thickness of 10 to 50 nm by CVD. Then, the sidewall nitride films are formed only on both sides of the polysilicon gate electrode 205 by directional (anisotropic) etching such as RIE or the like. Then, using the sidewall nitride films and the polysilicon gate electrode 205 as a mask, Ge ions may be implanted at accelerating voltage Vac=50 kV and a dose $\Phi=1$ to $2\times10^{16}$ cm⁻², and then annealing is performed at 800° C. for 30 minutes. Thus, the $Si_xGe_{1-x}$ regions 411 and 412 are formed in the n⁺ source region 226 and the n⁺ drain region 216.

(e) Then, an oxide film for the interlayer insulating film is formed by CVD etc. on an entire surface to have a thickness of 0.5 μm, for example. Then, a resist film is spin-coated thereon and is patterned by photolithography. After this, contact holes are opened on the n⁺ source region 216 by photolithography. Also, as shown in FIG. 37A, a window for forming a contact electrode is opened near a boundary between the storage node electrode 415 and the n⁺ drain region 216. A W metal serving as the contact electrodes 408, 418 is buried in insides of the contact hole and the window for forming the contact electrode by either selective CVD of W or sputtering/reverse sputtering of W. By the way, if we want to make contact electrode 408, 418 by SiGe, instead of W, SiGe may be selectively deposited by CVD employing a vapor phase reaction between $SiH_4$ (or $Si_2H_6$) and $GeH_4$. As another method for forming SiGe contact electrode 408, 418, Ge ions may be ion-implanted into the polysilicon, which are selectively deposited in the contact hole portion in the interlayer insulating film by CVD. A metal such as Al, Al—Si, Al—Si—Cu, or the like is deposited by EB evaporation or sputtering, and, as shown in FIGS. 37A and 37B, a bit line 409 is formed by photolithography and RIE steps. As a result, the SOLMOS.DRAM of the sixteenth embodiment of the present invention can be completed.

In the above manufacturing steps, the $Si_xGe_{1-x}$ region 412 may also be formed in the upper part of the storage node electrode 415 by implanting Ge ions into the storage node electrode 415 formed of the polysilicon etc. (In FIG. 37B, the $Si_xGe_{1-x}$ region formed in the surface portion of the storage node electrode 415 is omitted). Ge ions may be implanted through the contact holes formed in the interlayer insulating film and the window for forming the contact electrode (referred to as "contact holes or the like" hereinafter). If Ge ions are implanted via contact holes or the like, the $Si_xGe_{1-x}$ regions 411 and 412 are fully included in the $n^+$ regions 216, 226 and formed away from the pn junction interface between the $n^+$ regions 216, 226 and p-type channel region of the switching transistor, so that the generation and propagation of the crystal defects in the $n^+$ regions 216, 226 can not influence the leakage current in the channel region. Moreover, the ion implantation doses for the peripheral circuits and the memory cell portions can be changed independently and the Ge ions can be implanted without using the specific implantation mask, so that the most suitable doses of implantation can be freely selected for respective cases. Further, in place of ion implantation for the formation of SiGe layer 411, 412, using the sidewall nitride films or the like as a mask, the $Si_xGe_{1-x}$ layer 411, 412 may be selectively deposited by CVD using the interlayer insulating film 8 as a mask for selective CVD.

Figure 38:
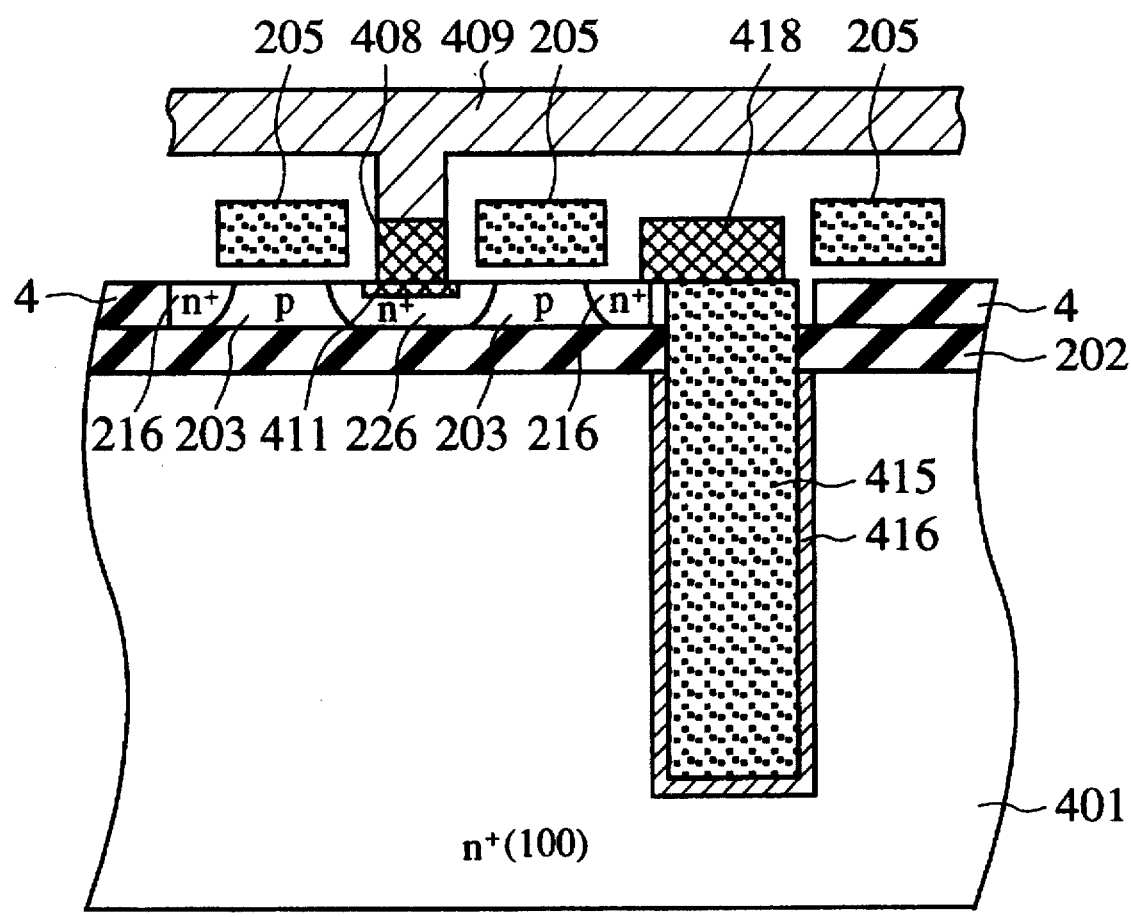
FIG. 38 is a sectional view showing a DRAM according to a modification of the sixteenth embodiment of the present invention.

In a first modification of the sixteenth embodiment of the present invention, as shown in FIG. 38, Ge ions may be implanted only in the contact hole on the $n^+$ drain region 226 side connected to the data line 409. Since the contact hole on the storage node electrode 415 side is only capacitively coupled to the $n^+$ substrate 401 serving as the plate electrode (opposing electrode), there is no current path for extracting holes away positively. Therefore, in case the $n^+$ doped polysilicon is used as the storage node electrode 415, hole concentration on the channel side can be reduced merely by the amount corresponding to the barrier height lowering in the $Si_xGe_{1-x}$ region and holes are not exhausted efficiently, whereby no significant effect for reducing the floating body effect can be expected. Therefore, it may be supposed that the existence of the SiGe region in the $n^+$ source region 216 does not matter and the same effect can be expected if Ge ions are implanted only into the $n^+$ drain region 226. In addition, since there is no possibility of the crystal defects near pn junction in the $n^+$ source region 216, leakage current due to the crystal defects can also be reduced, if the Ge implantation in the $n^+$ source region side is omitted. Incidentally, in the sixteenth embodiment, the $n^+$ region connected to the data line (bit line) 409 is called as the $n^+$ drain region 226 for convenience, but, since it is a mere matter of naming, and the $n^+$ region connected to the data line (bit line) 409 may be called as the $n^+$ source region. That is, either one of main electrode regions of the MOSFET serving as the switching transistor may be called as a source region or a drain region.

Figure 39A:
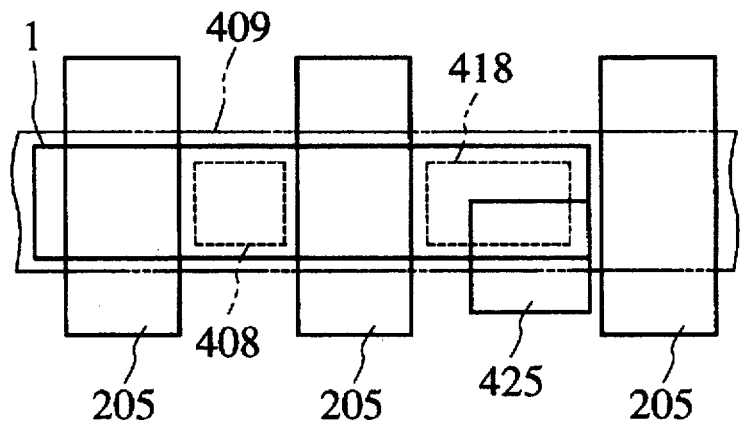
FIG. 39A is a plan view showing a DRAM according to another modification of the sixteenth embodiment of the present invention.
Figure 39B:
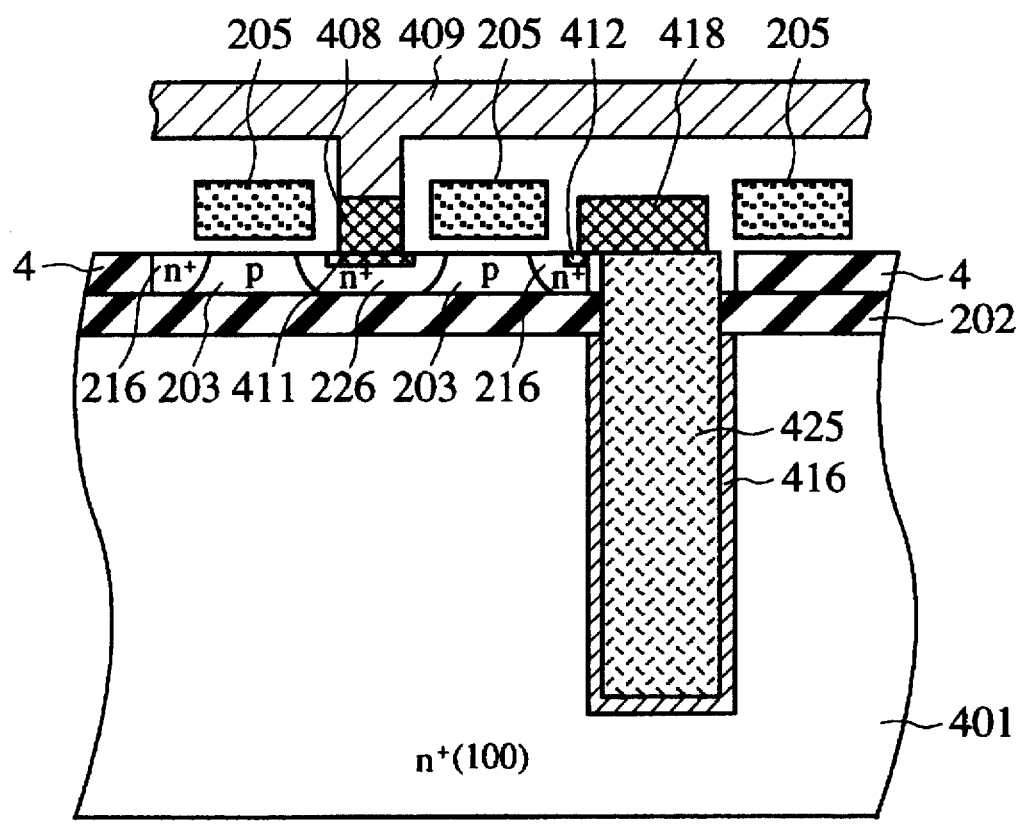
FIG. 39B is a sectional view showing the DRAM shown in FIG. 39A.

As a second modification of the sixteenth embodiment of the present invention, the storage node electrode 415 and the contact electrode 418 shown in FIGS. 37A and 37B can be formed by the $Si_xGe_{1-x}$ layer itself. In other words, although the doped polysilicon 415 is buried in the trench as a storage node electrode in the structure shown in FIGS. 37A, 37B and 38, a structure shown in FIGS. 39A and 39B may be adopted. In FIG. 39B, in place of the doped polysilicon 415, the $n^+$ $Si_xGe_{1-x}$ layer is deposited as a storage node electrode 425 by the CVD using the mixed atmosphere of $SiH_4$ (or $Si_2H_6$), $GeH_4$ and N type impurity (for example, $AsH_3$) and the etch-back process. In a second modification of the sixteenth embodiment, as shown in FIGS. 39A and 39B, the drawback of a small hole extracting effect by the $n^+$ narrow-bandgap-source region 412, which has already been explained with reference to FIG. 38, can be improved to some extent. If the storage node electrode 415 is formed by $n^+$ doped polysilicon, holes cannot be extracted readily into the $n^+$ doped polysilicon side due to the relatively high barrier height generated on the interface between the $Si_xGe_{1-x}$ layer 412 and the $n^+$ doped polysilicon. As a result, hole concentration in the SOI body cannot be effectively reduced. In order to overcome this drawback, as shown in FIG. 39B, the barrier height can be eliminated by forming the storage node electrode 425 per se as the $n^+$ $Si_xGe_{1-x}$ layer, so that holes can be extracted much more into the storage node electrode 425. In addition, if part of the storage node electrode 425 is formed by a metal such as W, such advantage can be improved still more.

Figure 40:
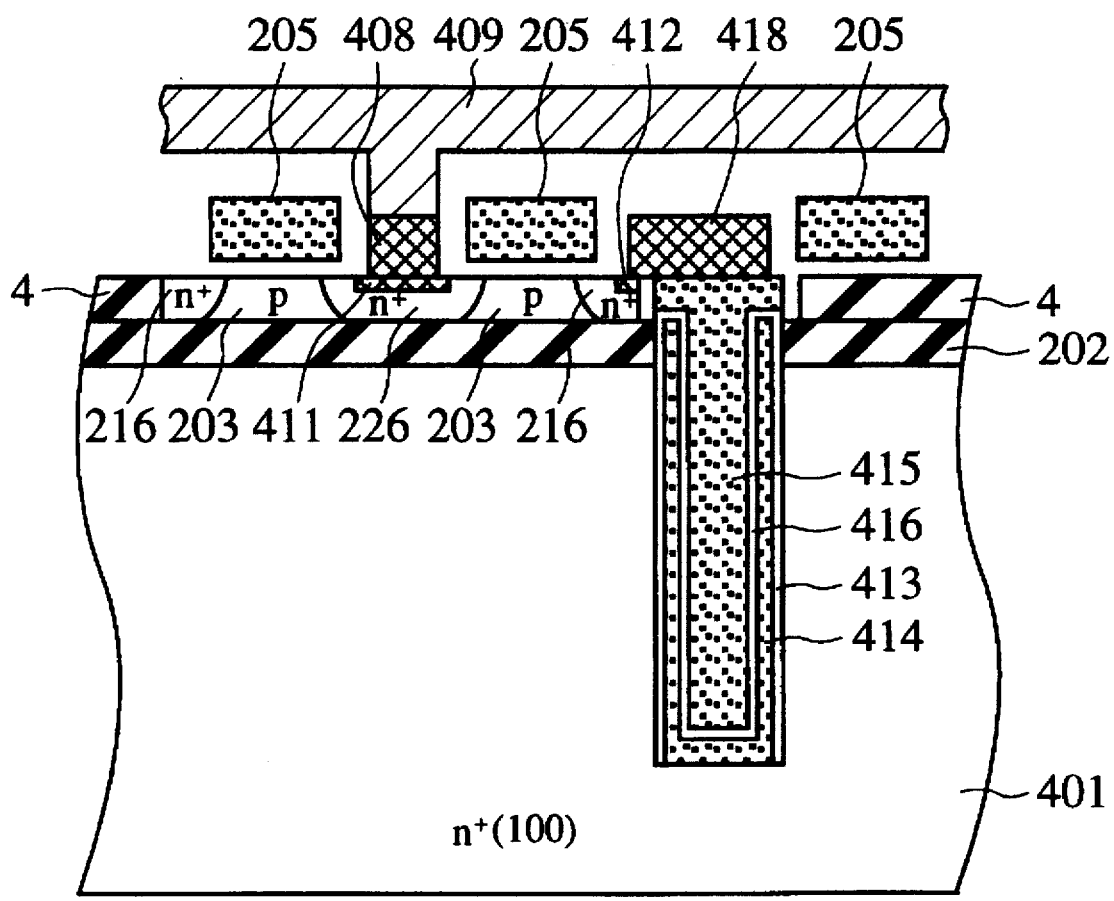
FIG. 40 is a sectional view showing a DRAM according to another modification of the sixteenth embodiment of the present invention.

In a third modification of the sixteenth embodiment, as shown in FIG. 40, first a sheath type oxide film 413 is formed on the inner wall, then a sheath type plate electrode 414 is formed thereon, and then the sheath type plate electrode 414 and the $n^+$ substrate 401 are contacted with each other at the bottom of the trench. A storage capacitor portion of the DRAM is composed of the sheath type plate electrode 414, the capacitor insulating film 416, and the storage node electrode 415. The large and stable capacitance as well as the capacitance having a smaller leakage current can be attained by the structure of the DRAM storage capacitor in FIG. 40.

Any one of SOLMOSFETs of the above first to fifteenth embodiments may be used as the switching transistor of the sixteenth embodiment of the present invention, as well as the SOI.MOSSIT which have the vaccum triode like $I_d$-$V_d$ characteristics. To obtain the SIT characteristics, the channel length, or the carrier concentration of the channel region should be lowered to approach the near-punch through condition.

In the above descriptions, a case has been discussed wherein the switching transistor (or the select transistor) is formed as the n channel MOSFET using the $n^+$ supporting substrate 401. However, if conductivity type of all elements is inverted, the switching transistor may be formed as the p channel MOSFET using the $p^+$ supporting substrate. Furthermore, the DRAM may be formed as a CMOS structure wherein an n well is formed in the p type SOI film 203, using the $n^+$ supporting substrate 401.

(SEVENTEENTH EMBODIMENT)

Figure 41A:
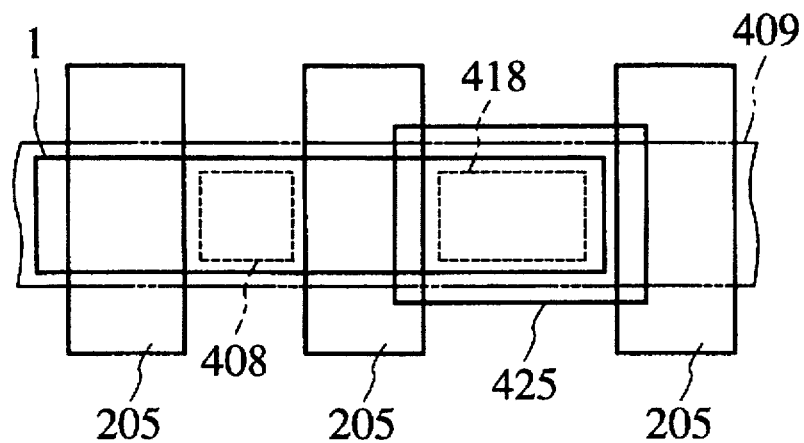
FIG. 41A is a plan view showing a SOI.MOS.DRAM according to a seventeenth embodiment of the present invention.
Figure 41B:
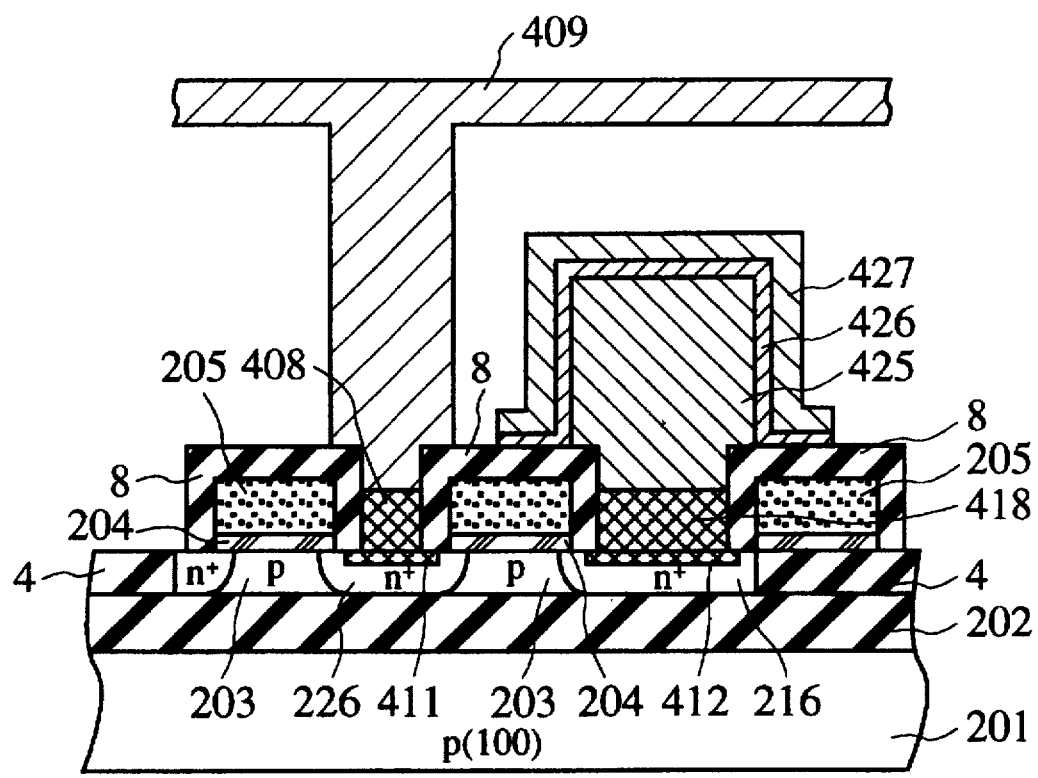
FIG. 41B is a sectional view showing the SOI.MOS.DRAM in FIG. 41A.

FIGS. 41A and 41B show respectively a plan structure and a sectional structure of a SOLMOS dynamic RAM (DRAM) according to a seventeenth embodiment of the present invention. FIG. 41A is a plan view of the seventeenth embodiment, and FIG. 41B is a sectional view of the seventeenth embodiment in FIG. 41A. In FIG. 41B, a p-type SOI film 203 is formed on a p type (100) silicon substrate 201 via a buried oxide film 202. The SOI film 203 is surrounded by a device isolation oxide film 4 formed by LOCOS technique etc., and an interior of the SOI film 203 surrounded by the oxide film 4 is used as an active region (device region) 1. FIG. 41B only shows a sectional structure near the active region 1. An $n^+$ source region 216 and an $n^+$ drain region 226, which constitute a switching transistor in a DRAM unit cell, are formed in the active region 1 and diffused deeply into the SOI film 203 so as to contact their bottoms with the buried oxide film 202. In addition, a gate electrode 205 formed of polysilicon etc. is formed on a channel region 203, or SOI body between the $n^+$ source region 216 and the $n^+$ drain region 226 of the switching transistor in each DRAM unit cell via the gate oxide film 204. As shown in FIG. 41A, the gate electrode 205 is also used as a word line. $Si_xGe_{1-x}$ regions 412 and 411 are respectively formed in insides of the n⁺ source region 216 and the n⁺ drain region 226. An interlayer insulating film 8 such as an oxide film etc. is formed on the word line. A contact electrode 408 formed of W, $WSi_2$, $TiSi_2$, $MoSi_2$, etc. is formed in a contact hole formed in the interlayer insulating film 8 so as to be connected to the $Si_xGe_{1-x}$ region 411 formed on the n⁺ drain region 226. The contact electrode 408 is connected to the data line (bit line) 409 formed by a metal such as W, Al, Al—Si, Al—Si—Cu, or the like.

The seventeenth embodiment of the present invention is a stack type DRAM in which the DRAM storage capacitor portion is formed on the n⁺ source region 216 and the gate electrode 205 of the select transistor. A contact electrode 418 formed of W, Ti, $WSi_2$, $TiSi_2$, $MoSi_2$, etc. is formed on the $Si_xGe_{1-x}$ region 412 formed in the surface portion of the n⁺ source region 216. The contact electrode 418 may be formed of the $Si_xGe_{1-x}$. The storage node electrode 425 which is formed of either a metal such as W, Ti, Pt, Ru(Rutenium), etc. or a silicide film of these metals is formed on the contact electrode 418. The conductive metal oxides such as $SrLaTiO_3$, $CaYTiO_3$, $CaNdTiO_3$, $LaNiO_3$, $SrCaLaRuO_3$, $NdNiO_3$, and $RuO_2$ may be used as a storage node electrode material. The storage node electrode 425 may be formed of a doped polysilicon film and a multilayered film such as Ti/TiN films formed on the doped polysilicon film. Further, an opposing electrode (cell plate electrode) 427 is formed on the capacitor insulating film 426, which is formed on the storage node electrode 425. The capacitor insulating film 426 may be formed of silicon oxide film ($SiO_2$), tantalum oxide film ($Ta_2O_5$), barium titanate ($BaTiO_3$), aluminium oxide ($Al_2O_3$), silicon nitride ($Si_3N_4$), or the like. Alternatively, the capacitor insulating film 426 may be formed a barium strontium titanate (BSTO) film which is solid solution of $SrTiO_3$ (STO) and $BaTiO_3$ (BTO), or a composite film of silicon nitride ($Si_3N_4$) film and silicon oxide ($SiO_2$) film. As the opposing electrode (cell plate electrode) 427, titanium nitride (TiN) film, W film, Ru film, $RuO_2$ film, or silicide film such as $WSi_2$, $MoSi_2$, $TiSi_2$, etc. may be used. As another example, the composite film of $RuO_2$/Ru or $RuO_2$/Ru/TiN/W may be used for the opposing electrode 427.

As shown in FIG. 41B, in the SOI.MOS.DRAM according to the seventeenth embodiment of the present invention, since the $Si_xGe_{1-x}$ regions 412 and 411 are formed in the n⁺ source region 216 and the n⁺ drain region 226 respectively, holes accumulated in the channel region 203, or the SOI body, can be extracted therefrom quickly and at high efficiency. Therefore, the floating body effect is suppressed and the drain breakdown voltage (drain endurance) can be improved. Moreover, as shown in FIG. 41B, the $Si_xGe_{1-x}$ regions are fully included in the n⁺ regions 216, 226 and formed spaced apart from pn junction interface by a distance corresponding to the thickness of sidewalls of the gate electrode, i.e., by about 10 to 50 nm. In addition, the generation of the crystal defects due to ion implantation can be prevented, or the influence to the leakage current by the generation of crystal defect is eliminated and a good data holding characteristic of DRAM can be exhibited, even though some crystal defect has been generated.

The SOI.MOS.DRAM according to the seventeenth embodiment of the present invention can be manufactured by manufacturing steps described hereinbelow. A case wherein the capacitor insulating film in the DRAM storage capacitor is formed of the barium strontium titanate (BSTO) film will be explained hereinbelow, but it is of course that other materials (insulating materials) may be used.

(a) First, like the above embodiments of the present invention, the SOI film 203 is formed by SIMOX or SDB technique on a p type (100) substrate via the buried oxide film 202.

(b) Then, the device isolation oxide film 4 is formed by LOCOS, BOX or the like technique so as to electrically isolate adjacent devices. Thereafter, the gate oxide film 204 of a thickness of 10 nm is formed, and then a P-doped polysilicon film 205 with a thickness of 0.3 μm is formed thereon by LPCVD or the like. Then, the polysilicon gate electrode 205 having a gate length of 0.5 μm is defined on the gate oxide film 204 by patterning technology such as photolithography and RIE steps.

(c) Then, the n⁺ source region 216 and the n⁺ drain region 226 are formed by implanting P at accelerating voltage Vac=30 kV and a dose $\Phi=3\times10^{15}$ cm⁻², and annealing at 850° C. for 30 minutes. Then, the nitride film of 10 to 50 nm in thickness is deposited on an entire surface by CVD. Then, the sidewall nitride films are formed only on both sides of the polysilicon gate 205 by directional (anisotropic) etching such as RIE or the like. Then, using the sidewall nitride films and the polysilicon gate electrode 205 as a mask, Ge ions may be implanted at accelerating voltage Vac=50 kV and a dose $\Phi=1$ to $2\times10^{16}$ cm⁻², and annealing is performed at 800° C. for 30 minutes. As a result, the $Si_xGe_{1-x}$ regions 411 and 412 are formed respectively in the surface portion of the n⁺ source region 226 and the n⁺ drain region 216.

(d) Thereafter, the $SiO_2$/PSG film is deposited by 200 nm to 300 nm in thickness by CVD to form the first interlayer insulating film 8. The p⁺ channel stop implantation, the channel doping implantation etc. which are similar to those in standard MOS.DRAM processes may be taken if required, and therefore their explanations will be omitted.

(e) Then, contact holes are opened in the first interlayer insulating film, or the $SiO_2$/PSG film 8. An As doped n⁺ doped polysilicon layer or a W film having a thickness of 200 nm to 400 nm is deposited by CVD in the contact holes to form the contact electrodes 408, 418. In addition, as a storage node electrode 425, the conductive metal oxide or the W film is deposited on the contact electrode 418, and further a Ti/TiN layer is deposited by RF sputtering on the storage node electrode 425, to thus form a barrier metal layer for the storage node electrode materials. Then, a photoresist is spin-coated and patterned by photolithography to leave on an area of the Ti/TiN barrier metal corresponding to the storage node electrode portion of the DRAM storage capacitor.

(f) Using the photoresist as a mask, the barrier metal layer is etched by RIE using $BCl_3$, $C_4$, $SF_6$, $CCl_4$, or the like. Further, the conductive metal oxides or the W film therebeneath is also etched to pattern a shape of the storage node electrode 425, as shown in 41B. Subsequently, after the photoresist is removed, the structure is cleaned. Then, Pt film with a thickness of 50 nm, BSTO film 426 with a thickness of 30 nm and W film 427 with a thickness of 150 nm are formed continuously in this order so as to cover an upper surface and sidewalls of the storage node electrode 425. Instead of RF sputtering, CVD etc. may be used.

(g) Next, a photoresist is spin-coated on an entire surface. Then, as shown in FIG. 41B, using the photoresist film as a mask, the W film 427 is etched by photolithography with RIE using $CF_4$ to have a shape shown in FIG. 41B.

(h) Then, using the W film serving as the opposing electrode (cell plate electrode) 427 as a mask layer, the BSTO layer 426 is etched by using predetermined etching solution such as mixed solution of hydrogen peroxide, ammonia water and EDTA, etc. and the patterned.

(i) Next, using the BSTO layer 426 formed as above as a mask, the Pt layer formed beneath the BSTO film 426 is patterned by RIE using $CF_4$ or by etching solution, which is formed of iodine (I₂), cetylpyridinium iodide (CPI) and benzene, and then is heated at 60° C. After this process, the etching solution is rinsed by immersing a resultant structure in alcohol. Subsequently, the etching solution is perfectly washed by using choline as alkali hydroxide. A rinse solution known as Cicaclean TMK (product name of KANTO KAGAKU Co., Ltd.) may be used as the choline. By the above process, the DRAM storage capacitor cell, which is shown in FIG. 41B and uses the W/Ti/TiN/Pt storage node electrode (or the conductive metal oxide/Ti/TiN/Pt storage node electrode) 425, the high dielectric constant material film 426 and the W opposing electrode 427 on the $n^+$ source region 216, may be formed simply and at low cost. Alkali hydroxide, MABT, or various alcohol may be used for cleaning the etching solution other than the choline. At this time, it is preferable that it may be used in a vapor state under the application of some vapor pressure, or these solutions may be used under 50 KHz to 1 MHz ultrasonic power. If the cleaning liquid is used in a vapor state, i.e., the substrate is heated up to 50°~150° C. under reduced pressure, dry cleaning is enabled.

(j) Subsequently, the second interlayer insulating film such as SiO₂ film, PSG film, or BPSG film is deposited by CVD. Contact hole is opened in the second interlayer insulating film on the contact electrode 408 formed on the $n^+$ drain region 226. Then, the doped polysilicon film, the WSi₂ film, or the like is formed by selective CVD to bury the contact holes in the second interlayer insulating film. Instead of selective CVD, firstly, the blanket W or WSi₂ film may be formed on the entire surface by CVD and then etched back to flatten the surface thereof, thus filling the contact holes in the second interlayer insulating film. After this, the bit line 409 is formed using a metal such as Al, Al—Si, Al—Si—Cu, or the like. As a result, as shown in FIGS. 41A and 41B, the SOI.MOS.DRAM of the seventeenth embodiment of the present invention can be completed.

Figure 42A:
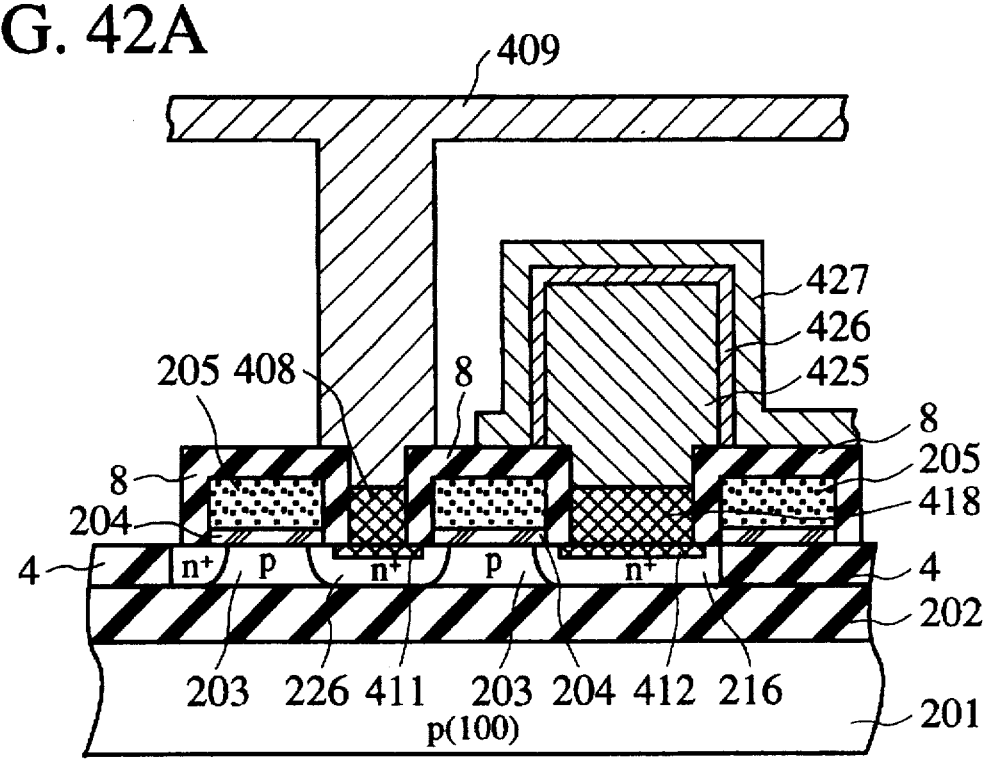
FIGS. 42A and 42B are sectional views each showing a SOI.MOS.DRAM according to a modification of the seventeenth embodiment of the present invention.
Figure 42B:
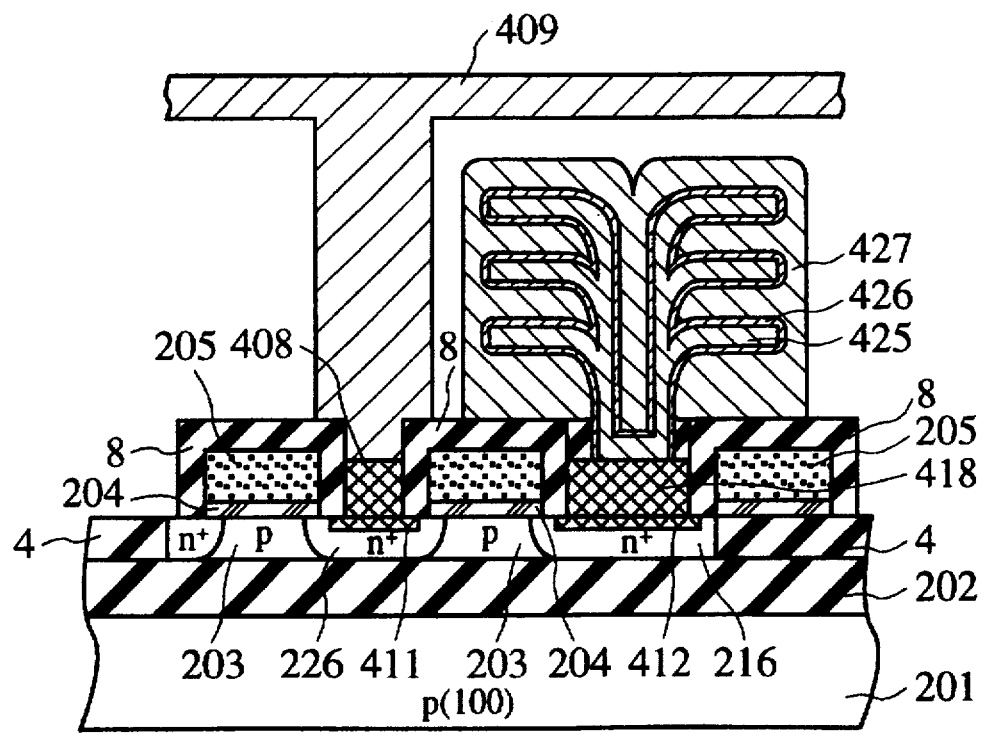
Figure 43A:
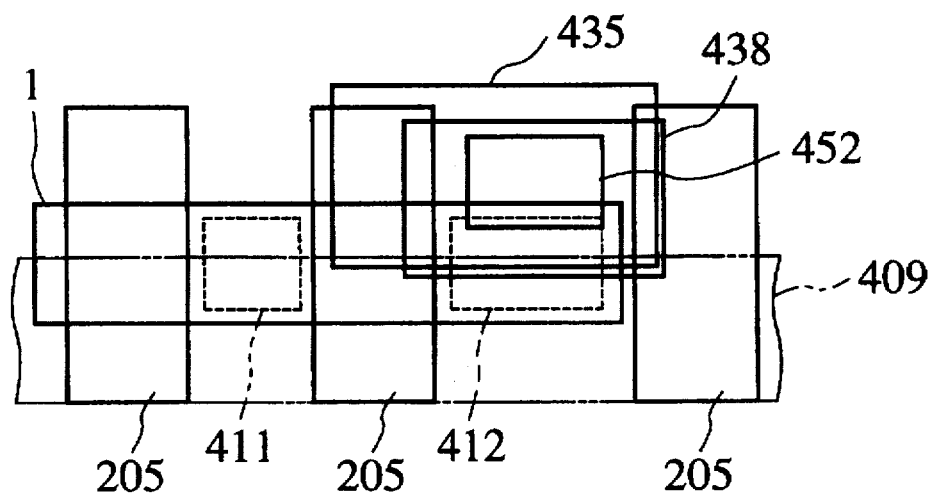
FIG. 43A is a plan view showing the SOI.MOS.DRAM according to the modification of the seventeenth embodiment of the present invention.
Figure 43B:
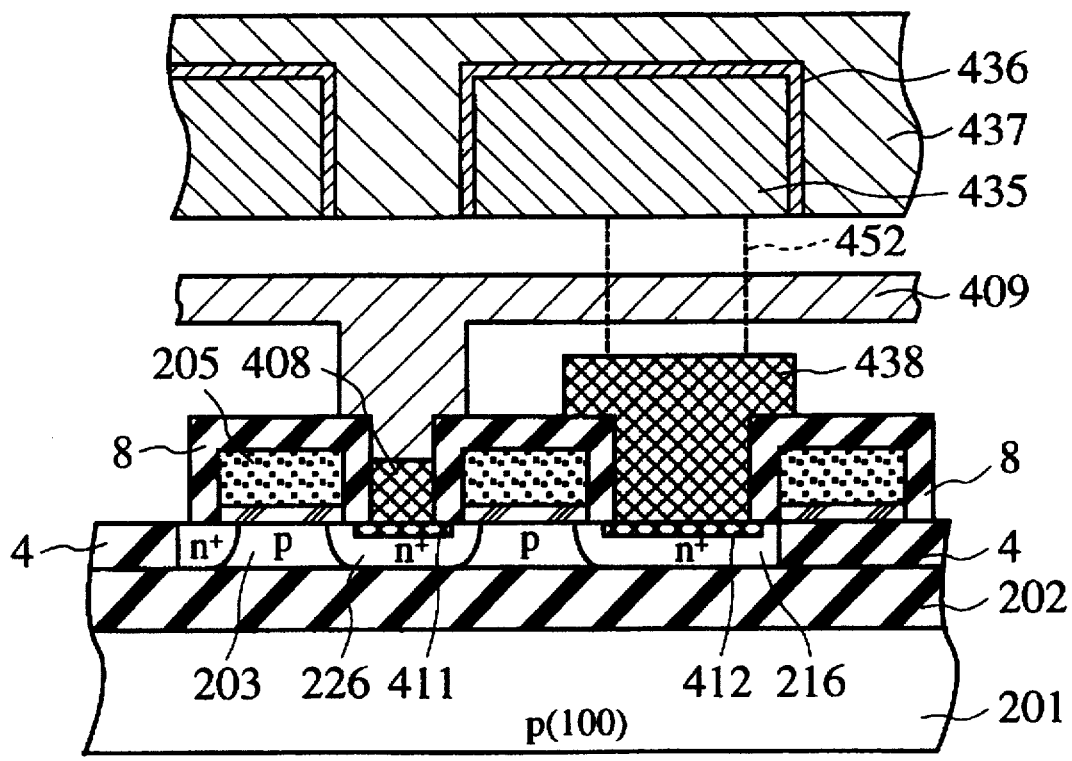
FIG. 43B is a sectional view showing the SOI.MOS.DRAM shown in FIG. 43A.

In an example of the stack type DRAM is shown in FIGS. 41A and 41B, a structure of the DRAM storage capacitor portion shown in FIGS. 42A and 42B may be used. FIG. 42B shows a so-called fin type capacitor enabling larger capacitance. In FIGS. 41A, 41B, 42A and 42B, although the DRAM storage capacitor portion is formed beneath the data line (bit line) 409, the storage capacitor portion comprising the storage node electrode 4S5, the capacitor insulating film 486, and the opposing electrode (cell plate electrode) 487 may be formed on the bit line 409, as shown in FIGS. 43A and 43B. The storage node electrode 485 is connected to the contact electrode 488, which is formed on the $Si_xGe_{1-x}$ region 412 formed in the surface portion of the $n^+$ source region 216, via the contact electrode 452, which is formed in the via hole formed in the second interlayer insulating film.

In the seventeenth embodiment of the present invention, the $Si_xSn_{1-x}$ region may be formed by implanting Sn ions in place of Ge ions. Ge ions or Sn ions may be implanted through the contact holes formed in the first interlayer insulating film, or the like. If ions are implanted via contact holes or the like, the $Si_xGe_{1-x}$ regions 411 and 412 or the $Si_xSn_{1-x}$ layers are fully included in the $n^+$ regions 216, 226 and formed spaced away from pn junction interface between the $n^+$ region and p-type channel region of the switching transistor. For this reason, leakage current based on the crystal defects can be suppressed since the defect exist far from the depletion layer in the channel region. Moreover, the ion implantation doses can be independently selected for the peripheral circuit portions and for memory cell portions, without using the implantation mask, so that a most suitable doses of ion implantation can be freely selected for respective cases. Instead of the contact electrodes 408, 418 and 488, the $Si_xGe_{1-x}$ layer may be formed in these contact holes or the like by CVD employing a vapor phase reaction between SiH₄ (or Si₂H₆) and GeH₄. Otherwise, in place of ion implantation using the sidewall nitride films or the like as a mask, the $Si_xGe_{1-x}$ layer may be formed by selective CVD. Similarly, the $Si_xSn_{1-x}$ layer or the narrow band gap material such as PbS, PbTe, SnTe, ZnSb, etc. may be formed by CVD instead of the $Si_xGe_{1-x}$ layer.

Any one of SOI.MOSFETs of the above first to fifteenth embodiments may be used as the switching transistor of the seventeenth embodiment of the present invention. For instance, the LDD.MOSFET shown in FIG. 17C may be used. Further, SOI.MOSSIT (Static Induction Transistor), which has the nonsaturated, vaccum triode like $I_d$-$V_d$ (drain current vs. drain voltage) Characteristics, may be employed instead of SOI.MOSFET. To obtain the SIT characteristics, the channel length or the carrier concentration of the channel region, or the SOI body should be lowered to approach the near-punch through condition. In this sense, SIT may be considered as a kind of short-channel MOSFET. By the SIT structure, the barrier height formed in front of the source region is controlled by the applied drain voltage, which will cause the $I_d$-$V_d$ characteristics depending on the exponential law. In addition, in the above descriptions, a case has been discussed wherein the switching transistor is formed as the n channel MOSFET using the p type Si substrate 201. But, if conductive type of all elements is inverted, the switching transistor may be formed as the p channel MOSFET using the n type silicon substrate. Furthermore, the DRAM may be formed as a CMOS structure wherein an n well is formed in the p type SOI film 203, using the p type silicon substrate 201.

(EIGHTEENTH EMBODIMENT)

Figure 44A:
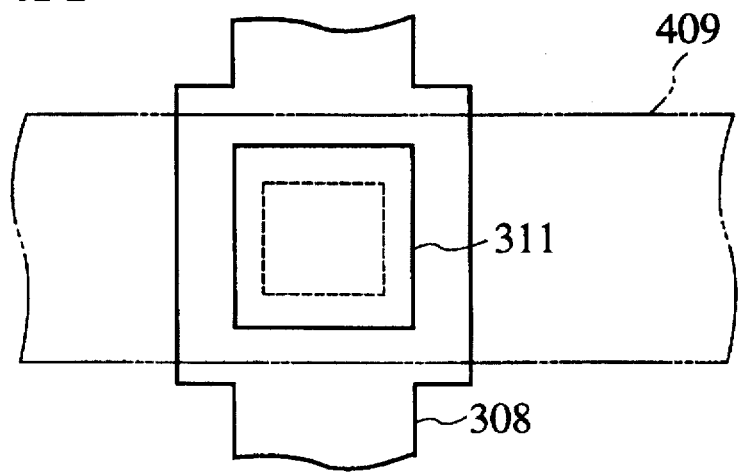
FIG. 44A is a plan view showing a MOS.DRAM, wherein a surrounding gate transistor (SGT) is used as a selection transistor, according to an eighteenth embodiment of the present invention.
Figure 44B:
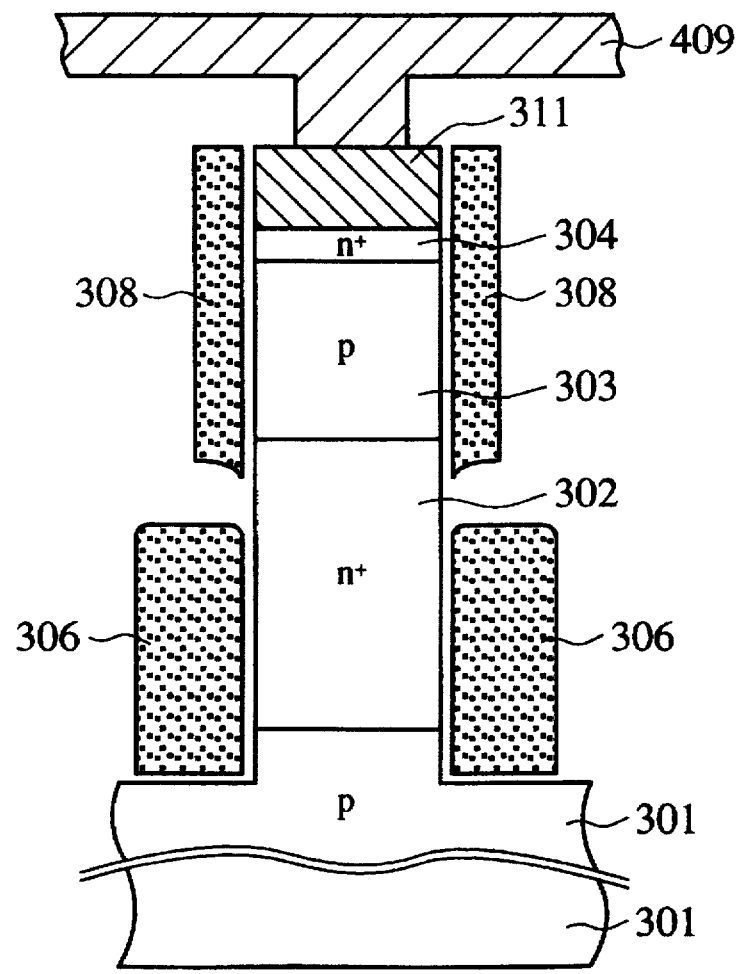
FIG. 44B is a sectional view showing the MOS.DRAM shown in FIG. 44A.

FIGS. 44A and 44B show respectively a plan structure and a sectional structure of a MOS dynamic RAM (DRAM) according to an eighteenth embodiment of the present invention. In this eighteenth embodiment of the present invention, a vertical type transistor called as a surrounding gate transistor (SGT) is used as a switching transistor (select transistor), and the DRAM storage capacitor portion is formed on a lower part of a silicon pillar in which the SGT is formed. In FIG. 44B, an $n^+$ source region 302, a p-type region 303 serving as a channel region of the SGT, an $n^+$ drain region 304, and an $Si_xGe_{1-x}$ region 311 are formed on a p type (100) silicon substrate 301 in that order. A gate electrode 308 of the SGT serving as a word line and an opposing electrode (plate electrode) 306 are formed around a rectangular silicon pillar which is formed in a $p/n^+/p/n^+$ multilayered structure. A DRAM storage capacitor is formed in the lower part of the silicon pillar and between the $n^+$ source region 302 and the opposing electrode 306, sandwiching a thin capacitor dielectrics such as oxide film therebetween. A bit line 409 is connected to the $Si_xGe_{1-x}$ region 311 formed on the n+ drain region 304 via a contact hole in the interlayer insulating film.

In the thin film SOI transistors of respective embodiments described above, the "floating body effect" is similarly caused. Namely, in the SGT wherein the vertical type transistor is formed in the silicon pillar shown in FIGS. 44A and 44B, the channel region 303, on the body, formed in the silicon pillar is easily caused to be a floating state since the silicon pillar is perfectly isolated from the other device regions except for the $n^+$ source region 302 formed at the bottom of the silicon pillar, especially if the silicon pillar has a diameter of about 200 nm. Therefore, the drain breakdown voltage lowering is caused by the accumulated holes in the silicon pillar body, as in the SOI.MOSFET. In order to overcome this "floating body effect", it is desired that the $Si_xGe_{1-x}$ layer is formed in or near the source and drain regions of the vertical type transistor, like the following eighteenth embodiment of the present invention.

As shown in FIGS. 44A and 44B, in the vertical MOS-.DRAM according to the eighteenth embodiment of the present invention, since the $Si_xGe_{1-x}$ region 311 is formed on the n⁺ drain region 304, holes accumulated in the channel region 303 can be extracted into the n⁺ drain region 304 quickly and at high efficiency. Therefore, the drain breakdown voltage (drain endurance) caused by the floating body effect can be improved. Moreover, as shown in FIG. 44B, since the $Si_xGe_{1-x}$ region 311 is formed spaced apart from pn-junction interface between the n⁺ region 304 and p-type pillar body 303, the crystal defects due to the lattice mismatching SiGe/Si heterojunction are generated only in the n⁺ region 304, and does not propagate into p-type body 303, and the generated defects can not influence the leakage current in the p-type body, or the channel region and a good data holding characteristic can be produced.

Incidentally, the $Si_xSn_{1-x}$ layer or the narrow band gap material such as PbS, PbTe, SnTe, ZnSb, etc. may be used instead of the $Si_xGe_{1-x}$ layer 311.

The vertical type MOS.DRAM according to the eighteenth embodiment of the present invention may be manufactured by manufacturing steps shown in FIGS. 45A to 45E.

(a) First, as shown in FIG. 45A, the n⁺ source region 302 of 2.5 µm in thickness, the p region 303 of 0.3 µm in thickness, and the n⁺ drain region 804 of 0.3 µm are formed continuously on a p type substrate 301 by low pressure epitaxy using $SiH_2Cl_2$ and $H_2$. $AsH_3$, $B_2H_6$ are used as dopant gas, for example. Above-mentioned thicknesses are merely given by way of example. Upon forming the vertical type transistor in a mesoscopic (≈10 nm) scale such as a ballistic transistor, vapor phase epitaxy under ultra high vacuum (UHV), MBE or MLE (Molecular Layer Epitaxy) may be used. In case the multilayer of Si is grown by MLE, since one molecular layer (0.186 nm for (100) surface) of Si is grown by one gas introducing/exhausting cycle such that, for example, $SiH_2Cl_2$ is introduced in a growth chamber at pressure of $3\times10^{-2}$ Pa for 15 seconds, then an interior of the growth chamber is evacuated into vacuum ($\approx10^{-4}\sim10^{-7}$ Pa), and then $H_2$ is introduced at pressure of $4\times10^{-3}$ Pa for 10 seconds, then the interior is evacuated again into vacuum. If we repeat this gas introducing/exhausting cycles up to predetermined number, or the desired molecular layer number, at substrate temperature of 815° C., the desired thickness of silicon obtained with an accuracy of one molecular layer.

(b) Then, an oxide film 315 is formed on the n⁺ drain region 304 by CVD or thermal oxidation, and then the oxide film is patterned by photolithography. Then, a photoresist used in etching the oxide film is removed. Subsequently, using the oxide film as a mask, U grooves having a depth of 3.2 µm shown in FIG. 45B are formed by RIE using $BCl_3$, $CF_4$, $SF_6$, $CCl_4$, etc. or ECR ion etching. Then, surfaces of the U grooves are oxidized to form the capacitor oxide film (the upper part of the capacitor oxide film is called the pad oxide film in the following) 305 with a thickness of 10 nm. Doped polysilicon film serving as the plate electrode 306 is formed by CVD on the capacitor oxide film 305 to bury the U grooves. Then, as shown in FIG. 45B, the plate electrodes 306 are formed near the bottom side of the U grooves by etching back the U grooves by about 0.7 µm from the surface. Then, the nitride ($Si_3N_4$) film 307 is deposited on an entire surface by CVD.

(c) Then, the nitride ($Si_3N_4$) film is etched to be left only on side walls of the U grooves by highly directional anisotropic etching such as RIE or the like. By this anisotropic etching the nitride films formed on the plate electrodes 806 and that on top of the oxide film are removed. As shown in FIG. 45C, an oxide film with a thickness of 0.1 µm is formed only on the polysilicon plate electrode 306 by selective oxidation (vertical LOCOS process) using the nitride film 307 remaining on the sidewalls.

(d) Thereafter, the nitride film 807 remaining on the sidewalls used for selective oxidation is removed by isotropic etching such as CDE, and the thin pad oxide film 305 therebeneath is also removed to expose the upper sidewall of the U groove. The gate oxide film 305 is formed again on the upper sidewall of the U groove. Polysilicon, W, $WSi_2$, etc. are formed by CVD on the surface of the gate oxide film 305 to form the gate electrode 308 serving as the word line, as shown in FIG. 45D. The gate electrode 308 may be formed in the U grooves by selective CVD. Otherwise, the gate electrode 308 may be formed by first forming a blanket film of polysilicon, W, $WSi_2$, etc. thicker than the depth of the U grooves and then etching back the blanket film to expose the surface of the n⁺ drain region 304 and obtain a flat surface by CMP technique as shown in FIG. 45D. After this, Ge ions are implanted at accelerating voltage Vac=100 kV and a dose $\Phi=2\times10^{16}$ cm⁻².

(e) After ion implantation, annealing is performed at 950° C. for 30 minutes to thus form the $Si_xGe_{1-x}$ region 311, as shown in FIG. 45E. Then, the interlayer insulating film 8 formed of $SiO_2$/PSG etc. is formed by CVD and then the contact holes are opened. After this, a metal such as Al, Al—Si, Al—Si—Cu, or the like is stacked. As shown in FIG. 45E, the bit line 409 is patterned by photolithography. As a result, the vertical MOS.DRAM according to the eighteenth embodiment of the present invention can be completed.

Upon conducting continuous epitaxy shown in FIG. 45A, an $Si_xGe_{1-x}$ region may be further formed on the top of n⁺ drain region 804 by epitaxial growth by means of vapor phase growth of $SiH_4$ (or $Si_2H_6$, $SiH_2Cl_2$) and $GeH_4$ (or $GeH_2Cl_2$). Otherwise, MLE growth may be effected by alternatively introducing $SiH_2Cl_2$ and $GeH_2Cl_2$. Alternatively, PbS may be formed by MLE growth by alternatively introducing lead halogenides (or one of lead acetate, lead chelates or lead tert-butoxide complexes such as $[Pb(OBu^t)_2]_2$, $Pb_4O(OBu^t)_6$) and $H_2S$ at a pressure of about $3\times10^{-2}$ Pa. If the narrow band gap region is formed by epitaxial growth or CVD process, leakage current is decreased and data holding characteristic of the DRAM is improved since the secondary defect caused by the ion implantation damages can be eliminated and other crystal defects relating the secondary defect can be reduced. In FIG. 45C, although the oxide film 317 has been formed on the plate electrode 306 by selective oxidation (vertical LOCOS process) which is similar to conventional LOCOS (lateral LOCOS) process, the insulating material (such as the oxide) film 317 may be formed by vaccum evaporation or MBE etc. with good directivity. For example, it may be deposited only on the bottom of the U groove, or on the plate electrode 306 to have a thickness of 0.1 µm without depositing on the sidewalls on the upper side of U groove. The insulating material may not be deposited on the sidewall of the silicon pillar by directional evaporation using highly collimated beams in UHV. By this directional evaporation technique, the plate electrode 306 can be formed by W, $WSi_2$, $MoSi_2$, etc. other doped silicon.

Figure 46A:
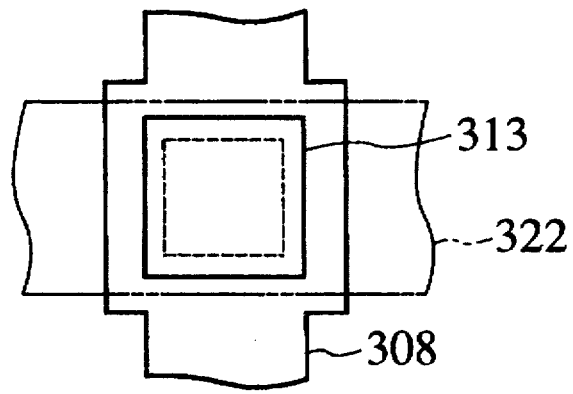
FIG. 46A is a plan view showing a MOS.DRAM according to a modification of the eighteenth embodiment of the present invention.
Figure 46B:
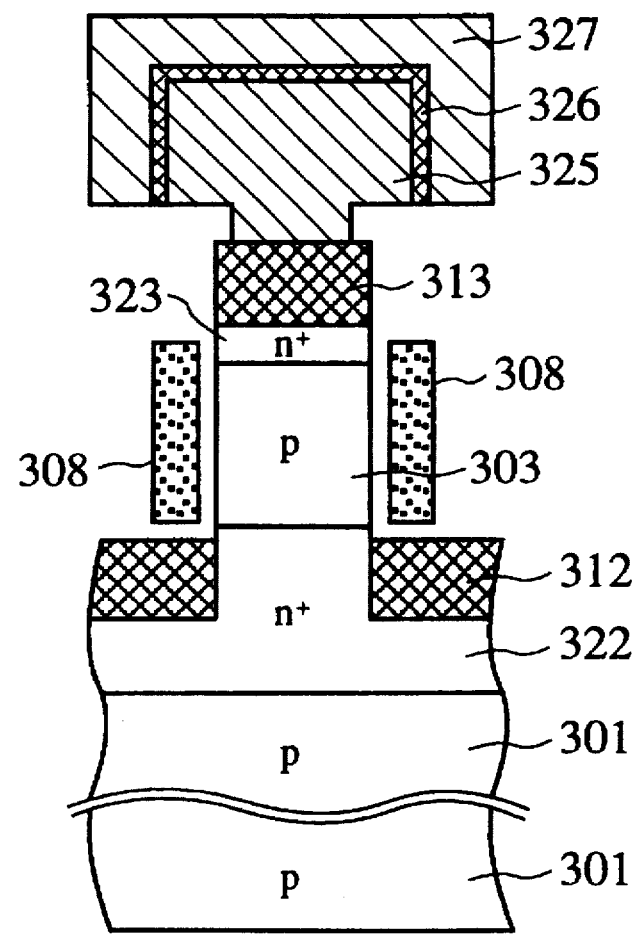
FIG. 46B is a sectional view showing the MOS.DRAM shown in FIG. 46A.

FIGS. 46A and 46B are a plan view and a sectional view respectively showing a first modification of the eighteenth embodiment of the present invention, wherein the SGT is used as the switching transistor, and the DRAM has a stack type storage capacitor comprising a storage node electrode 325, a capacitor insulating film 326, and an opposing electrode (cell plate electrode) 327 in the storage capacitor portion. In the MOS.DRAM shown in FIGS. 46A and 46B, an n$^+$ buried layer 322 formed on the p type silicon substrate 301 in a narrow stripe fashion is used as the bit line, and the gate electrode 308 of SGT is used as the word line. The SGT comprises the n$^+$ buried layer 322 serving as the n$^+$ drain region, the p channel region 303 formed on the n$^+$ drain region, the n$^+$ source region formed thereon, and the gate electrode 308 formed on the sidewall of the channel region 303 or the rectangular silicon pillar, and the like. An $Si_xGe_{1-x}$ region 312 and an $Si_xGe_{1-x}$ region 313 are respectively formed in the n$^+$ drain region 322 and the n$^+$ source region 323. A storage node electrode 325 is connected to the $Si_xGe_{1-x}$ region 313. As shown in FIG. 46B, the $Si_xGe_{1-x}$ region 312 is formed in the surface portion of the n$^+$ buried layer serving as the bit line 322 and in an area on which the silicon pillar constituting the SGT is not formed. The capacitor insulating film formed on the storage node electrode 325 may be formed of $Ta_2O_5$, STO, BTO, BSTO etc., like the seventeenth embodiment of the present invention. In contrast to the structure of the eighteenth embodiment as shown in FIGS. 44A and 44B, the shallower trench can be formed in this first modification, and further, the complicated "vertical LOGOS" process or the directional evaporation of insulating material 317 for separating the opposing electrode (plate electrode) 306 and the word line 308 is not required in the structure in FIGS. 46A and 46B. Therefore, the structure of the first modification is advantageously easy in manufacturing. It is of course that, in place of the $Si_xGe_{1-x}$ regions 312 and 313, $Si_xSn_{1-x}$, or narrow bandgap material such as PbS may be used.

Figure 47A:
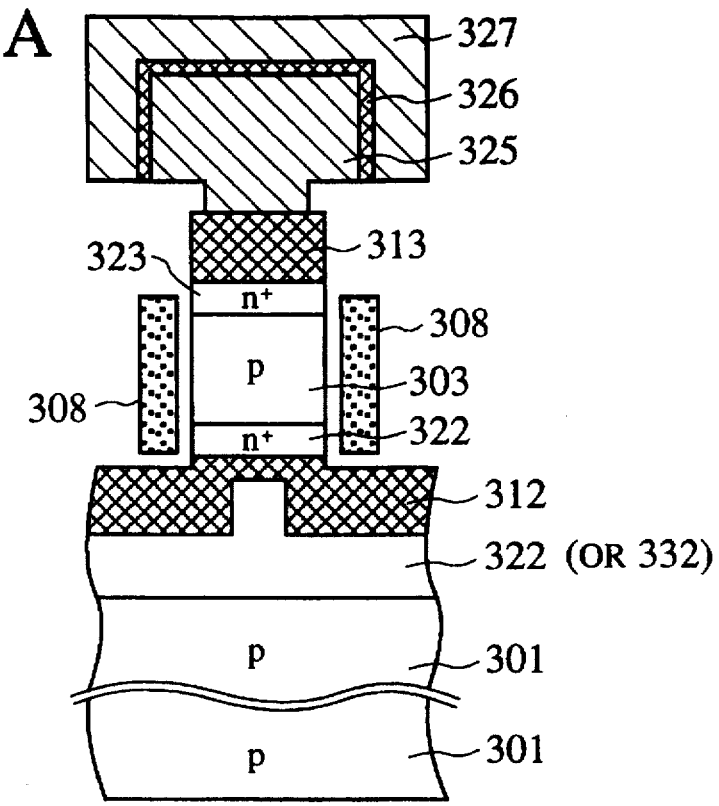
FIGS. 47A and 47B are sectional views each showing the MOS.DRAM according to the modification of the eighteenth embodiment of the present invention.
Figure 47B:
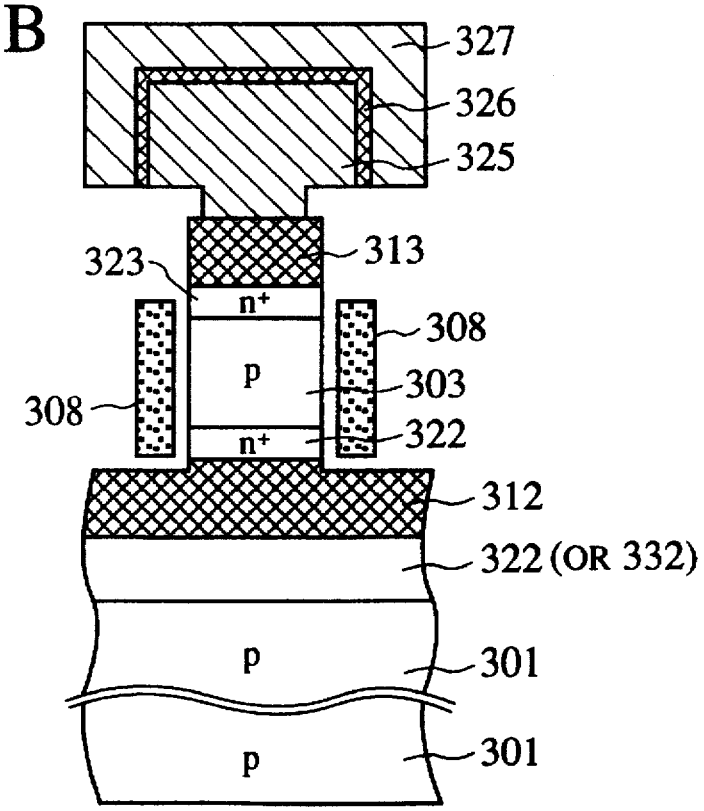

In the structure in FIG. 46B, the $Si_xSn_{1-x}$ region 312 has been formed on the n$^+$ buried layer serving as the bit line 322 and in an area in which the silicon pillar constituting the SGT is not formed. But, it is not always limited to such structure in FIG. 46B, the $Si_xSn_{1-x}$ region 312 may be formed just beneath the silicon pillar, as shown in FIG. 47 and 47B. According to the structure of second modification of the eighteenth embodiment as shown in FIGS. 47A and 47B, an increased hole extracting effect can be derived and the floating body effect is reduced, and finally the drain breakdown voltage can be improved. For this reason, a shorter channel can be realized in SGT.

If the channel length become short enough, and the drain electric field affect the potential barrier formed in front of the source region, the "SGT" becomes "surrounding gate static induction transistor (SGSIT)", which shows the non-saturated drain current ($I_d$) versus drain voltage ($V_d$) characteristics, similar to the vaccum triode. By forming narrow-bandgap-source region, the floating body effect in the SIT also reduced and high drain breakdown voltage improvement $\Delta V_{BD}$ is obtained.

The second modified structure of the vertical MOS-.DRAM of the eighteenth embodiment shown in FIGS. 47A and 47B can be formed by the buried epitaxy as follows. In order to form the n$^+$ buried layer 322, the n+ diffusion layer is formed at first in the p type substrate 301 in a narrow stripe fashion, and then Ge ions are implanted. And then the substrate is annealed to form SiGe layer on the n$^+$ buried stripe layer 322. Thereafter the p region 303 and the n$^+$ source region 323 may be formed by continuous epitaxial growth. By selecting the Ge implant acceleration voltage, the SiGe region 312 may be included in n$^+$ layer 322. Otherwise, in order to form the n$^+$ buried layer 322, first the n$^+$ diffusion layer is formed in the p substrate 301, then the oxide film is formed on the surface of the p substrate 301, then part of the surface of the n$^+$ diffusion layer 322 is etched using the oxide film as a mask to form the U groove, then the $Si_xGe_{1-x}$ region 312 and the n$^+$ region 322 are formed continuously by a selective epitaxial growth in the U groove so as to bury the U groove, then the surface of the resultant structure is evened. And then the oxide film used as the mask in an selective epitaxial growth is removed, and the p region 303 and the n$^+$ source region 323 may be formed by a continuous epitaxial growth thereon.

Figure 48A:
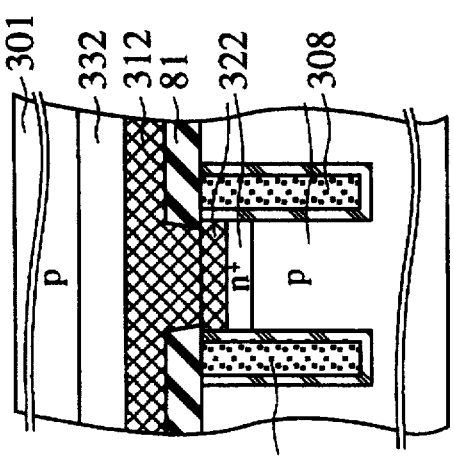
FIGS. 48A to 48F are sectional views each showing manufacturing step of the MOS.DRAM shown in FIGS. 46A to 47B.
Figure 48B:
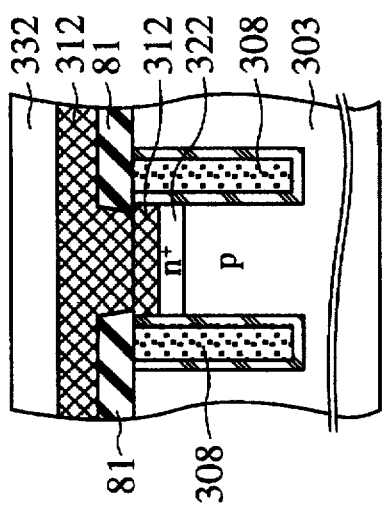
Figure 48C:
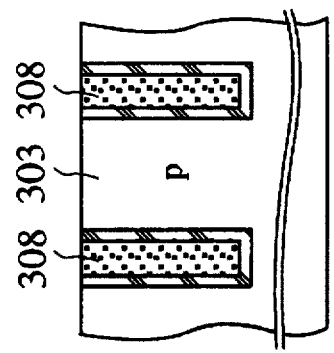
Figure 48D:
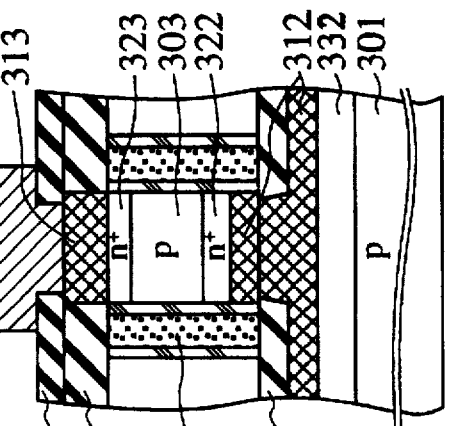
Figure 48E:
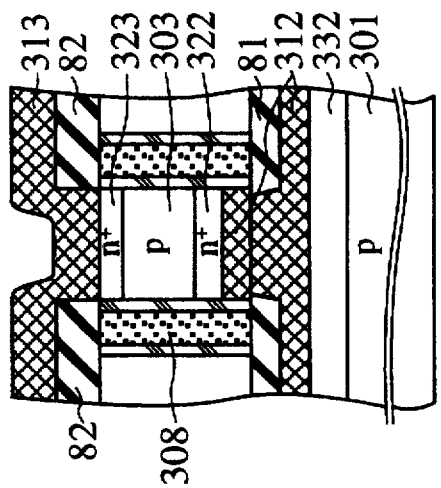

Furthermore, as shown in FIGS. 48A to 48F, the structure of the second modification of the eighteenth embodiment as shown in FIGS. 47A and 47B can be fabricated by SDB technique. In other words, as shown in FIG. 48A, U grooves are formed in the p type silicon substrate 303, and then silicon pillars are formed to be surrounded respectively by the U grooves. Insides of the U grooves are oxidized, and the gate electrodes 308 are formed as DRAM word line wirings so as to bury the U grooves. After this, a first interlayer insulating film 81 is deposited on an entire surface, and contact holes are opened selectively on tops of the silicon pillars. As ions are implanted at accelerating voltage Vac= 100 kV and a dose $\Phi=2\times10^{16}$ cm$^{-2}$, and annealing is effected at 750° C. for 30 minutes. Then, Ge ions are implanted at accelerating voltage Vac=50 kV and a dose $\Phi=1\times10^{16}$ cm$^{-2}$. Thus, as shown in FIG. 48B, an n$^+$ drain region 322 and a $Si_xGe_{1-x}$ region 312 are formed. In addition, an n$^+$ $Si_xGe_{1-x}$ layer is formed by CVD, and a refractory metal silicide or refractory metal (for example, W) 332 is deposited thereon to form data lines (bit lines) 322. The bit lines are wired in the direction parallel to the surface of this sheet and a plurality of parallel wirings are formed side by side in the direction perpendicular to the surface of this sheet. A second interlayer insulating film is stacked between bit lines (not shown) and a surface thereof is polished to obtain a mirror like surface. Preparing another silicon substrate 301, whose surface is also polished to mirror like surface, both substrates 303, 301 are mated with facing mirror surface to mirror surface and annealed at 900° C. for 1 h. And as shown in FIG. 48C, a p type silicon substrate 301 is bonded with the substrate 303 by SDB technique. After this, the p type silicon substrate 303 is grinded and polished from its back surface until the gate wiring 308 is exposed, leaving only the silicon pillar. Then, the p type silicon substrate is turned up from those shown in FIGS. 48A to 48C. As shown in FIG. 48D, a third interlayer insulating film 82 is deposited on an entire surface, and contact holes are opened in the third interlayer insulating film 82. An n$^+$ source region 323 is formed in the top side of the silicon pillar by implanting As (or P) ions via the contact holes in the third interlayer insulating film 82. Next, as shown in FIG. 48E, an $Si_xGe_{1-x}$ region 313 is deposited by CVD or MBE, then a surface of a resultant structure is flattened to be buried in the third interlayer insulating film 82.

Figure 48F:
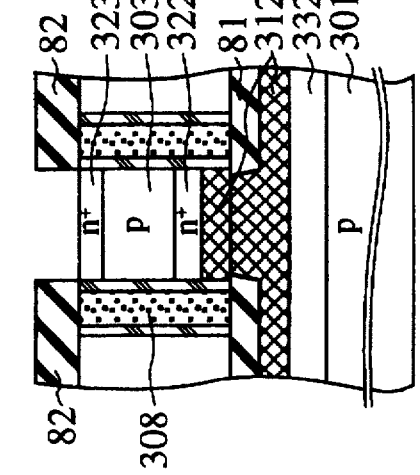

Next, fourth interlayer insulating film 83 is deposited on the third interlayer insulating film 82 and the $Si_xGe_{1-x}$ region 313. Then, contact holes are opened in the fourth interlayer insulating film 83. As shown in FIG. 48F, a metal such as W/Ti/TiN/Pt serving as the storage node electrode is formed by evaporation or sputtering and is then patterned.

After this, like the seventeenth embodiment, if the DRAM storage capacitor portion is formed by $Ta_2O_5$ film or BSTO film, the structure shown in FIGS. 47A and 47B is completed.

(NINETEENTH EMBODIMENT)

Figure 49A:
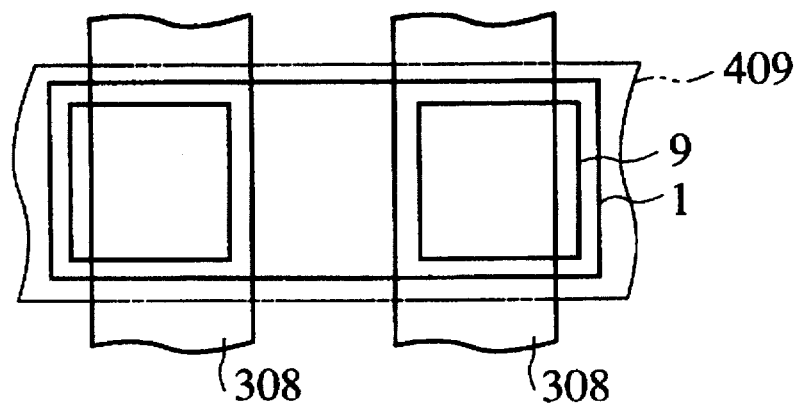
FIG. 49A is a plan view showing a structure of a vertical MOS.DRAM according to a nineteenth embodiment of the present invention.
Figure 49B:
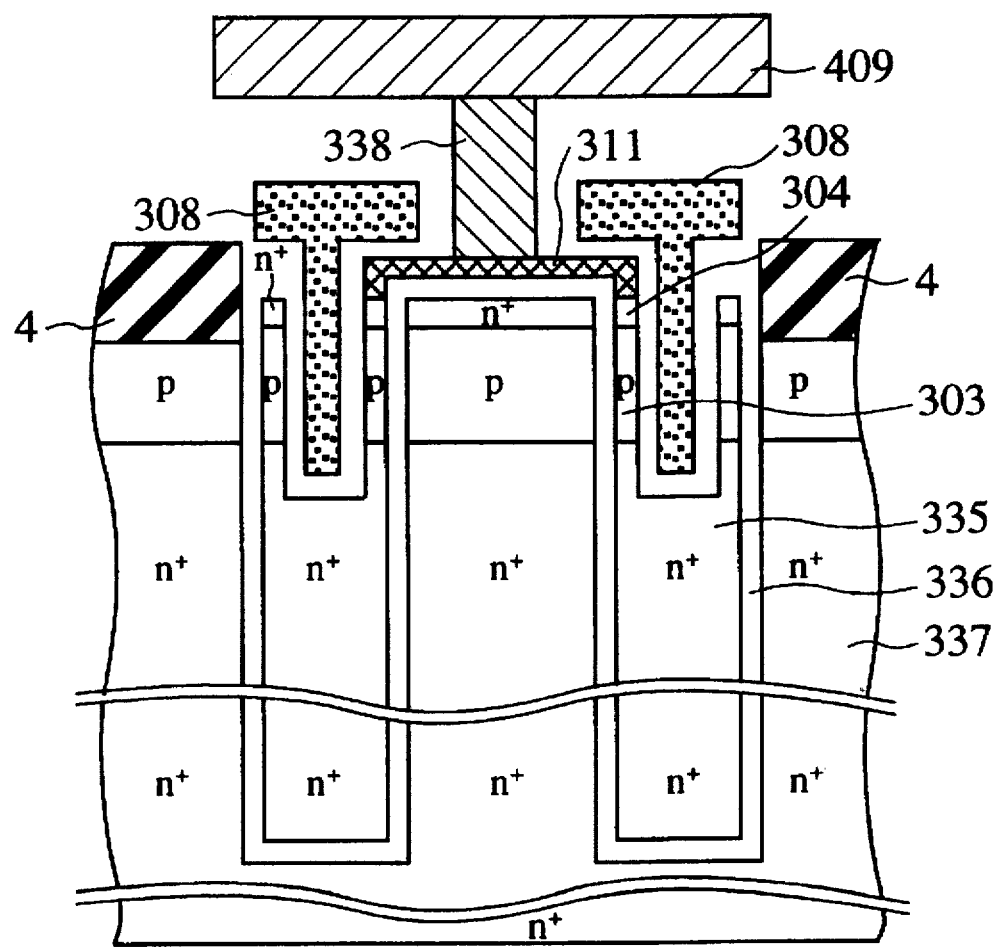
FIG. 49B is a sectional view showing the vertical MOS.DRAM shown in FIG. 49A.

FIGS. 49A and 49B are a plan view and a sectional view respectively showing a structure of a vertical MOS.DRAM according to a nineteenth embodiment of the present invention. In this nineteenth embodiment of the present invention, a DRAM storage capacitor portion is formed which comprises an $n^+$ region (substrate) 337 serving as a plate electrode (opposing electrode), a capacitor insulating film 336 formed in an inside of a first U groove 9 which is formed in the $n^+$ region 337, and a storage node electrode 335 formed of an $n^+$ single crystal silicon (or an $n^+$ doped polysilicon). As a switching transistor (or select transistor) of the DRAM, a vertical type thin film transistor (TFT) using a p type thin film silicon layer 303 as a channel region is formed on the DRAM storage capacitor portion (cell capacitor element). The TFT may be one of MOSFET or MOSSIT. The switching transistor comprises the $n^+$ region 337 serving as a source region, an $n^+$ region 304 formed as a drain region on the p-type thin film silicon 303, and polysilicon etc. serving as a gate electrode 308, which is formed in a second U groove formed in the first U groove 9 via a thin film silicon. The gate electrode 308 serves as a word line of the DRAM. A $Si_xGe_{1-x}$ region 311 is formed on the $n^+$ drain region 304, i.e., the uppermost layer on the thin film silicon. A bit line 409 is formed on the $Si_xGe_{1-x}$ region 311 via a contact electrode 338.

As shown in FIGS. 49A and 49B, in the vertical MOS.DRAM according to the nineteenth embodiment of the present invention, since the $Si_xGe_{1-x}$ region 311 is formed on the $n^+$ drain region 304, holes accumulated in the channel region 303 can be extracted into the $n^+$ drain region 304 quickly and at high efficiency and the floating body effect is efficiently suppressed. Therefore, the drain breakdown voltage (drain endurance) can be improved. Moreover, as shown in FIG. 49B, since the $Si_xGe_{1-x}$ region 311 is formed spaced far apart from pn junction interface between the $n^+$ region 304 and p-type thin film silicon 303, the leakage current caused by the crystal defects due to the lattice mismatching between the $Si_xGe_{1-x}$ region and Si region can be prevented, and a good data holding characteristic can be accomplished.

Incidentally, the $Si_xSn_{1-x}$ layer or the narrow band gap material such as PbS, PbTe, SnTe, ZnSb, etc. may be used instead of the $Si_xGe_{1-x}$ layer 311.

The vertical type MOS.DRAM according to the nineteenth embodiment of the present invention may be manufactured by manufacturing steps shown in FIGS. 50A to 50E.

Figure 50A:
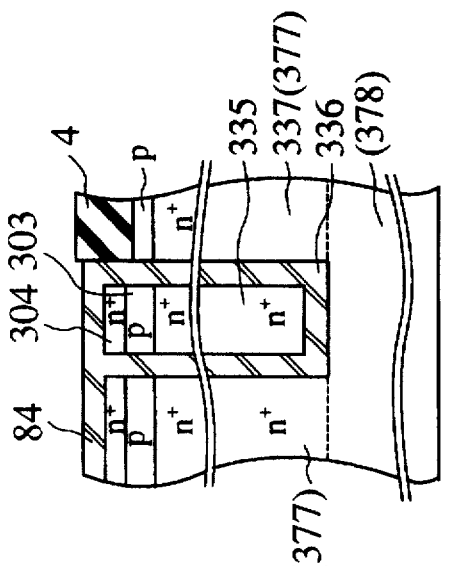
FIGS. 50A to 50E are sectional views each showing manufacturing steps of the vertical MOS.DRAM according to the nineteenth embodiment of the present invention.

(a) First, as shown in FIG. 50A, the $n^+$ region 377 is formed on a p type substrate 303 by low pressure epitaxy using $SiH_2Cl_2$ (or $SiHCl_3$) and $H_2$ with $AsH_3$ (or $PH_3$) gas as a dopant. Then, an oxide film is formed on the $n^+$ region 377 by CVD or thermal oxidation, and then the oxide film is patterned by photolithography. Then, a photoresist used in etching the oxide film is removed. Subsequently, using the oxide film as a mask, deep trenches (U grooves) shown in FIG. 50A are formed so as to reach the p type substrate 303 through the $n^+$ epitaxial growth layer 377 and further to dig a trench in the p type substrate 303 by RIE using $BCl_3$, $C_4$, $SF_6$, $CCl_4$, etc. or ECR ion etching. Although two trenches are shown by way of example in FIG. 50A, actually these two trenches are etched as a continuous pattern in a plane pattern and surrounding the rectangular pillar.

Figure 50B:
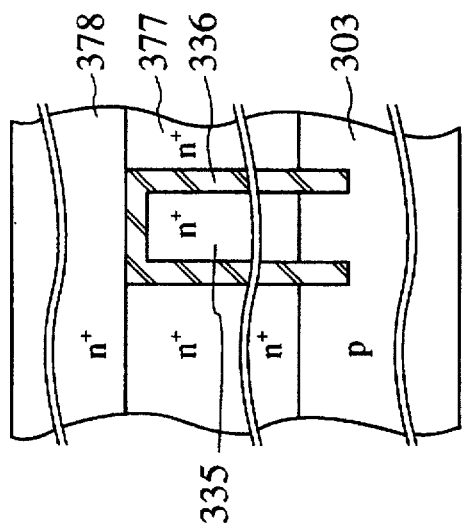

(b) Then, using a photoresist as a mask only a top portion of the rectangular pillar (silicon pillar) surrounded by the trench is etched selectively to a depth of 0.3 μm. After the photoresist is removed, an entire surface is oxidized. Then, an inside of the trench is buried by an oxide film 336, and a surface of the resultant structure is grinded and polished to finish a flat mirror surface until the $n^+$ region 377 is exposed. Next, preparing another $n^+$ substrate 378, and polishing the surface of another $n^+$ substrate 378 to a mirror like surface. And both subtrates 377, 378 are mated with facing mirror surface to mirror surface and annealed at 1100° C. for 1 h, to thus form an SDB substrate, as shown in FIG. 50B.

Figure 50C:
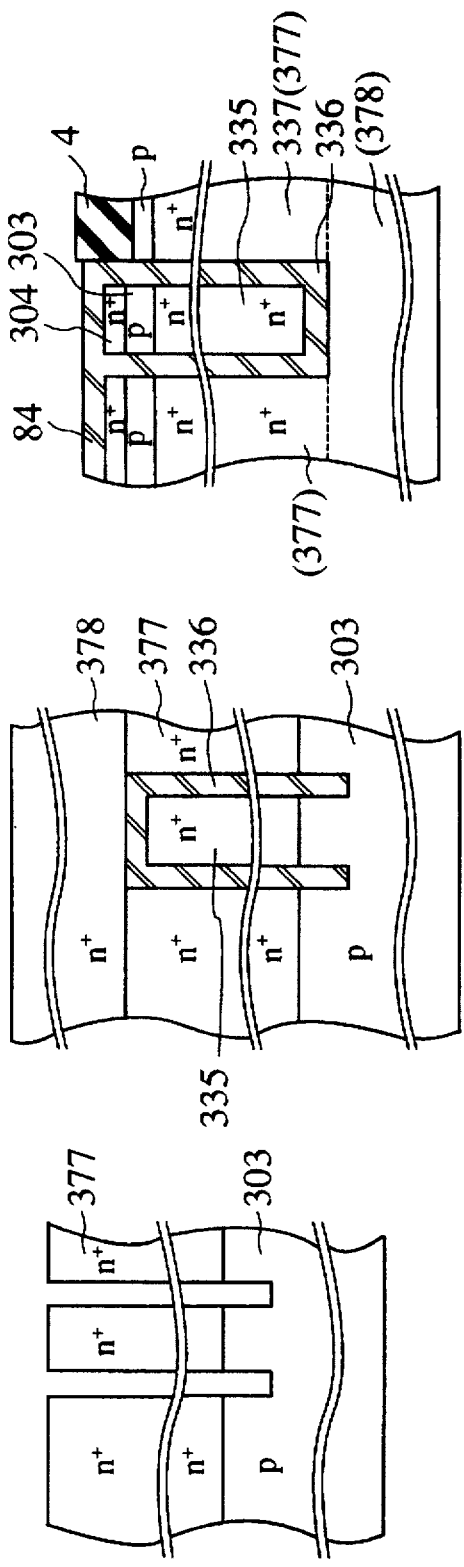

(c) By this SDB process, the $n^+$ epitaxial growth region 377 and the $n^+$ region 378 serving as a supporting substrate are bonded together as one body to result in an $n^+$ plate electrode 337. At the same time, the isolated $n^+$ region 335, or rectangular silicon pillar 335 is buried in the U grooves. Then, as shown in FIG. 50C, the SDB substrate is turned up. A surface of the p substrate 303 is polished until the buried oxide films 336 in the trench are exposed. Thereafter, a thick oxide film 4 for device isolation is formed as shown in FIG. 50C by LOCOS or BOX technique except for a device forming region. Using the thick oxide film 4 as a mask, the $n^+$ drain region 304 is formed on the surface of the p substrate 303 by implanting As ions etc. and, as shown in FIG. 50C, an oxide film 84 is formed on the $n^+$ drain region 304.

Figure 50E:
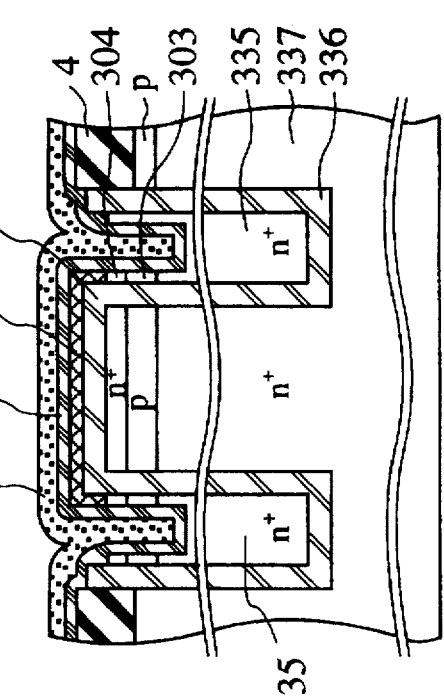
Figure 50D:
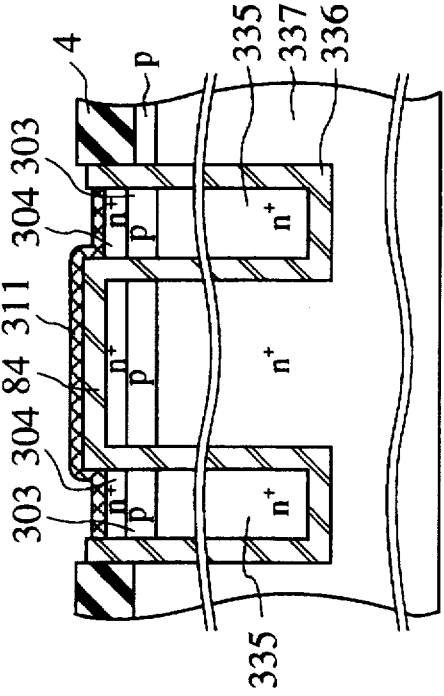

(d) Thereafter, the oxide film 84 on the $n^+$ drain region 304 is selectively removed by photolithography. As shown in FIG. 50D, a $Si_xGe_{1-x}$ layer 311 is formed entirely on the surface of $n^+$ drain region 304 and oxide film 84 by CVD using $SiH_4$ (or $SiH_2Cl_2$) and $GeH_4$ (or $GeH_2Cl_2$), or the like. At this time, to obtain the $n^+$ doped $Si_xGe_{1-x}$ layer 311 the $AsH_3$ (or $PH_3$) gas are simultaneously introduced into growth chamber with $SiH_4$ and $GeH_4$ gases.

(e) Then, the part of $Si_xGe_{1-x}$ layer 311 just on the $n^+$ drain region, which is formed in the top surface portion of the silicon pillar 335 in the first U groove is selectively removed by photolithography. In addition, a second U groove is formed in the silicon pillar 335 in the first U groove so as to reach the $n^+$ region 335 through the $n^+$ drain region 304 and the p region 303. Then, the gate oxide film 305 is formed on a surface of the second U grooves. The polysilicon film 308 serving as the gate electrode is formed by CVD, as shown in FIG. 50E.

(f) Thereafter, annealing is performed at 950° C. for 30 minutes to thus form the $Si_xGe_{1-x}$ region 311, as shown in FIG. 45E. Then, the interlayer insulating film is formed by CVD, and then the contact holes are opened in the interlayer insulating film. After this, the contact electrode 338 such as W etc. is buried in the contact holes. In addition, a wiring pattern of the bit line 409 is formed by a metal such as Al, Al—Si, Al—Si—Cu, or the like. As a result, the vertical MOS.DRAM according to the nineteenth embodiment of the present invention can be completed.

In the above explanations, although a way of forming the TFT in the U groove 9 by SDB technique has been explained, another way of that can be adopted. That is, first the U groove 9 is formed in the $n^+$ substrate 337, then the oxide film 336 is formed on the surface of the U groove, then the polysilicon 335 is formed in the U groove by CVD, then the upper portion of the polysilicon area in the U groove is changed to a single crystal by laser annealing or electron beam annealing. And if we implant B (or $BF_2$) ions into the single crystal silicon 303, the p-type single crystal channel region 303 of the TFT are formed. And then by implanting As ions, the n$^+$ drain regions 304 are obtained, and similar structure as shown in FIG. 50C is obtained. The following processes are same as the process already explained by using FIG. 50C-FIG. 50D.

Further, in place of the Si$_x$Ge$_{1-x}$ 831, the Si$_x$Sn$_{1-x}$, PbS or the like may be used, like the above embodiments. Furthermore, a refractory metal silicide film such as MoSi$_2$, TiSi$_2$, or WSi$_2$ may be formed on the surface of the Si$_x$Ge$_{1-x}$ 311.

(TWENTIETH EMBODIMENT)

Figure 51A:
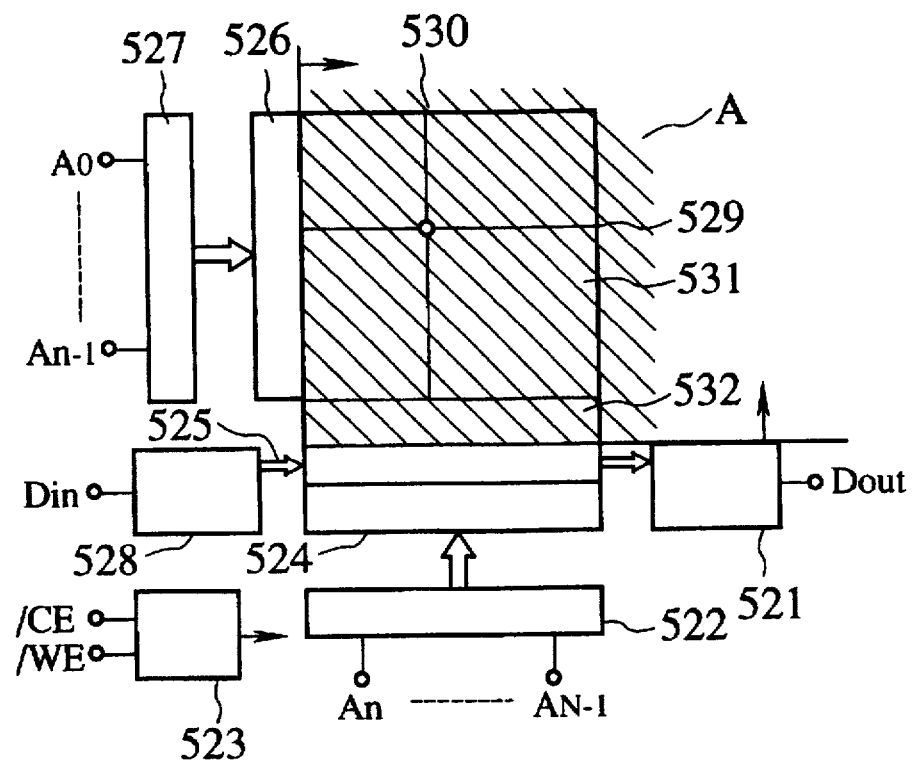
FIG. 51A is a view showing a circuit configuration of a DRAM according to a twentieth embodiment of the present invention.

FIG. 51A is a view showing a circuit configuration of a SOI.MOS.DRAM according to a twentieth embodiment of the present invention. In the above sixteenth to nineteenth embodiments of the present invention, a case wherein the narrow band gap semiconductor such as the Si$_x$Ge$_{1-x}$ region is formed as the switching transistor of the DRAM cell array has been explained. However, in the twentieth embodiment of the present invention, Ge ions are not implanted into the n$^+$ source and drain regions of the switching transistor in the cell array portion 531 and a sense amplifier portion 532 of the memory, but for a transistor in a periphery circuit connected to the cell array.

In other words, in FIG. 51A, Ge or Sn ions are implanted a row decoder 526, a column decoder 524, both being connected to a cell array portion 531, an address buffer 522 and 527, an input buffer 528, an output buffer 521 and the like. Thereby, minute leakage current generated in a transfer gate transistor or a switching transistor of the memory cell array portion 531 including bit lines 530 and word lines 529 can be suppressed, the degradation in a cell holding characteristic can be prevented, and soft error immunity can be realized. Therefore, the inherent advantages in the SOI-DRAM can be derived at maximum.

Figure 51B:
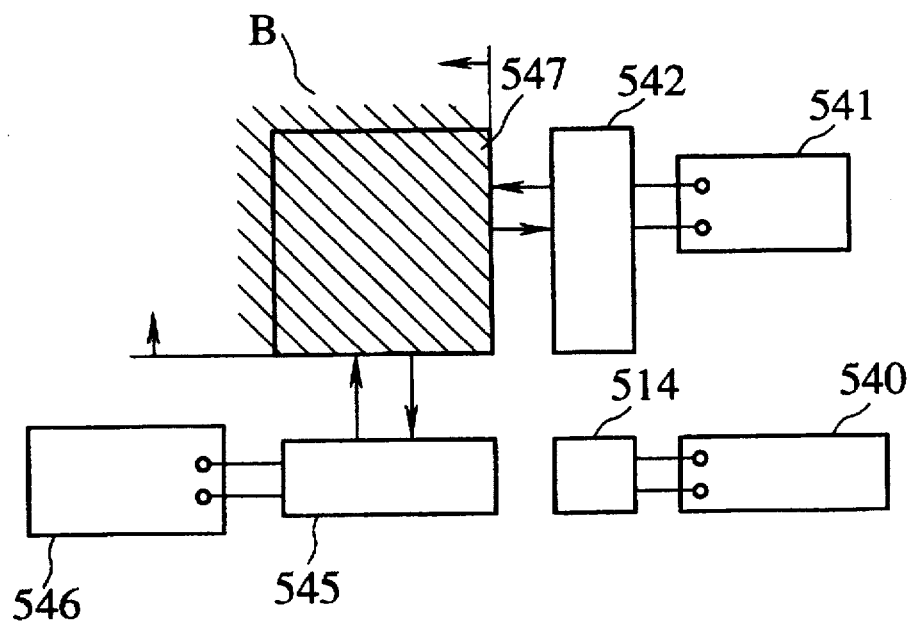
FIG. 51B is a view showing a circuit configuration of a logical integrated circuit according to a modification of the twentieth embodiment of the present invention.

The twentieth embodiment of the present invention can be applied to all semiconductor integrated circuits in addition to the DRAM. For instance, it is desired that leakage current is suppressed as small as possible for low power operation. However, in a logical integrated circuit device incorporated into a portable apparatus and shown in FIG. 51B, high breakdown voltages are required for an input/output circuit 542, a control circuit 545 and the like, in view of the interface nature between the external devices and the logic circuit. For this reason, if Ge or Sn ions are not implanted into the internal logical circuit 547 in the logical integrated circuit device but implanted only into the input/output interface circuit portion, the logical integrated circuit device, which can realize above advantages obtained by using the SOI substrate at maximum such that minute leakage current can be suppressed and low power consumption can be derived, can be fabricated.

In the twentieth embodiment of the present invention, a dose Φ or an accelerating voltage Vac may be controlled such that, in the SOI integrated circuit, the Si$_x$Ge$_{1-x}$ region or the Si$_x$Sn$_{1-x}$ region does not penetrate the SOI film and not reach the buried oxide layer.

In addition, if annealing is performed at a temperature of 700° C. or more after Ge or Sn ion implantation, the crystal defects due to formation of the Si$_x$Ge$_{1-x}$ region or the Si$_x$Sn$_{1-x}$ region can be controlled in desired location and direction.

Like the above embodiments, either a semiconductor such as PbS, PbTe, PbSe, SnSb, ZnSb, InSb, InAs etc. each having a narrower band gap than that of Si or a mixed crystal of Si and these narrow-bandgap-semiconductor may be used in place of the Si$_x$Ge$_{1-x}$ region.

Various modifications will become possible for those skilled in the art after receiving the teachings of the present disclosure without departing from the scope thereof. Especially, although the DRAM has been explained as a typical example of the memory in the above embodiments, it is apparent from the above explanations that characteristics of other LSIs such as EEPROM or SRAM can be improved if the present invention is applied to such other LSIs. In particular, since the EEPROM requires high breakdown voltage, high speed and high holding property can be derived if the structure of the present invention is adopted.

In the above embodiments, although the MOSFET of Si has been explained mainly, it is a matter of course that the present invention can be applied to compound semiconductor devices such as GaAs. In addition to the SOI structure, in a High Electron Mobility Transistor (HEMT) using such as an AlGaAs—GaAs heterojunction formed in a semi-insulating GaAs substrate may have a similar floating body effect, and a semiconductor such as InSb, InAs or the like having a narrower bandgap than that of GaAs may be formed in the n+ source region to exhaust the accumulated holes into p-type body. Further, n$^+$ Si region (the narrow-bandgap-source region) may be formed in the n$^+$ source region of the SiC-MIS.FET having a p-type SiC channel region, which has a wider band gap than Si.

What is claimed is:

1. An Insulated-Gate transistor at least having a first conductivity type channel region formed of a first semiconductor, which is formed on a first insulating film, a second insulating film formed on the channel region, and a gate electrode formed on the second insulating film to control electric current flowing through said channel region, wherein the improvement comprises:

a second conductivity type first source region formed of at least a second semiconductor having a narrower forbidden band gap than that of said first semiconductor, the first source region being doped with a first impurity element having the second conductivity type, and a second impurity element having a different covalent radius than that of the first impurity element so as to compensate a lattice mismatching in a heterojunction structure formed between said first and second semiconductors.

2. A transistor as claimed in claim 1, wherein the second impurity element has a smaller covalent radius than that of a constituent element of said first semiconductor.

3. A transistor as claimed in claim 1, wherein said first semiconductor is Si, said second semiconductor is Si$_x$Ge$_{1-x}$, said first impurity element is one of As and Sb, said second impurity element is one of P and B.

4. A transistor as claimed in claim 1, wherein said first impurity is doped into different location than that of said second impurity element.

5. A transistor as claimed in claim 1, wherein said first semiconductor is Si, said second semiconductor is Si$_x$Ge$_{1-x}$, said first impurity element is P and said second impurity element is B.

6. A transistor as claimed in claim 2, wherein said first semiconductor is Si, said second semiconductor is Si$_x$Ge$_{1-x}$, said first impurity element is one of As and Sb, said second impurity element is one of P and B.

7. An Insulated-Gate transistor at least having a first conductivity type channel region formed of a first semiconductor, which is formed on a first insulating film, a second insulating film formed on the channel region, and a gate electrode formed on the second insulating film to control electric current flowing through said channel region, wherein the improvement comprises:

a second conductivity type first source region formed of a second semiconductor having a narrower forbidden band gap than that of said first semiconductor, the first source region being doped with a first impurity element having the second conductivity type and a second impurity element having a different covalent radius than that of the first impurity element so as to compensate a lattice mismatching in a heterostructure formed between said first and second semiconductor; and a second conductivity type second source region formed adjacent to said first source region and formed of said first semiconductor, wherein at least the first impurity element is doped in said second source region.

8. A transistor as claimed in claim 7, wherein the second impurity element has a smaller covalent radius than that of a constituent element of said first semiconductor.

9. A transistor as claimed in claim 7, wherein said first semiconductor is Si, said second semiconductor is $Si_xGe_{1-x}$, said first impurity element is As or Sb for said second impurity element of P or B, or said first impurity element is P for said second impurity element of B.

10. A transistor as claimed in claim 7, wherein said first impurity is doped into different location than that of said second impurity element.

11. A transistor as claimed in claim 7, wherein said first semiconductor is Si, said second semiconductor is $Si_xGe_{1-x}$, said first impurity element is P and said second impurity element is B.

12. An Insulated-Gate transistor at least having a first conductivity type channel region formed of a first semiconductor, said first conductivity type channel region formed on a first insulating film, a second insulating film formed on the first conductivity type channel region, and a gate electrode formed on the second insulating film to control electric current flowing through said first conductivity type channel region, wherein the improvement comprises:

a second conductivity type first source region formed of a second semiconductor having a narrower forbidden band gap than that of said first semiconductor; and a second conductivity type second source region formed adjacently on said second conductivity type first source region and formed of said first semiconductor, wherein a top surface of said second conductivity type first source region is formed at a location having a larger depth than that of a depletion layer depth at a minimum depth portion, the depletion layer depth extending from the second insulating film with a maximum gate voltage applied on the gate electrode at an operation condition.

13. An Insulated-Gate transistor at least having a first conductivity type channel region formed of a first semiconductor formed on a first insulating film, a second insulating film formed on the first conductivity type channel region, and a gate electrode formed on the second insulating film to control electric current flowing through said first conductivity type channel region, wherein the improvement comprises:

a second conductivity type first source region formed of a second semiconductor having a narrower forbidden band gap than that of said first semiconductor;

a second conductivity type second source region formed adjacently on said second conductivity type first source region and formed of said first semiconductor; and a source metal electrode formed on said second conductivity type first source region via a groove formed in said second conductivity type second source region, wherein said second conductivity type first source region is formed at a location having a larger depth than that of a depletion layer depth at a minimum depth portion, the depletion layer depth extending from the second insulating film with a maximum gate voltage applied on the gate electrode at an operation condition.

14. An Insulated-Gate transistor at least having a first conductivity type channel region formed of a first semiconductor formed on a first insulating film, a second insulating film formed on the channel region, and a gate electrode formed on the second insulating film to control electric current flowing through said channel region, wherein the improvement comprises:

a second conductivity type first source region formed of a second semiconductor having a narrower forbidden band gap than that of said first semiconductor;

a second conductivity type second source region formed adjacently on said first source region and formed of said first semiconductor;

a third source region formed on and contacted to said first source region and formed of a semiconductor which has a smaller forbidden band gap than that of said first semiconductor; and a source metal formed on said third source region, wherein said first source region is formed at a location having a larger depth than that of a depletion layer depth at a minimum depth portion, the depletion layer extending from the second insulating film with a maximum gate voltage applied on the gate electrode at an operation condition.

15. An Insulated-Gate transistor at least having a first conductivity type channel region formed of a first semiconductor formed on a first insulating film, a second insulating film formed on the first conductivity type channel region, and a gate electrode formed on the second insulating film to control electric current flowing through said first conductivity type channel region, wherein the improvement comprises:

a second conductivity type first source region formed of a second semiconductor having a narrower forbidden bandgap than that of said first semiconductor, a bottom of said second conductivity type first source region being contacted to said first insulating film and a top of said second conductivity type first source region is formed at a location having a larger depth than that of a depletion layer depth at a minimum depth portion, the depletion layer depth extending from the second insulating film with a maximum gate voltage applied on the gate electrode at an operation condition;

a refractory metal silicide film formed on and contacted to said second conductivity type first source region; and a source metal electrode formed on said refractory metal silicide film.

16. An Insulated-Gate transistor having at least a first conductivity type first body region formed of a first semiconductor, which is formed on and in contact with a first insulating film, a second insulating film formed on the first body region, and a gate electrode formed on the second insulating film to control electric current flowing through said first body region, wherein the improvement comprises:

a second conductivity type first source region formed of a second semiconductor having a narrower forbidden band gap than that of said first semiconductor;

a second conductivity type second source region formed of the first semiconductor; and a first conductivity type second body region formed of the second semiconductor, wherein a portion of said first body region through which the main current of the transistor flows and the first source region are connected via said second body region.

17. A transistor as claimed in claim 16, wherein said first source region has at least a portion which is located lower than that of said second source region, so that the bottom of the first source region is contacted to said first insulating film.

18. A transistor as claimed in claim 16, wherein said second source region is contacted to said first body region via at least one of an upper and a lower layer portions of said first body region.

19. A transistor as claimed in claim 16, wherein said second source region is not metallurgically contacted to said first body region, but electrically connected via said first source region and said second body region to said first body region.

20. A transistor as in claim 16, further comprising a metal silicide film being formed on and contacted to said first source region.

21. An Insulated-Gate transistor having at least a first conductivity type first body region formed of a first semiconductor, which is formed on a first insulating film, a second insulating film formed on the first body region, and a gate electrode on the second insulating film to control electric current flowing through said first body region, wherein the improvement comprises:

a second conductivity type first source region formed of a second semiconductor having a narrower forbidden band gap than that of said first semiconductor, the first source region is formed on and in contact with said first insulating film;

a second conductivity type second source region formed of the first semiconductor, the second source region is formed in contact with said first source region and in a location shallower than said first source region; and a first conductivity type second body region formed in contact with said first insulating film, wherein a lower layer portion of said first body region is electrically connected to said first source region via said second body region.

22. A transistor as in claim 21, further comprising a metal silicide film being formed on and contacted to said first source region.

23. An Insulated-Gate transistor comprising:

a first conductivity type first body region formed of a first semiconductor, which is formed on a first insulating film;

a first conductivity type second body region formed of a second semiconductor having a narrower forbidden band gap than that of said first semiconductor, the second body region is formed on the first body region;

a second insulating film formed on the second body region;

a gate electrode on the second insulating film to control electric current flowing through said second body region;

a second conductivity type first source region formed of the second semiconductor; and a second conductivity type second source region formed of the first semiconductor, the second source region is contacted to the first source region, wherein the first source region is contacted to said second body region.

24. A transistor as in claim 23, further comprising a metal silicide film being formed on and contacted to said first source region.

25. An Insulated-Gate transistor having at least a first conductivity type channel region formed of a first semiconductor, which is formed on a first insulating film, a second insulating film formed on the first conductivity type channel region, and a gate electrode on the second insulating film to control electric current flowing through said first conductivity type channel region, wherein the improvement comprises:

a second conductivity type first source region formed by ion implantation method so as to provide a second semiconductor having a narrower forbidden band gap than that of said first semiconductor;

a second conductivity type second source region surrounding said second conductivity type first source region except at an upper surface thereof, said second conductivity type second source region formed of the first semiconductor;

a second conductivity type drain region formed so that said first conductivity type channel region is sandwiched in between said second conductivity type second source region and said second conductivity type drain region; and crystal defects due to a lattice mismatching in a heterojunction between the first semiconductor and the second semiconductor, the crystal defects being selectively formed in the second conductivity type second source region at a portion just under edges of the gate electrode and confined in the second conductivity type second source region so that the crystal defects do not reach a pn junction interface formed between the first conductivity type channel region and the second conductivity type second source region.

26. An Insulated-Gate transistor at least having a first conductivity type channel region formed of a first semiconductor formed on a first insulating film, a second insulating film formed on the first conductivity type channel region, and a gate electrode formed on the second insulating film to control electric current flowing through said first conductivity type channel region, wherein the improvement comprises:

a second conductivity type first source region formed of a second semiconductor having a narrower forbidden bandgap than that of said first semiconductor, a bottom of said second conductivity type first source region being contacted to said first insulating film;

a metal silicide film formed on and contacted to said second conductivity type first source region;

a second conductivity type second source region formed adjacently to said second conductivity type first source region and to said metal silicide film, the second conductivity type second source region being formed of said first semiconductor; and a source metal electrode formed on said metal silicide film.

27. An Insulated-Gate transistor at least having a first conductivity type channel region formed of a first semiconductor formed on a first insulating film, a second insulating film formed on the first conductivity type channel region, and a gate electrode formed on the second insulating film to control electric current flowing through said first conductivity type channel region, wherein the improvement comprises:

a second conductivity type first source region formed of a second semiconductor having a narrower forbidden bandgap than that of said first semiconductor, a bottom of said second conductivity type first source region being contacted to said first insulating film;

a metal silicide film formed on and contacted to said second conductivity type first source region; and a source metal electrode formed on said metal silicide film, wherein an interface between said source metal electrode and said metal silicide film is disposed at a location deeper than a top surface of said first conductivity type channel region.

28. An Insulated-Gate transistor having at least a first conductivity type first body region formed of a first semiconductor, which is formed on and in contact with a first insulating film, a second insulating film formed on the first body region, and a gate electrode formed on the second insulating film to control electric current flowing through said first body region, wherein the improvement comprises:

a second conductivity type first source region formed of a second semiconductor having a narrower forbidden band gap than that of said first semiconductor; and a first conductivity type second body region formed of the second semiconductor, wherein a portion of said first body region through which a main current of the transistor flows and the first source region are connected via said second body region.

29. A transistor as claimed in claim 28, further comprising a second conductivity type second source region formed of the first semiconductor, wherein said first source region has at least a portion which is located deeper than that of said second source region, so that a bottom of the first source region is contacted to said first insulating film.

30. A transistor as claimed in claim 28, further comprising a second conductivity type second source region formed of the first semiconductor, wherein said second source region is contacted to said first body region via at least one of upper and lower layer portions of said first body region.

31. A transistor as claimed in claim 28, further comprising a second conductivity type second source region formed of the first semiconductor, wherein said second source region is not metallurgically connected to said first body region, but electrically connected via said first source region and said second body region to said first body region.

* * * * *